(12) United States Patent
Kataoka et al.

(10) Patent No.: US 9,250,519 B2
(45) Date of Patent: Feb. 2, 2016

(54) PATTERN FORMING METHOD AND ACTINIC RAY-SENSITIVE OR RADIATION-SENSITIVE RESIN COMPOSITION FOR USE IN THE METHOD

(71) Applicant: FUJIFILM Corporation, Tokyo (JP)

(72) Inventors: Shohei Kataoka, Haibara-gun (JP);
Akinori Shibuya, Haibara-gun (JP);
Akiyoshi Goto, Haibara-gun (JP);
Tomoki Matsuda, Haibara-gun (JP);
Toshiaki Fukuhara, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/580,686

(22) Filed: Dec. 23, 2014

(65) Prior Publication Data

US 2015/0111135 A1 Apr. 23, 2015

Related U.S. Application Data

(63) Continuation of application No. PCT/JP2013/068304, filed on Jun. 26, 2013.

(30) Foreign Application Priority Data

Jul. 26, 2012 (JP) .................................. 2012-166049

(51) Int. Cl.
| | | |
|---|---|---|
| *G03F 7/039* | (2006.01) | |
| *G03F 7/20* | (2006.01) | |
| *G03F 7/34* | (2006.01) | |
| *G03F 7/038* | (2006.01) | |
| *G03F 7/004* | (2006.01) | |
| *G03F 7/11* | (2006.01) | |
| *G03F 7/32* | (2006.01) | |
| *G03F 7/30* | (2006.01) | |

(52) U.S. Cl.
CPC .............. *G03F 7/038* (2013.01); *G03F 7/0045* (2013.01); *G03F 7/0046* (2013.01); *G03F 7/0397* (2013.01); *G03F 7/11* (2013.01); *G03F 7/2041* (2013.01); *G03F 7/30* (2013.01); *G03F 7/325* (2013.01)

(58) Field of Classification Search
CPC ....... G03F 7/004; G03F 7/039; G03F 7/0392; G03F 7/32; G03F 7/325

USPC .................................................. 430/434, 435
See application file for complete search history.

(56) References Cited

U.S. PATENT DOCUMENTS

| | | | |
|---|---|---|---|
| 2008/0187860 A1* | 8/2008 | Tsubaki et al. ............ | 430/270.1 |
| 2010/0136479 A1* | 6/2010 | Yamaguchi et al. ....... | 430/270.1 |
| 2010/0190106 A1 | 7/2010 | Tsubaki | |
| 2012/0058427 A1 | 3/2012 | Enomoto et al. | |
| 2012/0129100 A1* | 5/2012 | Shibuya et al. ............ | 430/281.1 |
| 2012/0156617 A1 | 6/2012 | Kataoka et al. | |

FOREIGN PATENT DOCUMENTS

| | | | |
|---|---|---|---|
| JP | 3632410 B2 | | 3/2005 |
| JP | 2007-326821 | * | 12/2007 |
| JP | 2008-281975 A | | 11/2008 |
| JP | 2010-139996 A | | 6/2010 |
| JP | 2010-164958 A | | 7/2010 |
| JP | 2011-22560 A | | 2/2011 |
| JP | 2011-100105 A | | 5/2011 |
| WO | 2008/153110 A1 | | 12/2008 |

OTHER PUBLICATIONS

Machine translation of the abstract of JP 2007-326821, published on Dec. 20, 2007.*
International Search Report for PCT/JP2013/068304 dated Jul. 30, 2013, 2 pages in English.
Written Opinion for PCT/JP2013/068304 dated Jul. 30, 2013, 4 pages in English.
Office Action dated Jun. 30, 2015 from the Japanese Patent Office in counterpart Japanese Application No. 2012-166049.

* cited by examiner

*Primary Examiner* — Anca Eoff
(74) *Attorney, Agent, or Firm* — Sughrue Mion, PLLC

(57) ABSTRACT

The pattern forming method of the present invention includes: (i) forming a film including an actinic ray-sensitive or radiation-sensitive resin composition containing a compound (A) represented by General Formula (I) shown below; a resin (P) capable of decreasing solubility with respect to a developer including organic solvent by the action of an acid; and a compound (B) capable of generating an acid by irradiation of actinic rays or radiation; (ii) irradiating the film with actinic rays or radiation; (iii) developing the film irradiated with the actinic rays or radiation using a developer including an organic solvent.

[Chem. 1]

$$R_N\text{-}A^-X^+ \qquad (I)$$

20 Claims, No Drawings

PATTERN FORMING METHOD AND ACTINIC RAY-SENSITIVE OR RADIATION-SENSITIVE RESIN COMPOSITION FOR USE IN THE METHOD

CROSS-REFERENCE TO RELATED APPLICATIONS

This application is a Continuation of PCT International Application No. PCT/JP2013/068304 filed on Jun. 26, 2013, which claims priority under 35 U.S.C §119(a) to Japanese Patent Application No. 2012-166049 filed on Jul. 26, 2012. Each of the above application(s) is hereby expressly incorporated by reference, in its entirety, into the present application.

BACKGROUND OF THE INVENTION

1. Field of the Invention

The present invention relates to a pattern forming method and an actinic ray-sensitive or radiation-sensitive resin composition for use in the method. More specifically, the present invention relates to negative pattern forming method appropriately used in a semiconductor manufacturing process, such as IC, a manufacturing process of a circuit board of a liquid crystal, thermal head, and the like, and other photofabrication lithography processes, and an actinic ray-sensitive or radiation-sensitive resin composition used therein. In addition, the present invention relates to a manufacturing process of an electronic device including the pattern forming method and an electronic device manufactured by the method. Furthermore, the present invention also relates to an active-ray sensitive or radiation-sensitive film including the actinic ray-sensitive or radiation-sensitive resin composition.

2. Description of the Related Art

Since the development of a resist for a KrF excimer laser (248 nm), a pattern forming method using a chemical amplification has been used so as to compensate for sensitivity reduction caused by light absorption. By way of an example, in a positive chemical amplification method, a photoacid generator included in the exposed portion is decomposed by irradiation with light to generate an acid. Further, an alkali-insoluble group contained in a photosensitive composition is converted into an alkali-soluble group by the catalytic action of the generated acid in PEB (Post Exposure Bake) process. Subsequently, development is carried out using, for example, an alkali solution. In so doing, a desired pattern is obtained by removing the exposed portion (for example, refer to JP3632410B and JP2011-100105A).

For the method, various kinds of alkali developer have been proposed. For example, as the alkali developer, water-based alkali developing liquids such as a 2.38 mass % aqueous TMAH (tetramethylammonium hydroxide) solution have been widely used.

Due to miniaturization of a semiconductor device, there is a trend toward a shorter wavelength of the exposure light source and a higher numerical aperture (higher NA) of the projection lens and at the present time, an exposure machine using, as its light source, an ArF excimer laser having a wavelength of 193 nm has been developed. A method of filling a high refractive-index liquid (hereinafter sometimes referred to as an "immersion liquid") between the projection lens and the sample (that is, a liquid immersion method) has been proposed as a technique for further enhancing the resolving power. In addition, EUV lithography that performs exposure by using ultraviolet rays having a shorter wavelength (13.5 nm) has also been proposed.

Recently, a pattern forming method using a developer including an organic solvent has been developed (see, for example, US2012/058427A, JP2008-281975A, JP2010-139996A, or JP2010-164958A). For example, a pattern forming method having a process of developing using a developer including an organic solvent with respect to a resist composition having a compound capable of losing basicity due to irradiation of actinic rays or radiation has been disclosed in US2012/058427A. According to this method, stably forming a fine pattern with low line width variations (hereinafter, also referred to as "line width roughness" or LWR), high defocusing (hereinafter, also referred to as DOF), and a rectangular pattern profile is disclosed.

However, it is actually very difficult to find an appropriate combination of resist composition, developer and rinsing liquid, and the like, necessary for forming a pattern with excellent performance overall, and there is demand for further improvements. For example, it is desired that a resist composition with excellent LWR and exposure latitude (hereinafter, also referred to as EL) be developed.

SUMMARY OF THE INVENTION

An object of the present invention is to provide a pattern forming method with excellent roughness performance, such as line width roughness, and exposure latitude, and an actinic ray-sensitive or radiation-sensitive resin composition for use in the method.

Examples of the present invention are as follows.

[1] A pattern forming method including: (i) forming a film including an actinic ray-sensitive or radiation-sensitive resin composition containing a compound (A) represented by General Formula (I) shown below; a resin (P) capable of decreasing solubility with respect to a developer in which an organic solvent is included due to the action of an acid; and a compound (B) capable of generating an acid by irradiation of actinic rays or radiation;

(ii) irradiating the film with actinic rays or radiation;

(iii) developing the film irradiated with the actinic rays or radiation using a developer including an organic solvent.

[Chem. 1]

$$R_N\text{-}A^-X^+ \qquad (I)$$

In general formula (I), $R_N$ represents a monovalent basic compound residue containing at least one nitrogen atom;

$A^-$ represents any of general formula (a-1) to (a-3) shown below;

[Chem. 2]

(a-1)

(a-2)

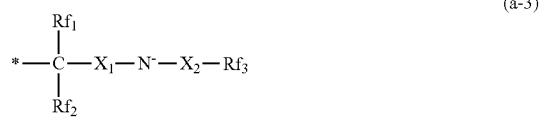

(a-3)

Ar represents an aryl group or a heteroaryl group;
$Rf_1$ and $Rf_2$ each independently represent a fluorine atom or an alkyl group substituted with at least one fluorine atom;
$Rf_3$ represents an alkyl group substituted with at least one fluorine atom;
$X_1$ and $X_2$ each independently represent —CO— or —$SO_2$—;
$X^-$ represents a counter cation;
\* represents a bonding site with $R_N$;
a Log P value of $R_N$—$CH_3$ is 1.2 or more to 4.0 or less.

[2] The pattern forming method according to [1] in which $R_N$-$A^-$ in the general formula (I) is represented by general formula (II) shown below.

[Chem. 3]

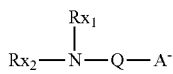

(II)

In general formula (II),
$A^-$ is as defined in the general formula (I);
Q represents a linking group;
$Rx_1$ and $Rx_2$ each independently represent a hydrogen atom or an organic group;
2 or more of $Rx_1$, $Rx_2$ and Q may be bonded together to form a ring together with a nitrogen atom bonded therewith.

[3] The pattern forming method according to [1] or [2], wherein $A^-$ in the general formula (I) and (II) is represented by the general formula (a-3).

[4] The pattern forming method according to any one of [1] to [3], wherein $X^+$ in the general formula (I) is an onium cation.

[5] The pattern forming method according to any one of [1] to [4], wherein the developing liquid includes at least one organic solvent selected from a group consisting of a ketone-based solvent, an ester-based solvent, an alcohol-based solvent, an amide-based solvent, and an ether-based solvent.

[6] A method for manufacturing an electronic device including the pattern forming method according to any one of [1] to [5].

[7] An electronic device manufactured by the manufacturing method of an electronic device according to [6].

[8] An actinic ray-sensitive or radiation-sensitive resin composition containing a compound (A) represented by general formula (I) shown below; a resin (P) capable of decreasing solubility with respect to a developer in which an organic solvent is included due to the action of an acid; and a compound (B) capable of generating an acid by irradiation of actinic rays or radiation.

[Chem. 4]

$R_N$-$A^-X^+$ (I)

In general formula (I),
$R_N$ represents a monovalent basic compound residue containing at least one nitrogen atom;
$A^-$ represents any of general formula (a-1) to (a-3) shown below;

[Chem. 5]

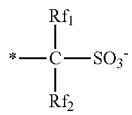

(a-1)

-continued

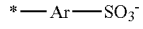

(a-2)

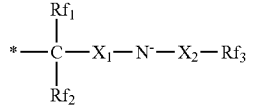

(a-3)

Ar represents an aryl group or a heteroaryl group;
$Rf_1$ and $Rf_2$ each independently represent a fluorine atom or an alkyl group substituted with at least one fluorine atom;
$Rf_3$ represents an alkyl group substituted with at least one fluorine atom;
$X_1$ and $X_2$ each independently represent —CO— or —$SO_2$—;
$X^-$ represents a counter cation;
\* represents a bonding site with $R_N$;
a Log P value of R—$CH_3$ is 1.2 or more to 4.0 or less.

[9] The actinic ray-sensitive or radiation-sensitive resin composition according to [8], wherein $R_N$-$A^-$ in the general formula (I) is represented by general formula (II) shown below:

[Chem. 6]

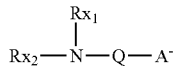

(II)

In general formula (II),
$A^-$ is as defined in the general formula (I);
Q represents a linking group;
$Rx_1$ and $Rx_2$ each independently represent a hydrogen atom or an organic group;
2 or more of $Rx_1$, $Rx_2$ and Q may be bonded together to form a ring together with a nitrogen atom bonded therewith.

[10] An actinic ray-sensitive or radiation-sensitive film including the actinic ray-sensitive or radiation-sensitive resin composition according to [8] or [9].

According to the present invention a pattern forming method with excellent roughness performance, such as line width roughness, and exposure latitude, and an actinic ray-sensitive or radiation-sensitive resin composition for use in the method can be provided.

DESCRIPTION OF THE PREFERRED EMBODIMENTS

Below, the present invention will be described in detail.
In a case where "substituted" or "unsubstituted" is not defined in the description of group or atomic group in the present specification, the description includes both a group and an atomic group not having a substituent and a group and an atomic group having a substituent. For example, "an alkyl group" without defining whether substituted or unsubstituted includes not only an alkyl group having no substituent (unsubstituted alkyl group) but also an alkyl group having a substituent (substituted alkyl group).

In the present invention, "actinic rays" or "radiation" means, for example, the bright line spectrum of a mercury lamp, far ultraviolet rays represented by an excimer laser, extreme ultraviolet rays (EUV light), x-rays, electron beams, particle beams such as an ion beam, or the like. Further, the "light" in the invention means actinic rays or radiation.

Furthermore, unless otherwise specifically indicated, the term "exposure" in the present specification includes not only exposure to a mercury lamp, far ultraviolet rays represented by an excimer laser, X-rays, extreme ultraviolet rays (EUV light), or the like but also lithography with a particle beam such as an electron beam and an ion beam.

<Actinic Ray-Sensitive or Radiation-Sensitive Resin Composition>

Firstly, the actinic ray-sensitive or radiation-sensitive resin composition according to the present invention (hereinafter, also referred to as the "composition of the present invention" or "resist composition of the present invention") will be described.

The actinic ray-sensitive or radiation-sensitive resin composition according to the invention is used for negative type development (development in which the solubility in a developing liquid decreases upon exposure, and thus, the exposed portion remains as a pattern and the non-exposed portion is removed). That is, the actinic ray-sensitive or radiation-sensitive resin composition according to the invention can be used as an actinic ray-sensitive or radiation-sensitive resin composition for organic solvent development, that is, used for development using a developing liquid including an organic solvent. Here, "for organic solvent development" means use in development using at least a developing liquid including an organic solvent.

The actinic ray-sensitive or radiation-sensitive resin composition of the invention is typically a resist composition, and is preferably a negative type resist composition (that is, a resist composition for organic solvent development) from the viewpoint of obtaining particularly superior effects. In addition, the composition according to the invention is typically a chemically amplified resist composition.

The actinic ray-sensitive or radiation-sensitive resin composition according to the present invention includes [1] a compound (A) represented by the general formula (I) described later, [2] a resin (P) capable of decreasing solubility with respect to a developer in which an organic solvent is included due to the action of an acid, and a [3] compound (B) capable of generating an acid by irradiation of actinic rays or radiation.

The reason that a resist composition including the compound (A) represented by general formula (I) is excellent in both of roughness performance, such as line width roughness, and exposure latitude is presumed to be as below.

First, in the molecule of compound (A), the generated acid is quickly neutralized by the generated acid and basic compound residue being linked. Therefore, it is thought that the roughness performance and the exposure latitude are improved. Furthermore, the compound becomes easier to dissolve in a developer including an organic solvent by selecting a basic compound residue having a higher Log P value (in other words, more hydrophobic). As a result, it can be inferred that the pattern side wall becomes smooth, and the roughness performance is improved.

As a further component which may be included in the composition according to the present invention, examples include [4] a solvent, [5] a hydrophobic resin, [6] a resin (D) practically not containing fluorine atoms and silicon atoms, different from the resin (P), [7] a basic compound, [8] a surfactant, and [9] other additives. The composition of the present invention can be used for pattern forming according to a method described later as, for example, a "pattern forming method".

[1] Compound (A) Represented by General Formula (I)

The actinic ray-sensitive or radiation-sensitive resin composition used in the pattern forming method of the present invention includes a compound represented by the general formula (I) below (hereinafter, also referred to as "compound (A)").

[Chem. 7]

In general formula (I), $R_N$ represents a monovalent basic compound residue containing at least one nitrogen atom;

$A^-$ represents any one of general formula (a-1) to (a-3) below.

[Chem. 8]

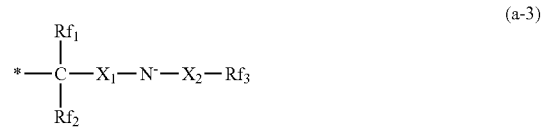

Ar represents an aryl group or a heteroaryl group.

$Rf_1$ and $Rf_2$ each independently represent a fluorine atom or an alkyl group substituted with at least one fluorine atom.

$Rf_3$ represents an alkyl group substituted with at least one fluorine atom.

$X_1$ and $X_2$ each independently represent —CO— or —SO$_2$—.

$X^-$ represents a counter cation.

The Log P value of $R_N$—CH$_3$ is 1.2 or more to 4.0 or less.

In the general formula (I), $A^-$ is preferably represented by the general formula (a-3) above.

At least one of $X_1$ and $X_2$ is preferably —SO$_2$—, and both of $X_1$ and $X_2$ are more preferably —SO$_2$—.

The alkyl group in the alkyl group substituted with a fluorine atom as $Rf_1$, $Rf_2$ or $Rf_3$ is preferably a linear and branched alkyl group with 1 to 30 carbon atoms, and may include an oxygen atom, a sulfur atom or a nitrogen atom in the alkyl chain. Specific examples of the alkyl group include linear alkyl groups such as a methyl group, an ethyl group, an n-propyl group, an n-butyl group, an n-pentyl group, an n-hexyl group, an n-octyl group, an n-dodecyl group, an n-tetradecyl group, and an n-octadecyl group, and branched alkyl groups such as an isopropyl group, an isobutyl group, a t-butyl group, a neopentyl group, and a 2-ethylhexyl group.

The above alkyl group may have a further substituent in addition to a fluorine atom. Examples of the substituent include a halogen atom other than a fluorine atom, a hydroxyl group, a nitro group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 10 carbon atoms). A cycloalkyl group, aryl group, alkoxy group, alkoxycarbonyl group as a substituent may be substituted with a halogen atom, such as a fluorine atom. As for the cyclic structure in the aryl group, cycloalkyl group and the like, examples of the substituent further include an alkyl group (preferably having 1 to 10 carbon atoms). As for the aminoacyl group, examples of the substituent further include an alkyl group (preferably having 1 to 10 carbon atoms).

Examples of an alkyl group substituted with at least one fluorine atom include perfluoroalkyl groups such as a perfluoromethyl group, a perfluoroethyl group, a perfluoropropyl group, or a perfluorobutyl group.

$Rf_1$ and $Rf_2$ preferably are each independently a fluorine atom or a trifluoromethyl group, and more preferably a fluorine atom.

$Rf_3$ is preferably a perfluoroalkyl group, more preferably a perfluoromethyl group or a perfluoroethyl group, and still more preferably a perfluoromethyl group.

The aryl group as Ar may have a substituent, and is preferably an aryl group with 6 to 14 carbon atoms. Examples thereof include a phenyl group, a naphthyl group, or a fluorophenyl group. Examples of a substituent which the aryl group may have include the substituent of the alkyl group in $Rf_1$, $Rf_2$ or $Rf_3$, a fluorine atom and an alkyl group. The substituent which the aryl group may have is preferably a fluorine atom.

heterocyclic structure, and particularly preferably is a structure having a primary to tertiary amino group. In these structures, from the viewpoint of enhancing the basicity, it is preferred that all atoms adjacent to a nitrogen atom contained in the structure be a carbon atom or a hydrogen atom. In addition, from the viewpoint of improving basicity, it is preferable that the electron withdrawing functional group (such as a carbonyl group, a sulfonyl group, a cyano group, a halogen atom) not be directly bonded to a nitrogen atom.

In compound (A), the Log P value of $R_N$—$CH_3$ representing the hydrophobicity of the basic site is 1.2 or more to 4.0 or less, preferably 1.2 or more to 3.5 or less, and more preferably 1.25 or more to 3.0 or less. When the Log P value of $R_N$—$CH_3$ is less than 1.2, there is a tendency for the effect of improving LWR to weaken.

In the present specification, the Log P value is a logarithmic value of an n-octanol/water partition coefficient (P), and is a parameter defining the hydrophilicity/hydrophobicity thereof with respect to a wide range of compounds. Ordinarily, the partition coefficient is obtained not by experiments but by calculation, and in the present specification represents a value calculated using ChemBioDraw Ultra ver. 12.0.2.1076.

For example, in the case of a compound represented by (A-1) and (A-2) below, $R_N$—$CH_3$ is represented by (A-1-1) below and the Log P value of $R_N$—$CH_3$ becomes 2.07.

[Chem. 9]

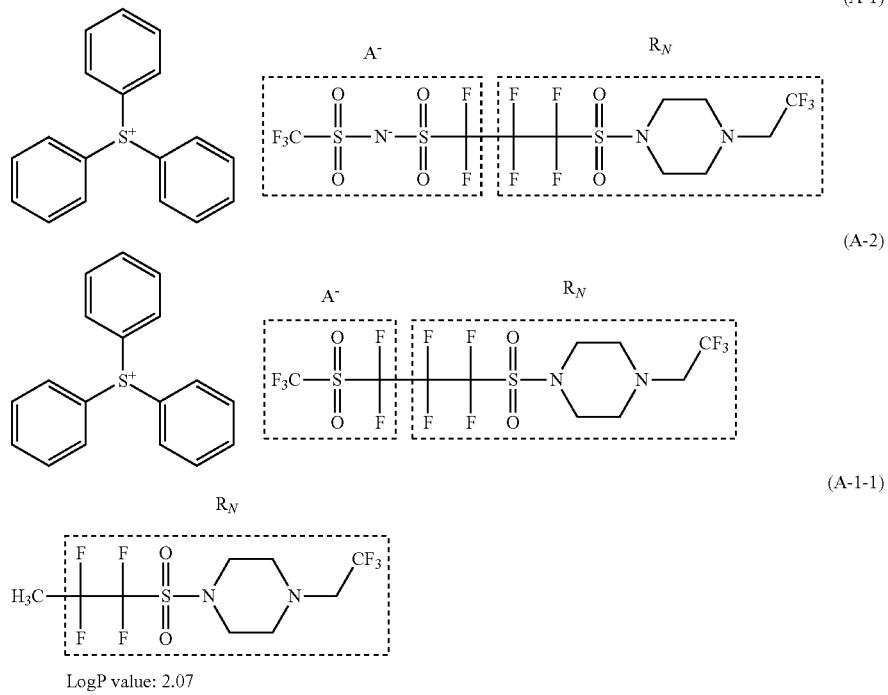

In general formula (I), $R_N$ is a monovalent basic compound residue containing at least one nitrogen atom, and below is also referred to as "basic site $R_N$".

Here, the basic compound residue $R_N$ is an organic group having at least one basic functional group. The basic functional group which $R_N$ has is preferably a functional group having a nitrogen atom, more preferably is a structure having a primary to tertiary amino group or a nitrogen-containing $R_N$-$A^-$ in the general formula (I) above is preferably represented by the general formula (II) below.

[Chem. 10]

In general formula (II),
A⁻ is as defined in the general formula (I);
Q represents a linking group.
$Rx_1$, and $Rx_2$ each independently represent a hydrogen atom or an organic group;
2 or more of $Rx_1$, $Rx_2$ and Q may bonded together to form a ring together with a nitrogen atom bonded therewith.

In the case where $Rx_1$ and $Rx_2$ are organic groups, in a case where two or more of $Rx_1$, $Rx_2$ and Q do not form a ring by being bonded to each other, $Rx_1$ and $Rx_2$ are monovalent organic groups; however, in a case where two or more of $Rx_1$, $Rx_2$ and Q form a ring by being bonded to each other, $Rx_1$ and $Rx_2$ are divalent or trivalent organic groups. Similarly, Q is ordinarily a divalent linking group; however, in a case where two or more of $Rx_1$, $Rx_2$ and Q form a ring by being bonded, Q is a trivalent linking group.

The organic group represented by $Rx_1$, and $Rx_2$ is preferably an organic group with 1 to 40 carbon atoms, and examples include, for example, an alkyl group, a cycloalkyl group, an aryl group, an aralkyl group or an alkenyl group.

In a case where $Rx_1$ and $Rx_2$ are alkyl groups, specific examples include the examples provided above of specific alkyl groups in $Rf_1$, $Rf_2$ or $Rf_3$, and preferable ranges are the same. The alkyl groups as $Rx_1$ and $Rx_2$ may have a substituent.

The cycloalkyl group represented by $Rx_1$ and $Rx_2$ may have a substituent, and preferably is a cycloalkyl group with 3 to 20 carbon atoms, and may have an oxygen atom and a nitrogen atom in the ring. Specific examples thereof include a cyclopropyl group, a cyclopentyl group, a cyclohexyl group, a norbornyl group and an adamantyl group.

The aryl group represented by $Rx_1$ and $Rx_2$ may have a substituent, and preferably an aryl group with 6 to 14 carbon atoms, and examples include, for example, a phenyl group or a naphthyl group.

The arakyl group represented by $Rx_1$ and $Rx_2$ may have a substituent, preferable examples are an arakyl group with 7 to 20 carbon atoms, and, for example, examples include a benzyl group, a phenethyl group, a naphthylmethyl group or a naphthylethyl group.

The alkenyl group represented by $Rx_1$ and $Rx_2$ may have a substituent, and examples include groups having a double bond at an arbitrary position of the alkyl group above.

Examples of the substituent that each of the groups above may have include the substituents of the alkyl groups in $Rf_1$, $Rf_2$ or $Rf_3$ above, a fluorine atom and an alkyl group.

Examples of the linking group represented by Q include —COO—, —OCO—, —CONH—, —NHCO—, —CO—, —O—, —S—, —SO—, —$SO_2$—, an alkylene group (preferably having 1 to 6 carbon atoms), a cycloalkylene group (preferably having 3 to 10 carbon atoms), an alkenylene group (preferably having 2 to 6 carbon atoms), —N($R_{x0}$)—, or a linking group formed by combination of a plurality of these groups. $R_{x0}$ represents a hydrogen atom or an organic group. Q may have a substituent, and examples of preferable substituents include a fluorine atom, a perfluoroalkyl group, a hydroxyl group, an alkoxy group, an alkoxy oxy group, or an alkylcarbonyloxy group.

The linking group represented by Q is preferably represented by the general formula (IV) below, and in this case, the basic site $R_N$ in the general formula (I) above is represented by the general formula (V) below.

[Chem. 11]

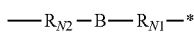
(IV)

-continued

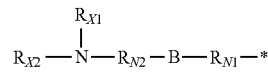
(V)

In general formula (IV) and (V),
$R_{N1}$ and $R_{N2}$ represent a single bond or a linking group.
B represents a single bond, —O—, —O—$X_3$—, —$X_3$—O—, N($R_{X3}$)—$X_3$—, or —$X_3$—N($R_{X3}$)—, when B is represented by —N($R_{X3}$)—$X_3$— or —$X_3$—N($R_{X3}$)—, $R_{X1}$ and $R_{X3}$ may bond to form a ring.
$X_3$ represents —CO— or —$SO_2$—.
$R_{X3}$ represents a hydrogen atom or an organic group.
$Rx_1$ and $Rx_2$ are as defined in the general formula (II) above.
* represents a bonding site with A⁻.

Examples of the linking group of $R_{N1}$ and $R_{N2}$ include the same linking groups as Q described above.

The linking group represented by the $R_{N1}$ is preferably an alkylene group which may have a substituent with 1 to 6 carbon atoms. Examples of the substituent preferably include a fluorine atom, a perfluoroalkyl group, a hydroxyl group, an alkoxy group, an alkoxy oxy group, or an alkylcarbonyloxy group.

Preferable examples of the linking group represented by $R_{N2}$ include an alkylene group and a phenylene group, and an alkylene group is particularly preferable.

When B is represented by —N($R_{X3}$)—$X_3$— or —$X_3$—N($R_{X3}$)—, $X_3$ is preferably —$SO_2$—.

Examples of the organic group of $R_{X3}$ include the specific examples provided above in a case where $Rx_1$ and $Rx_2$ are organic groups, and the preferable ranges are the same. The organic group of $R_{X3}$ may further have a substituent. Examples of the substituent include the same examples of substituents which an organic group as $Rx_1$ and $Rx_2$ may have provided above.

In an embodiment, the basic site $R_N$ is represented by general formula (VI) below.

[Chem. 12]

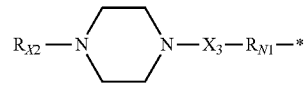
(VI)

In general formula (VI), $R_{X2}$, $X_3$, $R_{N1}$ and * are as defined in the general formula (IV) and (V) above.

In general formula (I), the counter cation represented by $X^+$ is preferably an onium cation, and more preferably a sulfonium cation or an iodonium cation.

As the preferable sulfonium cation and iodonium cation, in the compound generating an acid (acid generator) by irradiation of actinic rays or radiation described later, examples include the sulfonium cation and the iodonium cation in the compound represented by the general formula (ZI) and (ZII). Specific examples include the sulfonium cation and the iodonium cation in the specific example of the acid generator (B) listed later.

Below, specific examples of the compound (A) represented by general formula (I) are shown; however, the present invention is not limited thereto. The Log P value shown in Table 1 is a value calculated using the previously shown method of calculating Log P value of the basic site $R_N$—$CH_3$.

The content of the compound (A) is preferably 0.1 mass % to 10 mass %, more preferably 0.3 mass % to 8 mass % and particularly preferably 0.5 mass % to 5 mass %, with respect to the total solid content of the actinic ray-sensitive or radiation-sensitive resin composition (with the exception of solvent).

[Chem. 13-1]

(A-1)
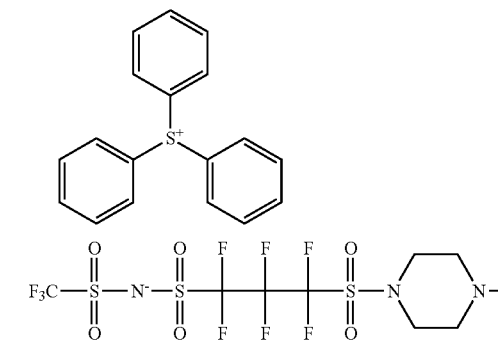

(A-2)
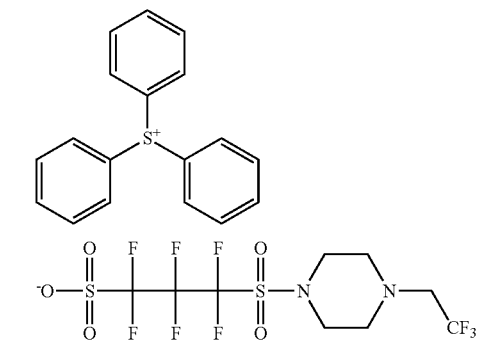

(A-3)
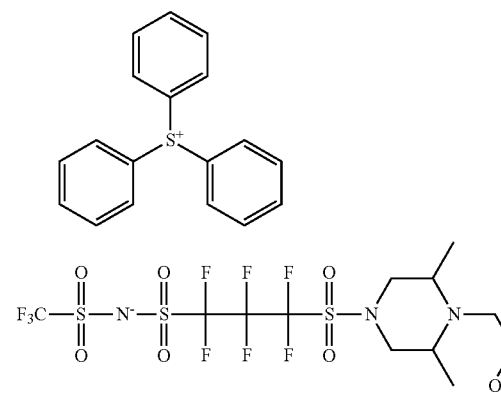

(A-4)
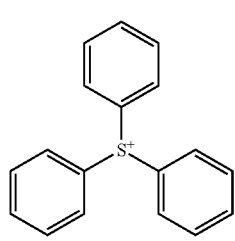

(A-5)
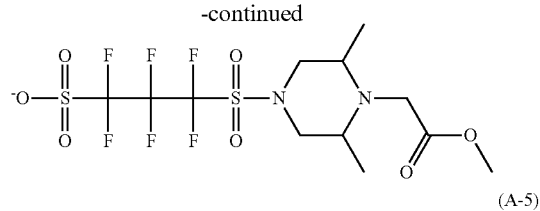

(A-6)
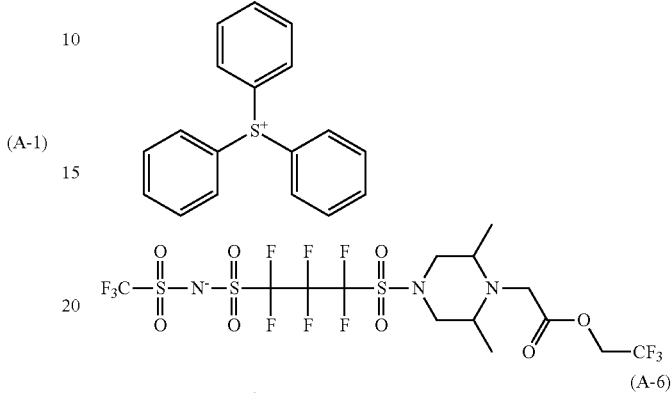

(A-7)
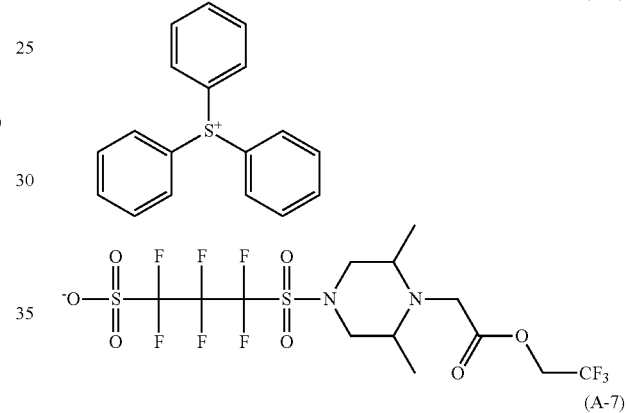

(A-8)
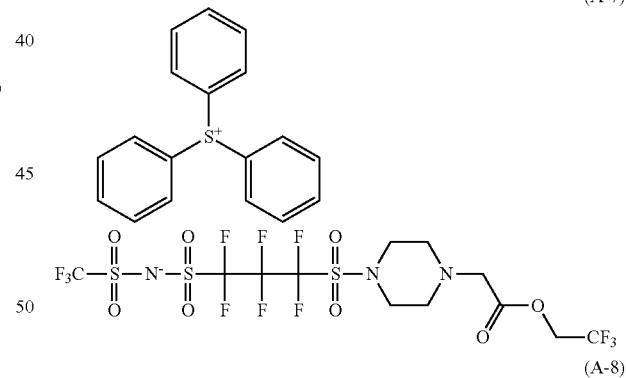

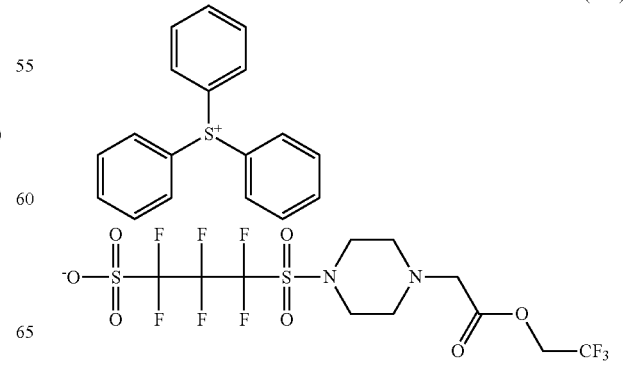

(A-9) 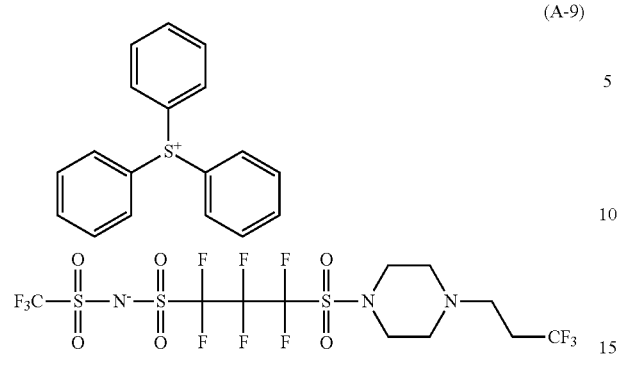
[Chem. 13-2]
(A-10) 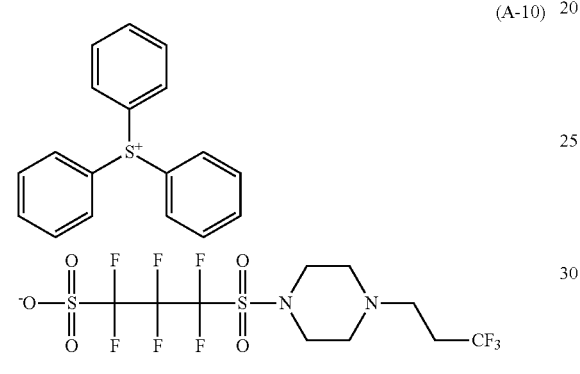
(A-11) 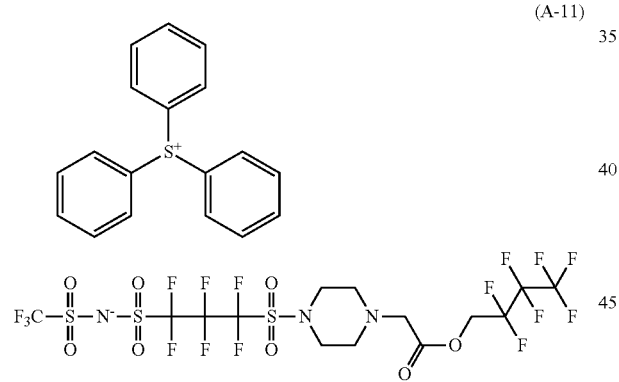
(A-12) 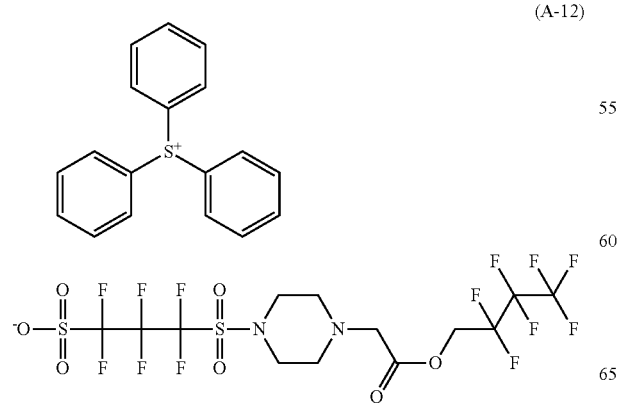
(A-13) 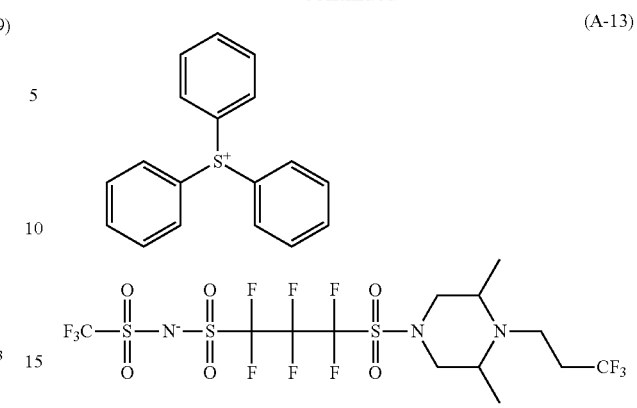
(A-14) 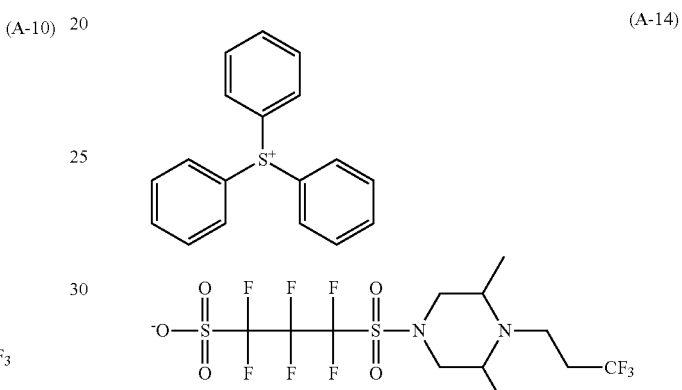
(A-15) 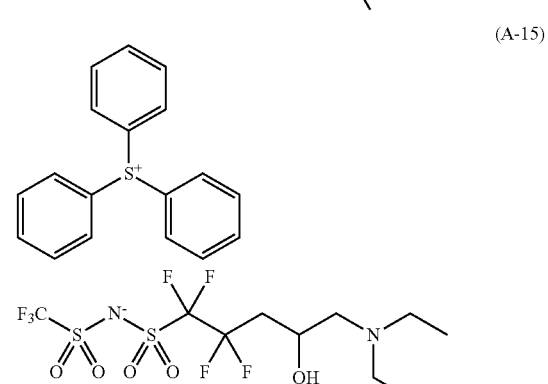
(A-16) 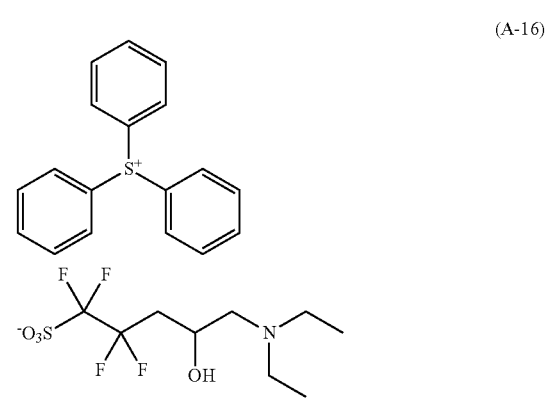

(A-17)
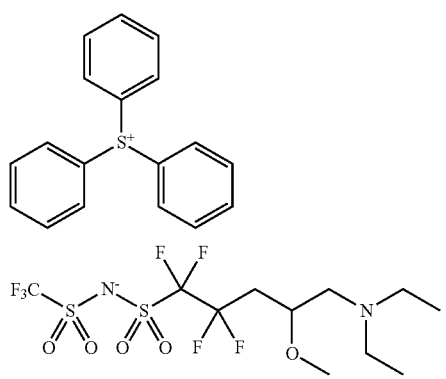
(A-18)
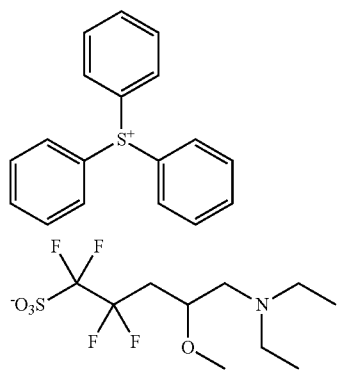
[Chem. 13-3]
(A-19)
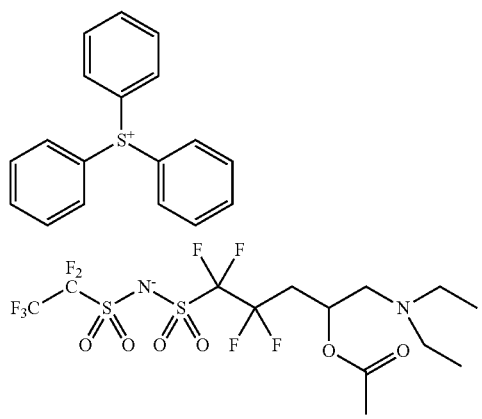
(A-20)
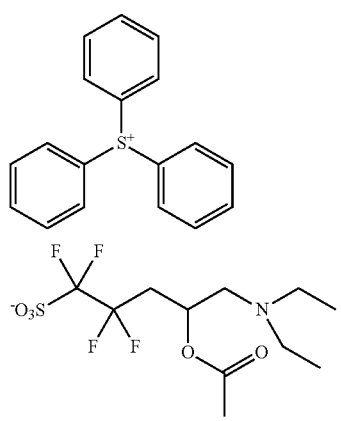
(A-21)
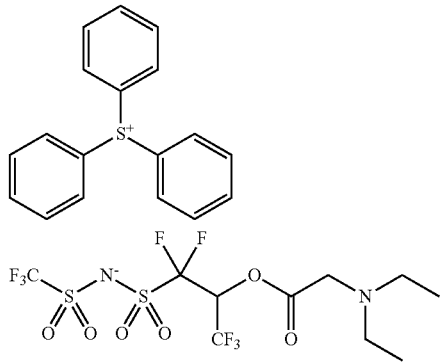
(A-22)
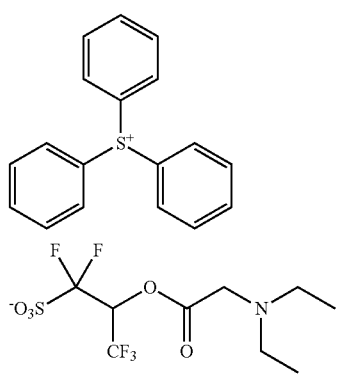
(A-23)
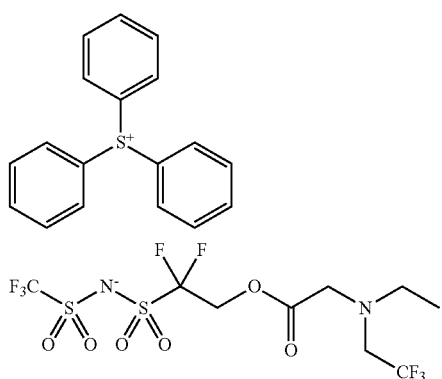
(A-24)
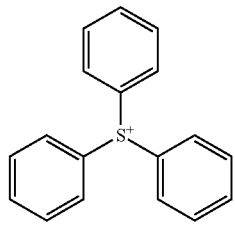
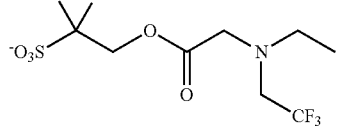

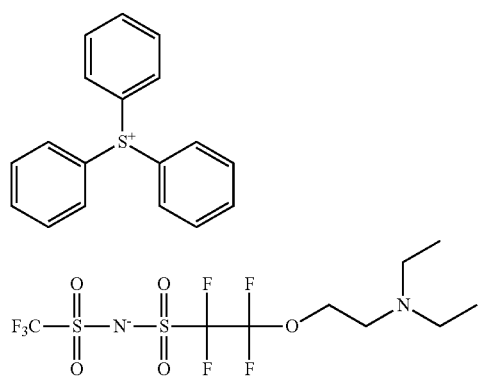
(A-25)
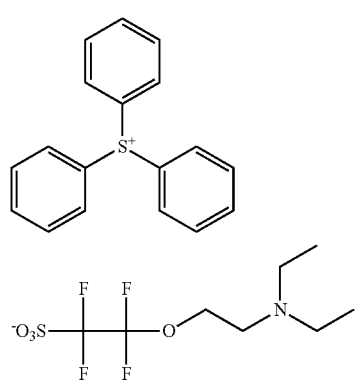
(A-26)
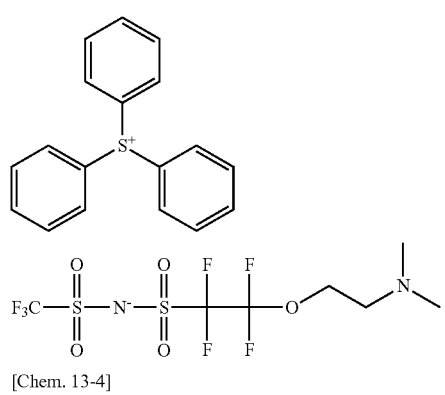
(A-27)
[Chem. 13-4]
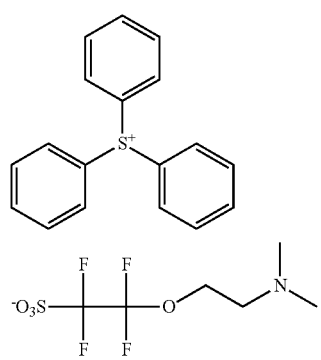
(A-28)
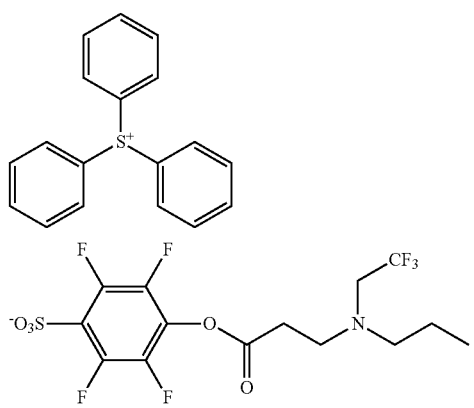
(A-29)
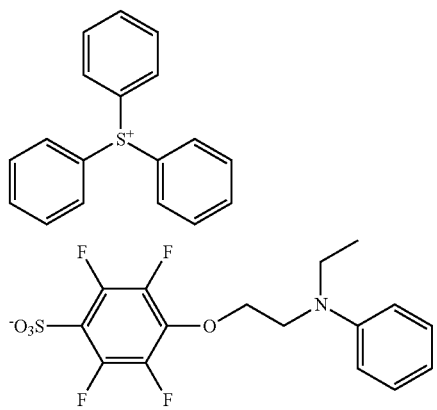
(A-30)
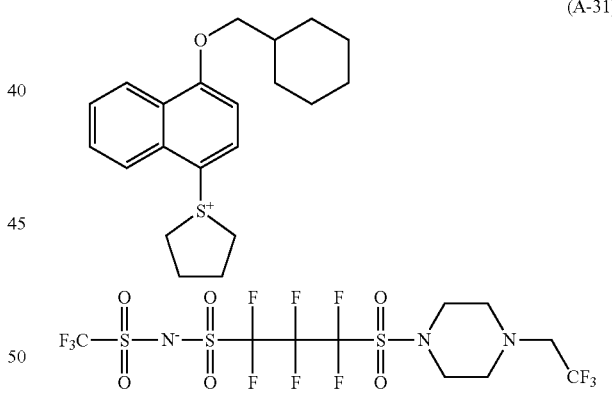
(A-31)
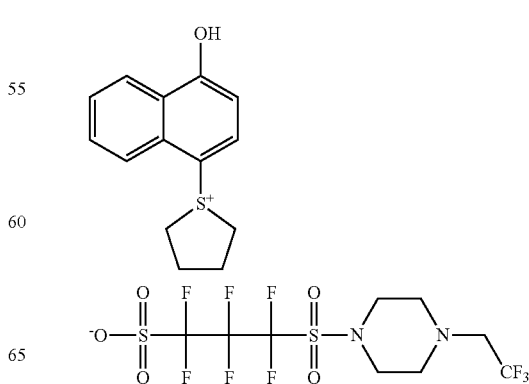
(A-32)

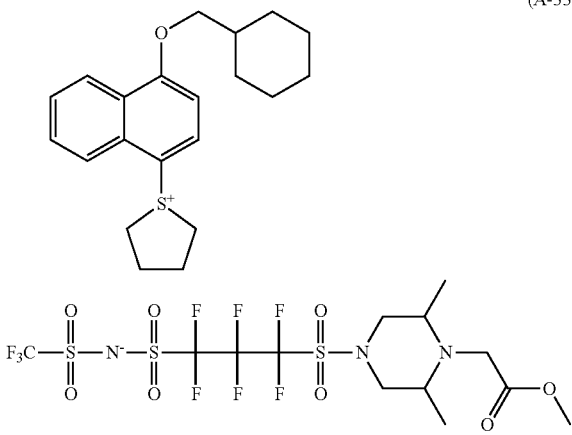
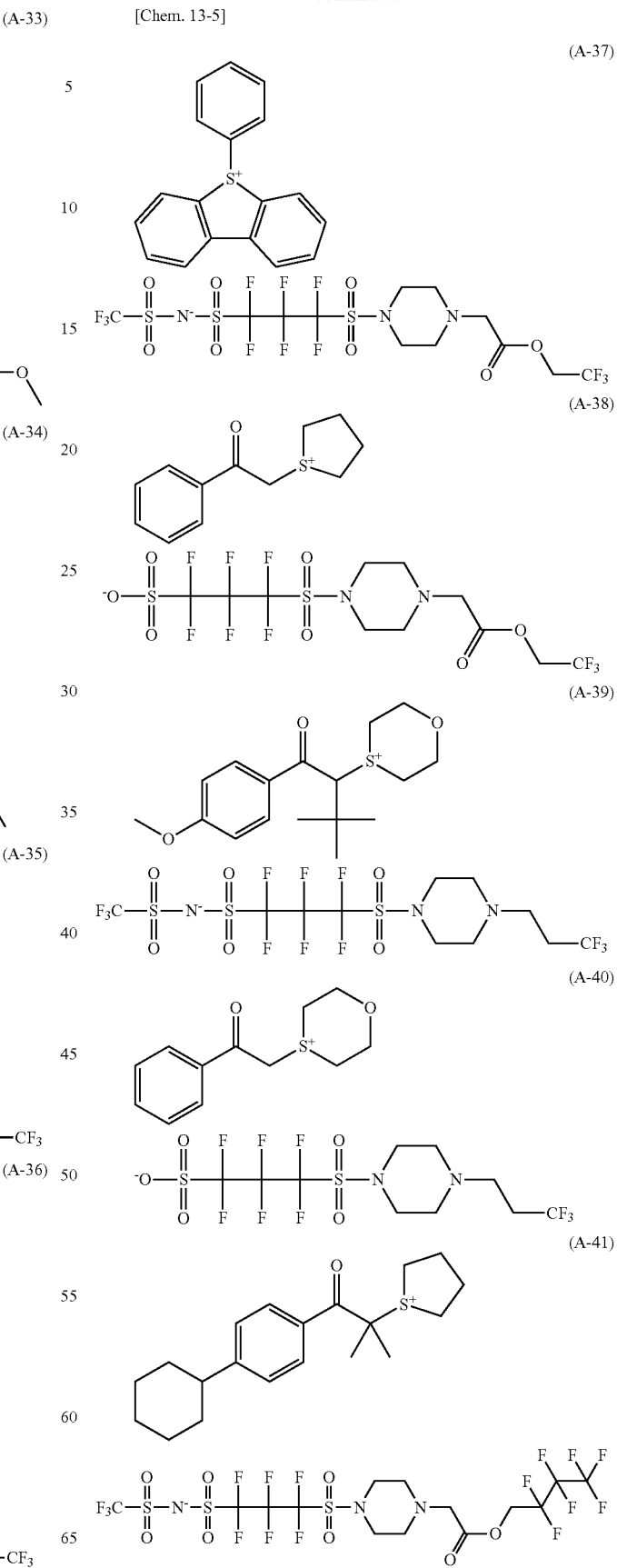

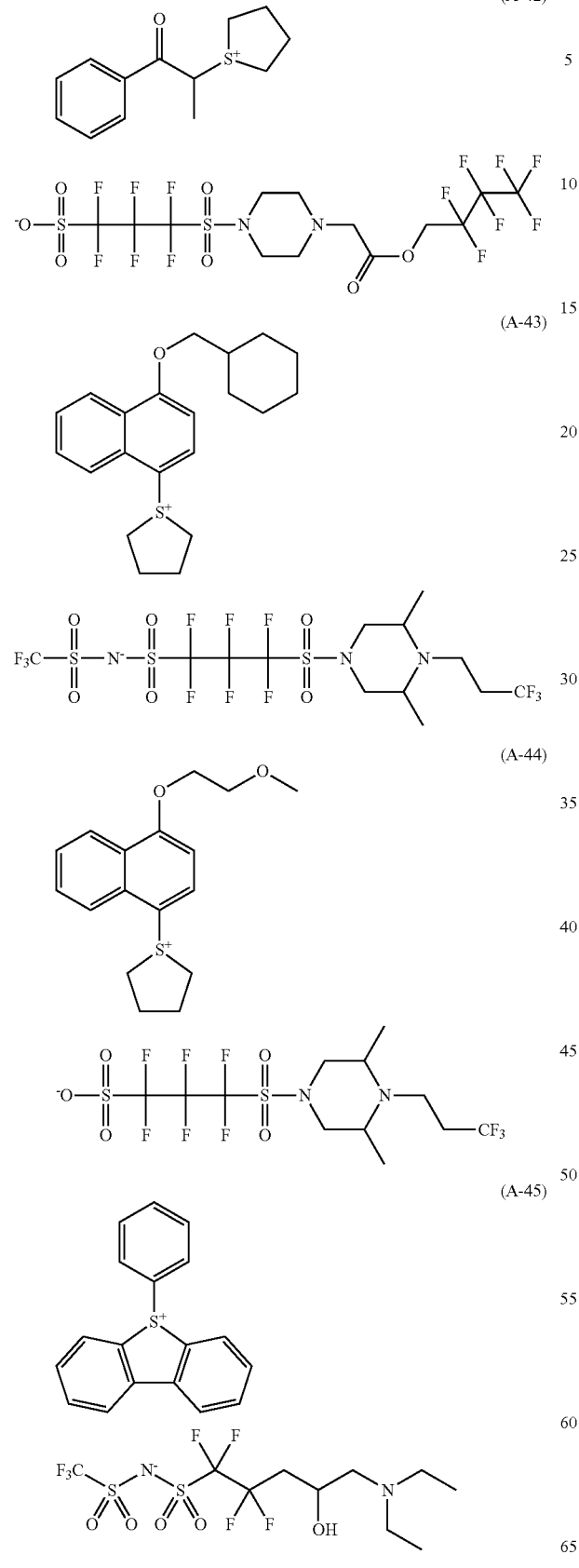
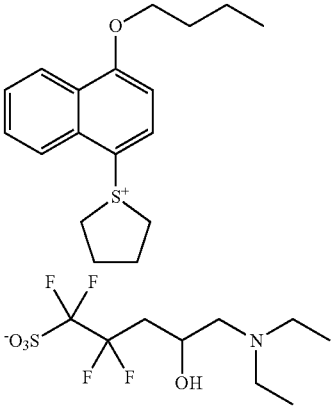
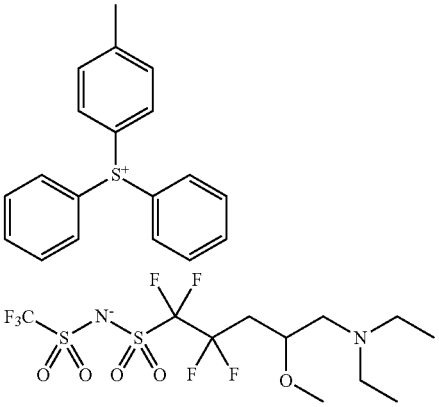
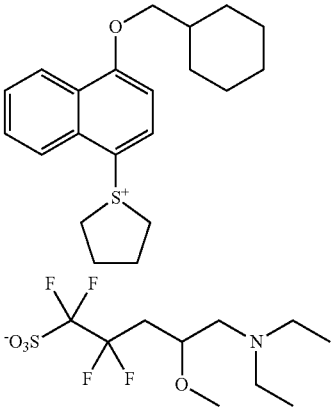
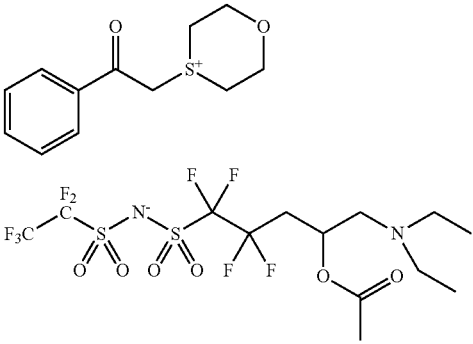

(A-50)
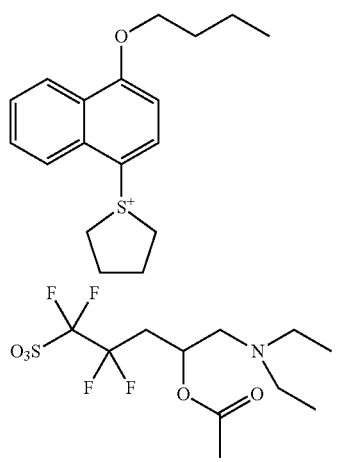
(A-51)
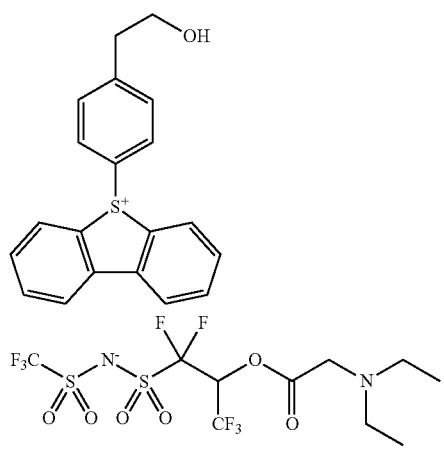
(A-52)
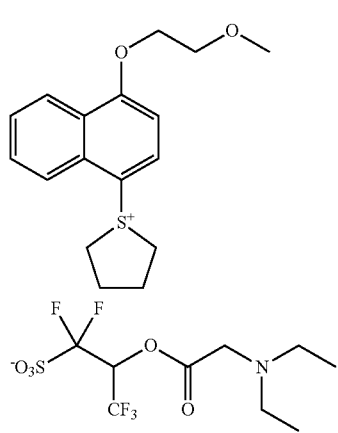
(A-53)
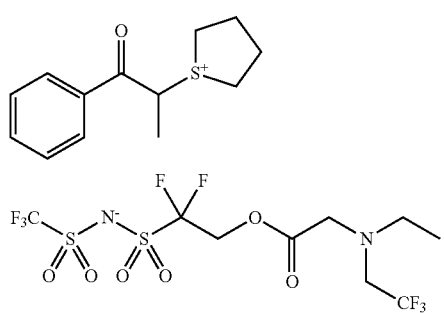
(A-54)
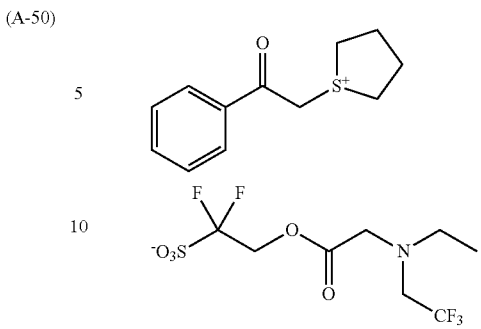
[Chem. 13-7]
(A-55)
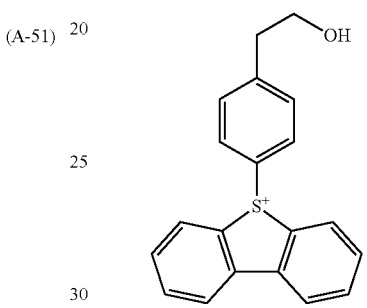
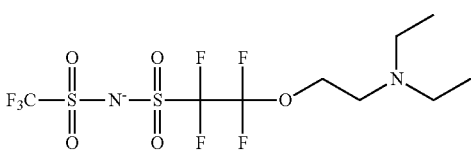
(A-56)
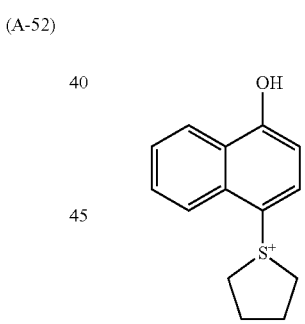
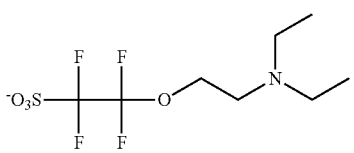
(A-57)
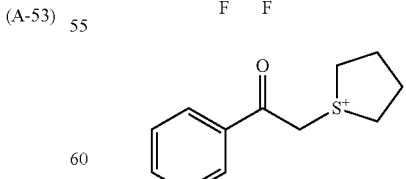
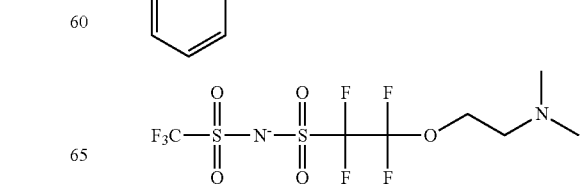

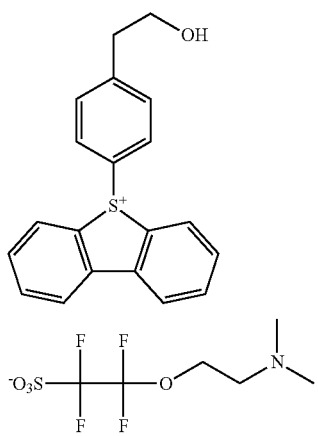
(A-58)
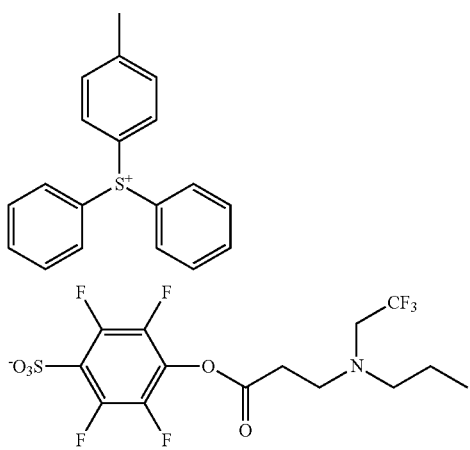
(A-59)
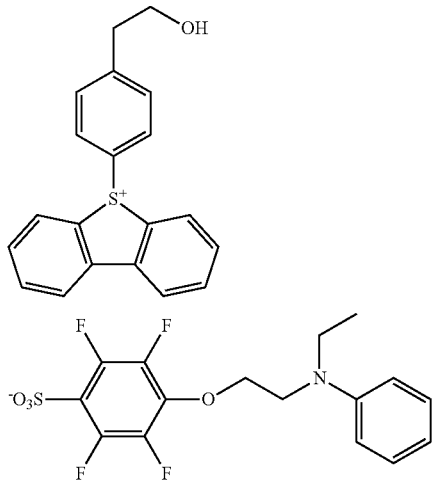
(A-60)
[Chem. 13-8]
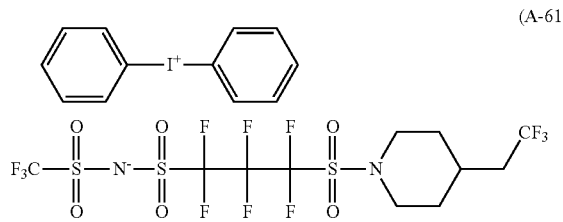
(A-61)
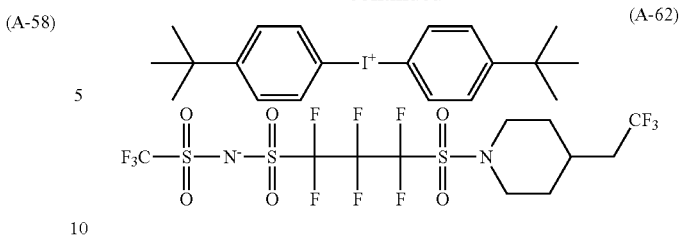
(A-62)
TABLE 1
| Compound Number | LogP Value |
|---|---|
| (A-1) | 2.07 |
| (A-2) | 2.07 |
| (A-3) | 1.26 |
| (A-4) | 1.26 |
| (A-5) | 2.24 |
| (A-6) | 2.24 |
| (A-7) | 1.60 |
| (A-8) | 1.60 |
| (A-9) | 2.70 |
| (A-10) | 2.70 |
| (A-11) | 2.81 |
| (A-12) | 2.81 |
| (A-13) | 3.34 |
| (A-14) | 3.34 |
| (A-15) | 1.34 |
| (A-16) | 1.34 |
| (A-17) | 1.70 |
| (A-18) | 1.70 |
| (A-19) | 1.57 |
| (A-20) | 1.57 |
| (A-21) | 1.75 |
| (A-22) | 1.75 |
| (A-23) | 1.43 |
| (A-24) | 1.43 |
| (A-25) | 2.11 |
| (A-26) | 2.11 |
| (A-27) | 1.43 |
| (A-28) | 1.43 |
| (A-29) | 1.58 |
| (A-30) | 2.19 |
| (A-31) | 2.07 |
| (A-32) | 2.07 |
| (A-33) | 1.26 |
| (A-34) | 1.26 |
| (A-35) | 2.24 |
| (A-36) | 2.24 |
| (A-37) | 1.60 |
| (A-38) | 1.60 |
| (A-39) | 2.70 |
| (A-40) | 2.70 |
| (A-41) | 2.81 |
| (A-42) | 2.81 |
| (A-43) | 3.34 |
| (A-44) | 3.34 |
| (A-45) | 1.34 |
| (A-46) | 1.34 |
| (A-47) | 1.70 |
| (A-48) | 1.70 |
| (A-49) | 1.57 |
| (A-50) | 1.57 |
| (A-51) | 1.75 |
| (A-52) | 1.75 |
| (A-53) | 1.43 |
| (A-54) | 1.43 |
| (A-55) | 2.11 |
| (A-56) | 2.11 |
| (A-57) | 1.43 |
| (A-58) | 1.43 |
| (A-59) | 1.58 |
| (A-60) | 2.19 |
| (A-61) | 2.07 |
| (A-62) | 2.07 |

[2] Resin (P) Reducing Solubility with Respect to Developer Including an Organic Solvent by Decomposing Due to Action of Acid (a) Repeating Unit Having Acid-decomposable Group The composition of the present invention contains a resin (P) increasing in polarity by decomposing due to the action of an acid and decreasing in solubility with respect to a developer including an organic solvent. The resin (P) may include a repeating unit having a group (hereinafter, also referred to as an "acid-decomposable repeating unit") decomposing by the action of an acid and generating a polar group (hereinafter, also referred to as an "acid-decomposable repeating unit") on the main chain or side chain of the repeating unit, or on both the main chain and side chain.

The acid-decomposable group preferably has a structure protected by a group decomposing and leaving the polar group due to the action of an acid.

The polar group is not particularly limited if it is a group poorly soluble or insoluble in a developer including an organic solvent; however, examples thereof include acid groups, such as a phenolic hydroxyl group, a carboxyl group, a fluorinated alcohol group, (preferably, a hexafluoroisopropanol group), a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group (a group dissociating in a 2.38 mass % tetramethylammonium hydroxide aqueous solution and used as a developer for a resist of the related art), or an alcoholic hydroxyl group.

Herein, the alcoholic hydroxyl group refers to a hydroxyl group bonded to a hydrocarbon group and a hydroxyl group other than a hydroxyl group directly bonded to an aromatic ring (phenolic hydroxyl group), but excluding an aliphatic alcohol having the α-position substituted with an electron withdrawing group such as a fluorine atom as a hydroxyl group (for example, a fluorinated alcohol group (a hexafluoroisopropanol group or the like)). As the alcoholic hydroxyl group, a hydroxyl group having a pKa of 12 to 20 is preferred.

Preferred examples of the polar group include a carboxyl group, a fluorinated alcohol group (preferably a hexafluoroisopropanol group), and a sulfonic acid group. The acid-decomposable group is preferably a group formed by substituting a group which leaves by the action of an acid for a hydrogen atom of the above-described group.

Examples of the group which leaves by the action of an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The alkyl group of $R_{36}$ to $R_{39}$, $R_{01}$, and $R_{02}$ are preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$, and $R_{02}$ may be either monocyclic or polycyclic. The monocyclic cycloalkyl group is preferably a cycloalkyl group having 3 to 8 carbon atoms, and examples thereof include a cyclopropyl group, a cyclobutyl group, a cyclopentyl group, a cyclohexyl group, and a cyclooctyl group. The polycyclic cycloalkyl group is preferably a cycloalkyl group having 6 to 20 carbon atoms, and examples thereof include an adamantyl, a norbornyl group, an isobornyl group, a camphanyl group, a dicyclopentyl group, an α-pinel group, a tricyclodecanyl group, a tetracyclododecyl group, and an androstanyl group. Further, at least one carbon atom in the cycloalkyl group may be substituted with a heteroatom such as an oxygen atom.

The aryl group of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

The aralkyl group of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

The alkenyl group of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

The ring formed by the mutual bonding of $R_{36}$ and $R_{37}$ is preferably a cycloalkyl group (monocyclic or polycyclic). The cycloalkyl group is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group. A monocyclic cycloalkyl group having 5 or 6 carbon atoms is more preferred, and a monocyclic cycloalkyl group having 5 carbon atoms is particularly preferred.

The acid-decomposable group is preferably a cumyl ester group, an enol ester group, an acetal ester group, a tertiary alkyl ester group or the like, and more preferably a tertiary alkyl ester group. A tertiary alkyl ester group is further preferable.

The repeating unit having an acid-decomposable group contained in the resin (P) is preferably a repeating unit represented by the general formula (I) below.

[Chem. 14]

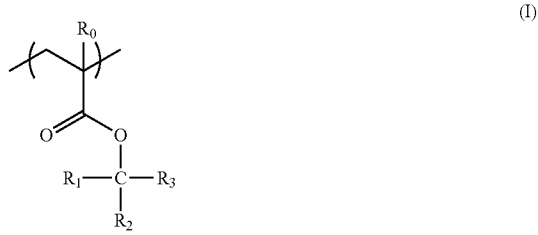

(I)

In general formula (I) above, $R_0$ represents a hydrogen atom or a linear or branched alkyl group.

$R_1$ to $R_3$ each independently represent a linear or branched alkyl group or a monocyclic or polycyclic cycloalkyl group.

Two of $R_1$ to $R_3$ may bond to form a monocyclic or polycyclic cycloalkyl group.

Regarding $R_0$, the linear or branched alkyl group may have a substituent, and is preferably a linear or branched alkyl group with 1 to 4 carbon atoms. Examples thereof include a methyl group, and ethyl group, an n-propyl group, an isopropyl group, an n-butyl group, an isobutyl group or a t-butyl group. Examples of the substituent include a hydroxyl group or a halogen atom (for example, a fluorine atom).

$R_0$ is preferably a hydrogen atom, a methyl group, trifluoromethyl group or a hydroxymethyl group.

The alkyl group of $R_1$ to $R_3$ is preferably an alkyl group having 1 to 4 carbon atoms, such as a methyl group, an ethyl group, an n-propyl group, an isopropyl group, an n-butyl group, an isobutyl group, and a t-butyl group.

The cycloalkyl group of $R_1$ to $R_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

The cycloalkyl group formed by the bonding of two of $R_1$ to $R_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group. A monocyclic cycloalkyl group having 5 or 6 carbon atoms is particularly preferred.

Examples of one preferable embodiment include $R_1$ being a methyl group or an ethyl group, and $R_2$ and $R_3$ bonding to form the above-described cycloalkyl group.

Each group above may have a substituent, examples of the substituent include, for example, a hydroxyl group, a halogen atom (for example, a fluorine atom), an alkyl (1 to 4 carbon atoms), a cycloalkyl group (3 to 8 carbon atoms), an alkoxy group (1 to 4 carbon atoms), a carboxyl group, an alkoxycarbonyl group (2 to 6 carbon atoms). The substituent preferably has 8 or fewer carbon atoms.

A particularly preferable embodiment of the repeating group represented by the general formula (I) is an embodiment in which $R_1$, $R_2$ and $R_3$ each independently represent a linear or branched alkyl group.

In the embodiment, as the linear or branched alkyl group for $R_1$, $R_2$, and $R_3$, an alkyl group having 1 to 4 carbon atoms is preferred, and examples thereof include a methyl group, an ethyl group, an n-propyl group, an isopropyl group, an n-butyl group, an isobutyl group, and a tert-butyl group.

As $R_1$, a methyl group, an ethyl group, an n-propyl group, and an n-butyl group are preferred, a methyl group and an ethyl group are more preferred, and a methyl group is particularly preferred.

As $R_2$, a methyl group, an ethyl group, an n-propyl group, an isopropyl group, and an n-butyl group are preferred, a methyl group and an ethyl group are more preferred, and a methyl group is particularly preferred.

As $R_3$, a methyl group, an ethyl group, an n-propyl group, an isopropyl group, an n-butyl group, an isobutyl group, and a tert-butyl group are preferred, a methyl group, an ethyl group, an isopropyl group, and an isobutyl group are more preferred, and a methyl group, an ethyl group, and an isopropyl group are particularly preferred.

Specific examples of the repeating units having an acid-decomposable group are shown below; however, the present invention is not limited thereto.

In the specific examples, Rx represents a hydrogen atom, $CH_3$, $CF_3$, or $CH_2OH$. Rxa and Rxb each represent an alkyl group having 1 to 4 carbon atoms. Z represents a substituent and when a plurality of Z's are present, they may be the same as or different from each other. p represents 0 or a positive integer. Specific examples and preferred examples of Z are the same as specific examples and preferred examples of the substituent that each of $R_1$ to $R_3$ and the like may have.

[Chem. 15]

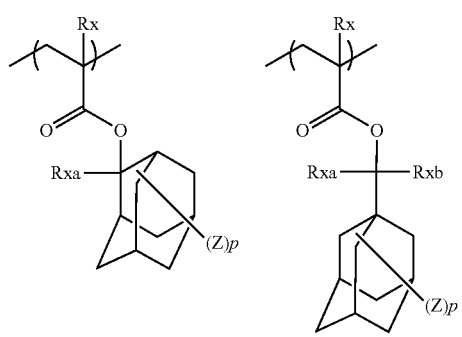

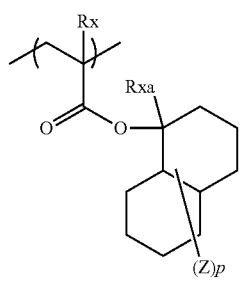

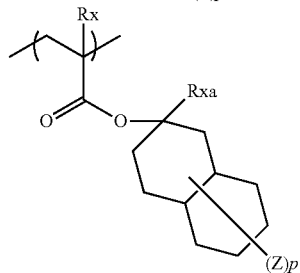

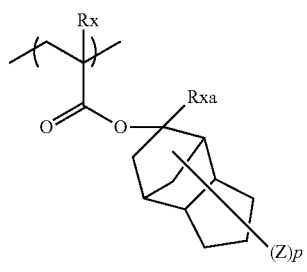

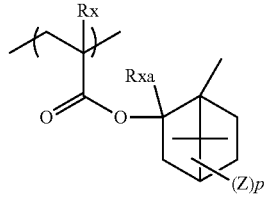

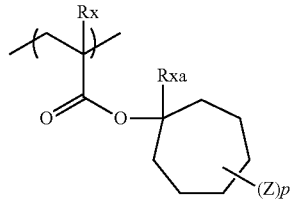

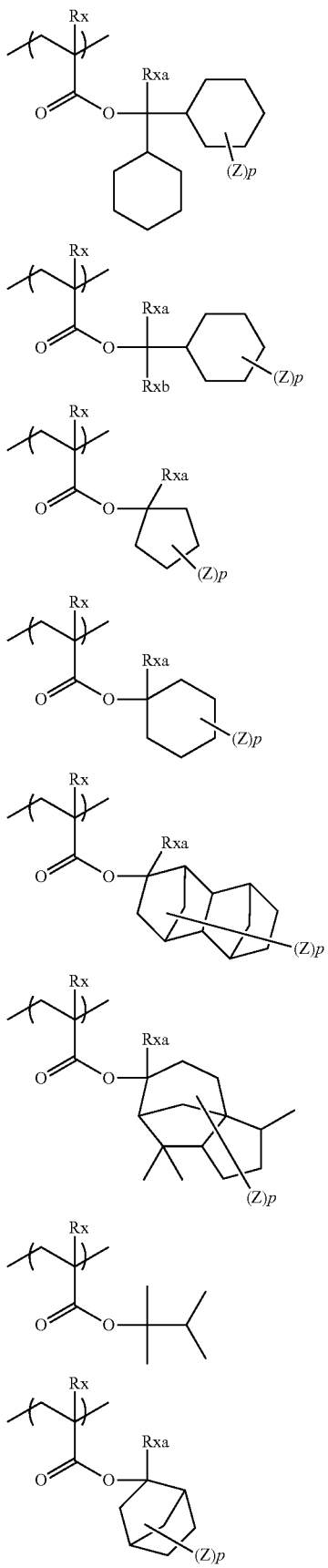

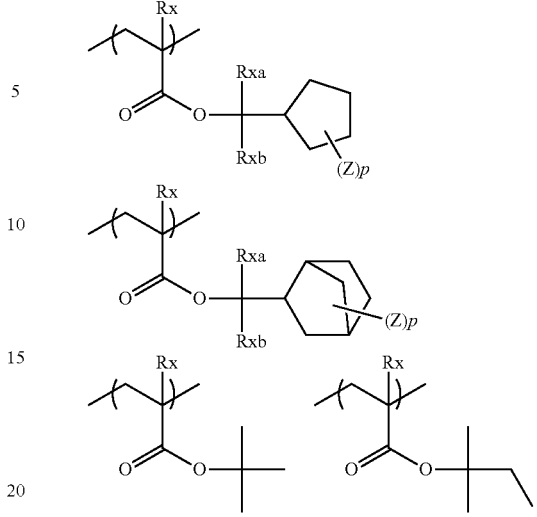

The repeating unit having an acid-decomposable group in the resin (P) may be one type or may be two or more types used together.

The resin (P) preferably has 50 mol % or higher with respect to all repeating units in the resin of a repeating unit having an acid-decomposable group (in a case of containing plural types, the total thereof) for which the molecular weight (in a case where plural types of leaving product are generated, the weighted average value of the molecular weight due to the mol fraction (hereinafter, also referred to as mol average value)) of a leaving product generated by decomposition of an acid-decomposable group is 140 or less. In this way, in the case of forming a negative type image, the exposed portion remains as a pattern, and therefore, reduction of the film thickness in the pattern portion can be prevented by reducing the molecular weight of the leaving product.

In the invention, the "leaving product that is generated by the decomposition of the acid-decomposable group" refers to a product decomposed and left by the action of an acid corresponding to a group that decomposes by the action of an acid, and leaves. For example, in a case of a repeating unit (α) (upper leftmost repeating unit in the examples listed below) listed below, this refers to an alkene ($H_2C=C(CH_3)_2$) generated by the t-butyl position decomposing.

In the present invention, the molecular weight (in the case of plural types of leaving product being generated, mol average value) of leaving product generated by decomposition of an acid-decomposable group is preferably 100 or lower from the viewpoint of preventing reduction of the film thickness of the pattern portion.

In addition, the molecular weight (in the case of plural types of leaving product being generated, mol average value) of leaving product generated by decomposition of an acid-decomposable group is not particularly limited in terms of a lower limit; however, from the viewpoint of the acid-decomposable group exhibiting its function, 45 or higher is preferably, and 55 or higher is more preferable.

The content rate as a total of the repeating units having an acid-decomposable group is preferably 20 mol % or higher with respect to all repeating units in the resin (P), more preferably 30 mol % or higher, still more preferably 45 mol % or higher, and particularly preferably 50 mol % or higher.

In addition, the content rate as a total of the repeating units having an acid-decomposable group is preferably 90 mol % or lower with respect to all repeating units in the resin (P), and more preferably 85% or lower.

(b) Repeating Unit Having Lactone Structure or Sultone Structure

The resin (P) may further contain a repeating unit having a lactone structure or sultone structure.

A lactone structure or a sultone structure may be used as long as it has a lactone structure or a sultone structure, but a 5- to 7-membered ring lactone structure is preferred, and a 5- to 7-membered ring lactone structure to which another ring structure is fused to form a bicyclo structure or a spiro structure is preferred. It is more preferred to include a repeating unit having a lactone structure represented by any of the following general formula (LC1-1) to (LC1-17) and a sultone structure represented by any of the following general formula (SL1-1) to (SL1-3). Further, the lactone structure or the sultone structure may be bonded directly to the main chain. Preferably lactone structures are (LC1-1), (LC1-4), (LC1-5), (LC1-6), (LC1-13), (LC1-14), and (LC1-17), and the lactone structure (LC1-4) is particularly preferable. By using such a specified lactone structure, LWR and development defects are improved.

[Chem. 16]

LC1-1

LC1-2

LC1-3

LC1-4

LC1-5

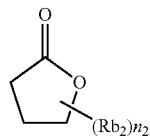
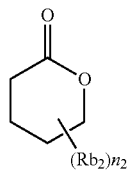
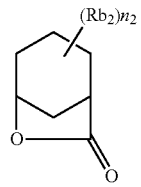
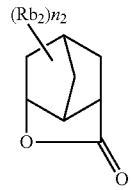
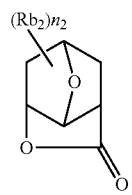

-continued

LC1-6

LC1-7

LC1-8

LC1-9

LC1-10

LC1-11

LC1-12

LC1-13

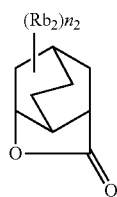
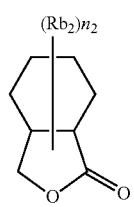
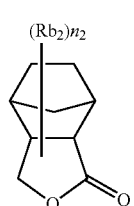
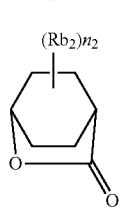
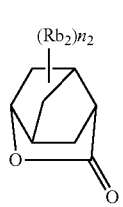
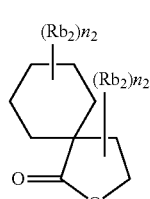
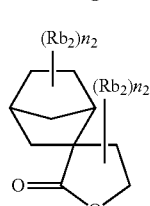
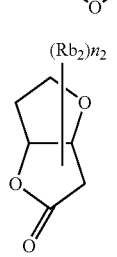

LC1-14 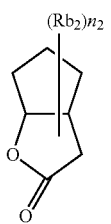

LC1-15 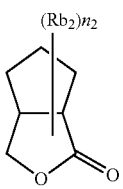

LC1-16 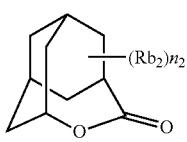

LC1-17 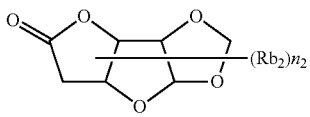

LC1-18 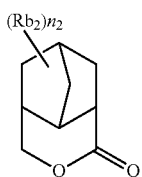

LC1-19 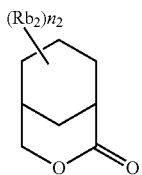

LC1-20 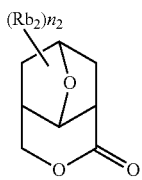

LC1-21 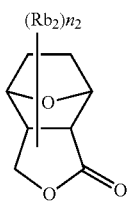

SL1-1 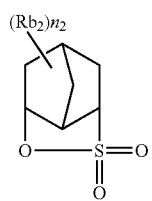

SL1-2 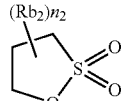

SL1-3 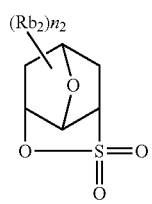

The lactone structure or sultone structure moiety may or may not have a substituent ($R_{b2}$). Preferred examples of the substituent ($R_{b2}$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group and an acid-decomposable group are more preferred. $n_2$ represents an integer of 0 to 4. When $n_2$ is 2 or more, plurally present substituents ($Rb_2$) may be the same or may be different. In addition, plurally present substituents ($Rb_2$) may be bonded to each other to form a ring.

The repeating unit having a lactone structure or a sultone structure usually has an optical isomer, but any optical isomer may be used. One optical isomer may be used independently or a mixture of a plurality of optical isomers may be used. In the case of mainly using one optical isomer, the optical purity (ee) thereof is preferably 90% or more, and more preferably 95% or more.

As the repeating unit having a lactone structure or a sultone structure, a repeating unit represented by the following general formula (AII) is preferred.

[Chem. 17]

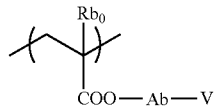

(AII)

In the general formula (AII), $Rb_0$ represents a hydrogen atom, a halogen atom, or an alkyl group (having 1 to 4 carbon atoms), which may have a substituent.

Preferred examples of the substituent which the alkyl group of $Rb_0$ may have include a hydroxyl group and a halogen atom. Examples of the halogen atom of $Rb_0$ include a fluorine atom, a chlorine atom, a bromine atom, and an iodine atom. $Rb_0$ is preferably a hydrogen atom, a methyl group, a hydroxymethyl group, or a trifluoromethyl group, and particularly preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combination thereof. Ab is preferably a single bond or a divalent linking group represented by -$Ab_1$-$CO_2$—.

$Ab_1$ is a linear or branched alkylene group or a monocyclic or polycyclic cycloalkylene group, and is preferably a methylene group, an ethylene group, a cyclohexylene group, an adamantylene group, or a norbornylene group.

V represents a group having a lactone structure or a sultone structure. Specifically, for example, V represents a group having a structure represented by any of general formula (LC-1-1) to (LC1-17) and (SL1-1) to (SL1-3) above.

In a case where the resin (P) contains a repeating unit having a lactone structure or a sultone structure, the content of the repeating unit having a lactone structure or a sultone structure is preferably in a range from 0.5 to 80 mol % with respect to all repeating units in the resin (P), more preferably in a range from 1 to 65 mol %, still more preferably in a range from 5 to 60 mol %, particularly preferably in a range from 3 to 50 mol %, and most preferably in a range from 10 to 50 mol %.

The repeating unit having a lactone structure or sultone structure may be one type, or two or more types may be combined together and used.

Below, specific examples of the repeating unit having a lactone structure or sultone structure are shown; however, the present invention is not limited thereto.

[Chem. 18-1]

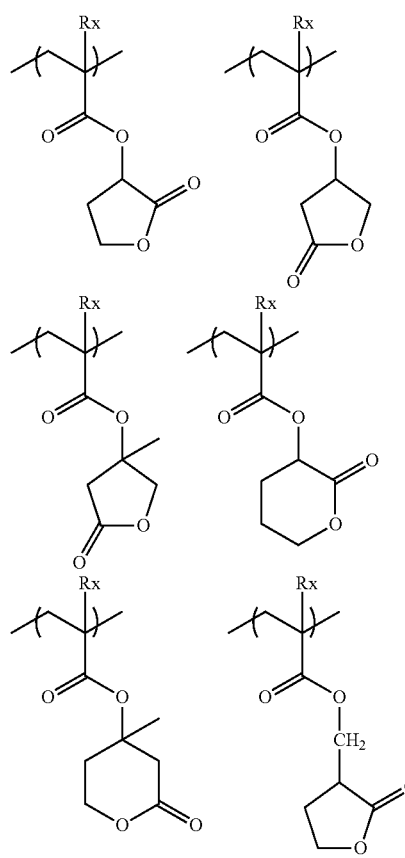

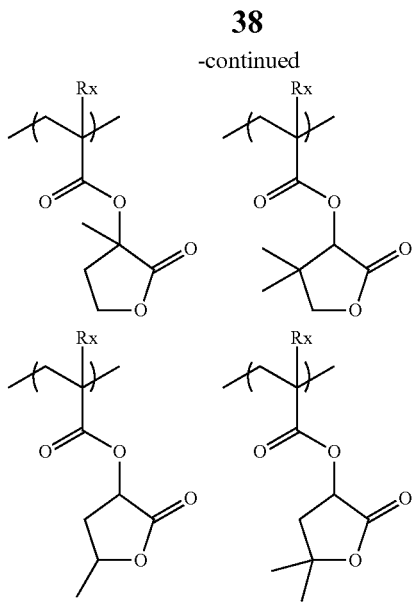

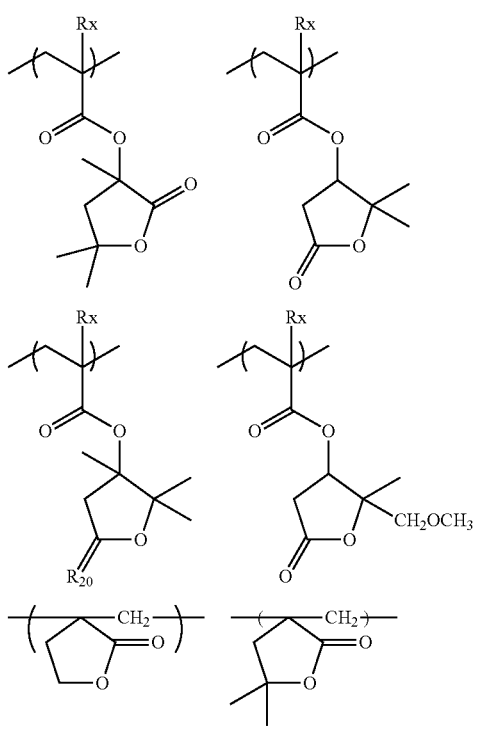

(in the formulae, $R_x$ represents H, $CH_3$, $CH_2OH$, or $CF_3$)

[Chem. 18-2]

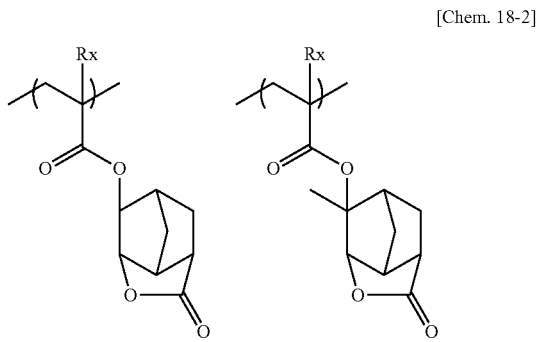

-continued
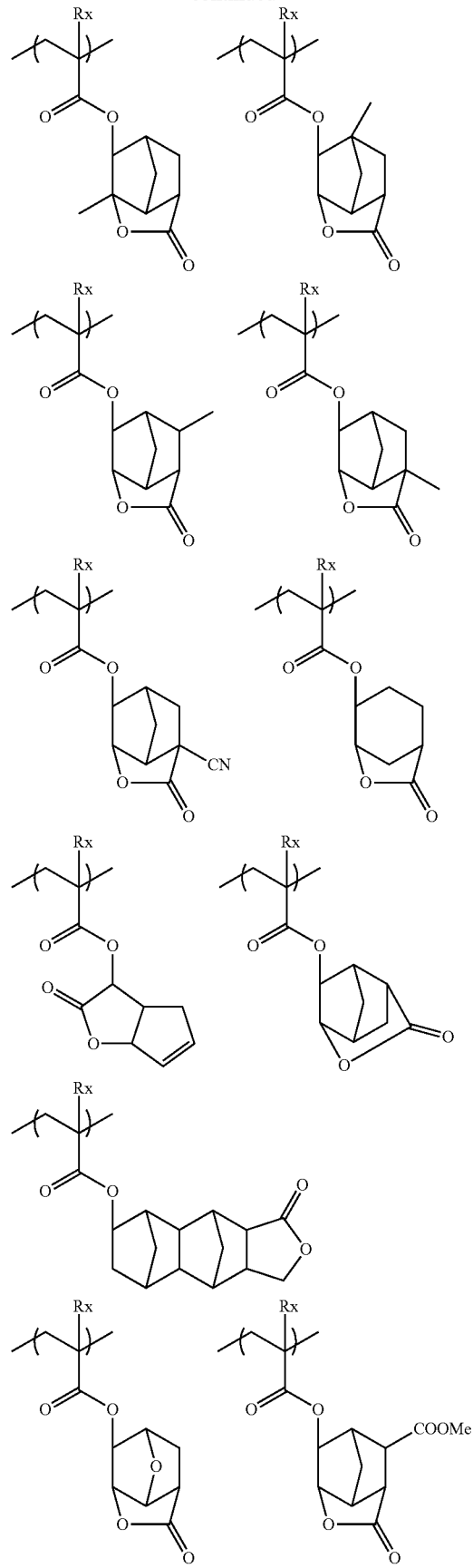
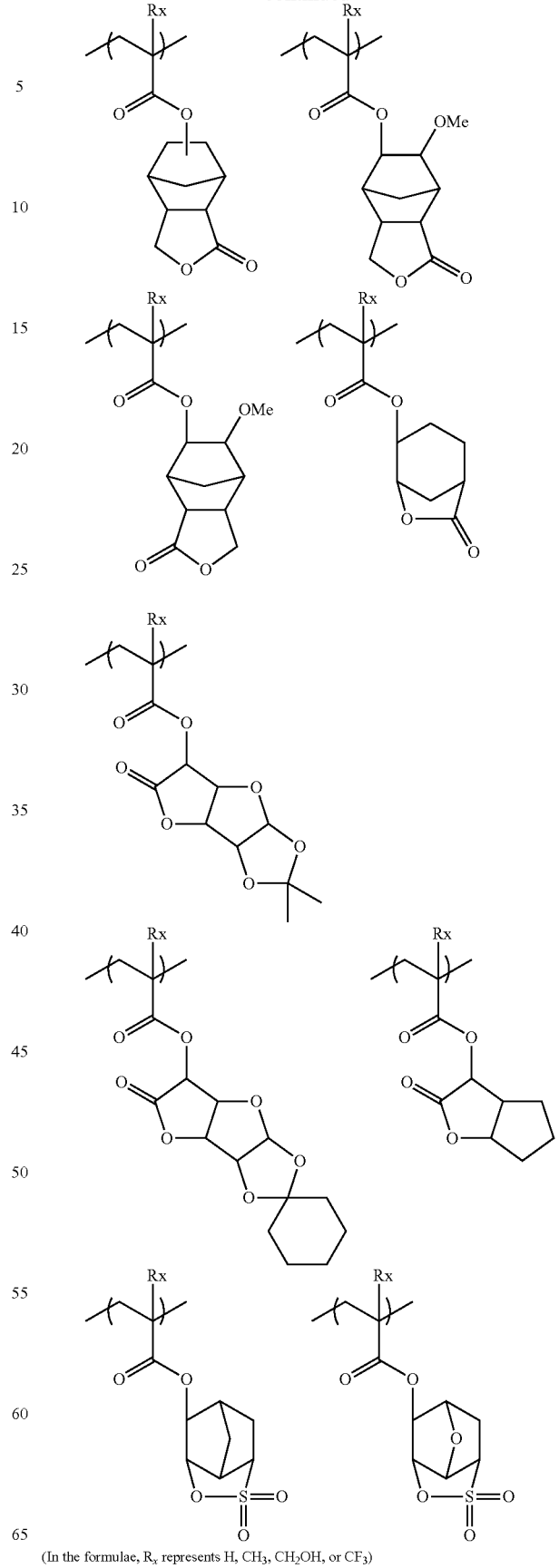
(In the formulae, R$_x$ represents H, CH$_3$, CH$_2$OH, or CF$_3$)

[Chem. 18-3]
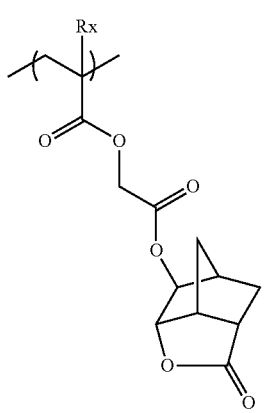
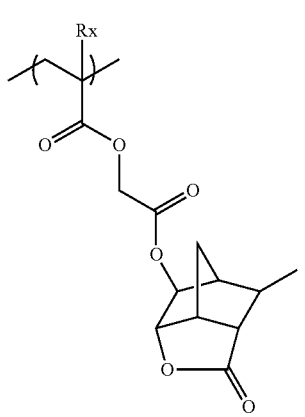
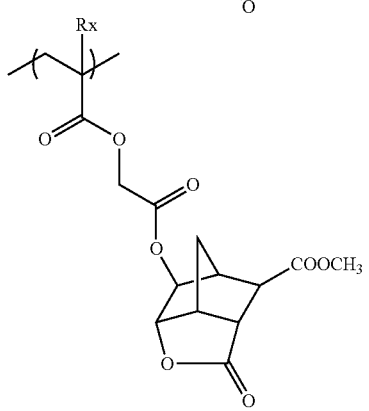
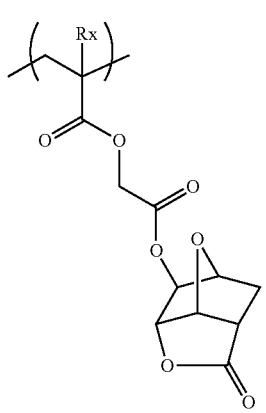
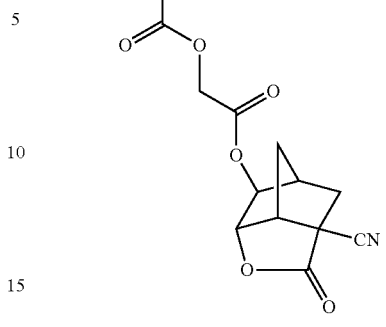
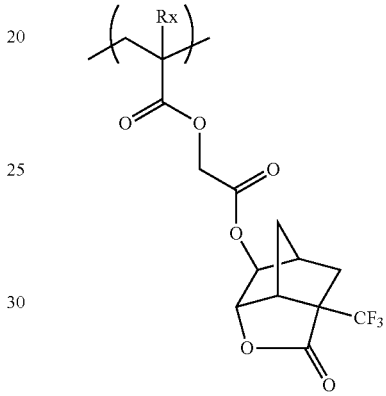
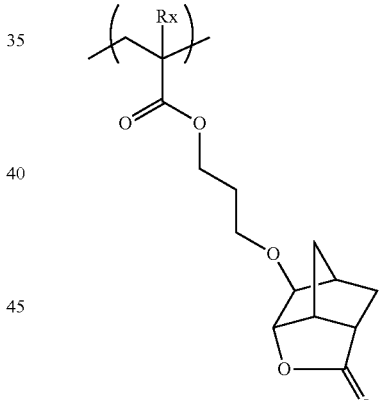
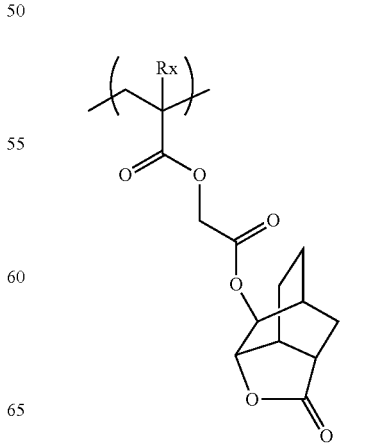

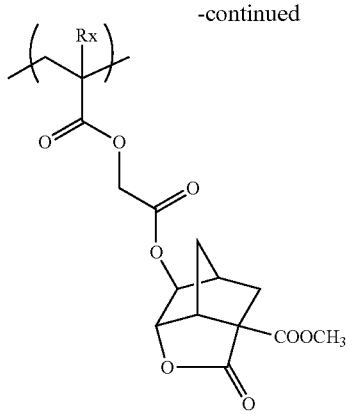

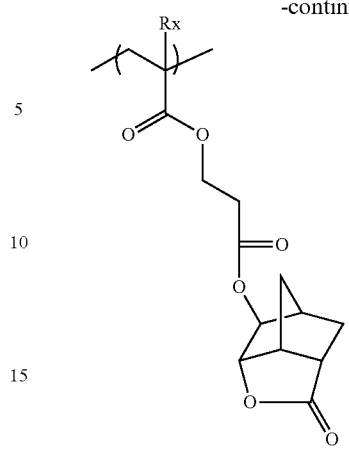

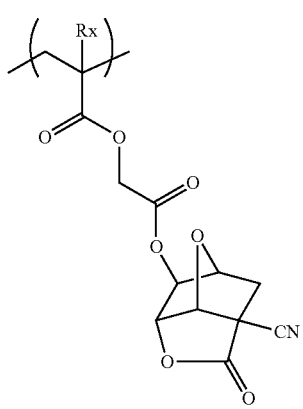

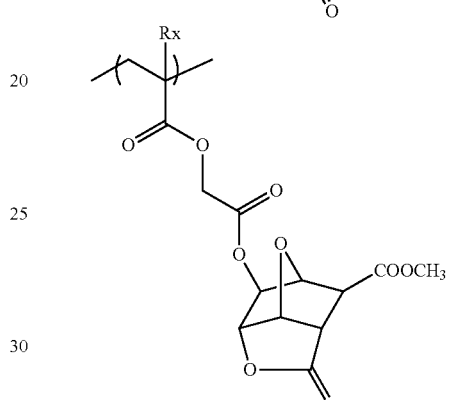

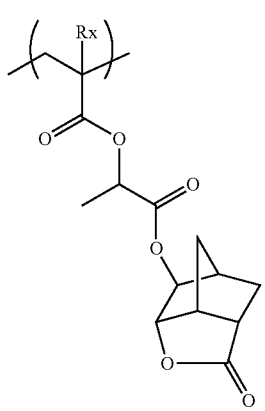

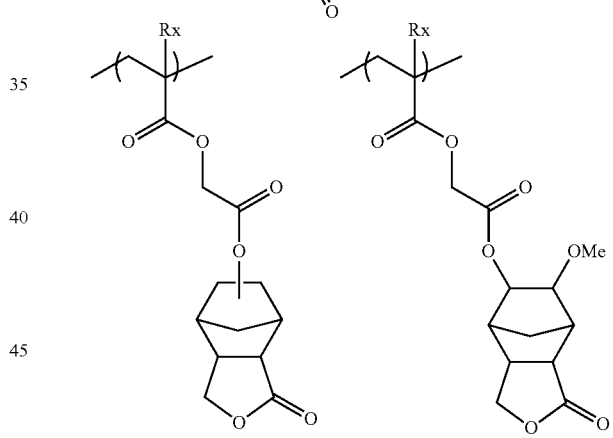

(In the formulae, $R_x$ represents H, $CH_3$, $CH_2OH$, or $CF_3$)

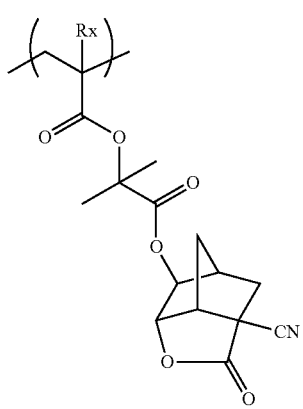

(c) Repeating Unit Having Hydroxyl Group or Cyano Group

The resin (P) may have a repeating unit having a hydroxyl group or a cyano group. In so doing, adhesion to a substrate and affinity for a developer are improved. The repeating unit having a hydroxyl group or a cyano group is preferably a repeating unit having an alicyclic hydrocarbon structure substituted with a hydroxyl group or a cyano group and preferably has no acid-decomposable group.

In addition, the repeating unit having an alicyclic hydrocarbon structure substituted with a hydroxyl group or cyano group is preferably different from the repeating unit represented by general formula (AII) above.

As the alicyclic hydrocarbon structure in the alicyclic hydrocarbon structure which is substituted with a hydroxyl group or a cyano group, an adamantyl group, a diamantyl group, or a norbornane group are preferable. A more preferable example is a repeating unit represented by the general formula (AIIa) to (AIIc) below.

[Chem. 19]

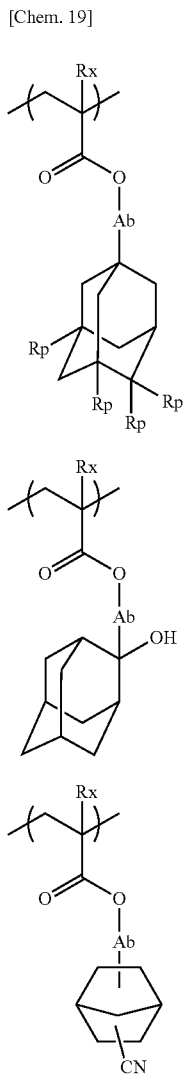

(AIIa)

(AIIb)

(AIIc)

In general formula (AIIa) to (AIIc),
Rx represents H, $CH_3$, $CH_2OH$, or $CF_3$.
Ab has the same meaning as Ab in the general formula (AII) above.
Rp represents any of a hydrogen atom, a hydroxyl group or a hydroxyalkyl group.
However, at least one Rp is a hydroxyl group or a hydroxyalkyl group.

The resin (P) may contain a repeating unit having a hydroxyl group or a cyano group, or may not contain such a group; however, in a case where the resin (P) contains a repeating unit having a hydroxyl group or a cyano group, the content of the repeating unit having a hydroxyl group or a cyano group is preferably 1 mol % to 40 mol % with respect to all the repeating units in the resin (P), more preferably 3 mol % to 30 mol %, still more preferably 5 mol % to 25 mol %.

Specific examples of the repeating unit having a hydroxyl group or a cyano group will be shown below, but the present invention is not limited thereto.

[Chem. 20-1]

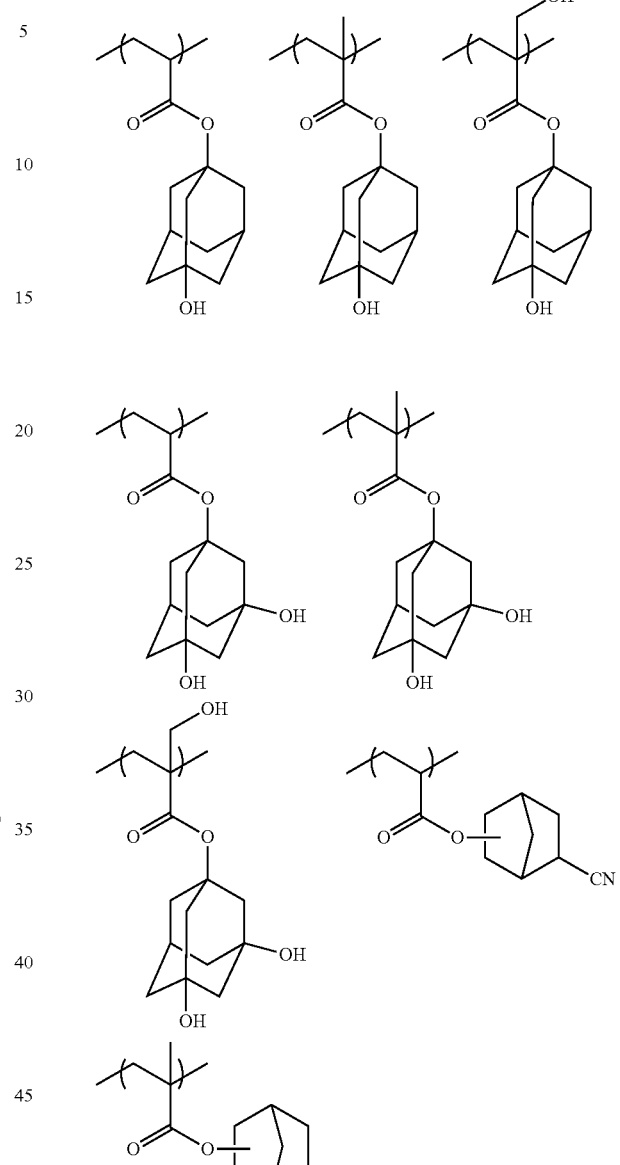

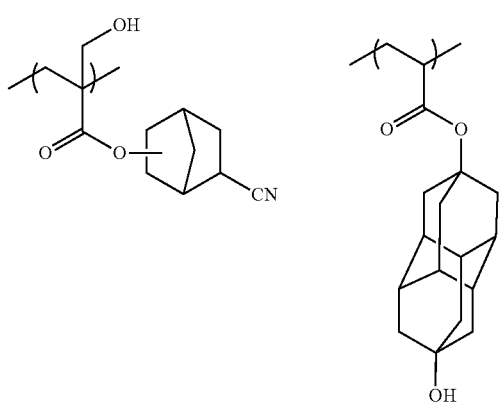

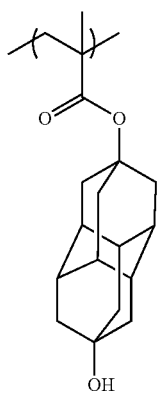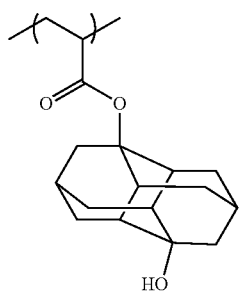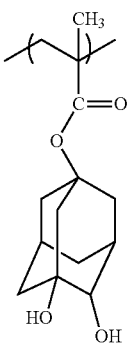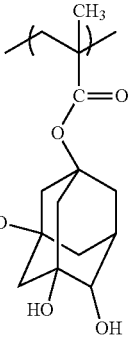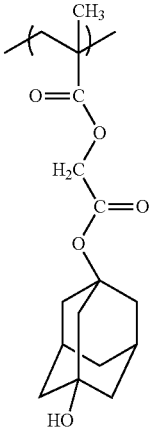
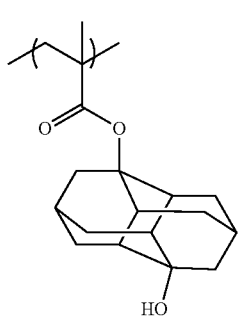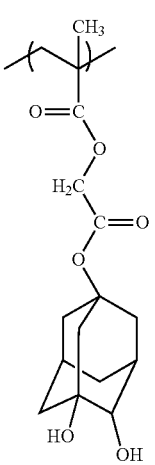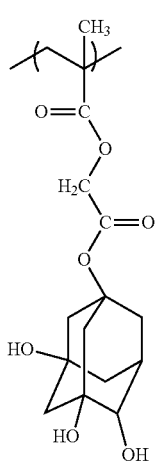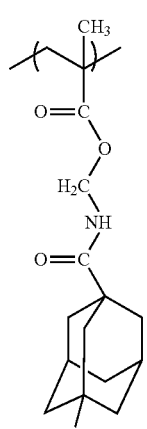
[Chem. 20-2]
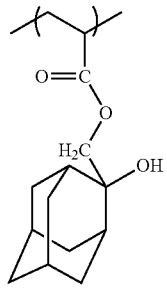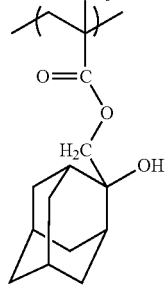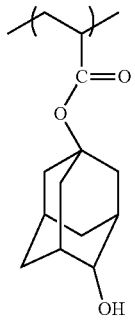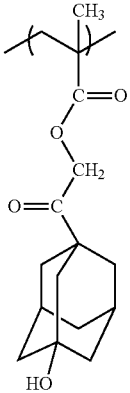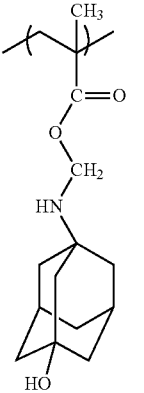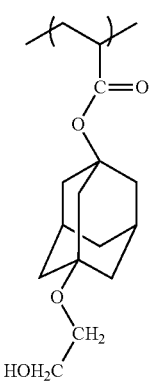
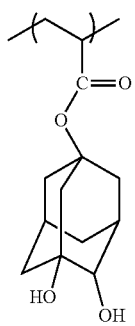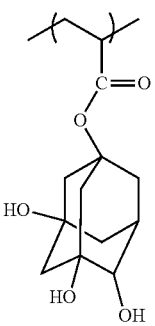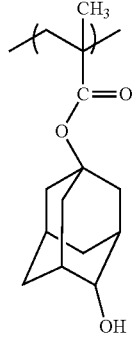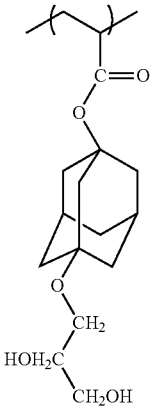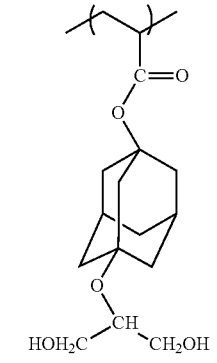

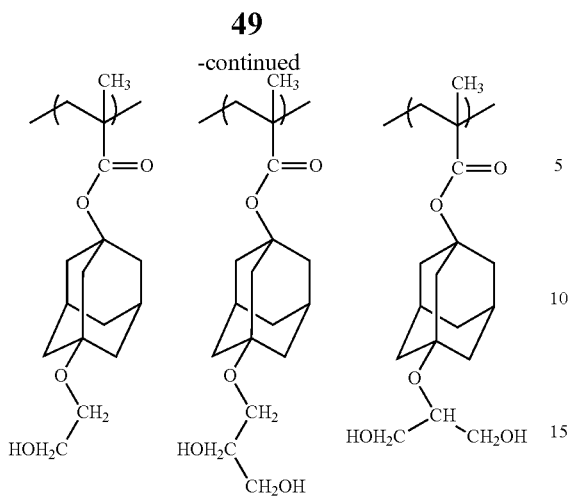

(d) Repeating Unit Having an Acid Group

The resin (P) may have a repeating unit having an acid group. Examples of the acid group include a carboxyl group, a sulfonamide group, a sulfonylimide group, a bissulfonylimide group, and an aliphatic alcohol substituted with an electron withdrawing group at the α-position (for example, a hexafluoroisopropanol group), and containing repeating units having a carboxyl group is more preferred. By virtue of containing repeating units having an acid group, the resolution increases in the usage of forming contact holes. As for the repeating units having an acid group, all of a repeating unit in which an acid group is directly bonded to the main chain of the resin, such as a repeating unit of an acrylic acid or methacrylic acid, a repeating unit in which an acid group is bonded to the main chain of the resin through a linking group, and a repeating unit in which an acid group is introduced into the polymer chain terminal using an acid group-containing polymerization initiator or chain transfer agent during the polymerization, are preferred. The linking group may have a monocyclic or polycyclic hydrocarbon structure. In particular, a repeating unit of an acrylic acid or a methacrylic acid is preferred.

The resin (P) may or may not contain a repeating unit having an acid group; however, in the case where such a group is contained, the content rate of the repeating unit having an acid group is preferably 15 mol % or lower with respect to all repeating units in the resin (P), and more preferably 10 mol % or lower. In a case where the resin (P) contains a repeating unit having an acid group, the content of the repeating unit having an acid group in the resin (P) is ordinarily 1 mol % or higher.

Specific examples of the repeating unit having an acid group are shown below, but the invention is not limited thereto.

In the specific examples, Rx represents H, $CH_3$, $CH_2OH$, or $CF_3$.

[Chem. 21]

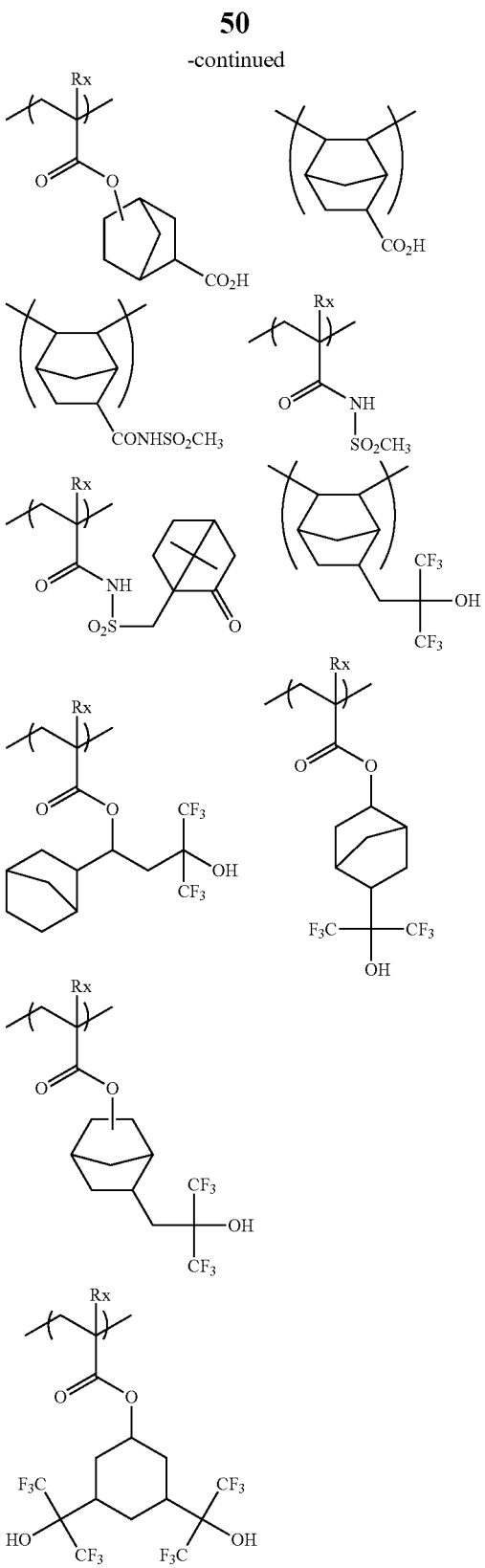

In the resin (P) used in the composition of the present invention, the molar ratio of the content of each repeating structural unit is appropriately set to control the dry etching resistance of a resist, suitability for standard developing liquid, adhesion to a substrate, resist profile, and performance that is generally required for a resist, such as resolving power, heat resistance, and sensitivity.

The type of the resin (P) in the invention may be any one of a random type, a block type, a comb type, and a star type. The resin (P) can be synthesized by, for example, radical, cationic, or anionic polymerization of unsaturated monomers corresponding to the respective structures. Further, it is also possible that polymerization be carried out using unsaturated monomers corresponding to the precursors of the respective structures, and then a polymer reaction be carried out, thereby obtaining a desired resin.

When the composition of the present invention is for ArF exposure, it is preferable that the resin (P) used in the composition of the present invention practically not contain an aromatic ring (specifically, the proportion of the repeating unit having an aromatic group in the resin is preferably 5 mol % or less, more preferably 3 mol % or less, and ideally 0 mol %; that is, not have an aromatic group), from the point of transparency to ArF light. It is preferable that the resin (P) have a monocyclic or polycyclic aliphatic hydrocarbon structure.

In a case where the composition of the present invention includes a hydrophobic resin (HR) described later, the resin (P) preferably does not contain a fluorine atom and a silicon atom, from the viewpoint of compatibility with the hydrophobic resin (HR).

The resin (P) used in the composition of the present invention is preferably a resin where all the repeating units are composed of a (meth)acrylate-based repeating unit. In this case, all the repeating units may be a methacrylate-based repeating unit, all the repeating units may be an acrylate-based repeating unit, or all the repeating units may be composed of a methacrylate-based repeating unit and an acrylate-based repeating unit, but the content of the acrylate-based repeating unit is preferably 50 mol % or less based on all the repeating units. A copolymerized polymer containing from 20 mol % to 50 mol % of an acid decomposable group-containing (meth)acrylate-based repeating unit, from 20 mol % to 50 mol % of a lactone group-containing (meth)acrylate-based repeating unit, from 5 mol % to 30 mol % of a (meth) acrylate-based repeating unit having an alicyclic hydrocarbon structure substituted with a hydroxyl group or a cyano group, and from 0 mol % to 20 mol % of other (meth)acrylate-based repeating units is also preferred.

In the case where the composition of the invention is irradiated with KrF excimer laser light, an electron beam, X-rays, or a high-energy beam at a wavelength of 50 nm or less (for example, EUV), the resin (P) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as a tertiary alkyl (meth)acrylate.

Preferred examples of the hydroxystyrene-based repeating unit having an acid-decomposable group include a repeating unit of t-butoxycarbonyloxystyrene, 1-alkoxyethoxystyrene or a tertiary alkyl (meth)acrylate. A repeating unit of a 2-alkyl-2-adamantyl(meth)acrylate or a dialkyl(1-adamantyl)methyl(meth)acrylate is more preferred.

(e) Repeating Unit (P1) Having a Cyclic Carbonate Structure

The resin (P) in the present invention may include a repeating unit represented by the general formula (A-1) below as a repeating unit (P1) having a cyclic carbonate structure.

[Chem. 22]

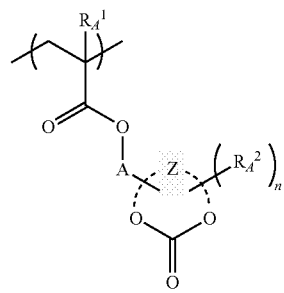

(A-I)

In general formula (A-1), $R_A^1$ represents a hydrogen atom or an alkyl group.

$R_A^2$ each independently represents a substituent, in a case where n is 2 or more.

A represents a single bond or a divalent linking group.

Z represents an atomic group forming a monocyclic or polycyclic structure together with the group represented by —O—C(=O)—O— in the formula.

n represents an integer of 0 or more.

The general formula (A-1) will be described in more detail.

The alkyl group represented by $R_A^1$ may have a substituent, such as a fluorine atom. $R_A^1$ preferably represents a hydrogen atom, methyl group or trifluoromethyl group, and more preferably represents a methyl group.

The substituent represented by $R_A^2$ is, for example, an alkyl group, a cycloalkyl group, a hydroxyl group, an alkoxy group, an amino group, and an alkoxycarbonyl amino group. The substituent is preferably an alkyl group with 1 to 5 carbon atoms, and examples thereof include a linear alkyl group with 1 to 5 carbon atoms, such as a methyl group, an ethyl group, a propyl group, or a butyl group; and a branched alkyl group with 3 to 5 carbon atoms, such as an isopropyl group, an isobutyl group, or a t-butyl group. The alkyl group may have a substituent, such as a hydroxyl group.

n is an integer of 0 or more representing the number of substituents. n is preferably 0 to 4, and more preferably 0, for example.

Examples of the divalent linking group represented by A include an alkylene group, a cycloalkylene group, an ester bond, an amide bond, an ether bond, a urethane bond, an urea bond or a combination thereof. The alkylene group is preferably an alkylene group with 1 to 10 carbon atoms, and more preferably an alkylene group with 1 to 5 carbon atoms. Examples thereof include a methylene group, an ethylene group and a propylene group.

In one embodiment of the present invention, A is preferably a single bond and an alkylene group.

As the monocycle including —O—C(=O)—O— represented by Z, examples include a 5- to 7-membered ring in which $n_A=2$ to 4 in the cyclic carbonate represented by general formula (a) below. A 5-membered ring or 6-membered ring ($n_A=2$ or 3) is preferable, and a 5-membered ring ($n_A=2$) is more preferable.

As the polycycle including —O—C(=O)—O— represented by Z, examples include a structure in which a condensed ring is formed by a cyclic carbonate represented by general formula (a) below and 1 or 2 or more of other ring structures, or a structure in which a spiro ring is formed. The "other ring structures" which can form a condensed ring or a spiro ring may be an alicyclic hydrocarbon group, may be an aromatic hydrocarbon group, or may be a heterocycle.

[Chem. 23]

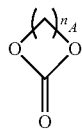
(a)

A monomer corresponding to the repeating unit represented by the general formula (A-1), for example, can be synthesized by methods known in the related art, as disclosed in Tetrahedron Letters, Vol. 27, No. 32, p. 3741 (1986), Organic Letters, Vol. 4, No. 15, p. 2561 (2002) or the like.

In the resin (P), one type of the repeating unit (P1) having a cyclic carbonate structure may be independently included, or two or more types may be included. In the resin (P), the content rate of the repeating unit having a cyclic carbonate structure (preferably, a repeating unit represented by general formula (A-1)) is preferably 3 mol % to 80 mol % with respect to all repeating units configuring the resin (P), more preferably 3 mol % to 60 mol %, and particularly preferably 3 mol % to 30 mol %. By setting such a content rate, developability, low defectiveness, lower LWR, low PEB temperature dependency, profile and the like as a resist can be improved.

Below, specific examples are provided of repeating units (repeating units (A-1a) to (A-1w)) represented by general formula (A-1); however, the present invention is not limited thereto.

Moreover, $R_A^1$ in the specific examples below have the same meaning as $R_A^1$ in general formula (A-1)

[Chem. 24-1]

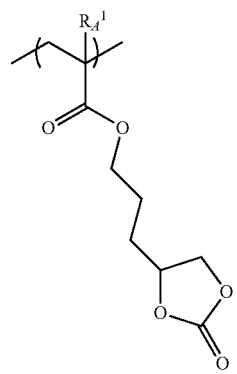
(A-1c)

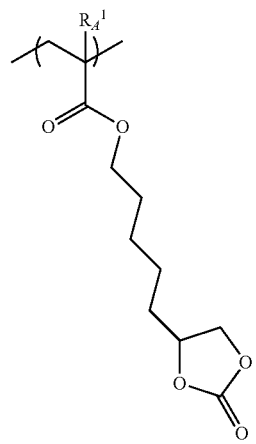
(A-1d)

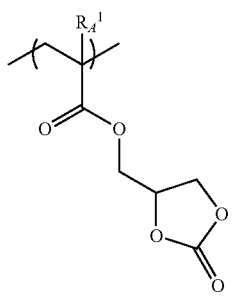
(A-1a)

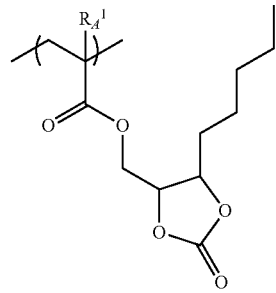
(A-1e)

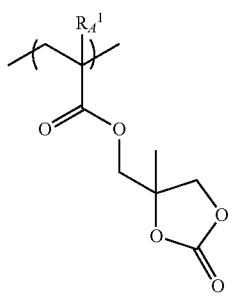
(A-1b)

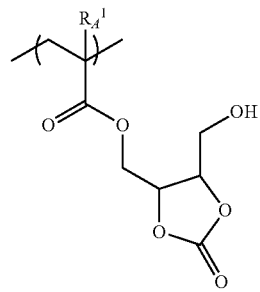
(A-1f)

(A-1g) 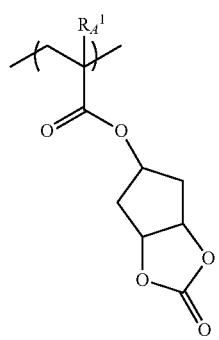
(A-1h) 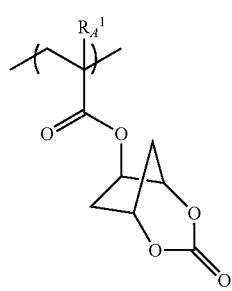
(A-1i) 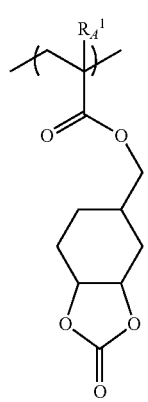
(A-1j) 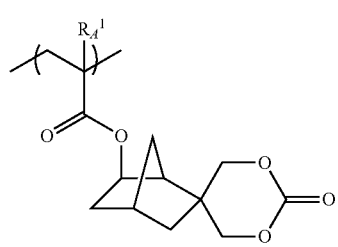
(A-1k) 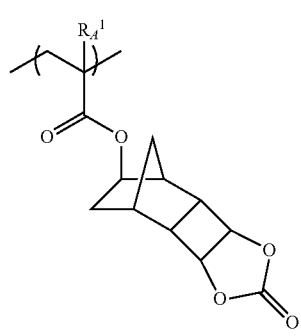
(A-1l) 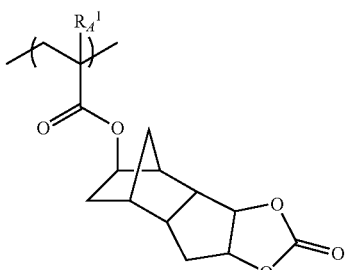
(A-1n) 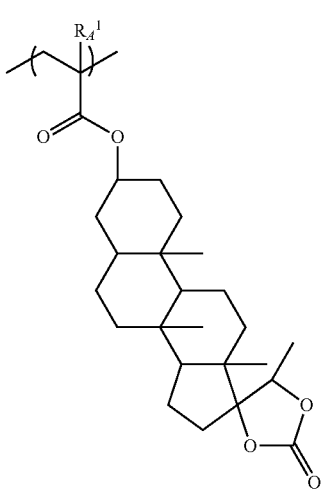
(A-1o) 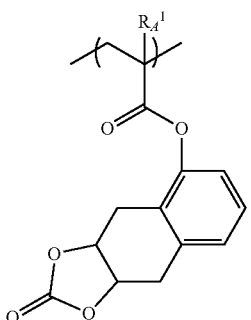
[Chem. 24-2]
(A-1p) 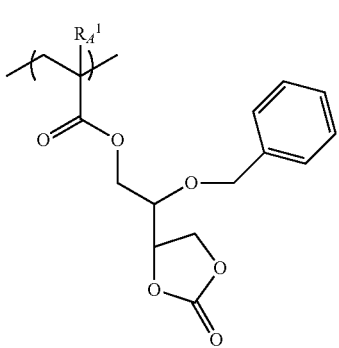

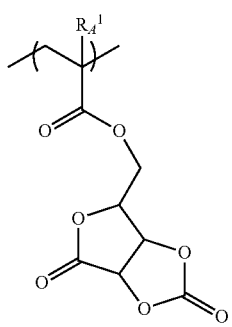
(A-1q)
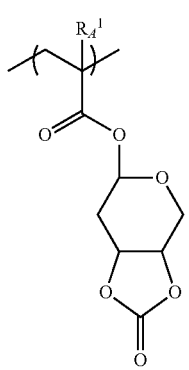
(A-1r)
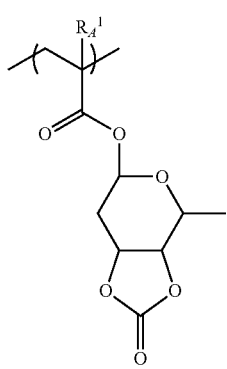
(A-1s)
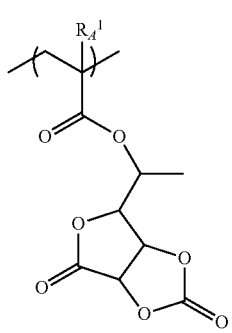
(A-1t)
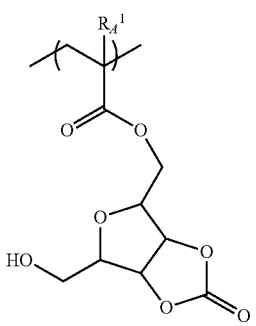
(A-1u)
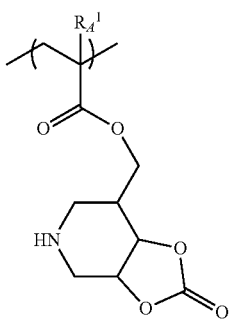
(A-1v)
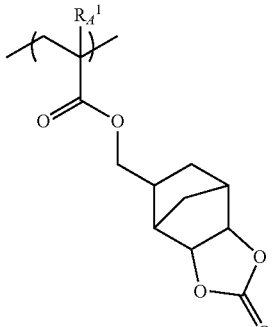
(A-1w)
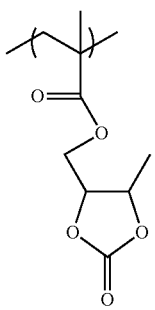
(A-1x)
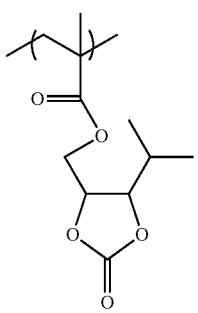
(A-1y)

-continued

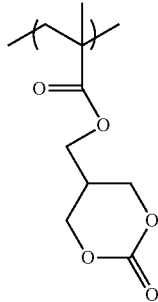

(A-1z)

(f) Repeating Unit (P2) Having Non-acid Leaving Hydrocarbon Group

The resin (P) in the present invention may contain a repeating unit (P2) having a non-acid leaving hydrocarbon group represented by general formula (P2-1) below.

[Chem. 25]

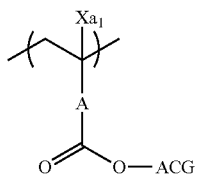

(P2-1)

In general formula (P2-1)

$Xa_1$ represents a hydrogen atom, an alkyl group, a cyano group, or a halogen atom.

A represents a single bond or a divalent linking group.

ACG represents a non-acid leaving hydrocarbon group formed from a carbon atom and a hydrogen atom only.

In the general formula (P2-1), $Xa_1$ represents a hydrogen atom, an alkyl group, a cyano group or a halogen atom. The alkyl group of $Xa_1$ may be substituted with a hydroxyl group or a halogen atom. $Xa_1$ is preferably a hydrogen atom or a methyl group.

A represents a single bond or a divalent linking group. A preferable divalent linking group is a —$CO_2$-alkylene group- in which —$CO_2$— and an alkylene group are linked. Examples of the alkylene group in the —$CO_2$-alkylene group include groups which become divalent linking groups by removing two hydrogen atoms from methylene and norbornane, and groups which become divalent linking groups by removing two hydrogen atoms from adamantane.

Any non-acid leaving hydrocarbon group ACG is acceptable if it is a hydrocarbon group not leaving from an oxygen atom in the formula due to the action of an acid; however, a hydrocarbon group formed from carbon atoms and hydrogen atoms only is preferable, and not having a polar substituent is more preferable. The non-acid leaving hydrocarbon group ACG preferably includes a monocyclic or polycyclic alicyclic hydrocarbon structure. The reason for this is that before and after irradiation by actinic rays or radiation, dissolution contrast improves in a case where the polarity of the resin changes greatly and is developed. Furthermore, the resin having a monocyclic or polycyclic alicyclic hydrocarbon structure ordinarily is highly hydrophobic, the development rate in a case of developing a region of the resist film for which irradiation strength is weak using a negative developer (preferably, an organic solvent), and the developability when a negative developer is used improves.

Examples of the non-acid leaving hydrocarbon group ACG include a linear or branched alkyl group or a monocyclic or polycyclic alkyl group not leaving from an oxygen atom in the formula due to the action of an acid. Specifically, a linear or branched alkyl group with 1 to 10 carbon atoms, such as a methyl group, an ethyl group, an n-propyl group, an isopropyl group, an isobutyl group, or a neopentyl group; a monocyclic alkyl group with 3 to 10 carbon atoms, such as a cyclopentyl group, a cyclohexyl group or a cycloheptyl group; or a polycyclic alkyl group with 7 to 15 carbon atoms, such as a norbornyl group, a tetracyclodecanyl group, a tetracyclododecanyl group, an adamantyl group, a diamantyl group, or a tetrahydrodecalin group are preferred. The linear or branched alkyl group may further be substituted with a monocyclic or polycyclic alkyl group as a substituent. The monocyclic or polycyclic alkyl group may further be substituted with a linear or branched alkyl group, or a monocyclic or polycyclic alkyl group as a substituent.

The non-acid decomposable repeating unit represented by general formula (P2-1) is preferably a non-acid decomposable repeating unit represented by general formula (I-1) below.

[Chem. 26]

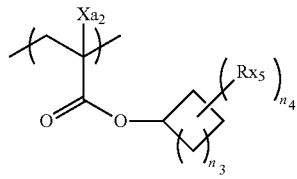

(I-1)

In general formula (I-1), $Xa_2$ represents a hydrogen atom, an alkyl group, a cyano group, or a halogen atom.

$Rx_5$ represents a linear or branched alkyl group or cycloalkyl group. In a case where a plurality of $Rx_5$ is present, $Rx_5$'s may be linked to each other to form a ring together with a carbon atom bonded therewith.

$n_3$ represents an integer of 2 to 5.

$n_4$ represents an integer of 0 to 3.

$Xa_2$ in general formula (I-1) has the same meaning as $Xa_a$ in general formula (P2-1). As the linear or branched alkyl group of $Rx_5$, a methyl group, an ethyl group, an n-propyl group, an isopropyl group, an n-butyl group, an isobutyl group, a t-butyl group or the like with 1 to 4 carbon atoms is preferred.

The cycloalkyl group of $Rx_5$ may be monocyclic or polycyclic, and a monocyclic alkyl group with 3 to 10 carbon atoms, such as a cyclopentyl group or a cyclohexyl group; or a polycyclic group with 7 to 15 carbon atoms, such as a norbornyl group, a tetracyclodecanyl group, a tetracyclododecanyl group, or an adamantyl group are preferred.

As the monocyclic or polycyclic alkyl group formed by at least two $Rx_5$'s linked to each other together with a carbon atom bonded therewith are, a monocyclic alkyl group with 3 to 10 carbon atoms, such as a cyclopentyl group or a cyclohexyl group; or a polycyclic alkyl group with 7 to 15 carbon atoms, such as a norbornyl group, a tetracyclodecanyl group, a tetracyclododecanyl group or an adamantyl group are preferred.

Examples of the monomer of the non-acid decomposable repeating unit represented by general formula (P2-1) and general formula (I-1) include compounds having one addition-polymerizable unsaturated bond selected from acrylates, methacrylates, allyl compounds, vinyl ethers, vinyl esters, or the like.

Specific examples of the non-acid decomposable repeating unit represented by general formula (P2-1) and general formula (I-1) are shown below; however, the present invention is not limited thereto.

[Chem. 27]

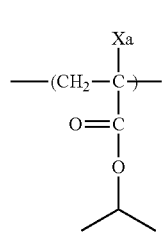
(ACG-1)

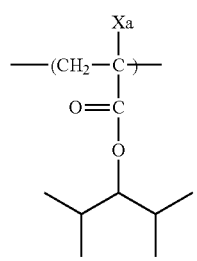
(ACG-2)

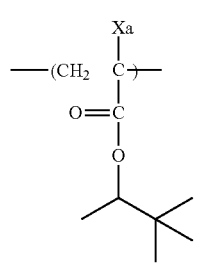
(ACG-3)

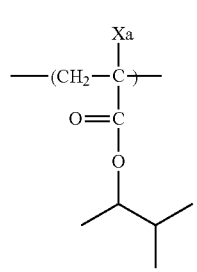
(ACG-4)

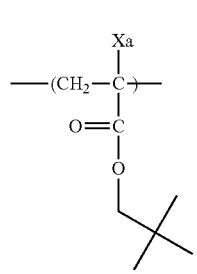
(ACG-5)

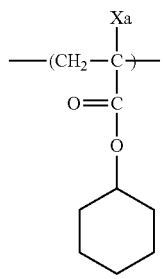
(ACG-6)

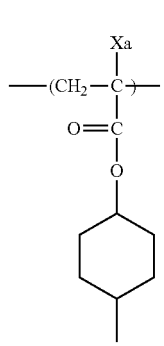
(ACG-7)

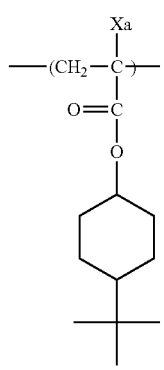
(ACG-8)

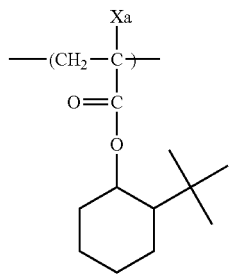
(ACG-9)

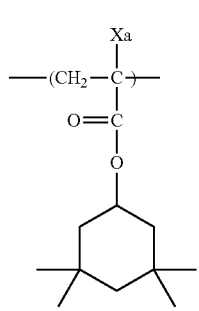
(ACG-10)

(ACG-11) 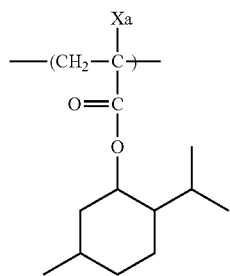
(ACG-12) 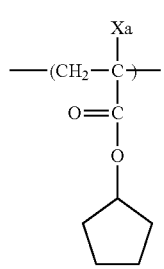
(ACG-13) 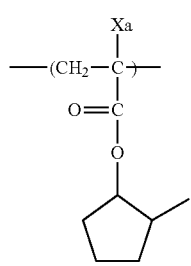
(ACG-14) 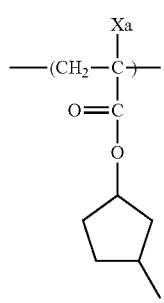
(ACG-15) 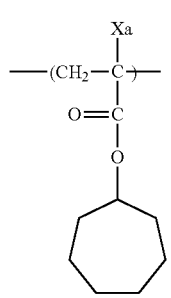
(ACG-16) 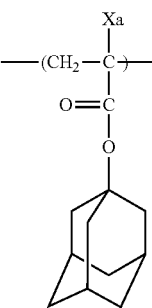
(ACG-17) 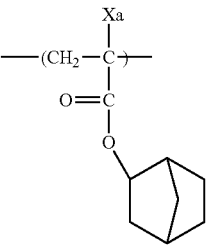
(ACG-18) 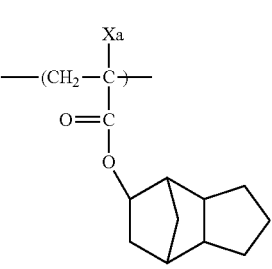
(ACG-19) 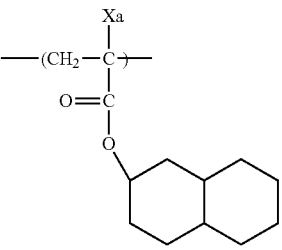
(ACG-20) 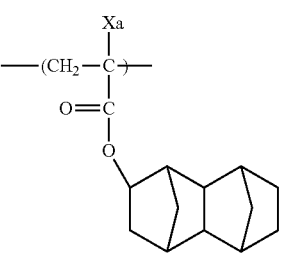
(ACG-21) 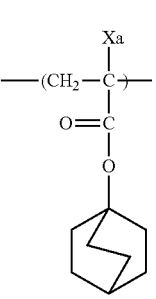

(ACG-22) 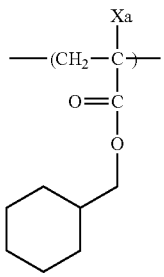

(ACG-23) 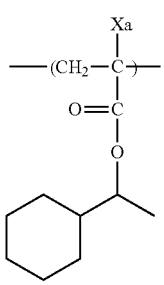

(ACG-24) 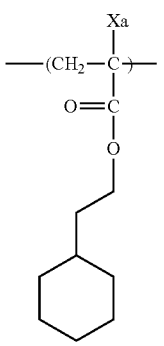

(ACG-25) 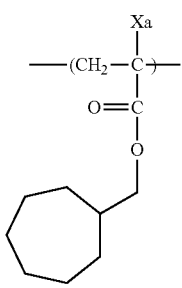

(ACG-26) 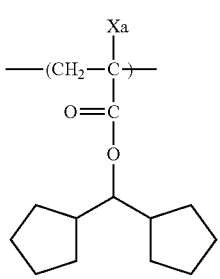

(ACG-27) 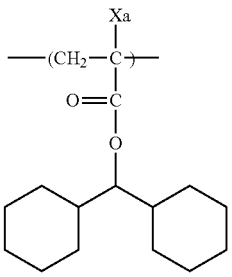

(ACG-28) 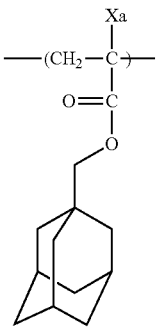

(ACG-29) 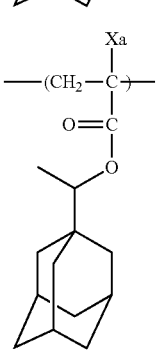

In the specific examples above, Xa represents H, CH$_3$, CF$_3$ or CH$_2$OH.

In the specific examples above, (ACG-2), (ACG-6), (ACG-7), (ACG-8), (ACG-9), (ACG-12), (ACG-16), (ACG-17), (ACG-18), (ACG-19), (ACG-20), (ACG-22), (ACG-23), (ACG-24), (ACG-26), (ACG-27), (ACG-28), and (ACG-29) are particularly preferred.

The content of the repeating unit represented by general formula (P2-1) or (I-1) above is preferably 3 mol % to 80 mol % with respect to all repeating units configuring the resin (P), more preferably 3 mol % to 60 mol %, particularly preferably 3 mol % to 30 mol %, and most preferably 5 mol % to 15 mol %.

In the resin (P), by introducing a repeating unit represented by general formula (P2-1) or (I-1) above, the performance demanded for an acid-decomposable resin, in particular,
 (1) Solubility in a Coating Solvent,
 (2) Film Formability (Glass Transition Temperature),
 (3) Solubility With Respect To Positive Developer and Negative Developer
 (4) Film Loss (selection of hydrophilic, hydrophobic, or alkali-soluble group),
 (5) Adhesion of Unexposed Portion to Substrate,
 (6) Dry Etching Resistance,
and the like, are improved.

The resin (P) of the present invention can be synthesized according to normal techniques (for example, radical polymerization). Examples of the general synthetic method include a batch polymerization method in which a monomer species and an initiator are dissolved in a solvent and heated so as to accomplish polymerization and a dropping polymerization method in which a solution of monomer species and initiator is added by dropwise addition to a heated solvent over a period of 1 to 10 hours. The dropping polymerization method is preferred. Examples of the reaction solvent include tetrahydrofuran, 1,4-dioxane, ethers such as diisopropyl ether, ketones such as methylethyl ketone and methyl isobutyl ketone, an ester solvent such as ethyl acetate, an amide solvent such as dimethylformamide and dimethylacetamide, and the later-described solvents capable of dissolving the composition of the invention, such as propylene glycol monomethyl ether acetate, propylene glycol monomethyl ether, and cyclohexanone. More preferably, polymerization is carried out with the use of the same solvent as the solvent used in the photosensitive composition of the present invention. By the use of the same solvent, generation of particles during storage may be inhibited.

The polymerization reaction is preferably carried out in an inert gas atmosphere, such as nitrogen or argon. Regarding the polymerization initiator, the polymerization is started using a commercially available radical initiator (for example, an azo-based initiator, or peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction solution is poured into a solvent, and the desired polymer is collected by powder or solid recovery, or other methods. The concentration during the reaction is in the range of 5 mass % to 50 mass %, preferably 10 mass % to 30 mass %. The reaction temperature is usually in the range of 10° C. to 150° C., preferably 30° C. to 120° C., more preferably 60° C. to 100° C.

After completion of the reaction, the temperature is cooled to room temperature, and purification is performed. The purification may be carried out by a normal method, for example, a liquid-liquid extraction method of applying water washing or combining appropriate solvents to remove residual monomers or oligomer components; a purification method in a solution state, such as ultrafiltration of extracting and removing only polymers having a molecular weight not more than a specific value; a reprecipitation method of adding dropwise the resin solution in a poor solvent to solidify the resin therein and thereby remove residual monomers and the like; and a purification method in a solid state, such as washing of a resin slurry with a poor solvent after separation of the slurry by filtration. For example, the resin may be precipitated as a solid by contacting the reaction solution with a solvent in which the resin is sparingly soluble or insoluble (poor solvent) and which has a volumetric amount of 10 times or less, preferably from 10 to 5 times of the reaction solution.

The solvent used during the operation of precipitation or reprecipitation from the polymer solution (a precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing these solvents, and the like, according to the kind of the polymer. Among these, as a solvent for precipitation or reprecipitation, a solvent including at least an alcohol (particularly, methanol or the like) or water is preferable.

The amount of the precipitation or reprecipitation solvent used may be appropriately selected by taking into consideration the efficiency, yield and the like, but in general, the amount used is from 100 parts by mass to 10,000 parts by mass, preferably from 200 parts by mass to 2000 parts by mass, and more preferably from 300 parts by mass to 1000 parts by mass, based on 100 parts by mass of the polymer solution.

The temperature during the precipitation or reprecipitation may be appropriately selected by taking into consideration the efficiency or operability but is usually approximately from 0° C. to 50° C., and is preferably in the vicinity of room temperature (for example, approximately from 20° C. to 35° C.). The precipitation or reprecipitation operation may be carried out using a commonly employed mixing vessel such as stirring tank by a known method such as a batch system or a continuous system.

The precipitated or reprecipitated polymer is usually subjected to commonly employed solid-liquid separation such as filtration and centrifugation, then dried and used. The filtration is carried out using a solvent-resistant filter preferably under pressure. The drying is carried out under atmospheric pressure or reduced pressure (preferably under reduced pressure) at a temperature of approximately from 30° C. to 100° C., preferably approximately from 30° C. to 50° C.

Incidentally, after the resin is once precipitated and separated, the resin may be dissolved again in a solvent and then put into contact with a solvent in which the resin is sparingly soluble or insoluble. That is, there may be used a method including, after the completion of radical polymerization reaction, bringing the polymer into contact with a solvent in which the polymer is sparingly soluble or insoluble to precipitate a resin (step a), separating the resin from the solution (step b), dissolving the resin again in a solvent to prepare a resin solution A (step c), bringing the resin solution A into contact with a solvent in which the resin is sparingly soluble or insoluble and which has a volumetric amount of less than 10 times (preferably 5 times or less) the resin solution A to precipitate a resin solid (step d), and separating the precipitated resin (step e).

Moreover, in order to inhibit the aggregation or the like of the resin after preparation of the composition, for example, as described in JP2009-037108A, dissolution of the synthesized resin in a solvent and heating the resulting solution at a temperature of about 30° C. to 90° C. for about 30 minutes to 4 hours may be added.

The weight average molecular weight of the resin (P) used in the composition of the invention is preferably from 1,000 to 200,000, more preferably from 2,000 to 100,000, still more preferably from 3,000 to 70,000, and particularly preferably from 5,000 to 50,000, in terms of polystyrene by a GPC method. When the weight average molecular weight is from 1,000 to 200,000, the deterioration of heat resistance and of dry etching resistance, and the deterioration of developability or of a film forming property due to an increase in viscosity may be prevented.

The dispersity (molecular weight dispersion, Mw/Mn) is ordinarily in a range of from 1.0 to 3.0, preferably 1.0 to 2.6, more preferably 1.1 to 2.5, still more preferably 1.2 to 2.4, even still more preferably from 1.3 to 2.2, and particularly preferably 1.4 to 2.0. When the molecular weight distribution is within the above-described ranges, the resolution and the resist shape are superior, the side wall of the resist pattern is smoother, and the roughness is superior. In the present specification, the weight average molecular weight (Mw) and the number average molecular weight (Mn) of the resin (P) may be obtained by using, for example, an HLC-8120 (manufactured by Tosoh Corporation) using TSK gel Multipore HXL-M columns (manufactured by Tosoh Corporation, 7.8 mm ID×30.0 cm) and THF (tetrahydrofuran) as an eluent.

In the actinic ray-sensitive or radiation-sensitive resin composition in the invention, the blending ratio of the resin (P) in the entire composition is preferably from 30 mass % to 99 mass %, and more preferably from 60 mass % to 95 mass %, based on the total solid content. In addition, for the resin (P) of the present invention, one kind of resin may be used, or a plurality of kinds of resins may be used in combination.

[3] Compound (B) Capable of Generating Acid Upon Irradiation with Actinic Rays or Radiation The composition of the present invention contains a compound (B) (hereinafter, also referred to "acid generator" or "compound (B)") generating an acid due to irradiation of actinic rays or radiation. As the compound (B) capable of generating an acid due to irradiation of actinic rays or radiation is preferably a compound generating an organic acid due to irradiation of actinic rays or radiation.

As such an acid generator, photoinitiators for photo-cation polymerization, photoinitiators for photo-radical polymerization, photodecoloring agents of dyes, photo-discoloring agents, known compounds that generate an acid by irradiation with actinic rays or radiation, which are used in microresists, or the like, and mixtures thereof may be suitably selected and used.

Examples of the acid generator include diazonium salts, phosphonium salts, sulfonium salts, iodonium salts, imide sulfonates, oxime sulfonates, diazodisulfone, disulfone, and o-nitrobenzylsulfonate.

Examples of the preferred compounds among the acid generators include the compounds represented by the following general formula (ZI), (ZII), and (ZIII).

[Chem. 28]

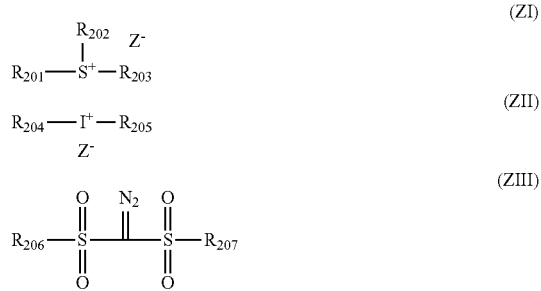

In the general formula (ZI), $R_{201}$, $R_{202}$, and $R_{203}$ each independently represent an organic group.

The organic group as $R_{201}$, $R_{202}$, and $R_{203}$ generally has 1 to 30 carbon atoms, and preferably 1 to 20 carbon atoms.

Further, two members of $R_{201}$ to $R_{203}$ may be bonded to each other to form a ring structure, and the ring may contain an oxygen atom, a sulfur atom, an ester bond, an amide bond or a carbonyl group. Examples of the group formed by bonding two members of $R_{201}$ to $R_{203}$ include an alkylene group (for example, a butylene group and a pentylene group).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methide anion.

The non-nucleophilic anion is an anion having an exceedingly low ability for causing a nucleophilic reaction, and is also an anion capable of suppressing the decomposition with aging by the nucleophilic reaction in the molecule. In so doing, the stability of the actinic ray-sensitive or radiation-sensitive resin composition over time is improved.

Examples of the sulfonate anion include an aliphatic sulfonate anion, an aromatic sulfonate anion, and a camphor sulfonate anion.

Examples of the carboxylate anion include an aliphatic carboxylate anion, an aromatic carboxylate anion, and an aralkylcarboxylate anion.

The aliphatic moiety in the aliphatic sulfonate anion and the aliphatic carboxylate anion may be an alkyl group or a cycloalkyl group. It is preferably an alkyl group having 1 to 30 carbon atoms and a cycloalkyl group having 3 to 30 carbon atoms, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group.

The aromatic group in the aromatic sulfonate anion and the aromatic carboxylate anion is preferably an aryl group having 6 to 14 carbon atoms, and examples thereof include a phenyl group, a tolyl group, and a naphthyl group.

The alkyl group, cycloalkyl group and aryl group in the aliphatic sulfonate anion and aromatic sulfonate anion may have a substituent. Examples of the substituent of the alkyl group, the cycloalkyl group, and the aryl group of the aliphatic sulfonate anion and the aromatic sulfonate anion include a nitro group, a halogen atom (fluorine atom, chlorine atom, bromine atom or iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). The aryl group or ring structure of these groups may further have an alkyl group (preferably having 1 to 15 carbon atoms) and a cycloalkyl group (preferably having 3 to 15 carbon atoms) as its substituent.

The aralkyl group in the aralkylcarboxylate anion is preferably an aralkyl group having 7 to 12 carbon atoms, and examples thereof include a benzyl group, a phenethyl group, a naphthylmethyl group, a naphthylethyl group, and a naphthylbutyl group.

The alkyl group, the cycloalkyl group, the aryl group, and the aralkyl group in the aliphatic carboxylate anion, the aromatic carboxylate anion, and the aralkylcarboxylate anion may have a substituent. Examples of the substituent include halogen atoms, alkyl groups, cycloalkyl groups, alkoxy groups, and alkylthio groups as described for the aromatic sulfonic acid anion.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms, and examples thereof include a methyl group, an ethyl group, a propyl group, an isopropyl group, an n-butyl group, an isobutyl group, a sec-butyl group, a pentyl group, and a neopentyl group. Examples of the substituent for the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and an alkyl group substituted with a fluorine atom is preferred.

Examples of other non-nucleophilic anions include phosphorus fluoride (for example, $PF_6^-$), boron fluoride (for example, $BF_4^-$), and antimony fluoride (for example, $SbF_6^-$).

The non-nucleophilic anion for $Z^-$ is preferably an aliphatic sulfonate anion substituted at least at its α-position of sulfonic acid with a fluorine atom, an aromatic sulfonate anion substituted with a fluorine atom, or a group having a fluorine atom, a bis(alkylsulfonyl)imide anion in which an alkyl group is substituted with a fluorine atom, or a tris(alkylsulfonyl)methide anion in which an alkyl group is substituted with a fluorine atom. The non-nucleophilic anion is more preferably a perfluorinated aliphatic sulfonate anion (having 4 to 8 carbon atoms) or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

The acid generator is preferably a compound generating an acid represented by general formula (IIIB) or (IVB) below due to irradiation of actinic rays or radiation. Since the acid generator has a cyclic organic group due to being a compound generating an acid represented by general formula (IIIB) or (IVB) below, resolution and roughness performance can be made superior.

The non-nucleophilic anion can be set as an anion generating an organic acid represented by general formula (IIIB) or (IVB) below.

[Chem. 29]

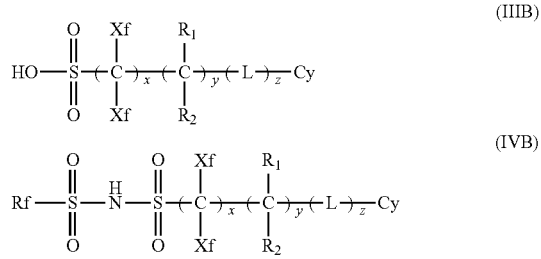

In the general formula above,

Xf's each independently represent a fluorine atom, or an alkyl group substituted with at least one fluorine atom;
$R_1$ and $R_2$ each independently represent a hydrogen atom, a fluorine atom, or an alkyl group;
L's each independently represent a divalent linking group;
Cy represents a cyclic organic group.
Rf represents a group containing a fluorine atom;
x represents an integer of 1 to 20;
y represents an integer of 0 to 10; and
and z represents an integer of 0 to 10.

Xf represents a fluorine atom, or an alkyl group substituted with at least one fluorine atom. The alkyl group preferably contains 1 to 10 carbon atoms, and more preferably 1 to 4 carbon atoms. Further, the alkyl group substituted with at least one fluorine atom is preferably a perfluoroalkyl group.

Xf is preferably a fluorine atom or a perfluoroalkyl group having 1 to 4 carbon atoms. Specific preferred examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, a fluorine atom and $CF_3$ are preferred. It is particularly preferable that both Xf's be fluorine atoms.

$R_1$ and $R_2$ each independently represent a hydrogen atom, a fluorine atom, or an alkyl group. The alkyl group may have a substituent (preferably a fluorine atom), and preferably contains 1 to 4 carbon atoms. A perfluoroalkyl group having 1 to 4 carbon atoms is more preferred. Specific examples of the alkyl group having a substituent for $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferred.

L is a divalent linking group. Examples of the divalent linking group include —COO—, —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), and a divalent linking group formed by combination of a plurality of these groups. Among these, —COO—, —OCO—, —CONH—, —NHCO—, —CO—, —O—, —SO$_2$—, —COO-alkylene group-, —OCO-alkylene group-, —CONH-alkylene group-, or —NHCO-alkylene group- is preferred, and —COO—, —OCO—, —CONH—, —SO$_2$—, —COO-alkylene group-, or —OCO-alkylene group- is more preferred.

Cy represents a cyclic organic group. Examples of the cyclic organic group include an alicyclic group, an aryl group, and a heterocyclic group.

The alicyclic group may be monocyclic or polycyclic. Examples of the monocyclic alicyclic group include monocyclic cycloalkyl groups, such as a cyclopentyl group, a cyclohexyl group, and a cyclooctyl group. Examples of the polycyclic alicyclic group include polycyclic cycloalkyl groups, such as a norbornyl group, a tricyclodecanyl group, a tetracyclodecanyl group, a tetracyclododecanyl group, and an adamantyl group. Among these, an alicyclic group having a bulky structure containing 7 or more carbon atoms, such as a norbornyl group, a tricyclodecanyl group, a tetracyclodecanyl group, a tetracyclododecanyl group, and an adamantyl group, is preferred since diffusion in a film during a postexposure baking (PEB) step is inhibited and a MEEF (Mask Error Enhancement Factor) is improved.

The aryl group may be monocyclic or polycyclic. Examples of the aryl group include a phenyl group, a naphthyl group, a phenanthryl group, and an anthryl group. Among these, a naphthyl group with a relatively low light absorbance at 193 nm is preferred.

The heterocyclic group may be monocyclic or polycyclic, and the polycyclic heterocyclic group can further inhibit the diffusion of an acid. Further, the heterocyclic group may be aromatic or non-aromatic. Examples of the aromatic heterocycle include a furan ring, a thiophene ring, a benzofuran ring, a benzothiophene ring, a dibenzofuran ring, a dibenzothiophene ring, and a pyridine ring. Examples of the non-aromatic heterocycle include a tetrahydropyran ring, a lactone ring, a sultone ring, and a decahydroisoquinoline ring. As the heterocycle in the heterocyclic group, a furan ring, a thiophene ring, a pyridine ring, or a decahydroisoquinoline ring are particularly preferred. In addition, examples of the lactone ring and sultone ring include the lactone structure and sultone structure listed in the resin (P) described above.

The cyclic organic group may have a substituent. Examples of the substituent include an alkyl group (may be linear, branched, or cyclic, preferably having 1 to 12 carbon atoms), a cycloalkyl group (may be monocyclic, polycyclic or spirocyclic, preferably having 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, and a sulfonic acid ester group. Incidentally, the carbon constituting the cyclic organic group (carbon contributing to ring formation) may be carbonyl carbon.

x is preferably from 1 to 8, more preferably from 1 to 4, and particularly preferably 1. y is preferably from 0 to 4, and more preferably 0. z is preferably 0 to 8, more preferably 0 to 4, and still more preferably 1.

Examples of the group containing a fluorine atom represented by Rf include an alkyl group having at least one fluorine atom, a cycloalkyl group having at least one fluorine atom, and an aryl group having at least one fluorine atom.

These alkyl group, cycloalkyl group, and aryl group may be substituted with fluorine atoms or with the substituents containing fluorine atoms. In the case where Rf is a cycloalkyl group having at least one fluorine atom or an aryl group having at least one fluorine atom, examples of the other substituent containing a fluorine atom include an alkyl group substituted with at least one fluorine atom.

Furthermore, these alkyl group, cycloalkyl group, and aryl group may be further substituted with substituents containing no fluorine atoms. Examples of the substituent include those containing no fluorine atoms particularly among those described above for Cy.

Examples of the alkyl group having at least one fluorine atom represented by Rf include those described above for the alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

In the general formula above, a particularly preferably embodiment is an embodiment in which x is 1 or 2, Xf's are fluorine atoms, y is 0 to 4, all of $R_1$ and $R_2$ are hydrogen atoms, and z is 1. Such an embodiment has few fluorine atoms, is not easily unevenly distributed on the surface during resist film formation, and is easily evenly dispersed in the resist film.

Examples of the organic group represented by $R_{201}$, $R_{202}$, and $R_{203}$ include the corresponding groups in the compounds (ZI-1), (ZI-2), (ZI-3), and (ZI-4) as described later.

Moreover, the compound may be a compound having a plurality of structures represented by the general formula (ZI). For example, the compound may be a compound having a structure where at least one of $R_{201}$ to $R_{203}$ in the compound represented by the general formula (ZI) is bonded to at least one of $R_{201}$ to $R_{203}$ in another compound represented by the general formula (ZI) through a single bond or a linking group.

More preferred examples of the component (ZI) include the compounds (ZI-1), (ZI-2), (ZI-3), and (ZI-4) as described below.

The compound (ZI-1) is an arylsulfonium compound where at least one of $R_{201}$ to $R_{203}$ in the general formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining ones being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In the case where the arylsulfonium compound has two or more aryl groups, these two or more aryl groups may be the same as or different from each other.

The alkyl group or the cycloalkyl group which is present, if desired, in the arylsulfonium compound is preferably a linear or branched alkyl group having 1 to 15 carbon atoms or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, as the substituent, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group or a phenylthio group. The substituent is preferably a linear or branched alkyl group having 1 to 12 carbon atoms, a cycloalkyl group having 3 to 12 carbon atoms, or a linear, branched, or cyclic alkoxy group having 1 to 12 carbon atoms, more preferably an alkyl group having 1 to 4 carbon atoms, or an alkoxy group having 1 to 4 carbon atoms. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

Next, the compound (ZI-2) will be described.

The compound (ZI-2) is a compound in which $R_{201}$ to $R_{203}$ in the formula (ZI) each independently represent an organic group having no aromatic ring. Here, the aromatic ring also includes an aromatic ring containing a heteroatom.

The organic group containing no aromatic ring as $R_{201}$ to $R_{203}$ generally contains 1 to 30 carbon atoms, and preferably 1 to 20 carbon atoms.

$R_{201}$ to $R_{203}$ each independently preferably represent an alkyl group, a cycloalkyl group, an allyl group, or a vinyl group, still more preferably a linear or branched 2-oxoalkyl group, a 2-oxocycloalkyl group, or an alkoxycarbonylmethyl group, and particularly preferably a linear or branched 2-oxoalkyl group.

Preferable examples of the alkyl group and the cycloalkyl group of $R_{201}$ to $R_{203}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group). More preferable examples of the alkyl group include a 2-oxoalkyl group and an alkoxycarbonylmethyl group, and more preferable examples of the cycloalkyl group include a 2-oxocycloalkyl group.

The 2-oxoalkyl group may be either linear or branched, and examples thereof include a group containing >C=O at the 2-position of the alkyl group.

The 2-oxocycloalkyl group is preferably the group containing >C=O at the 2-position of the cycloalkyl group.

Examples of the alkoxy group in the alkoxycarbonylmethyl group preferably include an alkoxy group having 1 to 5 carbon atoms (a methoxy group, an ethoxy group, a propoxy group, a butoxy group, and a pentoxy group).

$R_{201}$ to $R_{203}$ may be further substituted with a halogen atom, an alkoxyl group (for example, having 1 to 5 carbon atoms), a hydroxyl group, a cyano group, or a nitro group.

Next, the compound (ZI-3) will be described.

The compound (ZI-3) is a compound represented by the following general formula (ZI-3), which is a compound having a phenacylsulfonium salt structure.

[Chem. 30]

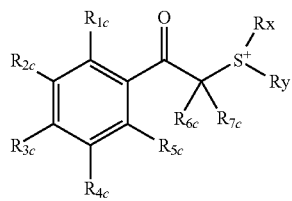

(ZI-3)

In the general formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group;

$R_{6c}$ and $R_{7c}$, each independently represent a hydrogen atom, an alkyl group, a cycloalkyl group, a halogen atom, a cyano group, or an aryl group; and $R_x$ and $R_y$ each independently represent an alkyl group, a cycloalkyl group, a 2-oxoalkyl group, a 2-oxocycloalkyl group, an alkoxycarbonylalkyl group, an allyl group, or vinyl group.

Any two or more members of $R_{1c}$ to $R_{5c}$, $R_{5c}$ and $R_{6c}$, $R_{6c}$ and $R_{7c}$, $R_{5c}$ and $R_x$, and $R_x$ and $R_y$ may be bonded to each other to form a ring structure respectively, and this ring structure may contain an oxygen atom, a sulfur atom, a ketone group, an ester bond, or an amide bond.

The ring structure includes an aromatic or non-aromatic hydrocarbon ring, an aromatic or non-aromatic heterocyclic ring, and a polycyclic condensed ring formed by combination of two or more of these rings. The ring structure includes a 3- to 10-membered ring, and is preferably a 4- to 8-membered ring, and more preferably a 5- or 6-membered ring.

Examples of the group formed by the mutual bonding of any two or more members of $R_{1c}$ to $R_{5c}$, $R_{6c}$ and $R_{7c}$, and $R_x$ and $R_y$ include a butylene group and a pentylene group.

The group formed by the mutual bonding of $R_{5c}$ and $R_{6c}$, and $R_{5c}$ and $R_x$ is preferably a single bond or an alkylene group, and examples of the alkylene group include a methylene group and an ethylene group.

$Zc^-$ represents a non-nucleophilic anion, and examples thereof include the same non-nucleophilic anions as mentioned above as examples of $Z^-$ in the general formula (ZI).

The alkyl group as $R_{1c}$ to $R_{7c}$, may be either linear or branched, and examples thereof include an alkyl group having 1 to 20 carbon atoms, and preferably a linear or branched alkyl group having 1 to 12 carbon atoms (for example, a methyl group, an ethyl group, a linear or branched propyl group, a linear or branched butyl group, and a linear or branched pentyl group), and examples of the cycloalkyl group include a cycloalkyl group having 3 to 10 carbon atoms (for example, a cyclopentyl group and a cyclohexyl group).

The aryl group as $R_{1c}$ to $R_{5c}$ preferably has 5 to 15 carbon atoms, and examples thereof include a phenyl group and a naphthyl group.

The alkoxy group as $R_{1c}$ to $R_{5c}$ may be any of linear, branched, and cyclic, and examples thereof include an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group, and a linear or branched pentoxy group), and a cyclic alkoxy group having 3 to 10 carbon atoms (for example, a cyclopentyloxy group and a cyclohexyloxy group).

Specific examples of the alkoxy group in the alkoxycarbonyl group as $R_{1c}$ to $R_{5c}$ include the same as those of the alkoxy group as $R_{1c}$ to $R_{5c}$.

Specific examples of the alkyl group in the alkylcarbonyloxy group and the alkylthio group as $R_{1c}$ to $R_{5c}$ include the same as those of the alkyl group as $R_{1c}$ to $R_{5c}$.

Specific examples of the cycloalkyl group in the cycloalkylcarbonyloxy group as $R_{1c}$ to $R_{5c}$ include the same as those of the cycloalkyl group as $R_{1c}$ to $R_{5c}$.

Specific examples of the aryl group in the aryloxy group and the arylthio group as $R_{1c}$ to $R_{5c}$ include the same as those of the aryl group as $R_{1c}$ to $R_{5c}$.

Preferably, any one of $R_{1c}$ to $R_{5c}$ is a linear or branched alkyl group, a cycloalkyl group, or a linear, branched, or cyclic alkoxy group, and $R_{1c}$ to $R_{5c}$ more preferably has 2 to 15 carbon atoms in sum, due to which the solvent solubility is more enhanced and production of particles during storage is inhibited.

The ring structure formed by the mutual bonding of any two or more of $R_{1c}$ to $R_{5c}$ preferably includes a 5- or 6-membered ring, and particularly preferably a 6-membered ring (such as a phenyl ring).

The ring structure formed by the mutual bonding of $R_{5c}$ and $R_{6c}$ preferably includes a 4 or more-membered ring (preferably a 5- or 6-membered ring) formed with the carbonyl carbon atom and carbon atom in the general formula (I) by the mutual bonding of $R_{5c}$ and $R_{6c}$ to constitute a single bond or an alkylene group (a methylene group, an ethylene group, and the like).

The aryl group as any of $R_{6c}$ and $R_{7c}$ is an aryl group having 5 to 15 carbon atoms, and examples thereof include a phenyl group and a naphthyl group.

In one embodiment of $R_{6c}$ and $R_{7c}$, a case where both of $R_{6c}$ and $R_{7c}$ are alkyl groups is preferred. Particularly, a case where $R_6$, and $R_{7c}$ are each a linear or branched alkyl group having 1 to 4 carbon atoms is preferred, and a case where both of them are methyl groups is particularly preferred.

Furthermore, in the case where $R_{6c}$ and $R_{7c}$ are bonded to form a ring, the group formed by the mutual bonding of $R_{6c}$ and $R_{7c}$ is preferably an alkylene group having 2 to 10 carbon atoms, and examples thereof include an ethylene group, a propylene group, a butylene group, a pentylene group, and a hexylene group. Further, the ring formed by the mutual bonding of $R_{6c}$ and $R_{1c}$ may contain a heteroatom such as an oxygen atom in the ring.

Examples of the alkyl group and the cycloalkyl group as $R_x$ and $R_y$ include the same as those of the alkyl group and the cycloalkyl group as in $R_{1c}$ to $R_{7c}$.

Examples of the 2-oxoalkyl group and the 2-oxocycloalkyl group as $R_x$ and $R_y$ include a group containing >C=O at the 2-position of the alkyl group and the cycloalkyl group as $R_{1c}$ to $R_{7c}$.

Examples of the alkoxy group in the alkoxycarbonylalkyl group as $R_x$ and $R_y$ are the same as those of the alkoxy group in $R_{1c}$ to $R_{5c}$. Examples of the alkyl group include an alkyl group having 1 to 12 carbon atoms, and preferably a linear alkyl group having 1 to 5 carbon atoms (for example, a methyl group and an ethyl group).

The allyl group as $R_x$ and $R_y$ is not particularly limited, but is preferably an unsubstituted allyl group or an allyl group substituted with a monocyclic or polycyclic cycloalkyl group (preferably a cycloalkyl group having 3 to 10 carbon atoms).

The vinyl group as $R_x$ and $R_y$ is not particularly limited, but is preferably an unsubstituted vinyl group or a vinyl group substituted with a monocyclic or polycyclic cycloalkyl group (preferably a cycloalkyl group having 3 to 10 carbon atoms).

The ring structure which may be formed by the mutual bonding of $R_{5c}$ and $R_x$ includes a 5-membered or higher ring (particularly preferably a 5-membered ring), formed together with a sulfur atom and a carbonyl carbon atom in the general formula (I) by the mutual boding of $R_{5c}$ and $R_x$ to constitute a single bond or an alkylene group (a methylene group, an ethylene group, and the like).

The ring structure which may be formed by the mutual bonding of $R_x$ and $R_y$ includes a 5- or 6-membered ring, and preferably a 5-membered ring (that is, a tetrahydrothiophene ring), formed together with the sulfur atom in the general formula (ZI-3) by divalent $R_x$ and $R_y$ (for example, a methylene group, an ethylene group, and a propylene group).

$R_x$ and $R_y$ are each preferably an alkyl group or cycloalkyl group having 4 or more carbon atoms, more preferably an alkyl group or cycloalkyl group having 6 or more carbon atoms, and still more preferably an alkyl group or cycloalkyl group having 8 or more carbon atoms.

$R_{1c}$ to $R_{7c}$, $R_x$ and $R_y$ may further contain a substituent, and examples of such a substituent include a halogen atom (for example, a fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

In the general formula (ZI-3), more preferably, $R_{1c}$, $R_{2c}$, $R_{4c}$, and $R_{5c}$ each independently represent a hydrogen atom, and $R_{1c}$ represents a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, Examples of the cation in compounds (ZI-2) or (ZI-3) in the present invention include the cation disclosed in US2012/0076996A.

Next, the compound (ZI-4) will be described.
The compound (ZI-4) is represented by the following general formula (ZI-4).

[Chem. 31]

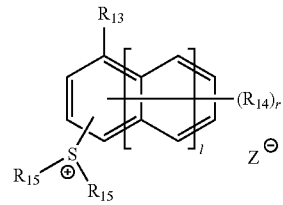

(ZI-4)

In the general formula (ZI-4),
$R_{13}$ represents a group containing a hydrogen atom, a fluorine atom, a hydroxyl group, an alkyl group, a cycloalkyl group, an alkoxy group, an alkoxycarbonyl group, or a cycloalkyl group, and these groups may have a substituent;
when a plurality of $R_{14}$'s are present, they each independently represent a group containing a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group, and these groups may have a substituent;
$R_{15}$'s each independently represent an alkyl group, a cycloalkyl group, or a naphthyl group. Two $R_{15}$'s may be bonded to each other to form a ring, and these groups may have a substituent;
l represents an integer of 0 to 2;
r represents an integer of 0 to 8;
and $Z^-$ represents a non-nucleophilic anion, and examples thereof include the same non-nucleophilic anions as mentioned above as $Z^-$ in the general formula (ZI).

In the general formula (ZI-4), the alkyl group of $R_{13}$, $R_{14}$, and $R_{15}$ is linear or branched, preferably has 1 to 10 carbon atoms, and preferred examples thereof include a methyl group, an ethyl group, an n-butyl group, and a t-butyl group.

Examples of the cycloalkyl group of $R_{13}$, $R_{14}$, and $R_{15}$ include a monocyclic or polycyclic cycloalkyl group (preferably a cycloalkyl group having 3 to 20 carbon atoms), and particularly preferred examples thereof include cyclopropyl, cyclopentyl, cyclohexyl, cycloheptyl, and cyclooctyl.

The alkoxy group of $R_{13}$ and $R_{14}$ is linear or branched, preferably has 1 to 10 carbon atoms, and preferred examples thereof include a methoxy group, an ethoxy group, an n-propoxy group, and an n-butoxy group.

The alkoxycarbonyl group of $R_{13}$ and $R_{14}$ is linear or branched, preferably has 2 to 11 carbon atoms, and preferred examples thereof include a methoxycarbonyl group, an ethoxycarbonyl group, and an n-butoxycarbonyl group.

Examples of the group having a cycloalkyl group of $R_{13}$ and $R_{14}$ include a monocyclic or polycyclic cycloalkyl group (preferably a cycloalkyl group having of 3 to 20 carbon atoms), and examples thereof include a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has a total number of carbon atoms of 7 or more, more preferably a total number of carbon atoms of 7 to 15, and preferably has a monocyclic cycloalkyl group. The monocyclic cycloalkyloxy group with a total of 7 carbon atoms or more indicates a monocyclic cycloalkyloxy group where a cycloalkyloxy group, such as a cyclopropyloxy group, a cyclobutyloxy group, a cyclopentyloxy group, a cyclohexyloxy group, a cycloheptyloxy group, a cyclooctyloxy group, and a cyclododecanyloxy group arbitrarily has a substituent, such as an alkyl group, such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, and an iso-amyl group; a hydroxyl group; a halogen atom (fluorine, chlorine, bromine, and iodine); a nitro group; a cyano group; an amido group; a sulfonamido group; an alkoxy group, such as a methoxy group, an ethoxy group, a hydroxyethoxy group, a propoxy group, a hydroxypropoxy group, and a butoxy group; an alkoxycarbonyl group, such as a methoxycarbonyl group, and an ethoxycarbonyl group; an acyl group, such as a formyl group, an acetyl group, and a benzoyl group; and an acyloxy group, such as an acetoxy group and a butyryloxy group; and a carboxy group, and where the total number of carbon atoms including the number of carbon atoms of the arbitrary substituent on the cycloalkyl group is 7 or more.

Furthermore, examples of the polycyclic cycloalkyloxy group having a total number of carbon atoms of 7 or more include a norbornyloxy group, a tricyclodecanyloxy group, a tetracyclodecanyloxy group, and an adamantyloxy group.

The alkoxy group having a monocyclic or polycyclic cycloalkyl group of $R_{13}$ and $R_{14}$ preferably has a total number of carbon atoms of 7 or more, and more preferably a total number of carbon atoms of 7 to 15, and is preferably an alkoxy group having a monocyclic cycloalkyl group. The alkoxy group having a total number of carbon atoms of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, and iso-amyloxy, in which where the total number of carbon atoms inclusive of the number of carbon atoms of the substituent is 7 or more. Examples thereof include a cyclohexylmethoxy group, a cyclopentylethoxy group, and a cyclohexylethoxy group, with a cyclohexylmethoxy group being preferred.

Furthermore, examples of the alkoxy group having a total number of carbon atoms of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$.

The alkylsulfonyl group or the cycloalkylsulfonyl group of $R_{14}$ is linear, branched, or cyclic, preferably has 1 to 10 carbon atoms, and preferred examples thereof include a methanesulfonyl group, an ethanesulfonyl group, an n-propanesulfonyl group, an n-butanesulfonyl group, a cyclopentanesulfonyl group, and a cyclohexanesulfonyl group.

Examples of the substituent which each of the groups above may have include a halogen atom (for example, a fluorine atom), a hydroxyl group, a carboxyl group, a cyano group, a nitro group, an alkoxy group, an alkoxyalkyl group, an alkoxycarbonyl group, and an alkoxycarbonyloxy group.

Examples of the alkoxy group include a linear, branched, or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the alkoxyalkyl group include a linear, branched, or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the alkoxycarbonyl group include a linear, branched, or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl.

Examples of the alkoxycarbonyloxy group include a linear, branched, or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, and a cyclohexyloxycarbonyloxy group.

Examples of the ring structure which may be formed by the mutual bonding of two $R_{15}$'s include a 5- or 6-membered ring, preferably a 5-membered ring (that is, a tetrahydrothiophene ring), formed together with the sulfur atom in the general formula (ZI-4) by two $R_{15}$'s and may be fused with an aryl group or a cycloalkyl group. The divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. As for the substituent on the ring structure, a plurality of substituents may be present, and they may be bonded to each other to form a ring (an aromatic or non-aromatic hydrocarbon ring, an aromatic or non-aromatic heterocyclic ring, a polycyclic condensed ring formed by combination of two or more of these rings, or the like).

In the general formula (ZI-4), $R_{15}$ is preferably, for example, a methyl group, an ethyl group, a naphthyl group, or a divalent group for forming a tetrahydrothiophene ring structure together with the sulfur atom when two $R_{15}$'s are bonded to each other, or the like.

The substituent which $R_{13}$ and $R_{14}$ may have is preferably a hydroxyl group, an alkoxy group, an alkoxycarbonyl group, or a halogen atom (particularly a fluorine atom).

l is preferably 0 or 1, and more preferably 1.

r is preferably from 0 to 2.

Examples of the cation of the compound represented by general formula (ZI-4) in the present invention include cations disclosed in JP2010-256842A, and JP2011-76056A.

Next, general formula (ZII) and (ZIII) will be described.

In general formula (ZII) and (ZIII), $R_{204}$ to $R_{207}$ each independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom or the like. Examples of the skeleton of the aryl group having a heterocyclic structure include pyrrole, furan, thiophene, indole, benzofuran, and benzothiophene.

Preferred examples of the alkyl group and cycloalkyl group in $R_{204}$ to $R_{207}$ include a linear or branched alkyl group having 1 to 10 carbon atoms (for example, a methyl group, an ethyl group, a propyl group, a butyl group, a pentyl group), and a cycloalkyl group having 3 to 10 carbon atoms (a cyclopentyl group, a cyclohexyl group, or a norbornyl group).

The aryl group, the alkyl group, and the cycloalkyl group of $R_{204}$ to $R_{207}$ may have a substituent. Examples of the substituent that the aryl group, the alkyl group, and the cycloalkyl group of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents a non-nucleophilic anion, and examples thereof include the same non-nucleophilic anions as mentioned above as $Z^-$ in general formula (ZI).

Further examples of the acid generator include compounds represented by the following general formula (ZIV), (ZV), and (ZVI)

[Chem. 32]

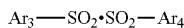
(ZIV)

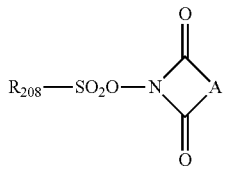
(ZV)

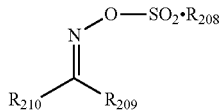
(ZVI)

In the general formula (ZIV) to (ZVI), $A_{r3}$ and $A_{r4}$ each independently represent an aryl group;

$R_{208}$, $R_{209}$, and $R_{210}$ each independently represent an alkyl group, a cycloalkyl group, or an aryl group; and A represents an alkylene group, an alkenylene group, or an arylene group.

Specific examples of the aryl group of $A_{r3}$, $A_{r4}$, $R_{208}$, $R_{209}$, and $R_{210}$ are the same as specific examples of the aryl group of $R_{201}$, $R_{202}$, and $R_{203}$ in the general formula (ZI-1).

Specific examples of the alkyl group and cycloalkyl group of $R_{208}$, $R_{209}$, and $R_{210}$ are the same as specific examples of the alkyl group and cycloalkyl group of $R_{201}$, $R_{202}$, and $R_{203}$ in the general formula (ZI-2), respectively.

Examples of the alkylene group of A include an alkylene group having 1 to 12 carbon atoms (for example, a methylene group, an ethylene group, a propylene group, an isopropylene group, a butylene group, and an isobutylene group); examples of the alkenylene group of A include an alkenylene group having 2 to 12 carbon atoms (for example, an ethenylene group, a propenylene group, and a butenylene group); and examples of the arylene group of A include an arylene group having 6 to 10 carbon atoms (for example, a phenylene group, a tolylene group, and a naphthylene group).

Examples of the acid generator further include compounds represented by any of general formula (B-1) to (B-3) below.

Firstly, the compound (B) represented by general formula (B-1) will be described.

[Chem. 33]

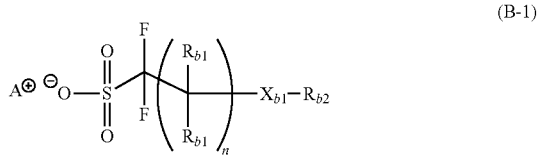
(B-1)

In general formula (B-1) above, $A^+$ represents a sulfonium cation or an iodonium cation.

$R_{b1}$'s each independently represent a hydrogen atom, a fluorine atom, or a trifluoromethyl group ($CF_3$).

n represents an integer of 1 to 4.

n is preferably an integer from 1 to 3, and more preferably 1 or 2.

$X_{b1}$ represents a single bond, an ether bond, an ester bond (—OCO— or —COO—) or a sulfonate bond (—OSO$_2$— or —SO$_3$).

$X_{b1}$ is preferably an ester bond (—OCO— or —COO—) or a sulfonate bond (—OSO$_2$— or —SO$_3$).

$R_{b2}$ represents a substituent with 6 or more carbon atoms.

The substituent with 6 or more carbon atoms for $R_{b2}$ is preferably a bulky group, and examples include an alkyl group, an alicyclic group, an aryl group and a heterocyclic group with 6 or more carbon atoms.

The alkyl group with 6 or more carbon atoms for $R_{b2}$ may be a straight chain or may be branched, and a linear or branched alkyl group with 6 to 20 carbon atoms is preferred. Examples thereof include a linear or branched hexyl group, a linear or branched heptyl group, or a linear or branched octyl group. From the viewpoint of bulkiness, a branched alkyl group is preferred.

The alicyclic group with 6 or more carbon atoms for $R_{b2}$ may be monocyclic, or may be polycyclic. Examples of the monocyclic alicyclic group include monocyclic cycloalkyl groups, such as a cyclohexyl group and a cyclooctyl group. Examples of the polycyclic alicyclic group include polycyclic cycloalkyl groups, such as a norbornyl group, a tricyclodecanyl group, a tetracyclodecanyl group, a tetracyclododecanyl group, and an adamantyl group. Among these, an alicyclic group having a bulky structure containing 7 or more carbon atoms, such as a norbornyl group, a tricyclodecanyl group, a tetracyclodecanyl group, a tetracyclododecanyl group, and an adamantyl group, is preferred since diffusion in a film during a post-exposure baking (PEB) step is inhibited and a MEEF (Mask Error Enhancement Factor) is improved.

The aryl group with 6 or more for $R_{b2}$ may be monocyclic, or may be polycyclic. Examples of the aryl group include a phenyl group, a naphthyl group, a phenanthryl group, and an anthryl group. Among these, a naphthyl group with a relatively low light absorbance at 193 nm is preferred.

The heterocyclic group with 6 or more carbon atoms for $R_{b2}$ may be monocyclic, or may be polycyclic; however, the polycyclic type is more able to suppress diffusion of an acid. Further, the heterocyclic group may be aromatic or non-aromatic. Examples of the heterocycle having aromaticity include a benzofuran ring, a benzothiophene ring, a dibenzofuran ring, and a dibenzothiophene ring. Examples of the non-aromatic heterocycle include a tetrahydropyran ring, a lactone ring, and a decahydroisoquinoline ring. The hetero ring in the heterocyclic group is particularly preferably a benzofuran ring or a decahydroisoquinoline ring. Further, examples of the lactone ring include the lactone structures exemplified in the above-described resin (P).

The substituent with 6 or more carbon atoms for the above $R_{b2}$ may further have a substituent. Examples of the further substituent include an alkyl group (may be linear or branched, preferably having 1 to 12 carbon atoms), a cycloalkyl group (may be monocyclic, polycyclic or spirocyclic, preferably having 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, and a sulfonic acid ester group. Moreover, the carbon configuring the above-described alicyclic group, aryl group or heterocyclic group (carbon contributing to the ring formation) may be carbonyl carbon.

Specific examples of the anion structure in the compound (B) represented by general formula (B-1) are provided below; however, the present invention is not limited thereto.

[Chem. 34]

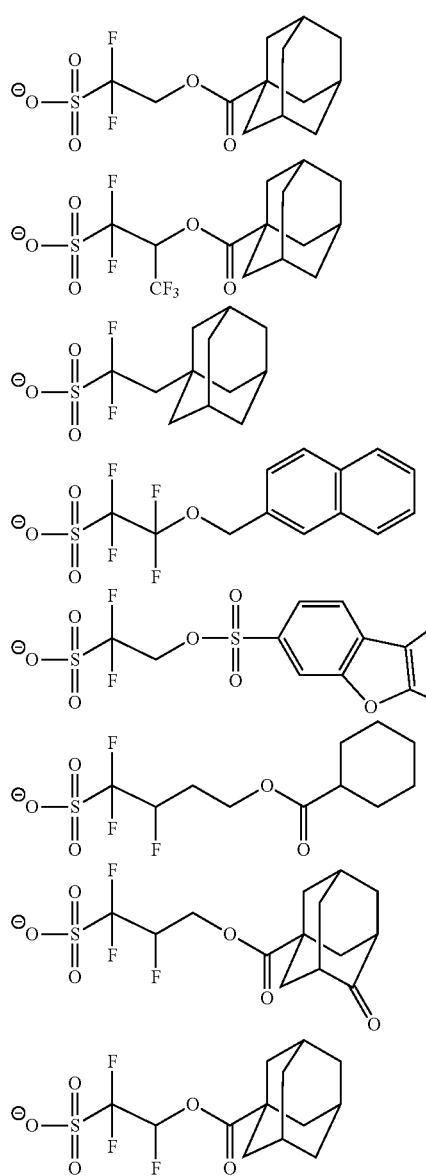

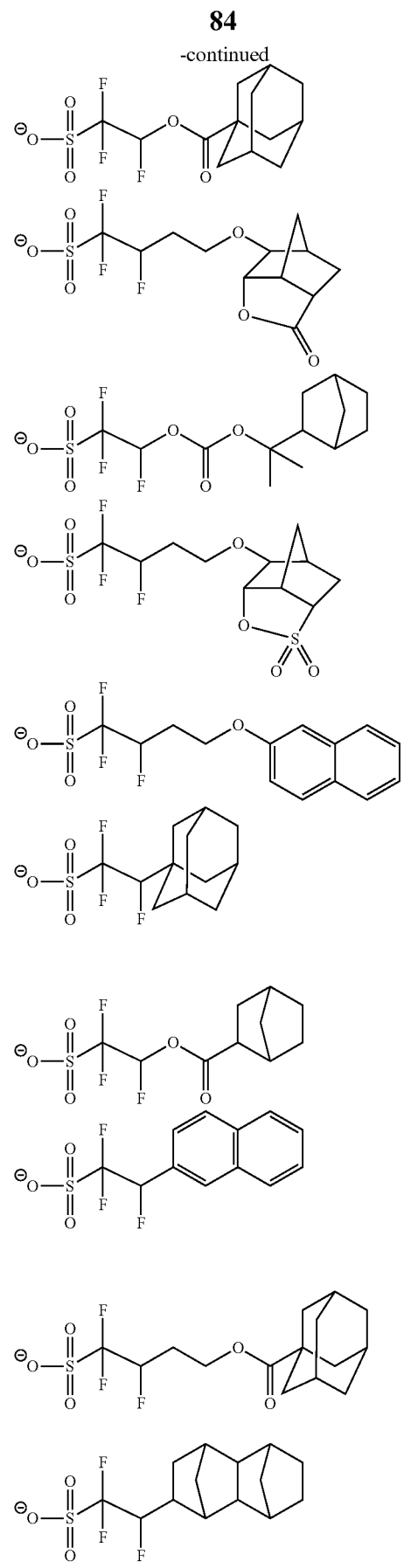

Next, the compound (B) represented by general formula (B-2) below will be described.

[Chem. 35]

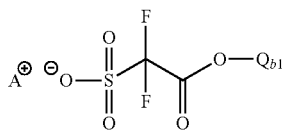

(B-2)

In general formula (B-2) above, $A^+$ represents a sulfonium cation or an iodonium cation.

$Q_{b1}$ represents a group having a lactone structure, a group having a sultone structure or a group having a cyclic carbonate structure.

Examples of the lactone structure and the sultone structure for $Q_{b1}$ include the same ones as the lactone structure and sultone structure in the repeating unit having a lactone structure and sultone structure described above for the resin (P). Specifically, examples include the lactone structure represented by any of general formula (LC1-1) to (LC1-17) above or the sultone structure represented by any of general formula (SL1-1) to (SL1-3) above.

The lactone structure or sultone structure may be directly bonded to the oxygen atom of the ester group in the general formula (B-2) above; however, the lactone structure or sultone structure may be bonded to the oxygen atom of the ester group via an alkylene group (for example, a methylene group and an ethylene group). In this case, the group having a lactone structure or sultone structure can be an alkyl group having the lactone structure or sultone structure as a substituent.

The cyclic carbonate structure for $Q_{b1}$ is preferably a cyclic carbonate structure with a 5- to 7-membered ring, and examples thereof include a 1,3-dioxolan-2-one, or 1,3-dioxane-2-one.

The cyclic carbonate structure may be directly bonded to the oxygen atom of the ester group in general formula (B-2) above; however, the cyclic carbonate structure may be bonded to the oxygen atom of the ester group via an alkylene group (for example, a methylene group and an ethylene group). In this case, the group having a cyclic carbonate structure can be an alkyl group having a cyclic carbonate structure as a substituent.

Specific examples of the anion structure in the compound (B) represented by general formula (B-2) are provided below; however, the present invention is not limited thereto.

[Chem. 36]

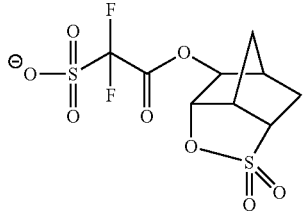

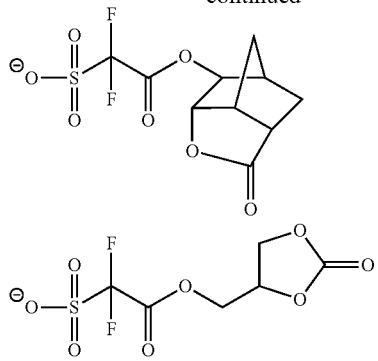

Next, the compound (B) represented by general formula (B-3) below will be described.

[Chem. 37]

(B-3)

$A^{\oplus} \ ^{\ominus}O-\overset{O}{\underset{O}{\overset{\|}{S}}}-\overset{F}{\underset{F}{C}}-\overset{O}{\overset{\|}{C}}-O-L_{b2}-X_{b2}-Q_{b2}$ In general formula (B-3) above, $A^+$ represents a sulfonium cation or an iodonium cation.

$L_{b2}$ represents an alkylene group with 1 to 6 carbon atoms, and examples thereof include a methylene group, an ethylene group, a propylene group or a butylene group. Among these, an alkylene group with 1 to 4 carbon atoms is preferred.

$X_{b2}$ represents an ether bond or an ester bond (—OCO— or —COO—).

$Q_{b2}$ represents an alicyclic group or a group containing an aromatic ring.

The alicyclic group for $Q_{b2}$ may be monocyclic, or may be polycyclic. Examples of the monocyclic alicyclic group include monocyclic cycloalkyl groups, such as a cyclopentyl group, a cyclohexyl group, and a cyclooctyl group. Examples of the polycyclic alicyclic group include polycyclic cycloalkyl groups, such as a norbornyl group, a tricyclodecanyl group, a tetracyclodecanyl group, a tetracyclododecanyl group, and an adamantyl group. Among these, an alicyclic group having a bulky structure with 7 or more carbon atoms, such as a norbornyl group, a tricyclodecanyl group, a tetracyclodecanyl group, a tetracyclododecanyl group, and an adamantyl group is preferred.

The aromatic ring in the group containing an aromatic ring for $Q_{b2}$ is preferably an aromatic ring with 6 to 20 carbon atoms, and examples include a benzene ring, a naphthalene ring, a phenanthrene ring and an anthracene ring. Among these, a benzene ring or a naphthalene ring is preferred. The aromatic ring may be substituted by at least one fluorine atom, and examples of the aromatic ring substituted with at least one fluorine atoms include a perfluorophenyl group.

The aromatic ring may be directly bonded to $X_{b2}$; however, the aromatic ring may be bonded to $X_{b2}$ via an alkylene group (for example, a methylene group or an ethylene group). In this case, the group containing an aromatic ring can be an alkyl group having the aromatic ring as a substituent.

Specific examples of the anion structure in the compound (B) represented by general formula (B-3) are provided below; however, the present invention is not limited thereto.

[Chem. 38]

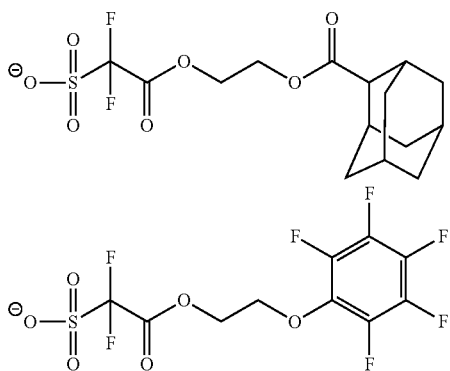

In general formula (B-1) to (B-3) above,
A⁺ is preferably a sulfonium cation in general formula (ZI) above or an iodonium cation in general formula (ZII) above. Specific examples of the A⁺ are the same as the specific examples shown for general formula (ZI) above and general formula (ZII) above.

Among the acid generators, compounds represented by general formula (B-1) to (B-3) are more preferable, and compounds represented by general formula (B-1) are particularly preferable.

Furthermore, the acid generator is preferably a compound capable of generating an acid having one of a sulfonic acid group or an imide group, more preferably a compound capable of generating a monovalent perfluoroalkanesulfonic acid, a compound capable of generating an aromatic sulfonic acid substituted with a monovalent fluorine atom or a fluorine atom-containing group, or a compound capable of generating an imide acid substituted with a monovalent fluorine atom or a fluorine atom-containing group, and still more preferably a sulfonium salt of a fluoro-substituted alkanesulfonic acid, fluorine-substituted benzenesulfonic acid, fluorine-substituted imide acid or fluorine-substituted methide acid. The usable acid generator is particularly preferably a fluorine-substituted alkanesulfonic acid, fluorine-substituted benzenesulfonic acid or fluorine-substituted imide acid in which the generated acid has a pKa of −1 or less, thereby improving sensitivity.

Particularly preferred examples of the acid generator are shown below.

[Chem. 39-1]

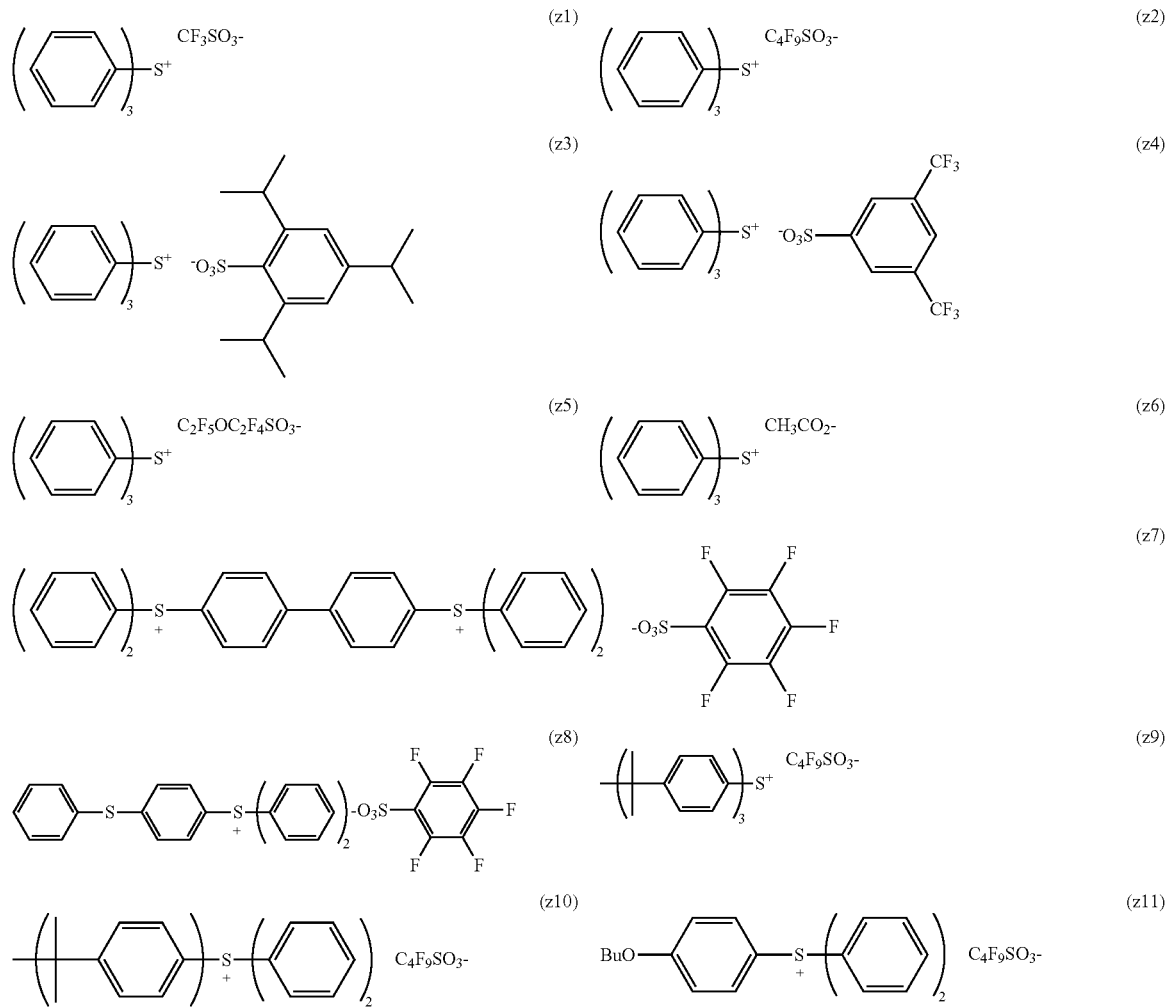

-continued
(z12) 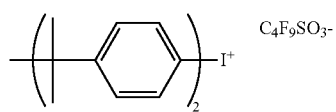
(z13) 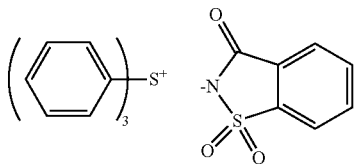
(z14) 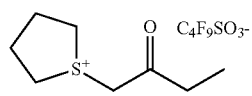
(z15) 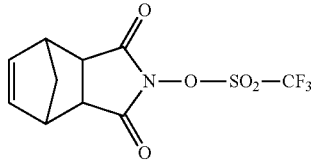
(z16) 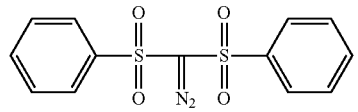
(z17) 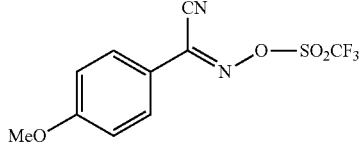
(z18) 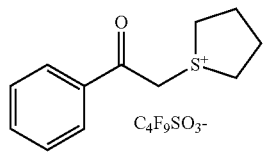
(z19) 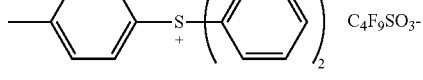
(z20) 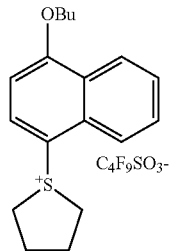
(z21) 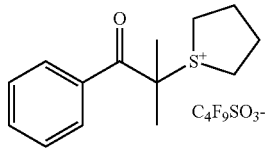
(z22) 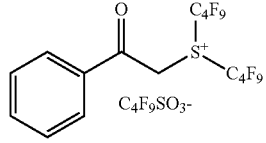
(z23) 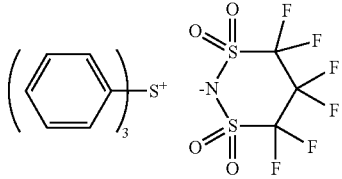
(z24) 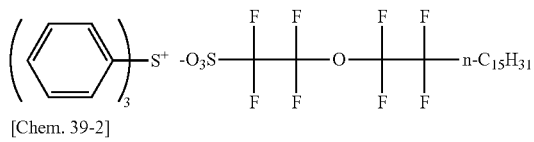
[Chem. 39-2]
(z25) 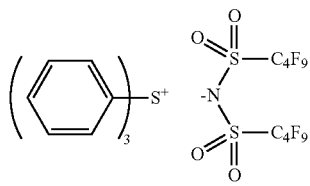
(z26) 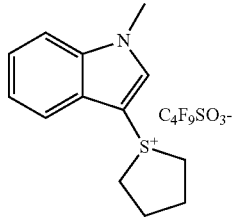
(z27) 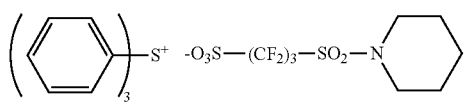
(z28) 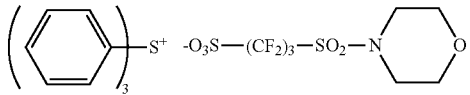

-continued
(z29) 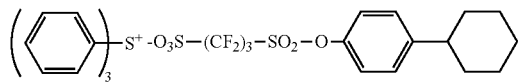
(z30) 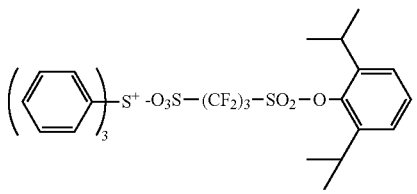
(z31) 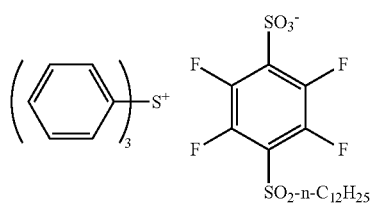
(z32) 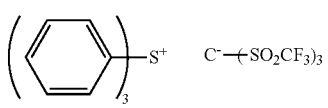
(z33) 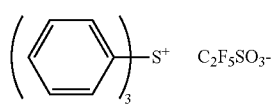
(z34) 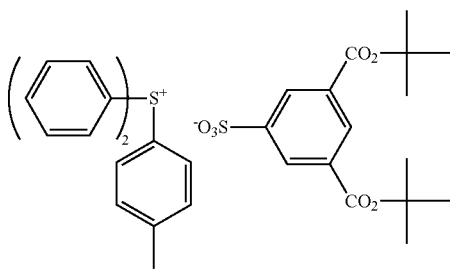
(z35) 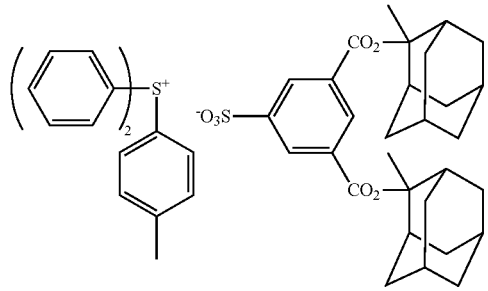
(z36) 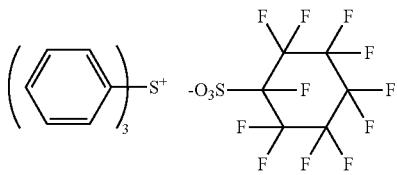
(z37) 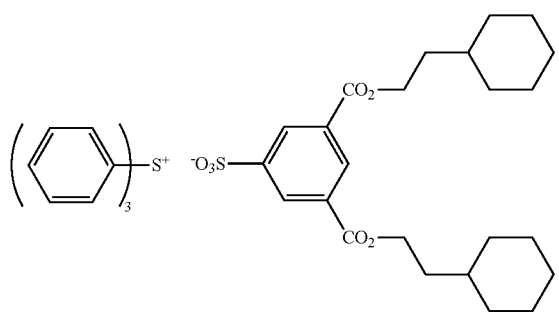
(z38) 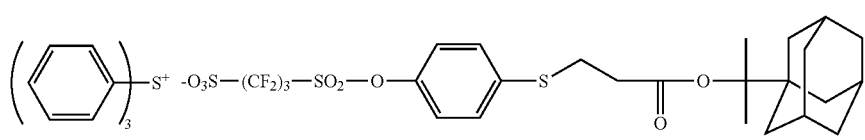
(z39) 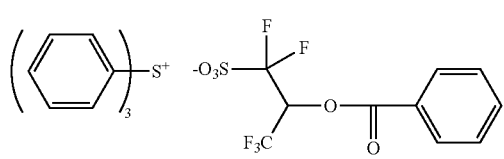

[Chem. 39-3]
(z40) 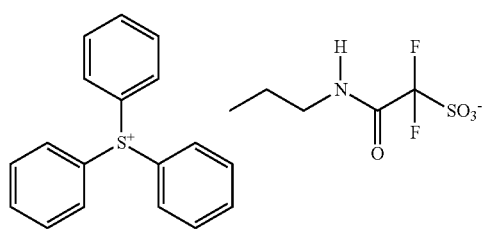
(z41) 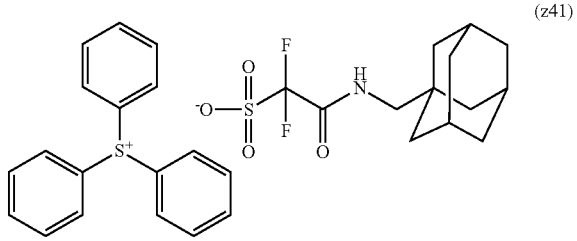
(z42) 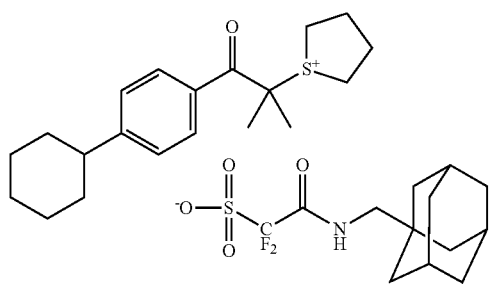
(z43) 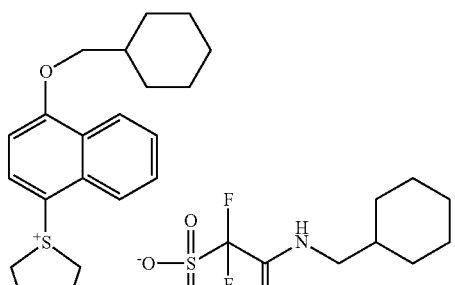
(z44) 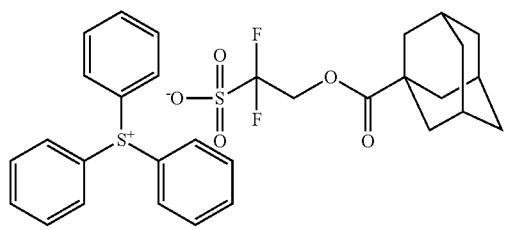
(z45) 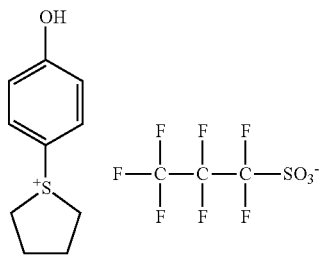
(z46) 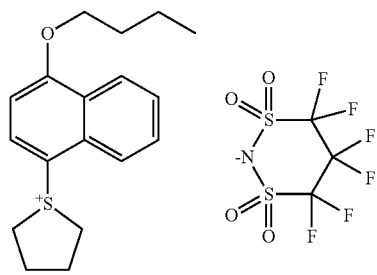
(z47) 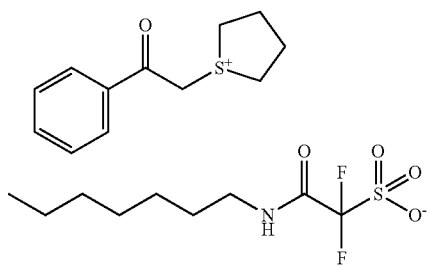
(z48) 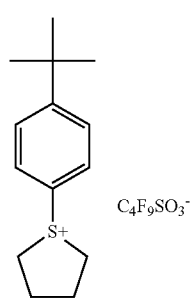
(z49) 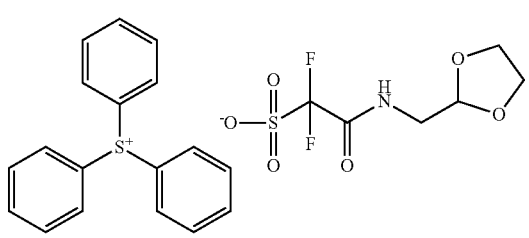

-continued
(z50)
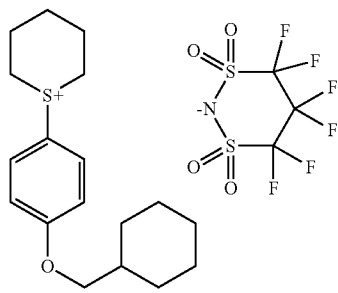
(z51)
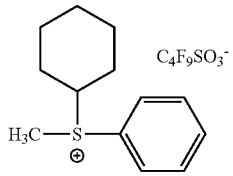
(z52)
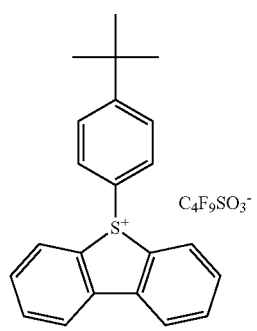
(z53)
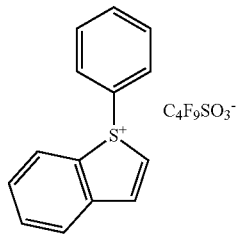
(z54)
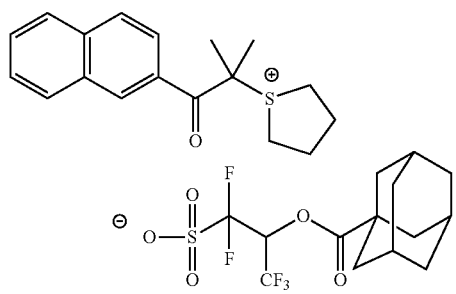
[Chem. 39-4]
(z55)
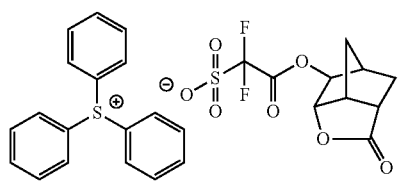
(z56)
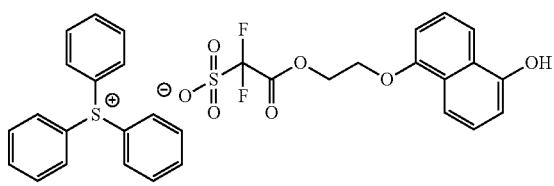
(z57)
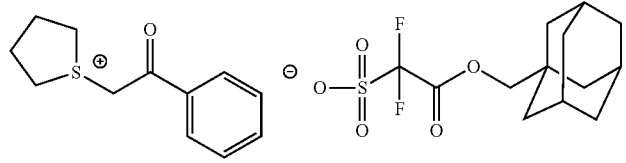
(z58)
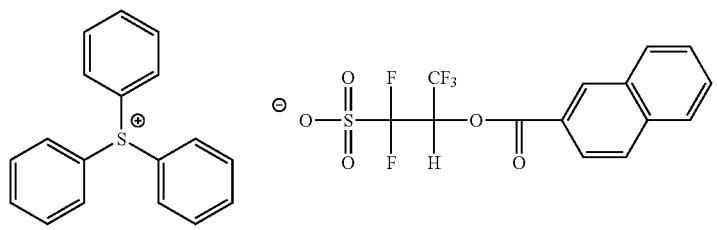

(z59) 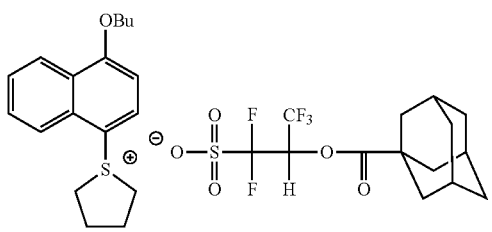
(z60) 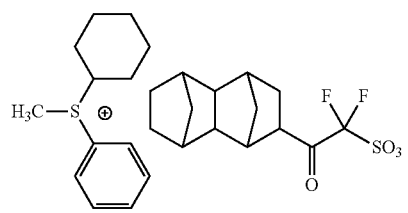
(z61) 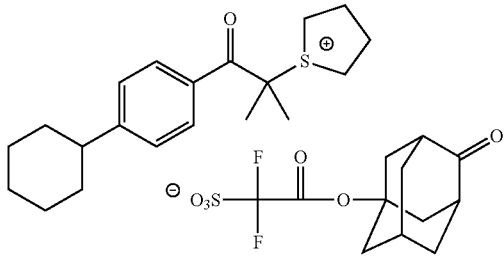
(z62) 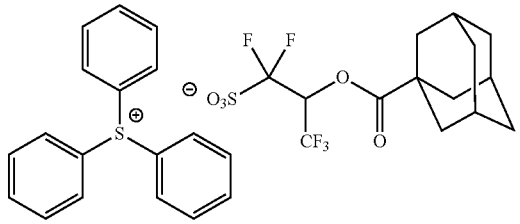
(z63) 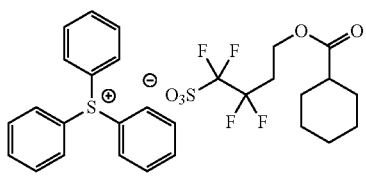
(z64) 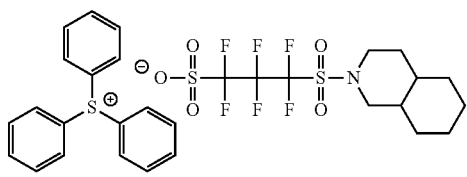
(z65) 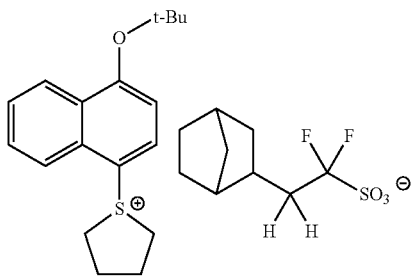
(z66) 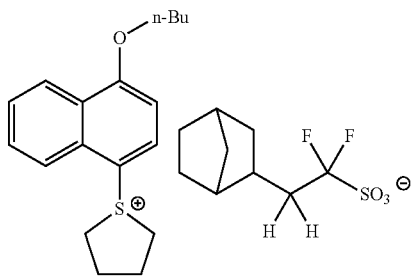
[Chem. 39-5]
(z67) 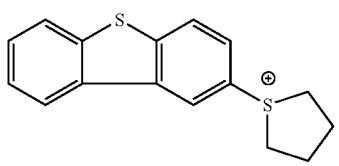 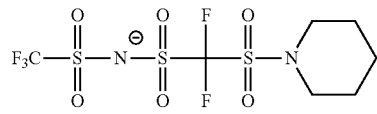
(z68) 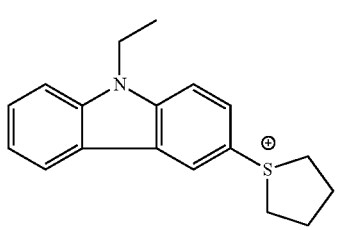 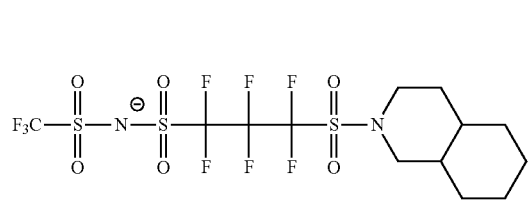
(z69) 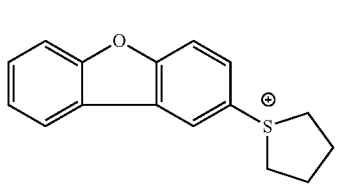 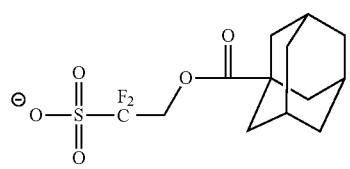

-continued
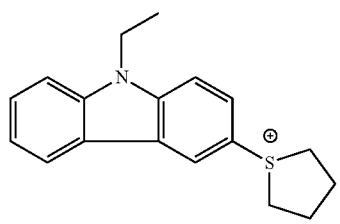 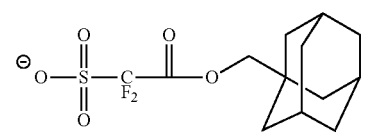
(z70)
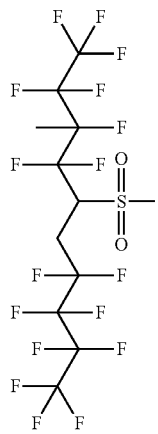 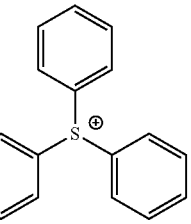
(z71)
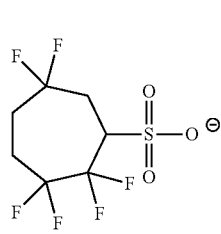 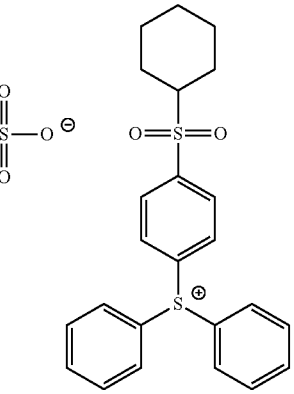
(z72)
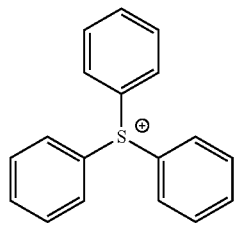 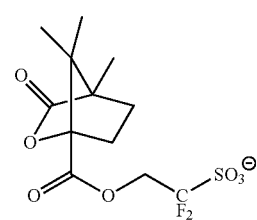
(z73)
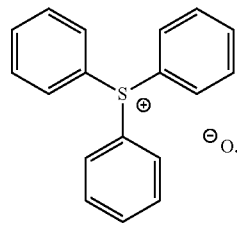 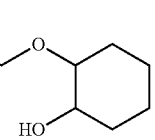
(z74)
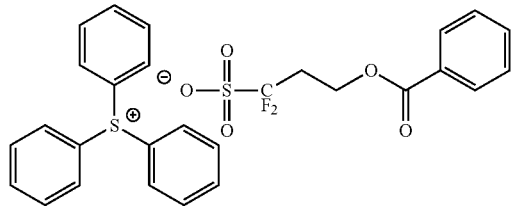
(z75)
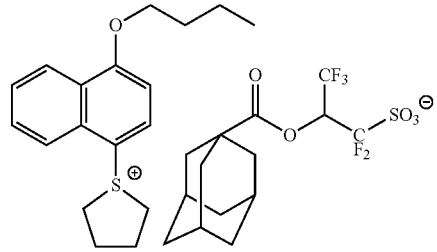
(z76)
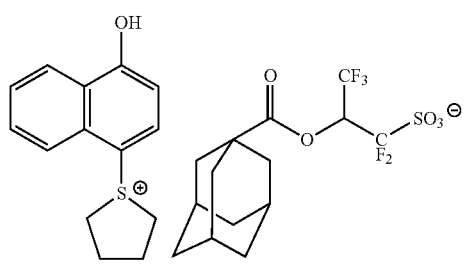
(z77)

-continued
[Chem. 39-6]
(z78)
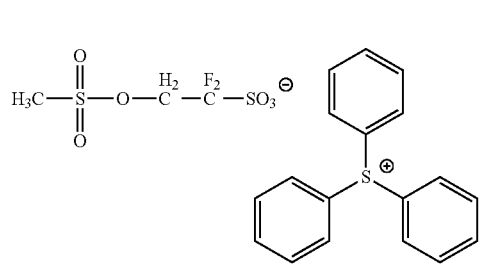
(z79)
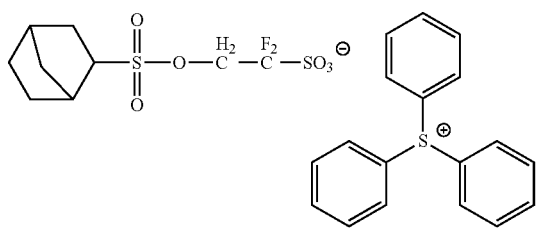
(z80)
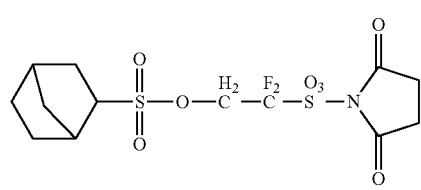
(z81)
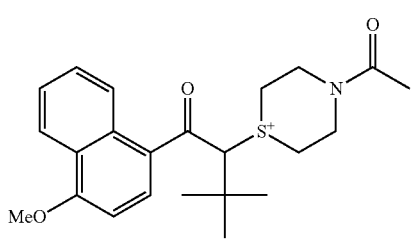
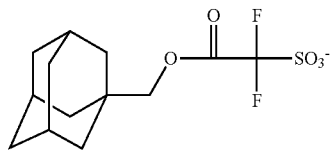
(z82)
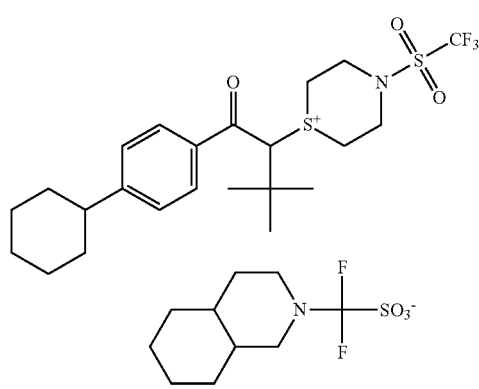
(z83)
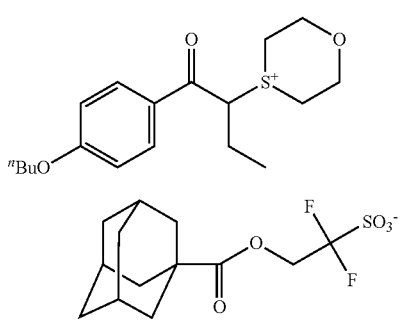
(z84)
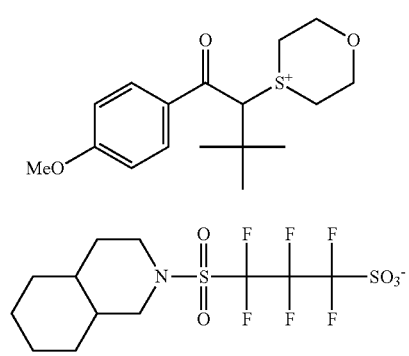
(z85)
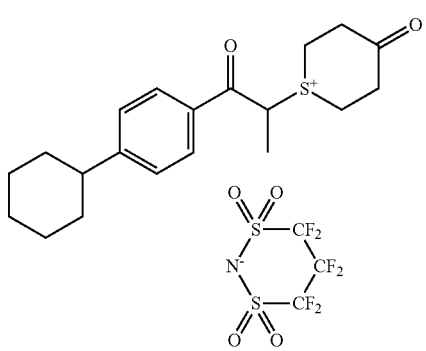

-continued
(z86)
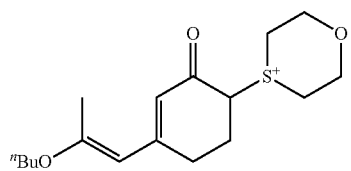
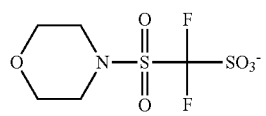
(z87)
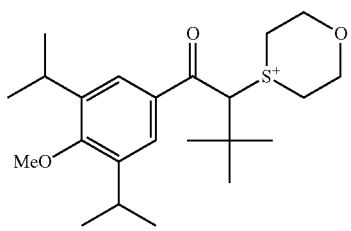
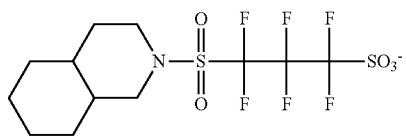
(z88)
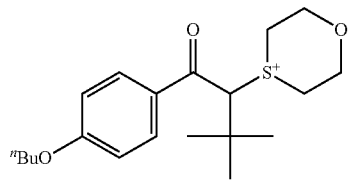
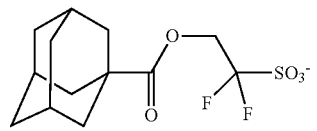
[Chem. 39-7]
(z89)
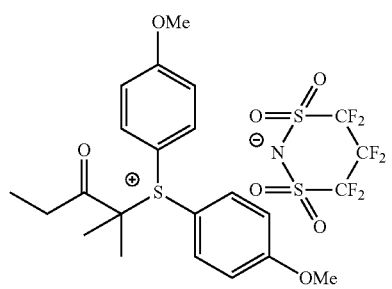
(z90)
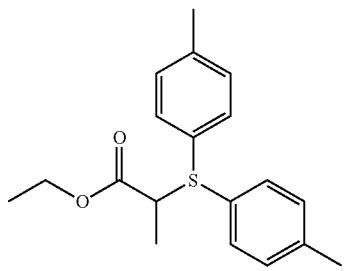
C$_4$F$_9$SO$_3$
(z91)
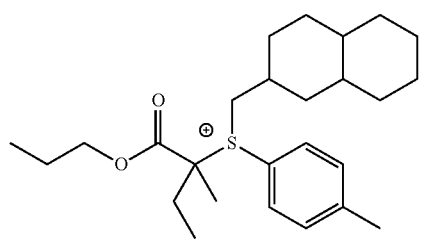
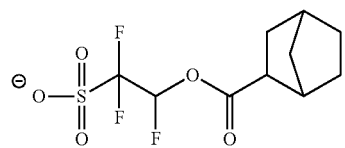
(z92)
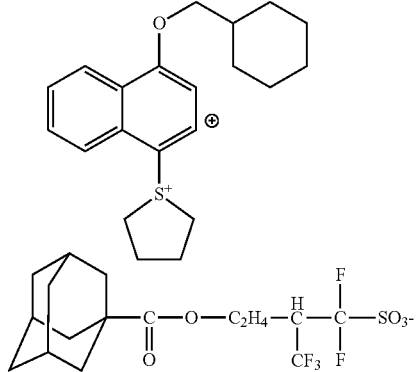

-continued
(z93)
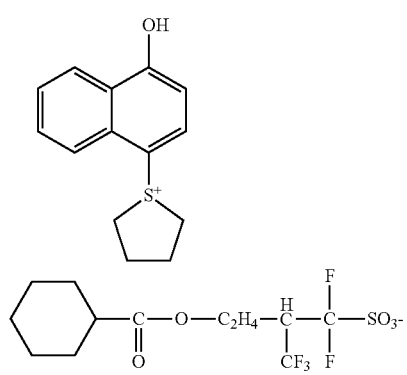
(z94)
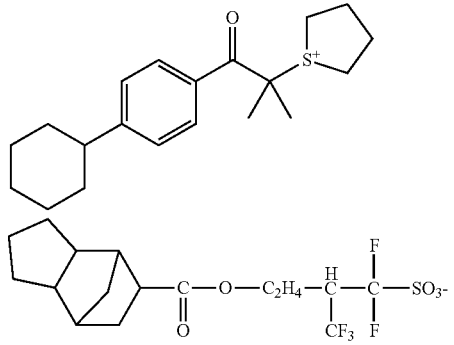
(z95)
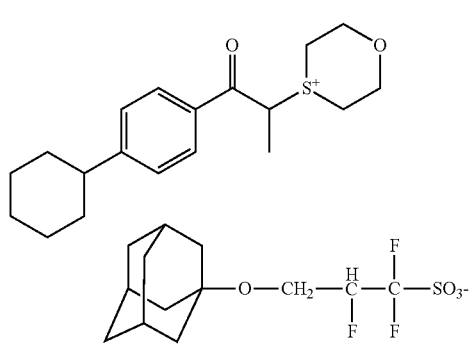
(z96)
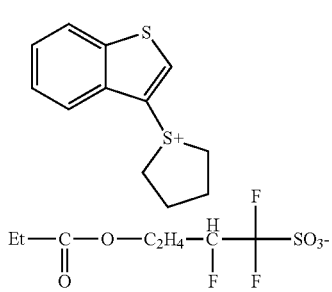
(z97)
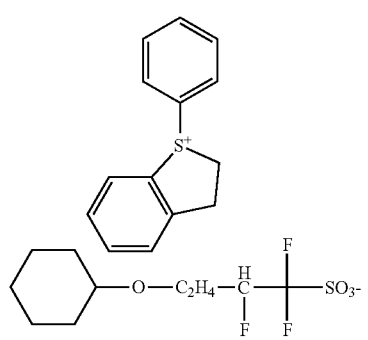
(z98)
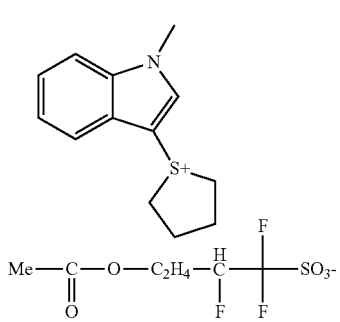
(z99)
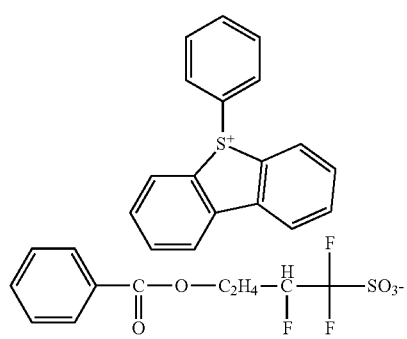

[Chem. 39-8]
(z100)
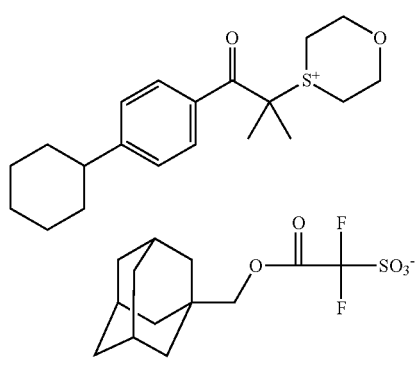
(z101)
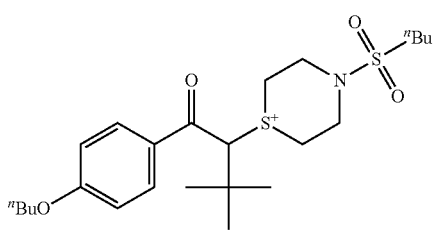
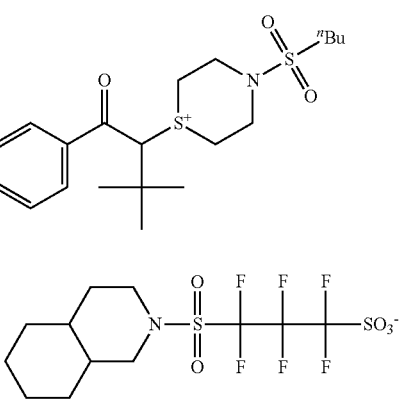
(z102)
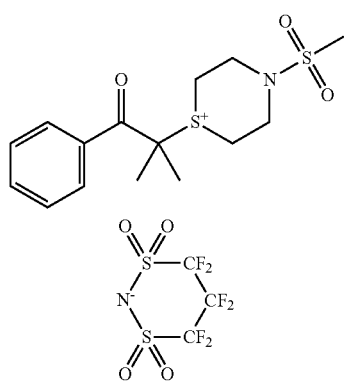
(z103)
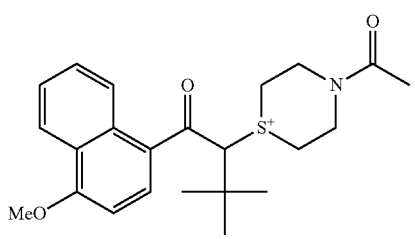
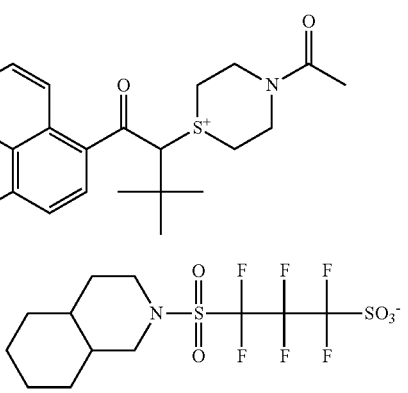
(z104)
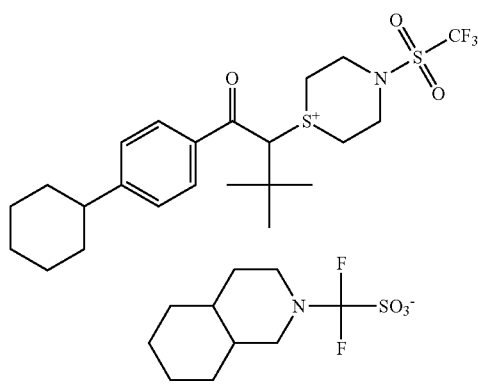
(z105)
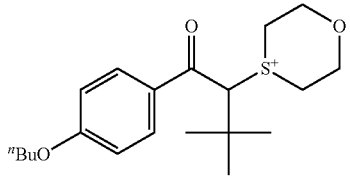
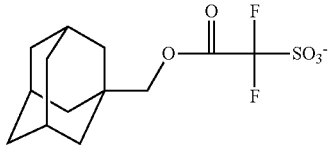
(z106)
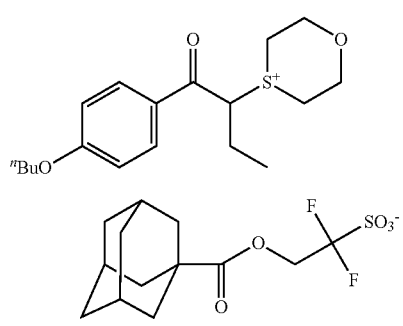
(z107)
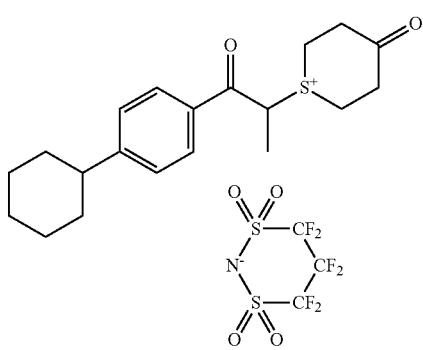

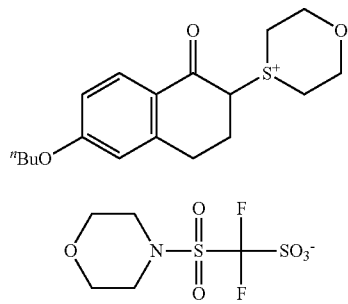

(z108)

The acid generator can be synthesized by a known method, for example, can be synthesized in accordance with the method described in JP2007-161707A.

As for the acid generator, one kind may be used independently, or two or more kinds may be used in combination.

The content of the compound capable of generating an acid upon irradiation with actinic rays or radiation in the composition is preferably from 0.1 mass % to 30 mass %, more preferably from 0.5 mass % to 25 mass %, still more preferably from 3 mass % to 20 mass %, and particularly preferably from 3 mass % to 15 mass %, based on the total solid contents of the actinic ray-sensitive or radiation-sensitive resin composition.

Furthermore, in the case where the acid generator is represented by the general formula (ZI-3) or (ZI-4), the content thereof is preferably from 5 mass % to 35 mass %, more preferably from 8 mass % to 30 mass %, still more preferably from 9 mass % to 30 mass %, and particularly preferably from 9 mass % to 25 mass %, based on the total solid contents of the composition.

[4] Solvent (C)

The actinic ray-sensitive or radiation-sensitive resin composition of the present invention can contain a solvent. Examples of the solvent which can be used at the time of preparing the actinic ray-sensitive or radiation-sensitive resin composition in the invention include an organic solvent such as alkylene glycol monoalkyl ether carboxylate, alkylene glycol monoalkyl ether, alkyl lactate, alkyl alkoxypropionate, cyclic lactone (preferably having 4 to 10 carbon atoms), monoketone compound (preferably having 4 to 10 carbon atoms) which may contain a ring, alkylene carbonate, alkyl alkoxyacetate, and alkyl pyruvate.

Specific examples of these solvents are the same as those described in US Patent App. No. 2008/0187860.

In the invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably, for example, an alkylene glycol monoalkyl ether or an alkyl lactate, more preferably propylene glycol monomethyl ether (PGME, alternative name, 1-methoxy-2-propanol), or ethyl lactate. Further, the solvent not containing a hydroxyl group is preferably, for example, an alkylene glycol monoalkyl ether acetate, an alkyl alkoxypropionate, a monoketone compound which may contain a ring, a cyclic lactone or an alkyl acetate, among these, particularly preferably propylene glycol monomethyl ether acetate (PGMEA, alternative name, 1-methoxy-2-acetoxy propane), ethyl ethoxypropionate, 2-heptanone, γ-butyrolactone, cyclohexanone, or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, and more preferably from 20/80 to 60/40. A mixed solvent in which the solvent not containing a hydroxyl group is contained in an amount of 50 mass % or more is particularly preferred in view of coating uniformity.

The solvent preferably contains propylene glycol monomethyl ether acetate, and preferably a solvent of propylene glycol monomethyl ether acetate alone, or a mixed solvent of two or more kinds containing propylene glycol monomethyl ether acetate.

[5] Hydrophobic Resin (HR)

The actinic ray-sensitive or radiation-sensitive resin composition of the present invention, particularly when applied to immersion exposure, may contain a hydrophobic resin (hereinafter, also referred to as "hydrophobic resin (HR)") having at least either a fluorine atom or a silicon atom. By this, the hydrophobic resin (FIR) is unevenly distributed to the surface layer of the film and when the immersion medium is water, the static/dynamic contact angle on the resist film surface for water as well as the followability of liquid for liquid immersion can be enhanced.

The hydrophobic resin (HR) is, as described above, unevenly distributed in the interface; however, different to a surfactant, the resin need not necessarily have a hydrophilic group in the molecule, and may not contribute to uniform mixing of polar/nonpolar substances.

The hydrophobic resin typically contains a fluorine atom and/or a silicon atom. Such a fluorine atom and/or a silicon atom in the hydrophobic resin (HR) may be contained in the main chain of the resin or contained in the side chain.

In the case where the hydrophobic resin contains a fluorine atom, the resin preferably contains, as the fluorine atom-containing partial structure, a fluorine atom-containing alkyl group, a fluorine atom-containing cycloalkyl group or a fluorine atom-containing aryl group.

The alkyl group having a fluorine atom is a linear or branched alkyl group with at least one hydrogen atom being substituted with a fluorine atom, preferably has 1 to 10 carbon atoms, and more preferably has 1 to 4 carbon atoms. The group may further have another substituent.

The cycloalkyl group having a fluorine atom is a monocyclic or polycyclic cycloalkyl group in which at least one hydrogen atom is substituted with a fluorine atom, and may further have another substituent.

The fluorine atom-containing aryl group is an aryl group with at least one hydrogen atom being substituted by a fluorine atom. Examples of this aryl group include a phenyl group and a naphthyl group. The fluorine atom-containing aryl group may further have another substituent.

Examples of the fluorine atom-containing alkyl group, the fluorine atom-containing cycloalkyl group, or the fluorine atom-containing aryl group include the groups represented by any of the following general formula (F2) to (F4), but the invention is not limited thereto.

[Chem. 40]

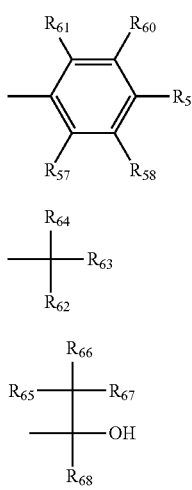

In general formula (F2) to (F4), $R_{57}$ to $R_{68}$ each independently represent a hydrogen atom, a fluorine atom, or an (linear or branched) alkyl group, provided that at least one of $R_{57}$ to $R_{61}$, at least one of $R_{62}$ to $R_{64}$, and at least one of $R_{65}$ to $R_{68}$ represent a fluorine atom or an alkyl group (preferably 1 to 4 carbon atoms) with at least one hydrogen atom substituted with a fluorine atom.

It is preferable that all of $R_{57}$ to $R_{61}$ and $R_{65}$ to $R_{67}$ be each a fluorine atom. $R_{62}$, $R_{63}$ and $R_{68}$ are preferably fluoroalkyl groups (preferably with 1 to 4 carbon atoms), and a perfluoroalkyl group with 1 to 4 carbon atoms is more preferable. When $R_{62}$ and $R_{63}$ are perfluoroalkyl groups, $R_{64}$ is preferably a hydrogen atom. $R_{62}$ and $R_{63}$ may be linked to each other to form a ring.

Specific examples of the group represented by the general formula (F2) include a p-fluorophenyl group, a pentafluorophenyl group, and a 3,5-di(trifluoromethyl)phenyl group. Specific examples of the group represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Among these, a hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferred, and a hexafluoroisopropyl group and a heptafluoroisopropyl group are more preferred.

Specific examples of the group represented by the general formula (F4) include —C(CF$_3$)$_2$OH, —C(C$_2$F$_5$)$_2$OH, —C(CF$_3$)(CH$_3$)OH, and —CH(CF$_3$)OH, and among these, —C(CF$_3$)$_2$OH is preferred.

The fluorine atom-containing partial structure may be bonded directly to the main chain or may be bonded to the main chain via a group selected from the group consisting of an alkylene group, a phenylene group, an ether bond, a thioether bond, a carbonyl group, an ester bond, an amide bond, a urethane bond and a ureylene bond, or a group formed by the combination of two or more thereof.

Preferred examples of the repeating units having a fluorine atom are shown below.

[Chem. 41]

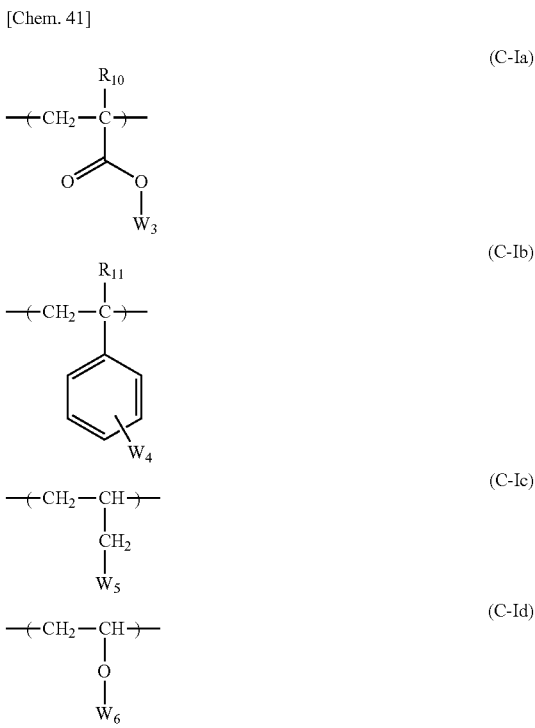

In the formula (C-Ia) to (C-Id), $R_{10}$ and $R_{11}$ each independently represent a hydrogen atom, a fluorine atom or an alkyl group. The alkyl group is preferably a linear or branched alkyl group having 1 to 4 carbon atoms and may have a substituent, and the alkyl group having a substituent includes, in particular, a fluorinated alkyl group.

$W_3$ to $W_6$ each independently represent an organic group having at least one or more fluorine atoms and specifically includes the atomic groups of (F2) to (F4) above.

Furthermore, other than these, the hydrophobic resin may contain a unit as shown below as the repeating units having a fluorine atom.

[Chem. 42]

-continued (C-III)

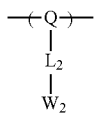

In the formula (C-II) and (C-III), $R_4$ to $R_7$ each independently represent a hydrogen atom, a fluorine atom or an alkyl group. The alkyl group is preferably a linear or branched alkyl group having 1 to 4 carbon atoms and may have a substituent, and the alkyl group having a substituent includes, in particular, a fluorinated alkyl group.

Incidentally, at least one of $R_4$ to $R_7$ represents a fluorine atom. $R_4$ and $R_5$, or $R_6$ and $R_7$ may form a ring.

$W_2$ represents an organic group having at least one fluorine atom and specifically includes the atomic groups of (F2) to (F4) above.

$L_2$ represents a single bond or a divalent linking group. The divalent linking group is a substituted or unsubstituted arylene group, a substituted or unsubstituted alkylene group, a substituted or unsubstituted cycloalkylene group, —O—, —SO$_2$—, —CO—, —N(R)— (wherein R represents a hydrogen atom or an alkyl group), —NHSO$_2$—, or a divalent linking group formed by the combination of a plurality of these groups.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having 3 to 8 carbon atoms, and examples thereof include a cyclopentyl group, a cyclohexyl group, a cyclobutyl group and a cyclooctyl group. Examples of the polycyclic structure include a group containing a bicyclo, tricyclo or tetracyclo structure having 5 or more carbon atoms. A cycloalkyl group having 6 to 20 carbon atoms is preferred, and examples thereof include an adamantyl group, a norbornyl group, a dicyclopentyl group, a tricyclodecanyl group and a tetracyclododecyl group. Further, at least one carbon atom in the cycloalkyl group may be substituted with a heteroatom such as an oxygen atom. In particular, preferred examples of Q include a norbornyl group, a tricyclodecanyl group, and a tetracyclododecyl group.

The hydrophobic resin may contain a silicon atom.

The resin preferably has an alkyl silyl structure (preferably a trialkylsilyl group) or a cyclic siloxane structure as a partial structure having a silicon atom.

Specific examples of the alkyl silyl structure or cyclosiloxane structure include groups represented by the following formula (CS-1) to (CS-3):

[Chem. 43]

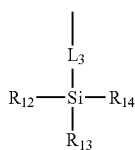

(CS-1)

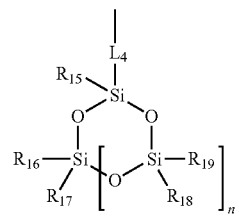

(CS-2)

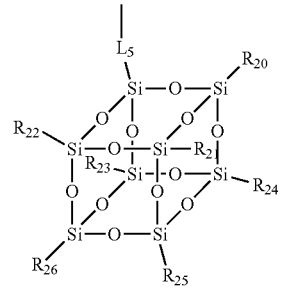

(CS-3)

In general formula (CS-1) to (CS-3), $R_{12}$ to $R_{26}$ each independently represent a linear or branched alkyl group (preferably having 1 to 20 carbon atoms) or a cycloalkyl group (preferably having 3 to 20 carbon atoms);

$L_3$ to $L_5$ each represent a single bond or a divalent linking group, Examples of the divalent linking group include a single group or a combination of two or more groups selected from a group formed of an alkylene group, a phenylene group, an ether bond, a thioether bond, a carbonyl group, an ester bond, an amide bond, a urethane bond or a ureylene bond.

and n represents an integer of 1 to 5, and is preferably an integer of 2 to 4.

The repeating unit having at least either a fluorine atom or a silicon atom is preferably a (meth)acrylate-based repeating unit.

Below, specific examples of repeating units having at least either a fluorine atom or a silicon atom are shown below; however, the present invention is not limited thereto. Moreover, in the specific examples, $X_1$ represents a hydrogen atom, —CH$_3$, —F or —CF$_3$, and $X_2$ represents —F or —CF$_3$.

[Chem. 44-1]

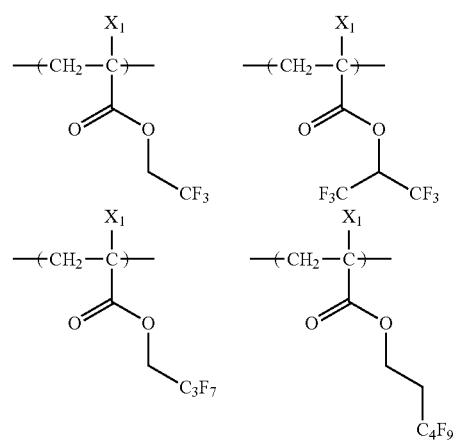

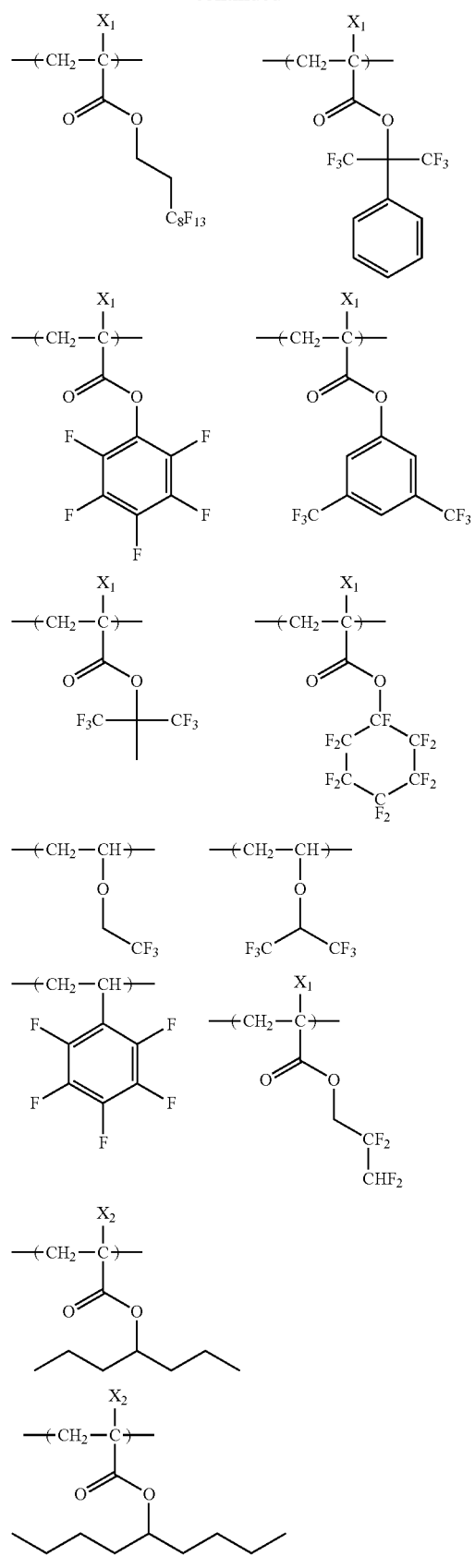
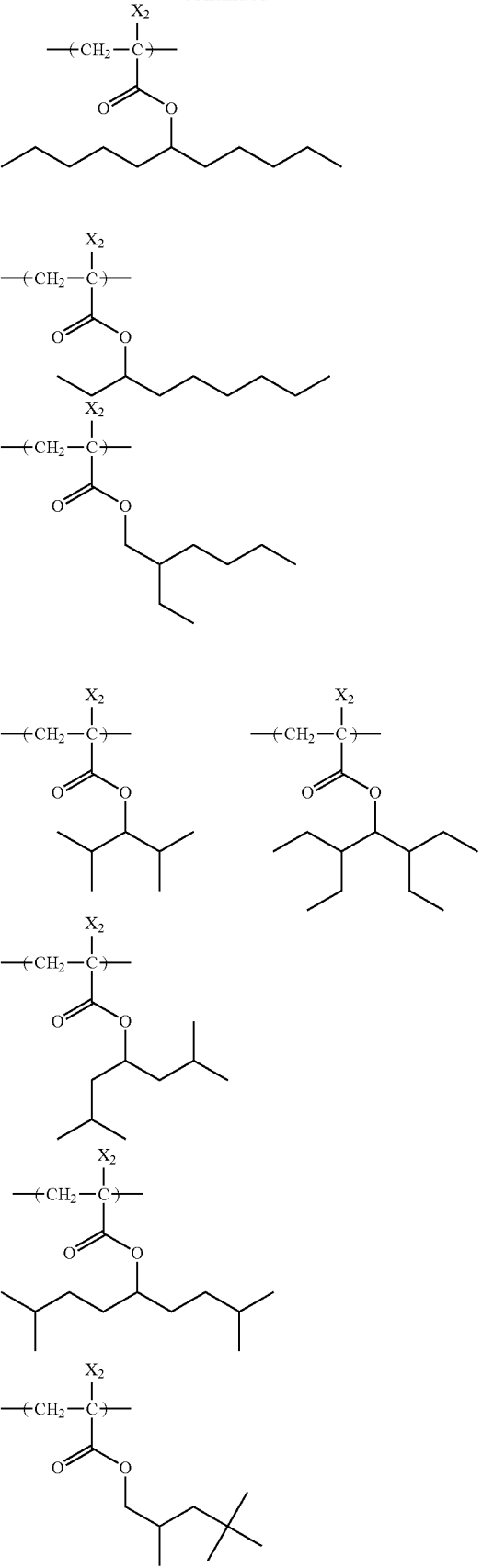

117
-continued
[Chem. 44-2]
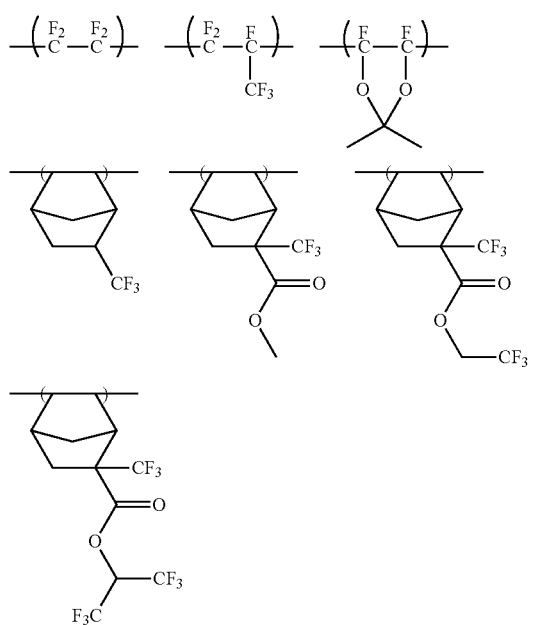
[Chem. 44-3]
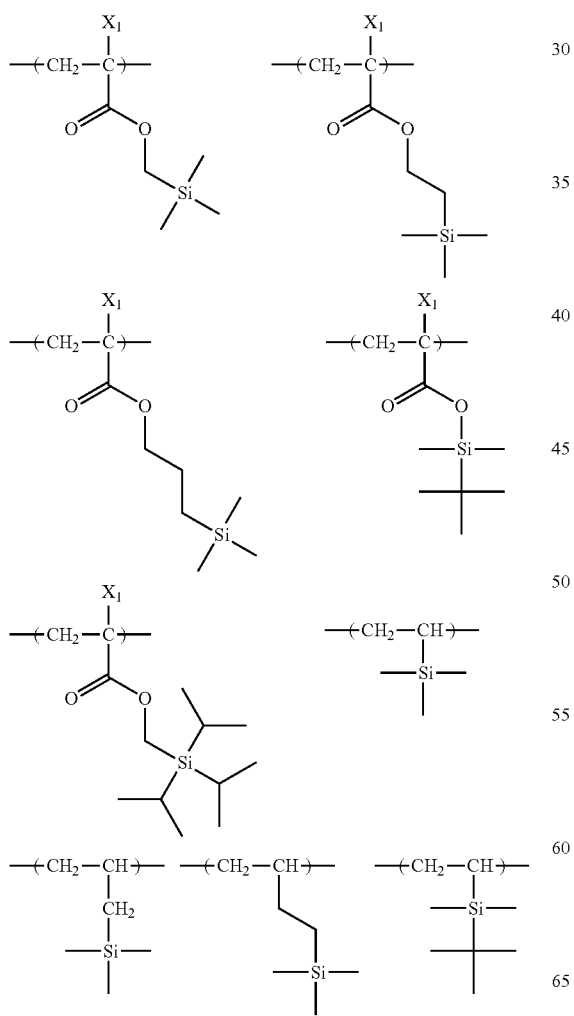
118
-continued
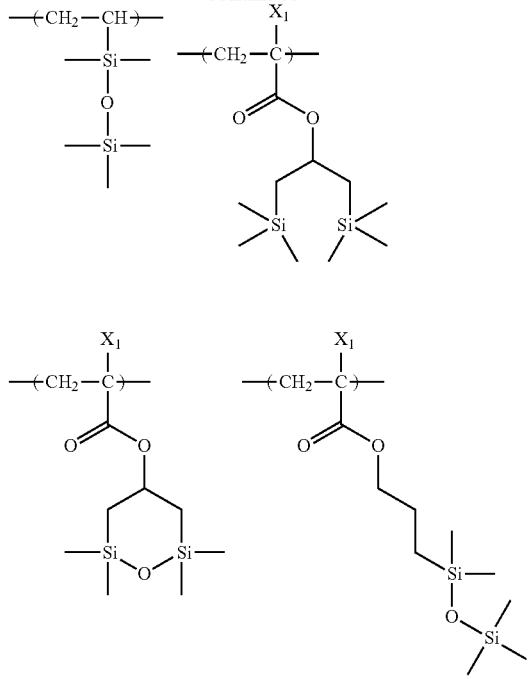
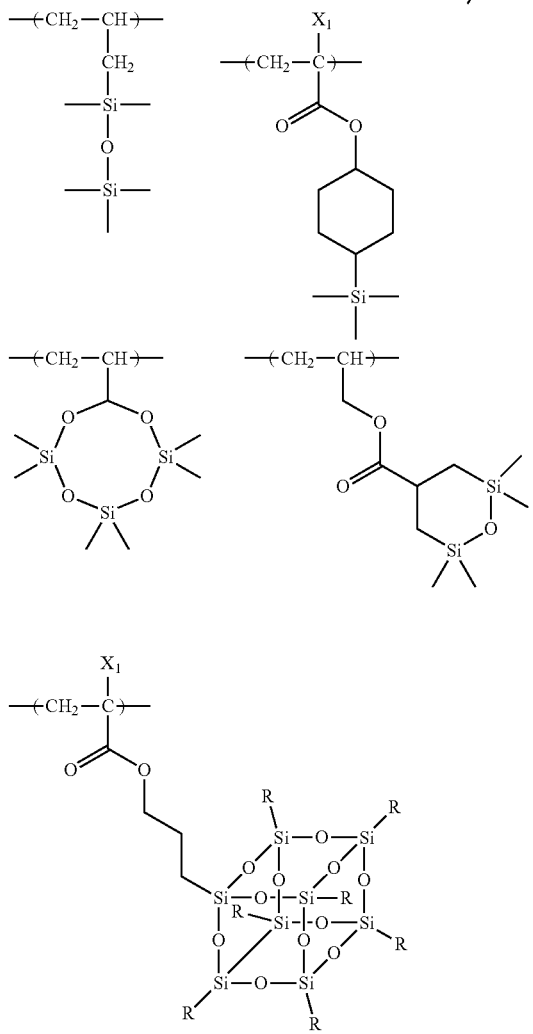
R = CH$_3$, C$_2$H$_5$, C$_3$H$_7$, C$_4$H$_9$ -continued

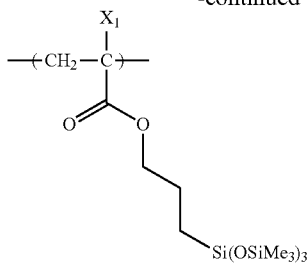

The hydrophobic resin preferably has a repeating unit (b) having at least one group selected from a group consisting of (x) to (z) below.
(x) an alkali soluble group
(y) a group increasing solubility with respect to an alkali developer by decomposing due to the action of an alkali developer (hereinafter, also referred to as a polarity conversion group)
(z) a group increasing solubility with respect to an alkali developer by decomposing due to the action of an acid
The repeating unit (b) includes the following types.
(b') a repeating unit having at least either of a fluorine atom or a silicon atom and at least one group selected from the group consisting of (x) to (z) above on one side chain,
(b*) a repeating unit having at least one group selected from the group consisting of (x) to (z) above and having neither a fluorine atom nor a silicon atom,
(b") a repeating unit having at least one group selected from the group consisting of (x) to (z) above on one side chain and having at least either of a fluorine atom or a silicon atom on a side chain different from the side chain above in the same repeating unit The hydrophobic resin more preferably has a repeating unit (b') as the repeating unit (b). That is, the repeating unit (b) having at least one group selected from the group consisting of (x) to (z) above more preferably contains at least either of a fluorine atom or a silicon atom.

Moreover, in a case where the hydrophobic resin has a repeating unit (b*), the resin is preferably a copolymer with a repeating unit having at least either of a fluorine atom or a silicon atom (a repeating unit different from the repeating units (b') and (b")). In addition, in the repeating unit (b"), the side chain having at least one group selected from the group consisting of (x) to (z) above and the side chain having at least either of a fluorine atom or a silicon atom are preferably bonded to the same carbon atom on the main chain, that is, have a positional relationship as in the following formula (K1).

In the formula, B1 represents a partial structure having at least one group selected from the group consisting of (x) to (z) above, and B2 represents a partial structure having at least either of a fluorine atom or a silicon atom.

[Chem. 45]

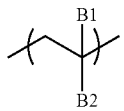

(K1)

The group selected from the group consisting of (x) to (z) above is preferably (x) an alkali-soluble group or (y) a polarity conversion group, and more preferably (y) a polarity conversion group.

Examples of the alkali-soluble group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Examples of preferable alkali-soluble groups include a fluorinated alcohol group (preferably, a hexafluoroisopropanol group), a sulfonimide group and a bis(carbonyl)methylene group.

Examples of the repeating unit (bx) having (x) an alkali-soluble group include a repeating unit in which an alkali-soluble group is directly bonded to the main chain of the resin, such as a repeating unit composed of an acrylic acid or a methacrylic acid, or a repeating unit in which an alkali-soluble group is bonded to the main chain of the resin via a linking group. Furthermore, an alkali-soluble group may be introduced into the polymer chain terminal using a polymerization initiator or a chain transfer agent having an alkali-soluble group during polymerization. Any of these cases are also preferred.

In a case where the repeating unit (bx) is a repeating unit having at least either of a fluorine atom or a silicon atom (that is, a case corresponding to the repeating unit (b') or (b")), examples of partial structure having a fluorine atom in the repeating unit (bx) are the same as those described for the repeating unit having at least either of a fluorine atom or a silicon atom. The groups represented by the general formula (F2) to (F4) are preferred. Also in this case, examples of a partial structure having a silicon atom in the repeating unit (bx) are the same as those described for the repeating unit having at least either of a fluorine atom or a silicon atom. The groups represented by the general formula (CS-1) to (CS-3) are preferred.

The content of the repeating unit (bx) having an alkali-soluble group (x) is preferably 1 mol % to 50 mol % with respect to all repeating units in the hydrophobic resin, more preferably 3 mol % to 35 mol %, and still more preferably 5 mol % to 20 mol %.

Specific examples of the repeating unit (bx) having (x) an alkali-soluble group are shown below; however, the present invention is not limited thereto. Moreover, in specific examples, $X_1$ represents a hydrogen atom, $—CH_3$, $—F$, or $—CF_3$.

[Chem. 46-1]

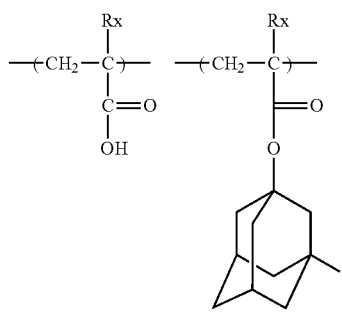

121
-continued
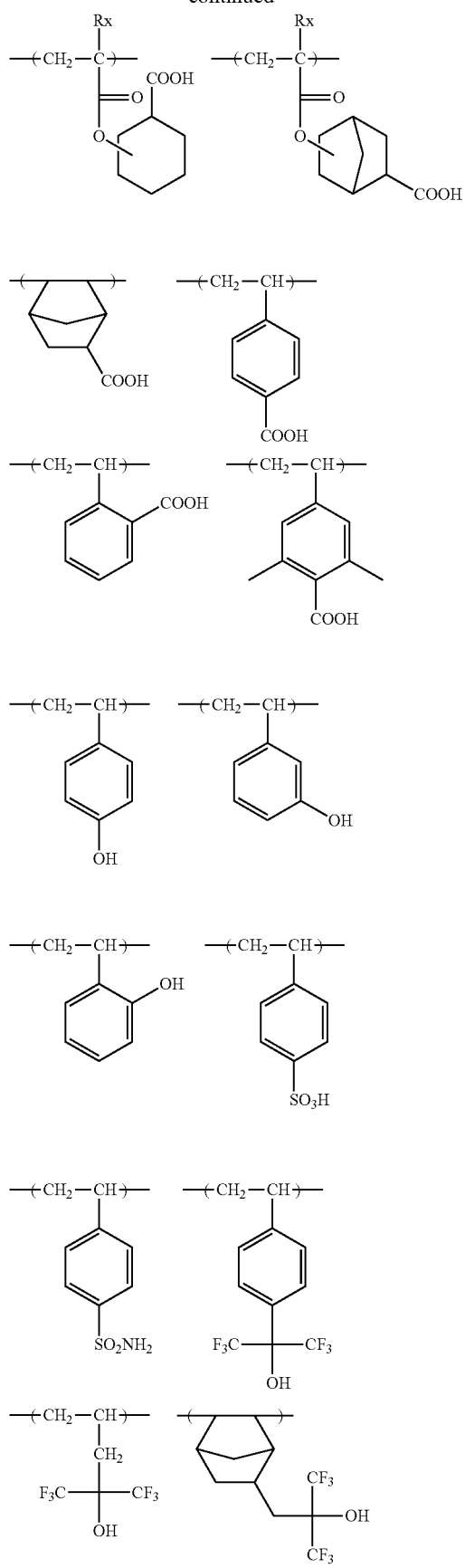
122
-continued
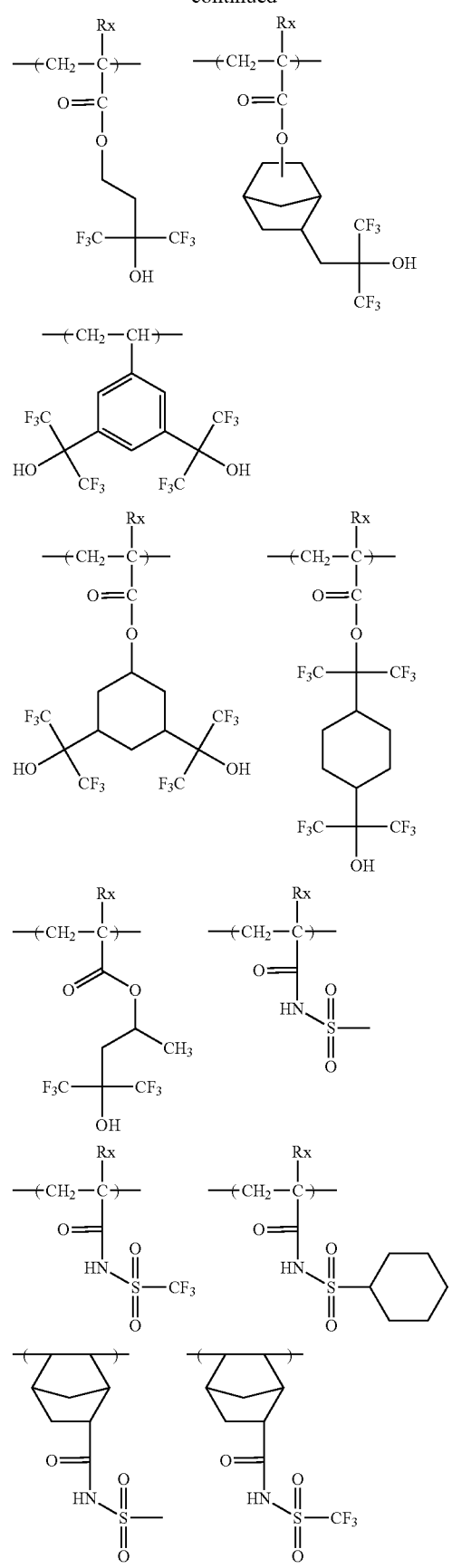

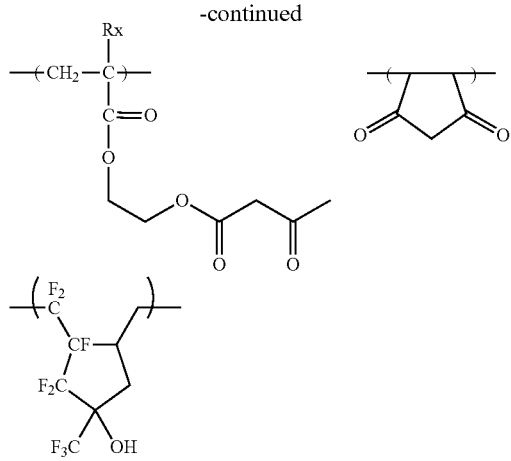

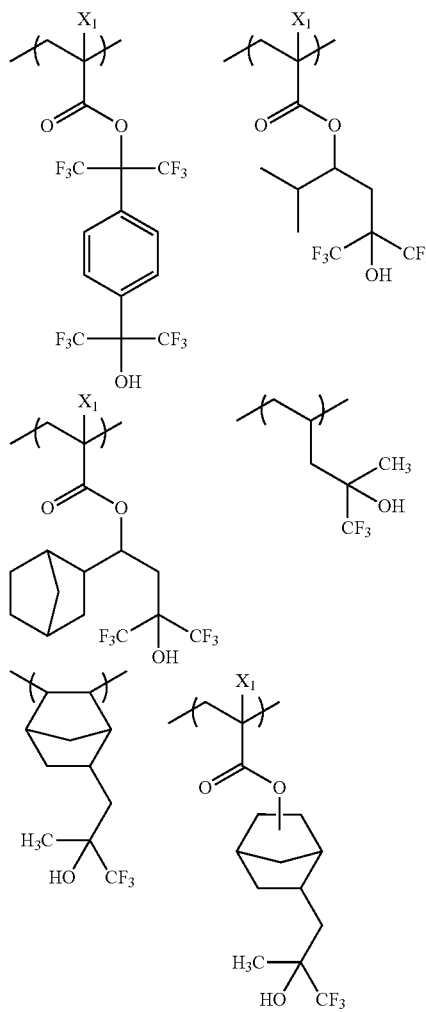

Examples of the polarity conversion group (y) include a lactone group, a carboxylic ester group (—COO—), an acid anhydride group (—C(O)OC(O)—), an acid imide group (—NHCONH—), a carboxylic thioester group (—COS—), a carbonic ester group (—OC(O)O—), a sulfuric ester group (—OSO$_2$O—) and a sulfonic ester group (—SO$_2$O—). Among these, a lactone group is preferred.

As for the polarity conversion group (y), either of a configuration where the polarity conversion group is contained in a repeating unit formed of an acrylic acid ester or a methacrylic acid ester and thereby is introduced into the side chain of the resin, or a configuration where the polarity conversion group is introduced into the polymer chain terminal using a polymerization initiator or chain transfer agent having the polarity conversion group (y) during polymerization is preferred.

Specific examples of the repeating unit (by) having a polarity conversion group (y) include repeating units having a lactone structure represented by formula (KA-1-1) to (KA-1-17) described later.

Further, the repeating unit (by) having a polarity conversion group (y) is preferably a repeating unit having at least either of a fluorine atom and a silicon atom (that is, a repeating unit corresponding to the repeating unit (b') or (b")). The resin having a repeating unit (by) has hydrophobicity, and is particularly preferred on the point of reducing development defects.

Examples of the repeating unit (by) include a repeating unit represented by formula (K0).

[Chem. 47]

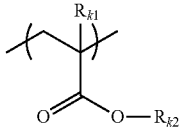

(K0)

In the formula, $R_{k1}$ represents a hydrogen atom, a halogen atom, a hydroxyl group, an alkyl group, a cycloalkyl group, an aryl group, or a group including a polarity conversion group.

$R_{k2}$ represents an alkyl group, a cycloalkyl group, an aryl group or a group including a polarity conversion group.

However, at least one of $R_{k1}$ and $R_{k2}$ represents a group including a polarity conversion group.

The polarity conversion group represents a group increasing solubility in an alkali developer by decomposing due to the action of an alkali developer as described above. The polarity conversion group is preferably a group represented by X in a partial structure represented by general formula (KA-1) or (KB-1).

[Chem. 48]

(KA-1)

(KB-1)

Y$^1$—X—Y$^2$

In general formula (KA-1) or (KB-1), X represents a carboxylic ester group: —COO—, an acid anhydride group: —C(O)OC(O)—, an acid imide group: —NHCONH—, a carboxylic thioester group: —COS—, a carbonic ester group: —OC(O)O—, a sulfuric ester group: —OSO$_2$O—, or a sulfonic ester group: —SO$_2$O—.

Y$^1$ and Y$^2$ may be the same as or different to each other, and represent an electron withdrawing group.

Moreover, the repeating unit (by) has a preferred group increasing solubility in an alkali developer by containing a group having a partial structure represented by general formula (KA-1) or (KB-1); however, in a case where the partial structure does not have a bond, as in a case where the partial structure represented by general formula (KA-1), or the partial structure represented by general formula (KB-1) in which $Y^1$ and $Y^2$ are monovalent, the group having the partial structure is a group having a monovalent or higher-valency group formed by removing at least one arbitrary hydrogen atom in the partial structure.

The partial structure represented by general formula (KA-1) or (KB-1) is linked to the main chain of the hydrophobic resin at an arbitrary position via a substituent.

The partial structure represented by general formula (KA-1) is a structure forming a ring structure together with the group as X.

In the general formula (KA-1), X is preferably a carboxylic ester group (that is, in a case where a lactone ring structure is formed as KA-1), and an acid anhydride group or a carbonic ester group. A carboxylic ester group is more preferable.

The ring structure represented by general formula (KA-1) may have a substituent and, for example, may have nka substituents $Z_{ka1}$.

In a case of a plurality being present, each $Z_{ka1}$ independently represents a halogen atom, an alkyl group, a cycloalkyl group, an ether group, a hydroxyl group, an amido group, an aryl group, a lactone ring group, or an electron withdrawing group.

The $Z_{ka1}$'s may be linked to each other to form a ring. Examples of the ring formed by linking Zka1's with each other include a cycloalkyl ring and a heterocyclic ring (for example, a cyclic ether ring, or a lactone ring).

nka represents an integer of 0 to 10. nka is preferably an integer of 0 to 8, more preferably an integer of 0 to 5, still more preferably an integer of 1 to 4, and most preferably an integer of 1 to 3.

The electron withdrawing group as $Z_{ka1}$ is the same as the electron withdrawing group of $Y^1$ and $Y^2$ described later. Moreover, the electron withdrawing group above may be substituted with another electron withdrawing group.

$Z_{ka1}$ is preferably an alkyl group, a cycloalkyl group, an ether group, a hydroxyl group or an electron withdrawing group, and more preferably an alkyl group, a cycloalkyl group or an electron withdrawing group. The ether group is preferably an ether group substituted with an alkyl group or a cycloalkyl group or the like, that is, an alkyl ether group or the like. The electron withdrawing group has the same meaning as above.

Examples of the halogen atom as $Z_{ka1}$ include a fluorine atom, a chlorine atom, a bromine atom and an iodine atom. Among these a fluorine atom is preferred.

The alkyl group as $Z_{ka1}$ may have a substituent, and may be either linear or branched. The linear alkyl group is preferably an alkyl group with 1 to 30 carbon atoms, more preferably 1 to 20 carbon atoms, and examples thereof include a methyl group, an ethyl group, an n-propyl group, an n-butyl group, a sec-butyl group, a t-butyl group, an n-pentyl group, an n-hexyl group, an n-heptyl group, an n-octyl group, an n-nonyl group and an n-decanyl group. The branched alkyl group is preferably an alkyl group with 3 to 30 carbon atoms, more preferably 3 to 20, and examples thereof include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group and a t-decanoyl group. An alkyl group with 1 to 4 carbon atoms, such as a methyl group, an ethyl group, an n-propyl group, an i-propyl group, an n-butyl group, an i-butyl group and a t-butyl group is preferred.

They cycloalkyl group as $Z_{ka1}$ may have a substituent, and may be monocyclic or may be polycyclic. In a case of a polycyclic type, the cycloalkyl group may be crosslinked. That is, in this case, the cycloalkyl group may have a bridged structure. The monocyclic cycloalkyl group is preferably a cycloalkyl group with 3 to 8 carbon atoms, and examples thereof include a cyclopropyl group, a cyclopentyl group, a cyclohexyl group, a cyclobutyl group, and a cyclooctyl group. The polycyclic cycloalkyl group includes a group having a bicyclo, tricyclo or tetracyclo structure or the like and with 5 or more carbon atoms, and 6 to 20 carbon atoms is preferred. Examples thereof include an adamantyl group, a norbornyl group, an isobornyl group, a camphanyl group, a dicyclopentyl group, an α-pinel group, a tricyclodecanyl group, a tetracyclododecyl group and an androstanyl group. The following structures are also preferred as the cycloalkyl group. Further, at least one carbon atom in the cycloalkyl group may be substituted with a heteroatom such as an oxygen atom.

[Chem. 49]

(1)

(2)

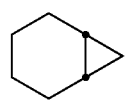

(3)

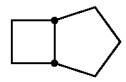

(4)

(5)

(6)

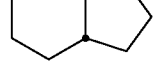

(7)

(8)

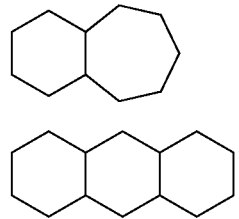

(9)

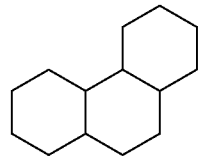

(10)

-continued
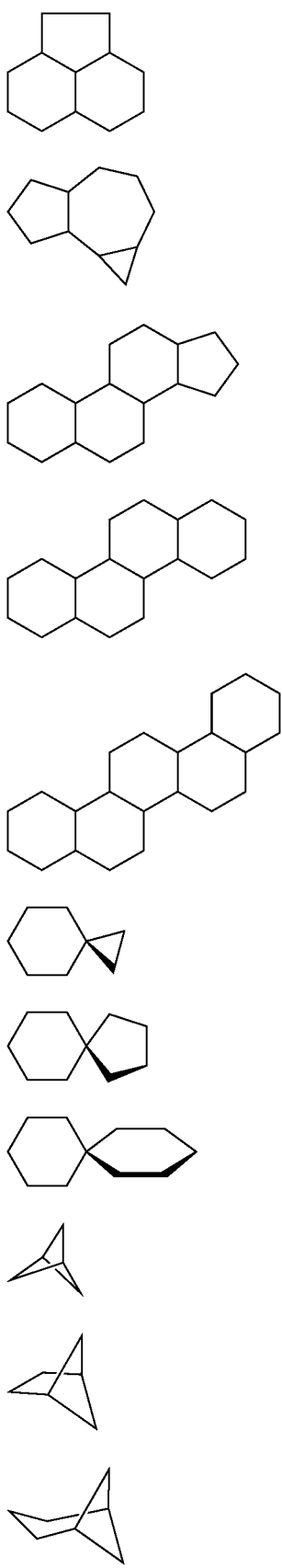
-continued
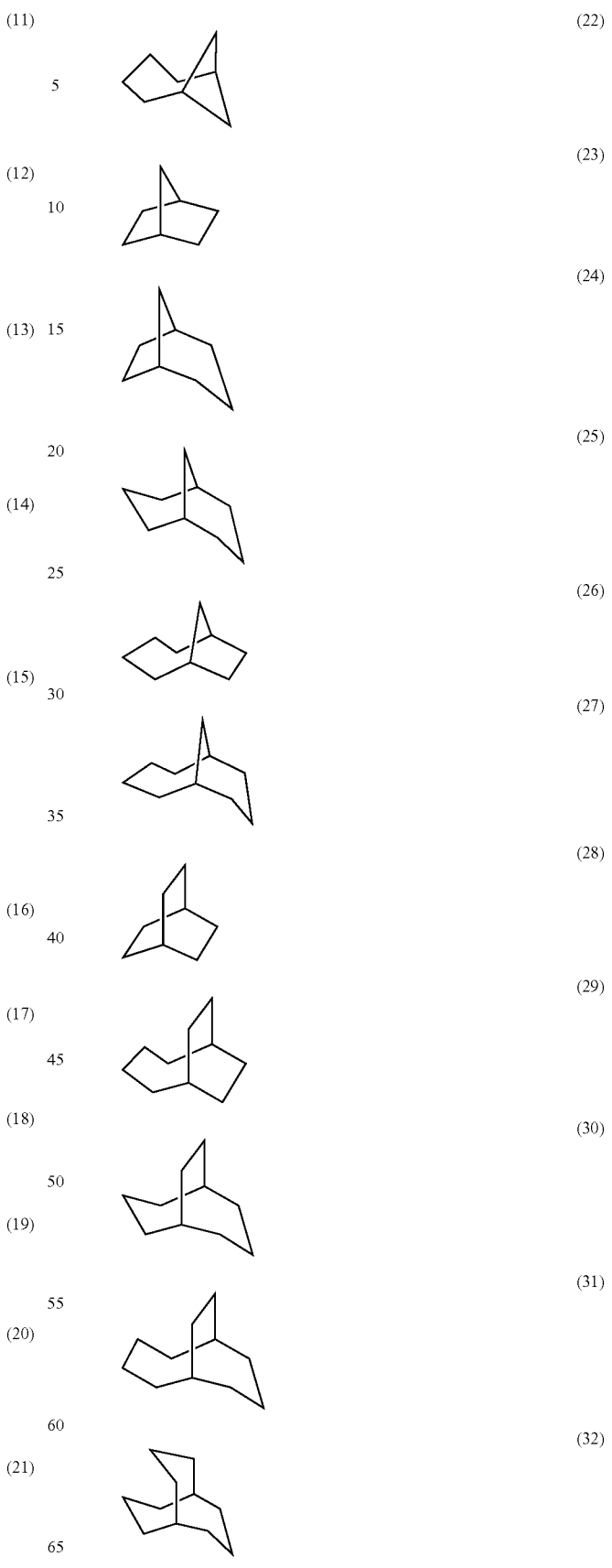

-continued

(33) 

(34) 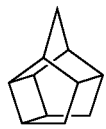

(35) 

(36) 

(37)

(38) 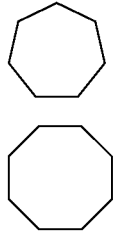

(39)

(40)

(41)

(42)

(43)

(44)

-continued

(45) 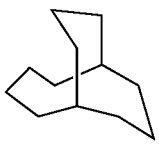

(46) 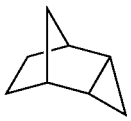

(47) 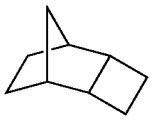

(48) 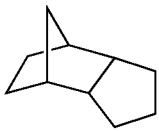

(49) 

(50) 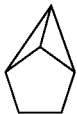

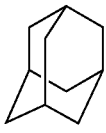
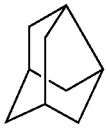
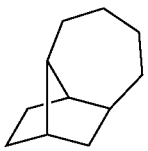
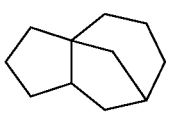

Examples of the preferred alicyclic portions include an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group or a cyclododecanyl group. Among these, an adamantyl group, decalin group, a norbornyl group, a cedrol group, a cyclohexyl group, a cycloheptyl group, a cyclootly group, a cyclodecanyl group, a cyclododecanyl group, and a tricyclodecanyl group are preferred.

Examples of the substituent of these alicyclic structures includes an alkyl group, a halogen atom, a hydroxyl group, an alkoxy group, a carboxyl group and an alkoxycarbonyl group. The alkyl group is preferably a lower alkyl group, such as a methyl group, an ethyl group, a propyl group, an isopropyl group or a butyl group, and more preferably a methyl group, an ethyl group, a propyl group or an isopropyl group. Examples of the alkoxy group preferably include an alkoxy group with 1 to 4 carbon atoms, such as a methoxy group, an ethoxy group, a propoxy group or a butoxy group. Examples of the substituent that the alkyl group and alkoxy group may have include a hydroxyl group, a halogen atom and an alkoxy group (preferably with 1 to 4 carbon atoms).

The above groups may further have a substituent, and examples of the further substituent include a hydroxyl group, a halogen atom (for example, fluorine, chlorine, bromine, or iodine), a nitro group, a cyano group, the foregoing alkyl group, an alkoxy group such as a methoxy group, an ethoxy group, a hydroxyethoxy group, a propoxy group, a hydroxypropoxy group, an n-butoxy group, an isobutoxy group, a sec-butoxy group or a tert-butoxy group; an alkoxycarbonyl group such as a methoxycarbonyl group or an ethoxycarbonyl group; an aralkyl group such as a benzyl group, a phenethyl group or a cumyl group; an acyl group such as an aralkyloxy group, a formyl group, an acetyl group, a butyryl group, a benzoyl group, a cinnamoyl group or a valeryl group; an acyloxy group such as a butyryloxy group; an alkenyl group such as a vinyl group, a propenyl group or an aryl group; an alkenyloxy group such as a vinyloxy group, a propenyloxy group, an allyloxy group or a butenyloxy group; an aryl group such as a phenyl group or a naphthyl group; an aryloxy group such as a phenoxy group; and an aryloxycarbonyl group such as a benzoyloxy group.

X in general formula (KA-1) is a carboxylic ester group, and the partial structure represented by general formula (KA-1) is preferably a lactone ring, and preferably a 5- to 7-membered lactone ring.

Moreover, as in (KA-1-1) to (KA-1-17) described below, another ring structure is preferably fused to a 5- to 7-membered lactone ring as the partial structure represented by general formula (KA-1), in the form of forming a bicyclo or spiro structure.

For the peripheral ring structure with which the ring structure represented by general formula (KA-1) may be bonded, examples include those in (KA-1-1) to (KA-1-17) below and structures based thereon.

The structure containing the lactone ring structure represented by general formula (KA-1) is more preferably a structure represented by any one of (KA-1-1) to (KA-1-17) below. Moreover, the lactone structure may be directly bonded to the main chain. Preferred structures are (KA-1-1), (KA-1-4), (KA-1-5), (KA-1-6), (KA-1-13), (KA-1-14), and (KA-1-17).

[Chem. 50]

KA-1-1
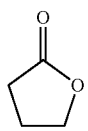

KA-1-2
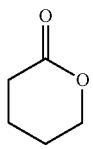

KA-1-3
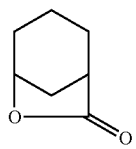

KA-1-4
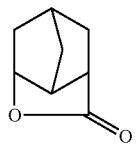

KA-1-5
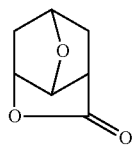

KA-1-6
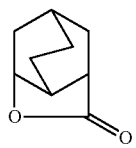

KA-1-7
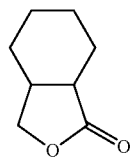

KA-1-8
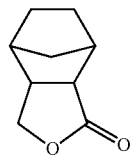

KA-1-9
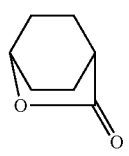

KA-1-10
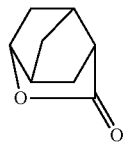

KA-1-11
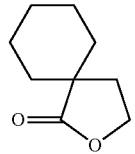

KA-1-12
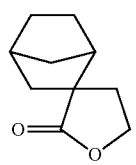

KA-1-13
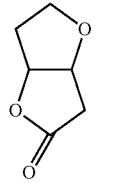

KA-1-14
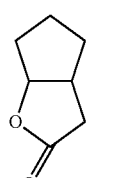

KA-1-15
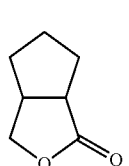

KA-1-16

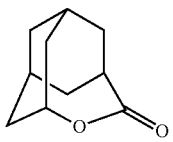

KA-1-17

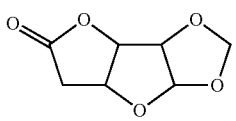

The structure containing the lactone ring structure described above may or may not have a substituent. Examples of preferred substituents are the same as those of the substituent $Z_{ka1}$ which the ring structure shown by general formula (KA-1) may have.

Examples of X in general formula (KB-1) preferably include a carboxylic ester group (—COO—).

$Y^1$ and $Y^2$ in general formula (KB-1) each independently represent an electron withdrawing group.

The electron withdrawing group is a partial structure represented by formula (EW) described below. In formula (EW), * indicates a direct bond to (KA-1) or a direct bond to X in (KB-1).

[Chem. 51]

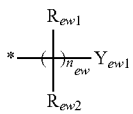

(EW)

In formula (EW)

$R_{ew1}$ and $R_{ew2}$ each independently represent an arbitrary substituent, and represent, for example, a hydrogen atom, an alkyl group, a cycloalkyl group or an aryl group.

$n_{ew}$ is a repetition number of linking groups represented by —C($R_{ew1}$)($R_{ew2}$)—, and represents an integer of 0 or 1. $n_{ew}$ represents a single bond when 0, and indicates $Y_{ew1}$ is directly bonded.)

$Y_{ew1}$ is a halogen atom, a cyano group, a nitrile group, a nitro group, a halo(cyclo)alkyl group represented by —C($R_{f1}$)($R_{f2}$)—$R_{f3}$, or a haloaryl group, an oxy group, a carbonyl group, a sulfonyl group, a sulfinyl group, and a combination thereof. The electron withdrawing group may be the structure below. Moreover, the "halo(cyclo)alkyl group" represents an alkyl or cycloalkyl group that is at least partially halogenated, and the "haloaryl group" represents an aryl group that is at least partially halogenated. In the structural formula below, $R_{ew3}$ and $R_{ew4}$ each independently represent an arbitrary structure. The partial structure represented by formula (EW) has an electron withdrawing group regardless of the structure of $R_{ew3}$ or $R_{ew4}$, and may be linked to the main chain of the resin; however, it is preferably an alkyl group, a cycloalkyl group or a fluorinated alkyl group.

[Chem. 52]

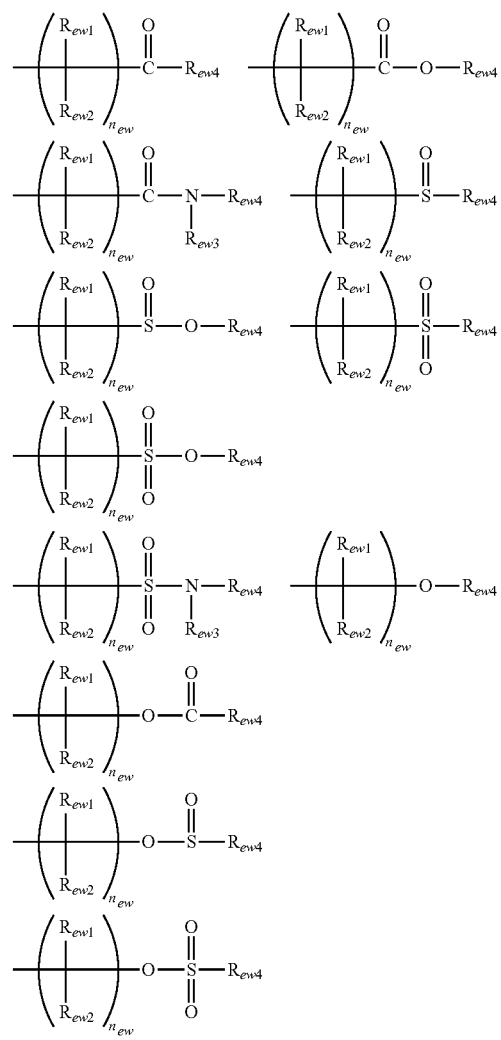

When $Y_{ew1}$ is a divalent or higher-valency group, the remaining bond forms a bond to an arbitrary atom or substituent. At least any group of $Y_{ew1}$, $R_{ew1}$ and $R_{ew2}$ may be connected to the main chain of the hydrophobic resin via a further substituent.

$Y_{ew1}$ is preferably a halogen atom, a halo(cyclo)alkyl group represented by —C($R_{f1}$)($R_{f2}$)—$R_{f3}$ or a haloaryl group.

At least two of $R_{ew1}$, $R_{ew2}$ and $Y_{ew1}$ may be linked to each other to form a ring.

Here, $R_{f1}$ represents a halogen atom, a perhaloalkyl group, a perhalocycloalkyl group or a perhaloaryl group, is preferably a fluorine atom, a perfluoroalkyl group or a perfluorocycloalkyl group, and more preferably a fluorine atom or a trifluoromethyl group.

$R_{f2}$ and $R_{f3}$ each independently represent a hydrogen atom, a halogen atom or an organic group, and $R_{f2}$ and $R_{f3}$ may be linked to form a ring. The organic group represents an alkyl group, a cycloalkyl group and an alkoxy group or the like. $R_{f2}$ is more preferably the same group as $R_{f1}$ or is linked to $R_{f3}$ to form a ring.

$R_{f1}$ to $R_{f3}$ may be linked to form a ring, and examples of the ring formed include a (halo)cycloalkyl ring and a (halo)aryl ring.

Examples of the (halo)alkyl group in $R_{f1}$ to $R_{f3}$ include the alkyl group in $Z_{ka1}$ and halogenated structures thereof.

Examples of the (per)halocycloalkyl group and (per)haloaryl group in $R_{f1}$ to $R_{f3}$ or in the ring formed by linking $R_{f2}$ and $R_{f3}$ include structures in which a cycloalkyl group is halogenated in $Z_{ka1}$ described above, and more preferably a fluorocycloalkyl group represented by $-C_{(n)F(2n-2)}H$, and a perfluoroaryl group represented by $-C_{(n)F(n-1)}$. Here, the number of carbon atoms n is not particularly limited; however, 5 to 13 carbon atoms is preferable, and 6 is more preferable.

The ring which may be formed by linking at least two of $R_{ew1}$, $R_{ew2}$ and $Y_{ew1}$ with each other is preferably a cycloalkyl group or a heterocyclic group, and the heterocyclic group is preferably a lactone ring group. Examples of the lactone ring include structures represented by formula (KA-1-1) to (KA-1-17) above.

Moreover, the repeating unit (by) may have a plurality of partial structures represented by general formula (KA-1), a plurality of partial structures represented by general formula (KB-1), or both of a partial structure represented by general formula (KA-1) and a partial structure represented by general formula (KB-1).

Moreover, a part or the entirety of the partial structure of general formula (KA-1) may serve as the electron withdrawing group of $Y^1$ or $Y^2$ in general formula (KB-1). For example, in a case where X in general formula (KA-1) is a carboxylic ester group, the carboxylic ester group can function as an electron withdrawing group of $Y^1$ or $Y^2$ in general formula (KB-1).

In the case where the repeating unit (by) has a partial structure corresponding to the repeating unit (b*) or (b") and represented by general formula (KA-1), the partial structure represented by general formula (KA-1) is more preferable when the polarity conversion group is a partial structure represented by $-COO-$ in the structure shown in general formula (KA-1).

The repeating unit (by) may be a repeating unit having a partial structure represented by general formula (KY-0).

[Chem. 53]

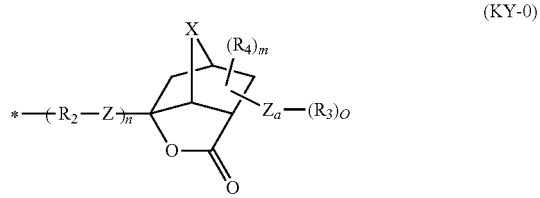

(KY-0)

In general formula (KY-0), $R_2$ represents a linear or cyclic alkylene group, and in a case of a plurality of units, may be the same or may be different.

$R_3$ represents a linear, branched or cyclic hydrocarbon group where a part or all of the hydrogen atoms on the constituent carbons are substituted with a fluorine atom.

$R_4$ represents a halogen atom, a cyano group, a hydroxyl group, an amide group, an alkyl group, a cycloalkyl group, an alkoxy group, a phenyl group, an acyl group, an alkoxycarbonyl group or a group represented by $R-C(=O)-$ or $R-C(=O)O-$ (R represents an alkyl group or a cycloalkyl group). In a case where a plurality of $R_4$'s are present, they may be the same or different, and further, two or more $R_4$'s may be bonded to form a ring.

X represents an alkylene group, an oxygen atom or a sulfur atom.

Z and Za represent a single bond, an ether bond, an ester bond, an amide bond, a urethane bond or a urea bond, and in a case where plurality are present, each Z or Za may be the same or different.

* represents a bond to the main or side chain of the resin.

o is the number of substituents and represents an integer of 1 to 7.

m is the number of substituents and represents an integer of 0 to 7.

n is the number of repetitions and represents an integer of 0 to 5.

The structure of $-R_2-Z-$ is preferably a structure represented by $-(CH_2)_lCOO-$ (l represents an integer of 1 to 5).

The preferred range of the number of carbon atoms and specific examples of the linear or cyclic alkylene group as $R_2$ are the same as those described for the linear alkylene group and cyclic alkylene group in $Z_2$ of general formula (bb).

The number of carbon atoms of the linear, branched or cyclic hydrocarbon group as $R_3$ is, in the case of a linear hydrocarbon group, preferably from 1 to 30, and more preferably from 1 to 20; in the case of a branched hydrocarbon group, preferably from 3 to 30, and more preferably from 3 to 20; and in the case of a cyclic hydrocarbon group, from 6 to 20. Specific examples of the $R_3$ include the specific examples of the alkyl group and cycloalkyl group as $Z_{ka1}$ described above.

The preferred number of carbon atoms and specific examples of the alkyl group and cycloalkyl group as $R_4$ and R are the same as those disclosed above for the alkyl group and cycloalkyl group as $Z_{ka1}$.

The acyl group as $R_4$ is preferably an acyl group with 1 to 6 carbon atoms, and examples thereof include a formyl group, an acetyl group, a propionyl group, a butyryl group, an isobutyryl group, a valeryl group and a pivaloyl group.

The alkyl site in the alkoxy group and alkoxycarbonyl group as $R_4$ includes a linear, branched or cyclic alkyl site, and the preferred number of carbon atoms and specific examples of the alkyl site are the same as those described above for the alkyl group and cycloalkyl group as $Z_{ka1}$.

The alkylene group as X includes a linear or cyclic alkylene group, and the preferred number of carbon atoms and specific examples thereof are the same as those described for the linear alkylene group and cyclic alkylene group as $R_2$.

In addition, examples of the specific structure of the repeating unit (by) also include repeating units having a partial structure shown below.

[Chem. 54]

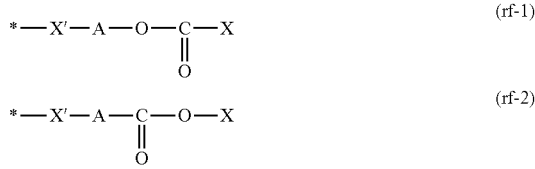

In general formula (rf-1) and (rf-2),

X' represents an electron withdrawing substituent, and is preferably a carbonyloxy group, an oxycarbonyl group, an alkylene group substituted with a fluorine atom or a cycloalkylene group substituted with a fluorine atom.

A represents a single bond or a divalent linking group represented by —C(Rx)(Ry)-. Here, Rx and Ry each independently represent a hydrogen atom, a fluorine atom, an alkyl group (preferably with 1 to 6 carbon atoms, may be substituted with a fluorine atom or the like) or a cycloalkyl group (preferably with 5 to 12 carbon atoms, may be substituted with a fluorine atom or the like). Rx and Ry are preferably a hydrogen atom, an alkyl group or an alkyl group substituted with a fluorine atom.

X represents an electron withdrawing group, and specific examples thereof include an electron withdrawing group as $Y^1$ and $Y^2$ described above, and is preferably a fluorinated alkyl group, a fluorinated cycloalkyl group, an aryl group substituted with a fluorine atom or a fluorinated alkyl group, an aralkyl group substituted with a fluorine atom or a fluorinated alkyl group, a cyano group or a nitro group.

* represents a bond to the main or side chain of the resin. That is, * represents a bond bonding to the main chain of the resin through a single bond or a linking group.

Moreover, when X' is a carbonyloxy group or an oxycarbonyl group, A is not a single bond.

By the polarity conversion group changing in polarity by decomposing due to the action of an alkali developer, the receding contact angle with water of the resist film after alkali development can be lowered. The receding contact angle with water of a film after alkali development lowering is preferable from the viewpoint of suppressing development defects.

The receding contact angle with water of the resist film after alkali development is preferably 50° or less at a temperature of 23±3° C., and a humidity of 45±5%, more preferably 40° or lower, still more preferably 35° or lower, and most preferably 30° or lower.

Receding contact angle refers to a contact angle measured when the contact line at a droplet-substrate interface recedes, and is generally known to be useful when simulating the ease of movement of a droplet in a dynamic state. Simply put, receding contact angle can be defined as the contact angle when the interface of a droplet recedes after a droplet ejected from the tip of a needle is attached to a substrate, and the droplet is drawn into the needle again. The contact angle can ordinarily be measured using a method of measuring the contact angle called an expansion and contraction method.

The hydrolysis rate of the hydrophobic resin with respect to an alkali developer is preferably 0.001 nm/sec or higher, more preferably 0.01 nm/sec or higher, still more preferably 0.1 nm/sec or higher, and most preferably 1 nm/sec or higher.

Here, the hydrolysis rate of the hydrophobic resin with respect to an alkali developer is the rate at which the film thickness of a resin film formed of a hydrophobic resin only decreases with respect to TMAH (tetramethylammonium hydroxide aqueous solution)(2.38 mass %) at 23° C.

In addition, the repeating unit (by) is more preferably a repeating unit having at least two or more polar conversion groups.

In a case where the repeating unit (by) has at least two polar conversion groups, the repeating unit preferably has a group having a partial structure having 2 polar conversion groups represented by general formula (KY-1) below. Moreover, the structure represented by general formula (KY-1), in a case of not having a bond, is preferably a monovalent or higher-valency group with at least 1 arbitrary hydrogen atom in the structure removed.

[Chem. 55]

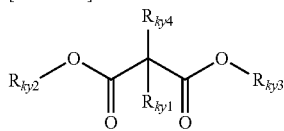

(KY-1)

In general formula (KY-1), $R_{ky1}$ and $R_{ky4}$ each independently represent a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group. Alternatively, $R_{ky1}$ and $R_{ky4}$ may be bonded to the same atom to form a double bond. For example, $R_{ky1}$ and $R_{ky4}$ may be bonded to the same oxygen atom to form a part (=O) of a carbonyl group.

$R_{ky2}$ and $R_{ky3}$ are each independently an electron withdrawing group, or $R_{ky3}$ is an electron withdrawing group along with $R_{ky1}$ and $R_{ky2}$ bonding to form a lactone ring. As the lactone ring formed, the structure of (KA-1-1) to (KA-1-17) is preferred. Examples of the electron withdrawing group are the same as $Y_1$ and $Y_2$ in the formula (KB-1), and a halogen group or a halo(cyclo)alkyl group or haloaryl group represented by —C(R$_{f1}$)(R$_{f2}$)—R$_{f3}$ are preferred. $R_{ky3}$ is preferably a halogen atom, or a halo(cyclo)alkyl group or haloaryl group represented by —C(R$_{f1}$)(R$_{f2}$)—R$_{f3}$, and $R_{ky2}$ is bonded to $R_{ky1}$ to form a lactone ring, or is an electron withdrawing group not having a halogen atom.

$R_{ky1}$, $R_{ky2}$ and $R_{ky4}$ may be linked with each other to form a monocyclic or polycyclic structure.

Specific examples of $R_{ky1}$ and $R_{ky4}$ include the same groups as $Z_{ka1}$ in formula (KA-1).

The lactone ring formed by linking $R_{ky1}$ to $R_{ky2}$ is preferably the structure of (KA-1-1) to (KA-1-17). Examples of the electron withdrawing group are the same as those of $Y_1$ and $Y_2$ in the formula (KB-1).

The structure represented by general formula (KY-1) is preferably a structure represented by general formula (KY-2) below. Moreover, the structure represented by general formula (KY-2) is a group having a monovalent or higher-valency group in which at least one arbitrary hydrogen atom in the structure is removed.

[Chem. 56]

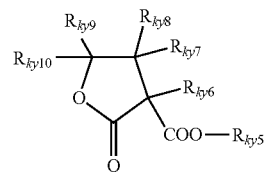

(KY-2)

In formula (KY-2)

$R_{ky6}$ to $R_{ky10}$ each independently represent a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group.

Two or more of $R_{ky6}$ to $R_{ky10}$ may be bonded to each other to form a monocyclic or polycyclic structure.

$R_{ky5}$ represents an electron withdrawing group. Examples of the electron withdrawing group are the same as in $Y_1$ and $Y_2$, and a halogen atom or a halo(cyclo)alkyl group or haloaryl group represented by —C(R$_{f1}$)(R$_{f2}$)—R$_{f3}$ are preferred.

Specific examples of $R_{ky5}$ to $R_{ky10}$ are the same as $Z_{ka1}$ in formula (KA-1).

The structure represented by formula (KY-2) is preferably a partial structure represented by the general formula (KY-3) below.

[Chem. 57]

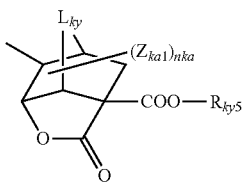

(KY-3)

In (KY-3), $Z_{ka1}$ and nka each have the same meaning as in the general formula (KA-1). $R_{ky5}$ has the same meaning as in the general formula (KY-2).

$L_{ky}$ represents an alkylene group, an oxygen atom or a sulfur atom. Examples of the alkylene group of $L_{ky}$ include a methylene group and an ethylene group. $L_{ky}$ is preferably an oxygen atom or a methylene group, and more preferably a methylene group.

The repeating unit (b) is not limited as long as it is a repeating unit obtained by polymerization, such as addition polymerization, condensation polymerization or addition condensation; however, a repeating unit obtained by addition polymerization of a carbon-carbon double bond is preferable. Examples thereof include an acrylate-based repeating unit (also including a system having a substituent at the α- or β-position), a styrene-based repeating unit (also including a system having a substituent at the α- or β-position), a vinyl ether-based repeating unit, a norbornene-based repeating unit, and a maleic acid derivative (a maleic anhydride or its derivatives, maleimide, or the like) repeating unit. An acrylate-based repeating unit, a styrene-based repeating unit, a vinyl ether-based repeating unit and a norbornene-based repeating unit are preferred, an acrylate-based repeating unit, a vinyl ether-based repeating unit and a norbornene-based repeating unit are more preferred, and an acrylate-based repeating unit is most preferred.

In a case where the repeating unit (by) is a repeating unit having at least either of a fluorine atom or a silicon atom (that is, a case corresponding to a repeating unit (b') or (b")), examples of partial structure having a fluorine atom in the repeating unit (by) are the same as those described for the repeating unit having at least either of a fluorine atom or a silicon atom. The groups represented by the general formula (F2) to (F4) are preferred. Also in this case, examples of the partial structure having a silicon atom in the repeating unit (by) are the same as those in the repeating unit having at least either of a fluorine atom or a silicon atom, and the groups represented by general formula (CS-1) to (CS-3) are preferred.

In the hydrophobic resin, the content of the repeating unit (by) is preferably from 10 mol % to 100 mol % with respect to all repeating units in the hydrophobic resin, more preferably from 20 mol % to 99 mol %, still more preferably from 30 mol % to 97 mol %, and most preferably from 40 mol % to 95 mol %.

Specific examples of the repeating unit (by) having a group increasing solubility in an alkali developer are shown below; however, the present invention is not limited thereto.

In the specific examples shown below, Ra represents a hydrogen atom, a fluorine atom, a methyl group or a trifluoromethyl group.

[Chem. 58-1]

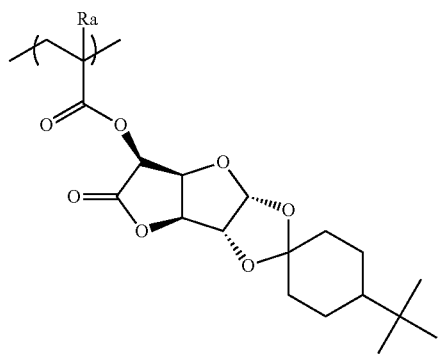

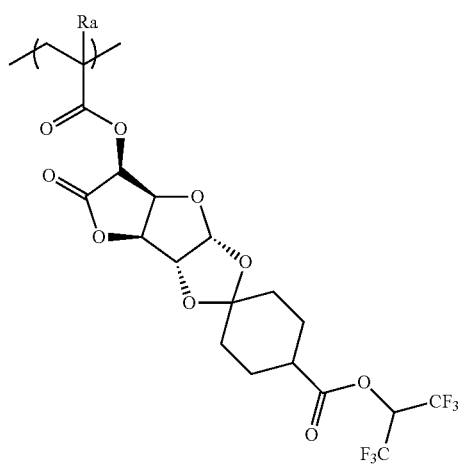

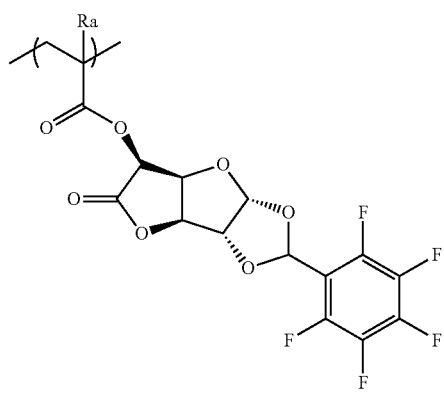

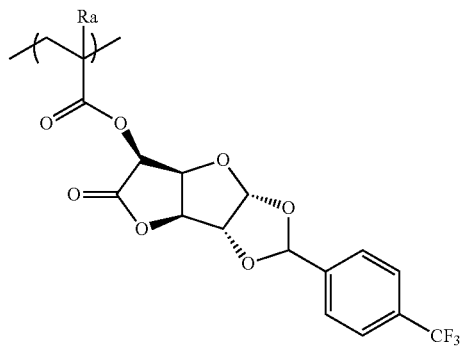

141
-continued
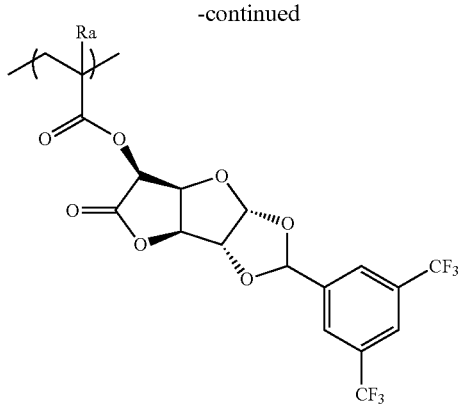
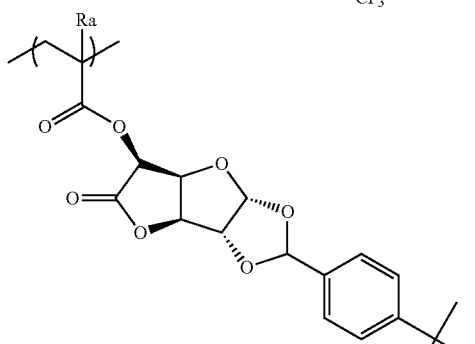
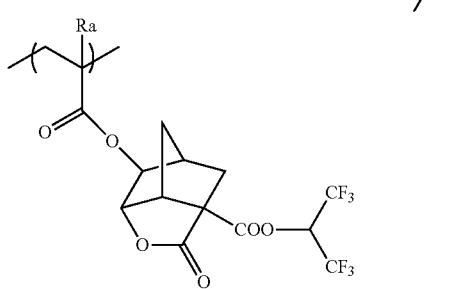
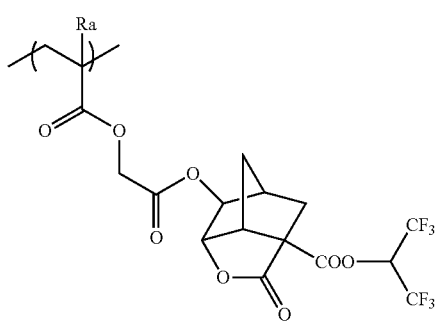
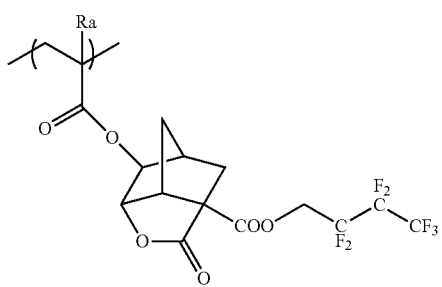
142
-continued
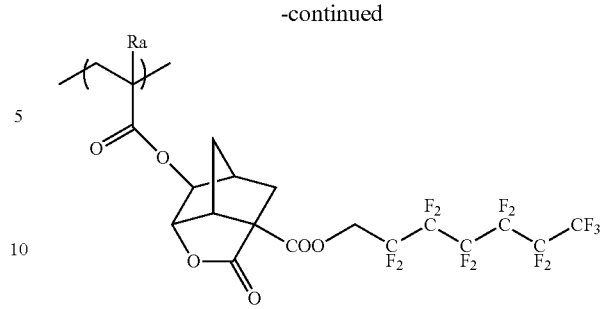
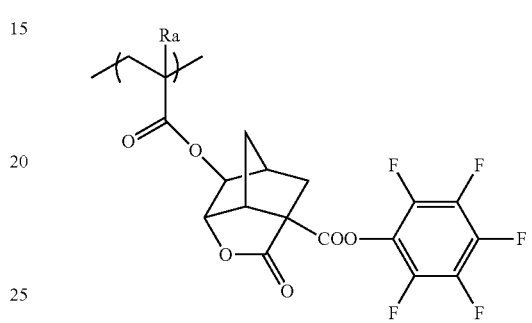
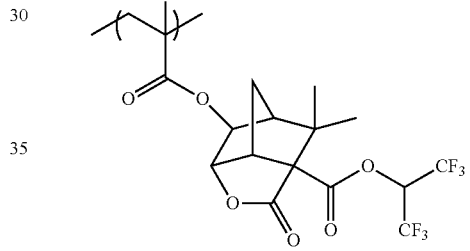
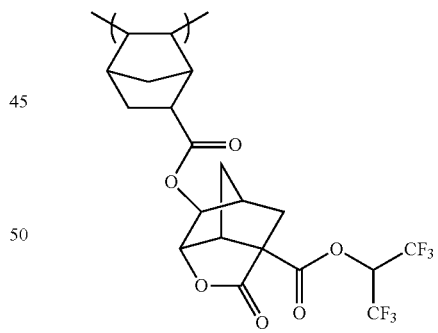
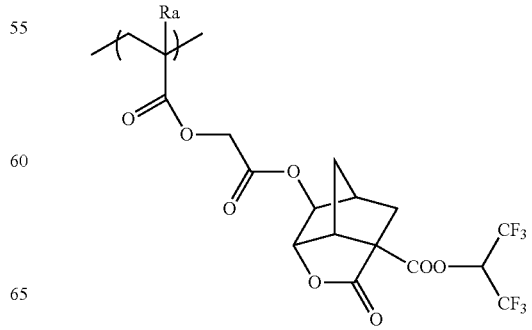

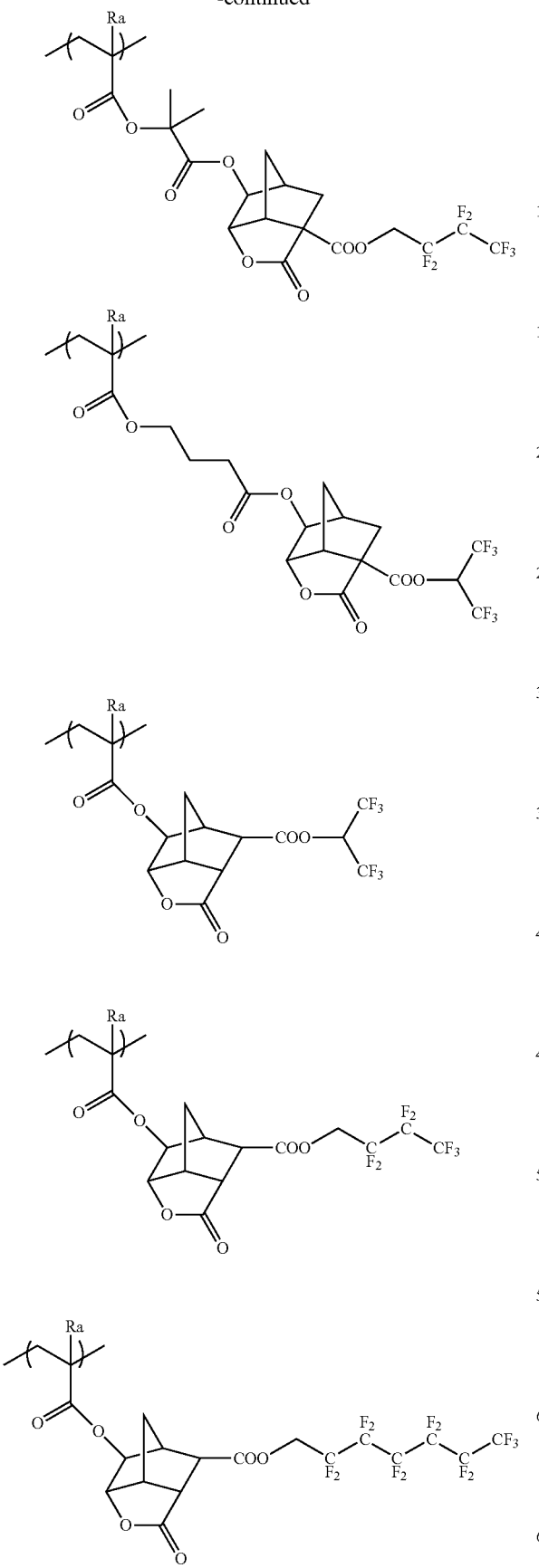
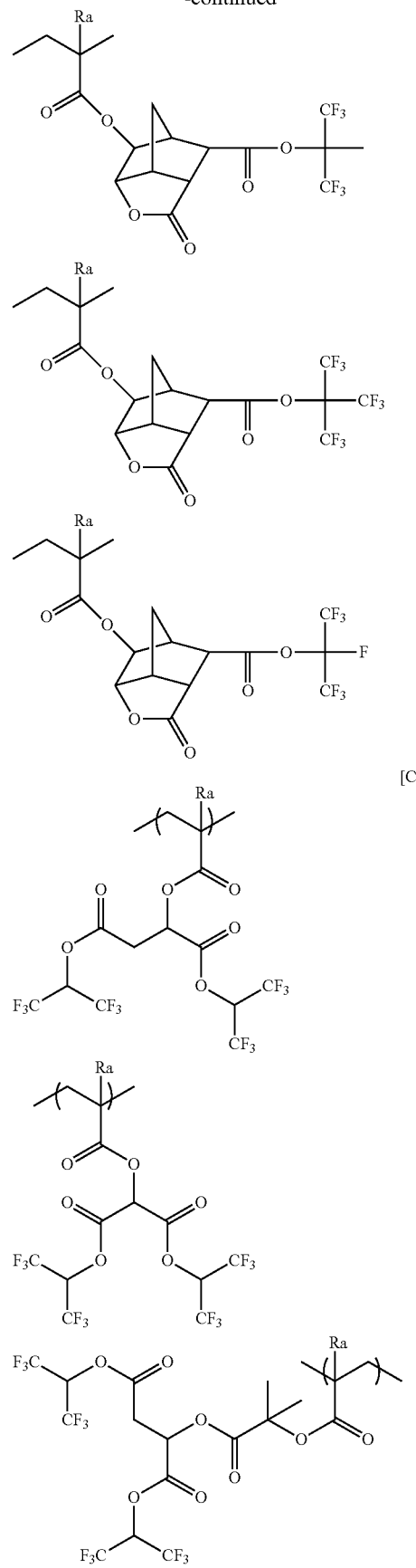

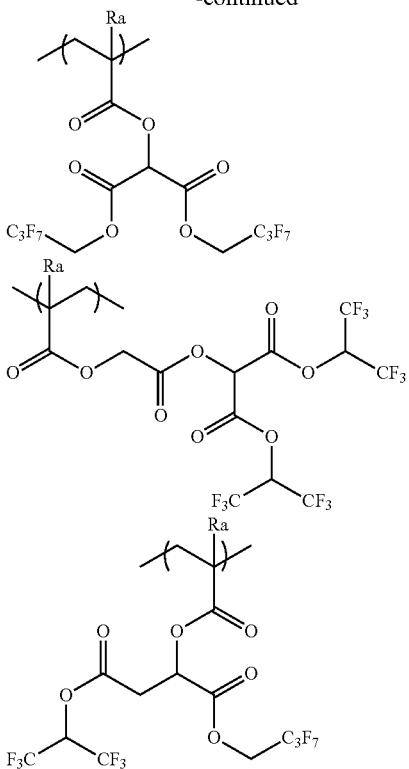

Synthesis can be performed with reference to the methods disclosed in WO2010/067905A or WO2010/067905A as a method of synthesizing a monomer corresponding to the repeating unit (by) having a polarity conversion group (y) as described above.

In the hydrophobic resin, examples of the repeating unit (bz) having a group (z) decomposing due to the action of an acid are the same as those provided for the repeating unit having an acid-decomposable group in the resin (B).

In a case where the repeating unit (bz) is a repeating unit having at least either of a fluorine atom or a silicon atom (that is, a case corresponding to the repeating unit (b') or (b")), examples of partial structure having a fluorine atom in the repeating unit (bz) are the same as those described for the repeating unit having at least either of a fluorine atom or a silicon atom. The groups represented by the general formula (F2) to (F4) are preferred. Also in this case, examples of the partial structure having a silicon atom in the repeating unit (by) are the same as those in the repeating unit having at least either of a fluorine atom or a silicon atom, and the groups represented by general formula (CS-1) to (CS-3) are preferred.

In the hydrophobic resin, the content of the repeating unit (bz) having a group (z) decomposing due to the action of an acid is preferably from 1 mol % to 80 mol % with respect to all repeating units in the hydrophobic resin, more preferably from 10 mol % to 80 mol %, and still more preferably from 20 mol % to 60 mol %.

Above, the repeating unit (b) having at least one group selected from the group consisting of (x) to (z) has been described; however, the content of the repeating unit (b) in the hydrophobic resin is preferably from 1 mol % to 98 mol % with respect to all repeating units in the hydrophobic resin, more preferably from 3 mol % to 98 mol %, still more preferably from 5 mol % to 97 mol %, and most preferably from 10 mol % to 95 mol %.

The content of the repeating unit (b') is preferably 1 mol % to 100 mol % with respect to all repeating units in the hydrophobic resin, more preferably 3 mol % to 99 mol %, still more preferably 5 mol % to 97 mol %, and most preferably 10 mol % to 95 mol %.

The content of the repeating unit (b*) is preferably 1 mol % to 90 mol % with respect to all repeating units in the hydrophobic resin, more preferably 3 mol % to 80 mol %, still more preferably 5 mol % to 70 mol %, and most preferably 10 mol % to 60 mol %. The content of the repeating unit having at least either of a fluorine atom or a silicon atom and used together with the repeating unit (b*) is preferably from 10 mol % to 99 mol % with respect to all repeating units in the hydrophobic resin, more preferably from 20 mol % to 97 mol %, still more preferably from 30 mol % to 95 mol %, and most preferably from 40 mol % to 90 mol %.

The content of the repeating unit (b") is preferably 1 mol % to 100 mol % with respect to all repeating units in the hydrophobic resin, more preferably 3 mol % to 99 mol %, still more preferably 5 mol % to 97 mol %, and most preferably 10 mol % to 95 mol %.

The hydrophobic resin may further contain a repeating unit represented by the following general formula (CIII).

[Chem. 59]

(CIII)

In the general formula (CIII), $R_{c31}$ represents a hydrogen atom, an alkyl group (which may be substituted with a fluorine atom or the like), a cyano group or a —$CH_2$—O-$Rac_2$ group, wherein $Rac_2$ represents a hydrogen atom, an alkyl group, or an acyl group, and $R_{c31}$ is preferably a hydrogen atom, a methyl group, a hydroxymethyl group, or a trifluoromethyl group, and particularly preferably a hydrogen atom or a methyl group;

$R_{c32}$ represents a group containing an alkyl group, a cycloalkyl group, an alkenyl group, a cycloalkenyl group, or an aryl group. These groups may be substituted with a group containing a fluorine atom or a silicon atom or the like; and $L_{c3}$ represents a single bond or a divalent linking group.

In the general formula (CIII), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably a phenyl group or a naphthyl group having 6 to 20 carbon atoms, each of which may have a substituent $R_{c32}$ is preferably an unsubstituted alkyl group or an alkyl group substituted with a fluorine atom.

The divalent linking group of $L_{c3}$ is preferably an alkylene group (preferably having 1 to 5 carbon atoms), an oxy group, a phenylene group, or an ester bond (a group represented by —COO—).

The hydrophobic resin preferably further contains a repeating unit represented by the following general formula (BII-AB).

[Chem. 60]

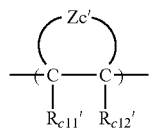

(BII-AB)

In formula (BII-AB)

$R_{c11}'$ and $R_{c12}'$ each independently represent a hydrogen atom, a cyano group, a halogen atom, or an alkyl group; and Zc' represents an atomic group for forming an alicyclic structure containing two carbon atoms (C—C) bonded to each other.

In the case where each group in the repeating units represented by general formula (CIII) and (BII-AB) is substituted with group including a fluorine atom or silicon atom, the repeating units also correspond to the repeating unit having at least either of a fluorine atom or a silicon atom.

Specific examples of the repeating units represented by general formula (CIII) and (BII-AB) are shown below, but the invention is not limited thereto. In the formula, Ra represents H, $CH_3$, $CH_2OH$, $CF_3$, or CN. Moreover, the repeating unit in a case where Ra is $CF_3$ also corresponds to the repeating unit having at least either of a fluorine atom or a silicon atom.

[Chem. 61]

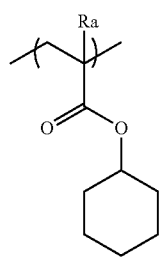
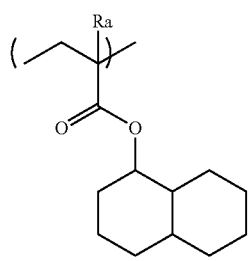

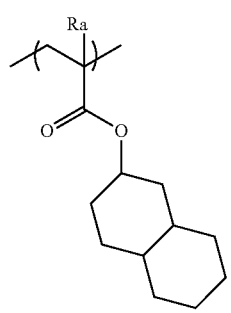
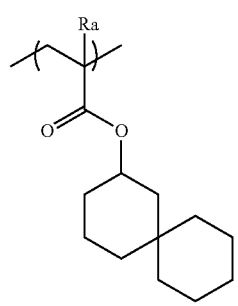

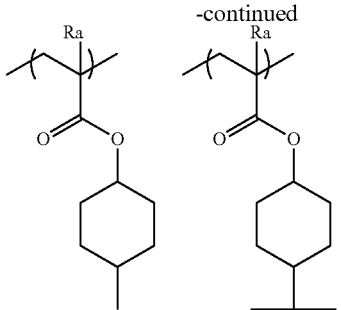

-continued

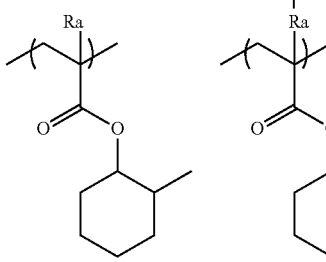

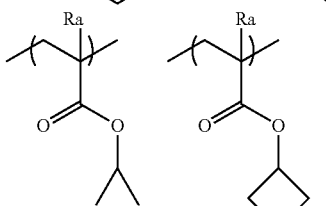

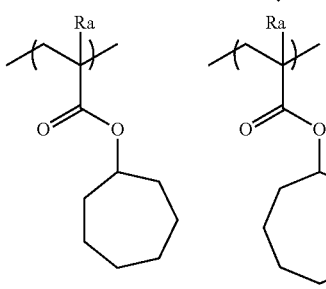

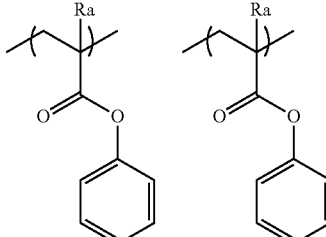

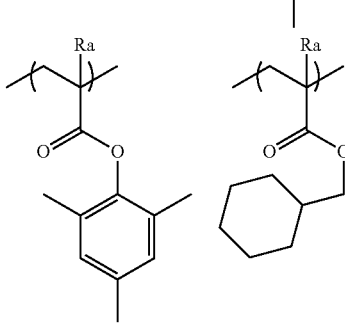

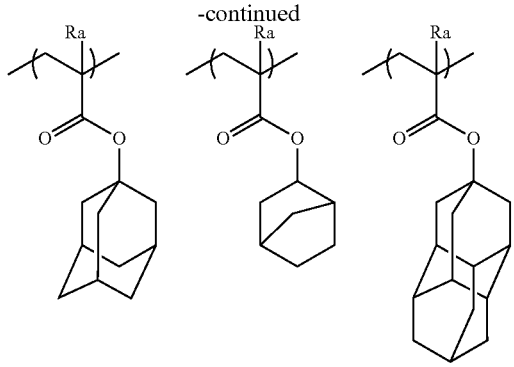
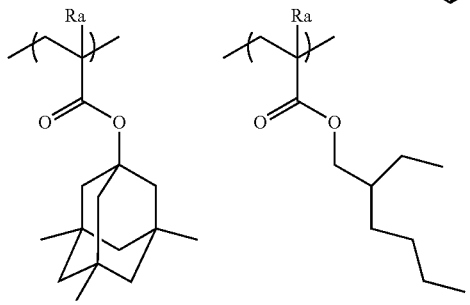
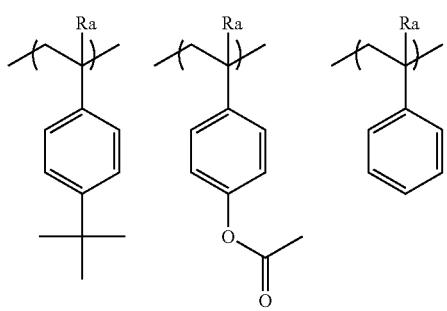
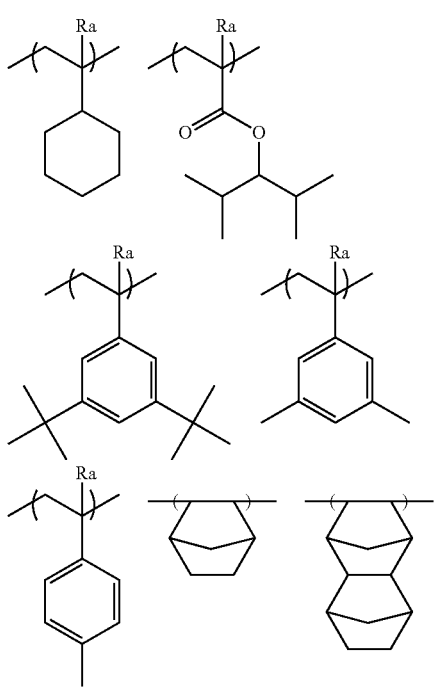

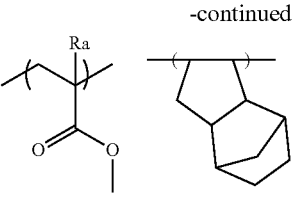

Similarly to the resin (B), it is natural that there are few impurities, such as metals, in the hydrophobic resin, and the content of residual monomers or oligomer components is preferably from 0 mass % to 10 mass %, more preferably from 0 mass % to 5 mass %, and still more preferably from 0 mass % to 1 mass %. In so doing, a resist composition without foreign substances in the liquid or changes in sensitivity or the like over time can be obtained. In addition, in view of resolution, resist profile, side wall of resist pattern, roughness and the like, the molecular weight distribution (Mw/Mn, also referred to as "dispersity") is preferably in a range from 1 to 3, more preferably from 1 to 2, still more preferably from 1 to 1.8, and most preferably from 1 to 1.5.

As for the hydrophobic resin, various commercially available products may be used or the resin may be synthesized by an ordinary method (for example, radical polymerization). Examples of the general synthetic method include a batch polymerization method in which a monomer species and an initiator are dissolved in a solvent and heated so as to accomplish polymerization and a dropping polymerization method in which a solution of monomer species and initiator is added by dropwise addition to a heated solvent over a period of 1 to 10 hours. The dropping polymerization method is preferred.

The reaction solvent, polymerization initiator, reaction condition (temperature, concentration, or the like) and purification method after reaction are the same as the content described for resin (B) above.

Below, specific examples of the hydrophobic resin (HR) are shown. In addition, the molar ratio (the positional relationship of each repeating unit in each resin shown in the specific examples corresponds to the positional relationship of the number of the compositional ratio in Table 2), weight average molecular weight, and dispersity of the repeating units in each resin are shown in Table 2 below.

[Chem. 62-1]

(B-1)

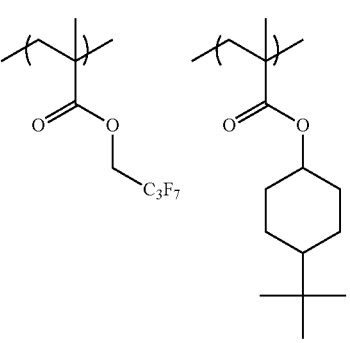

(B-2) 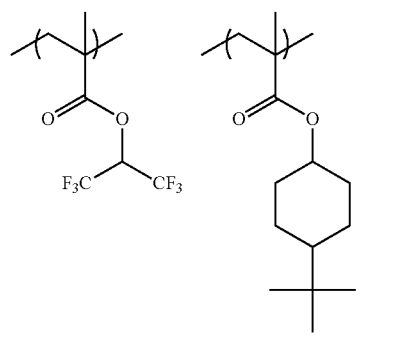
(B-3) 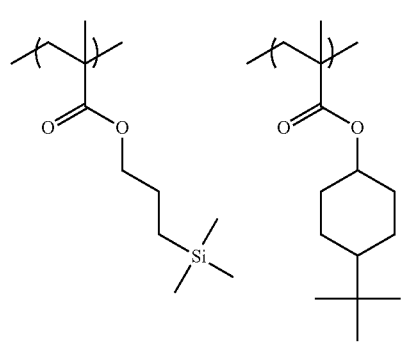
(B-4) 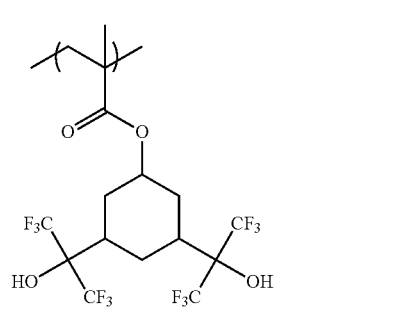
(B-5) 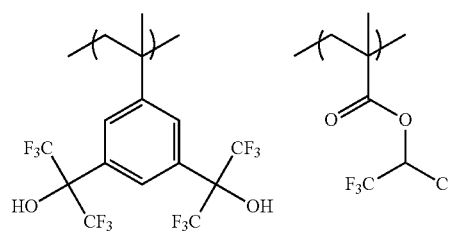
(B-6) 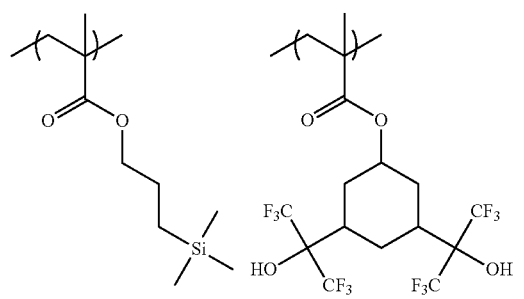
(B-7) 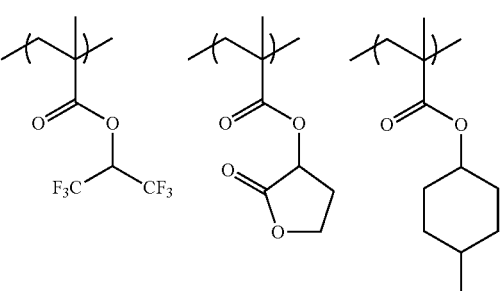
(B-8) 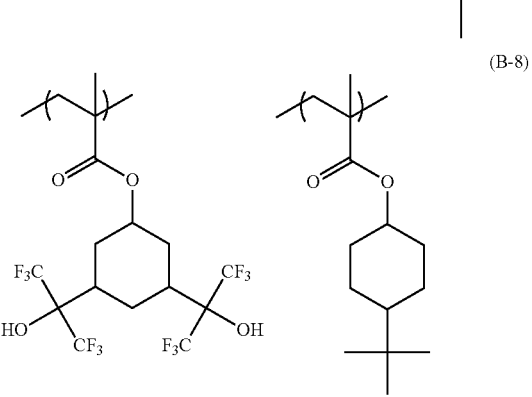
(B-9) 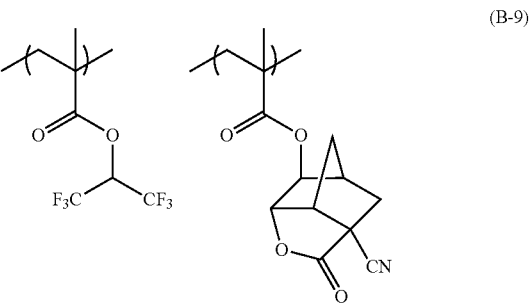
(B-10) 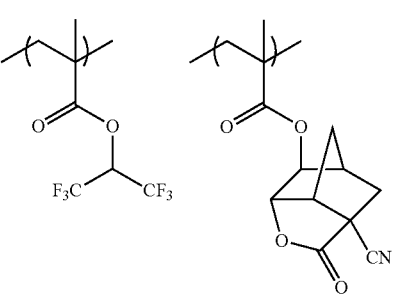
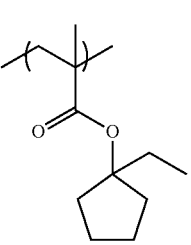

(B-11) 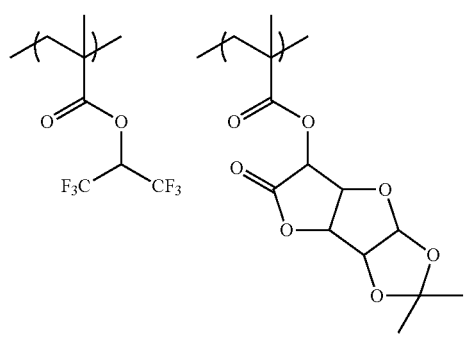
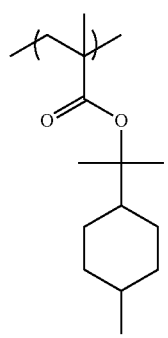
(B-12) 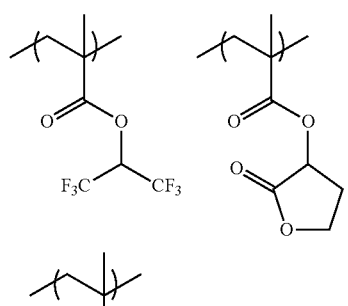
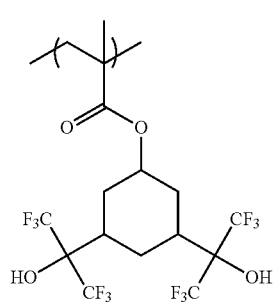
(B-13) 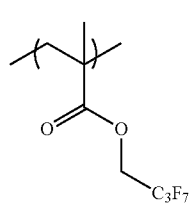
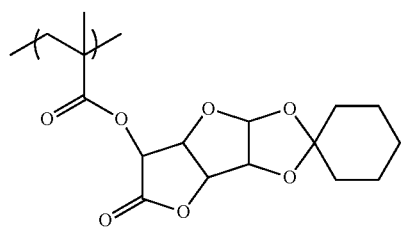
(B-14) 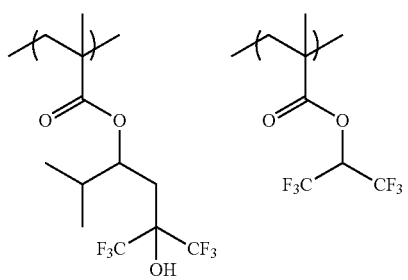
(B-15) 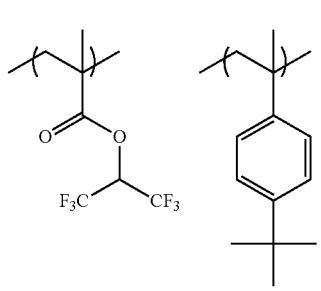
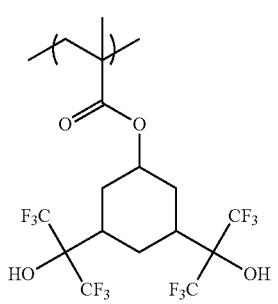
(B-16) 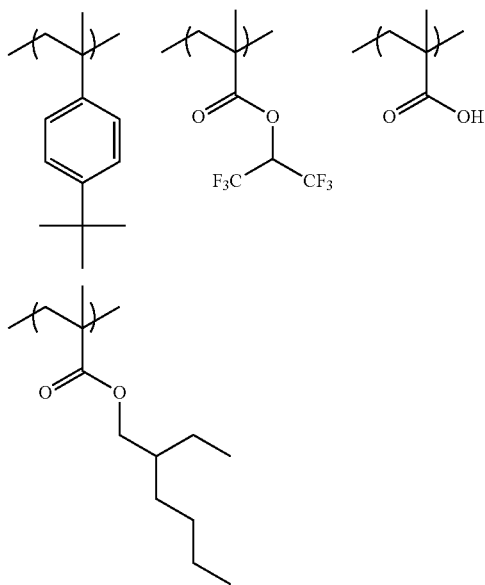

(B-17)
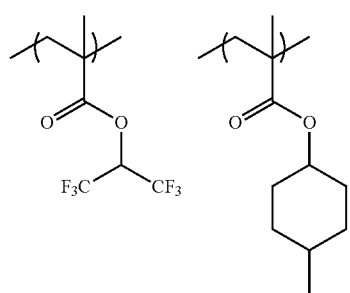
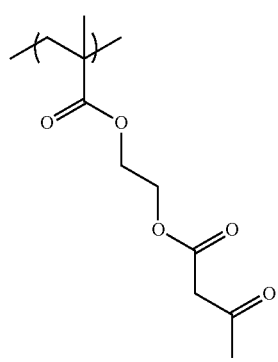
(B-18)
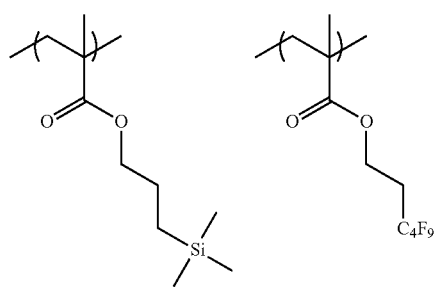
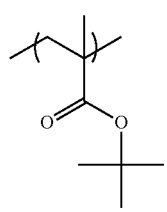
(B-19)
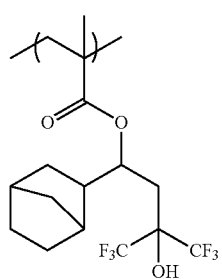
(B-20)
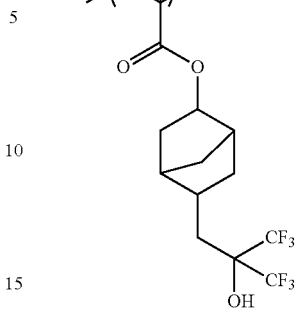
(B-21)
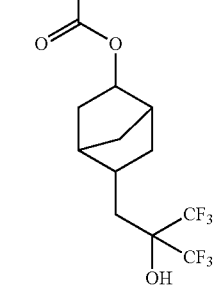
(B-22)
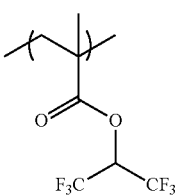
[Chem. 62-2]
(B-23)
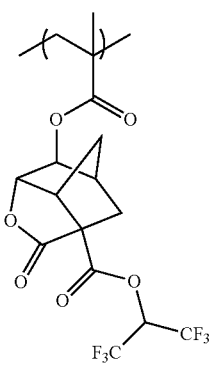

(B-24) 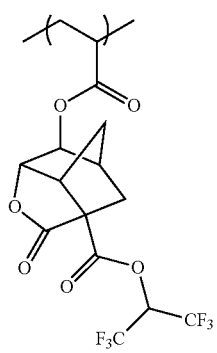
(B-25) 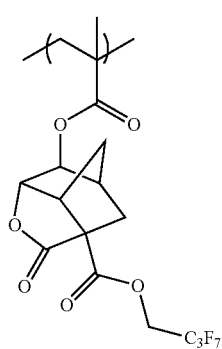
(B-26) 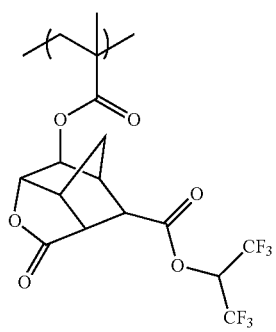
(B-27) 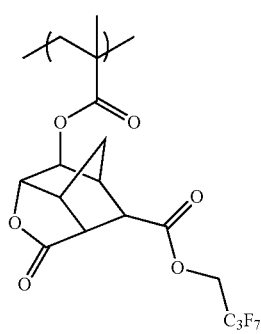
(B-28) 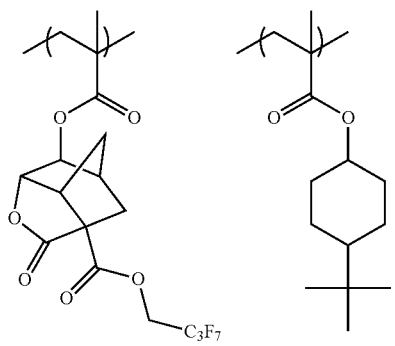
(B-29) 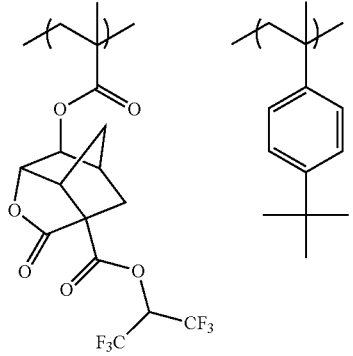
(B-30) 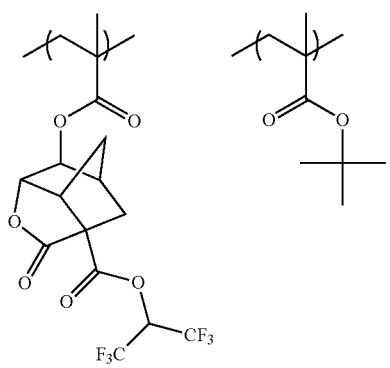
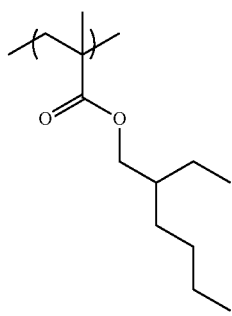

(B-31)
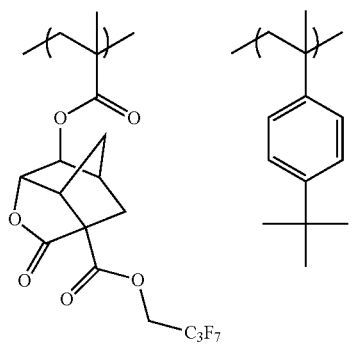
(B-32)
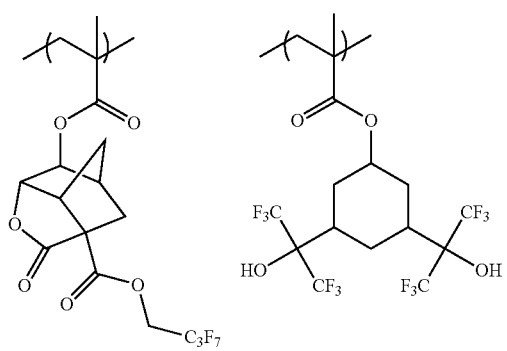
(B-33)
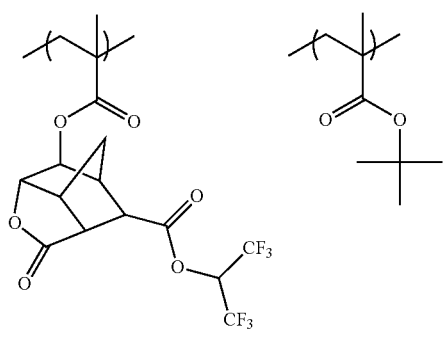
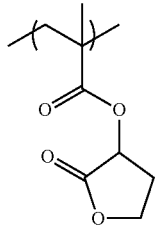
(B-34)
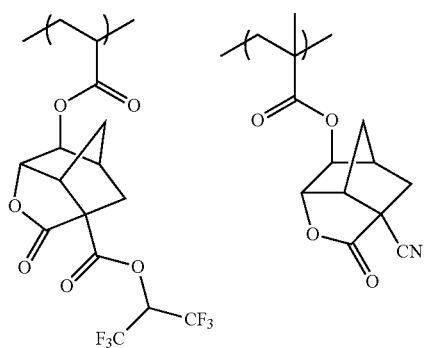
(B-35)
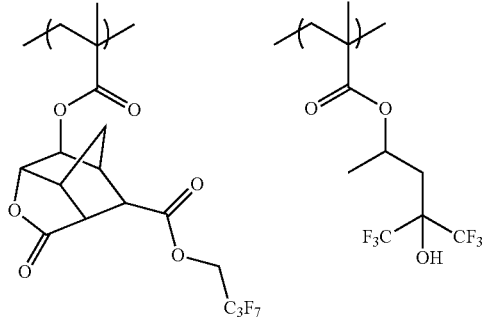
(B-36)
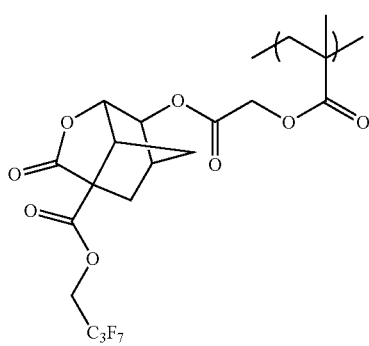
(B-37)
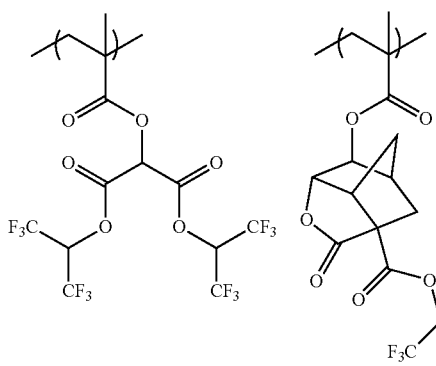
(B-38)

-continued
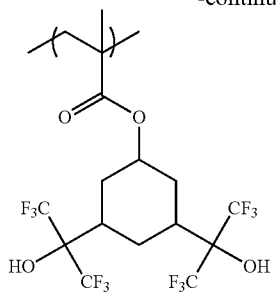
(B-39)
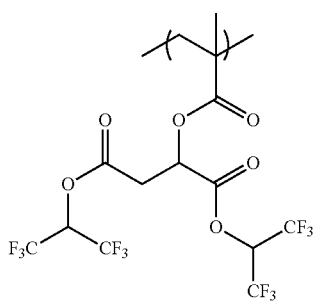
(B-40)
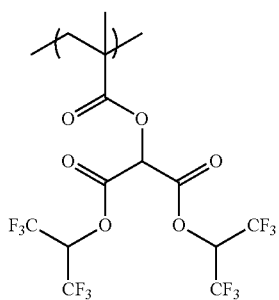
(B-41)
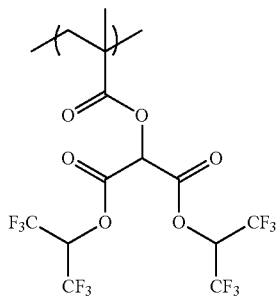
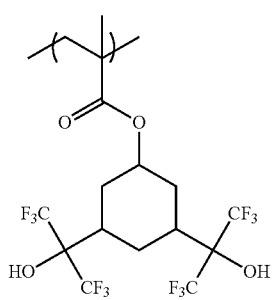
-continued
(B-42)
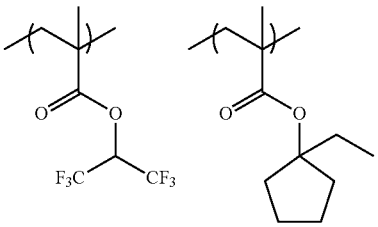
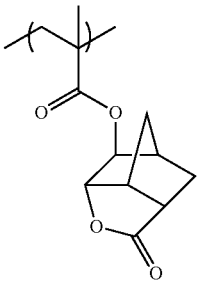
[Chem. 62-3]
(B-43)
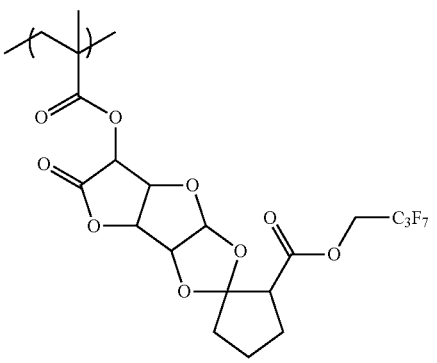
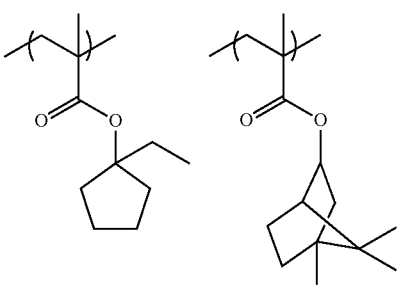
(B-44)
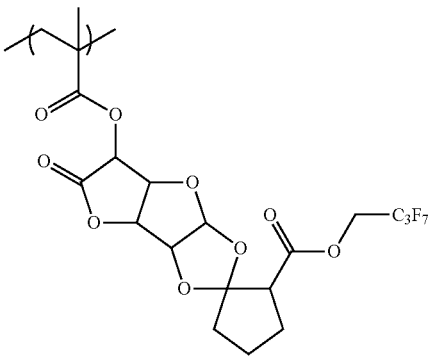

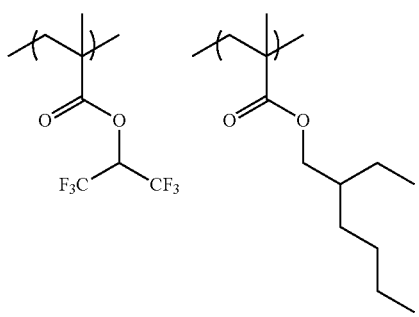
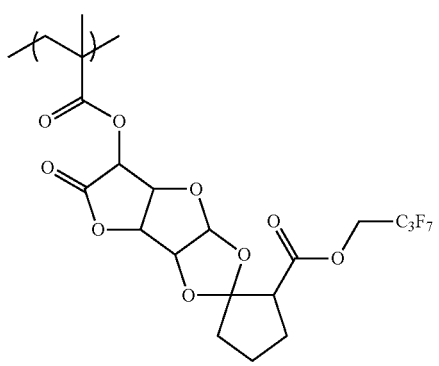
(B-45)
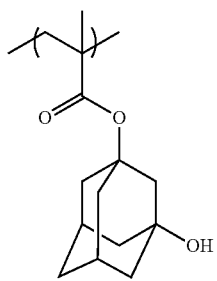
(B-46)
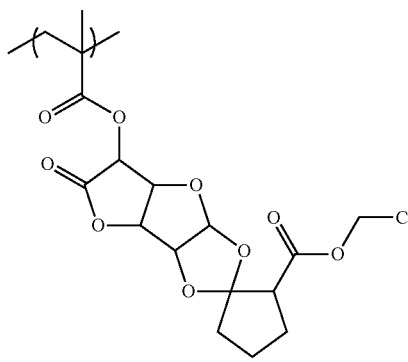
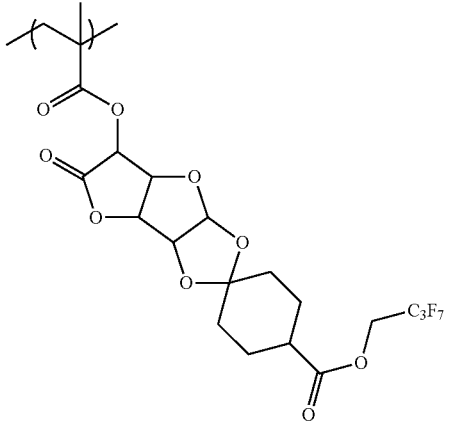
(B-47)
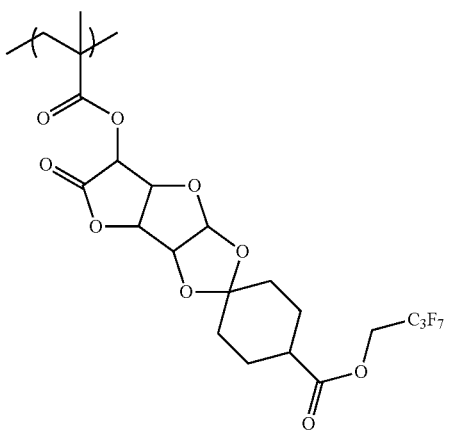
(B-48)
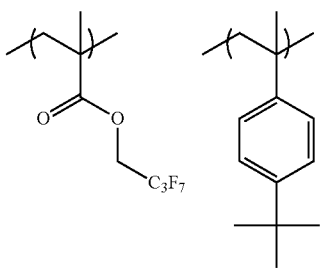

(B-49)
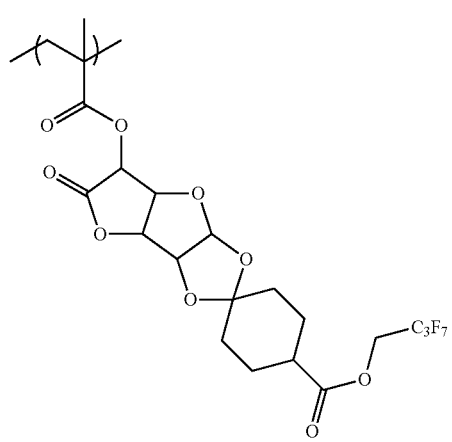
(B-50)
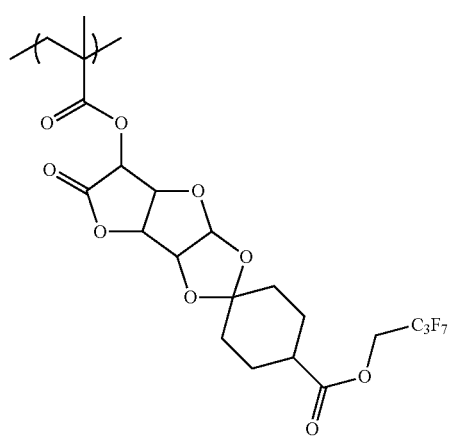
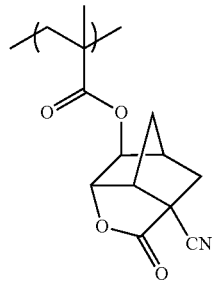
(B-51)
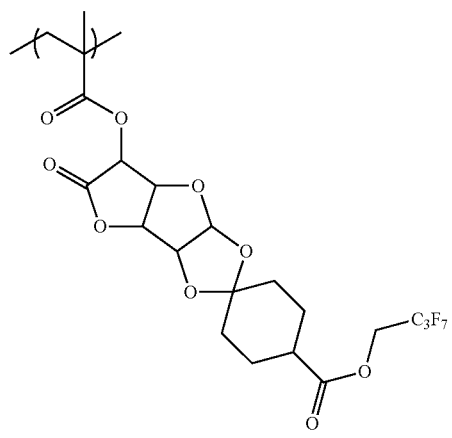
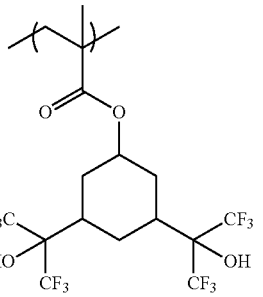
(B-52)
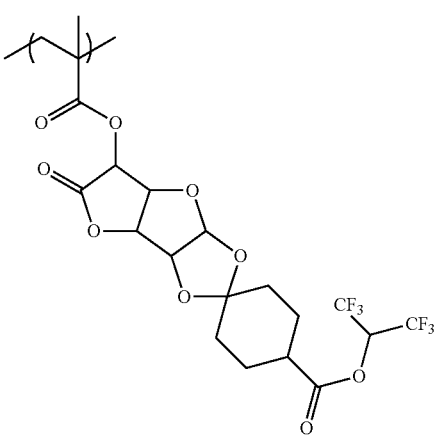
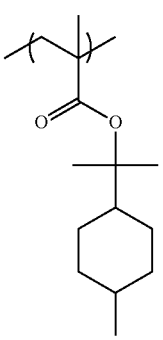
(B-53)
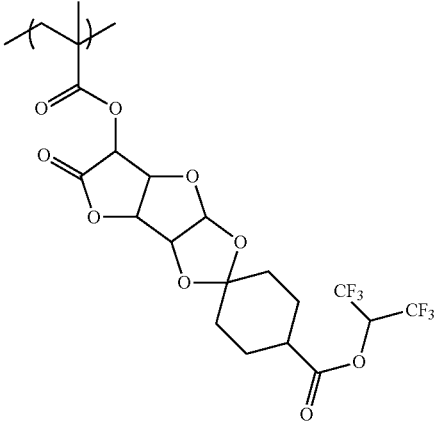

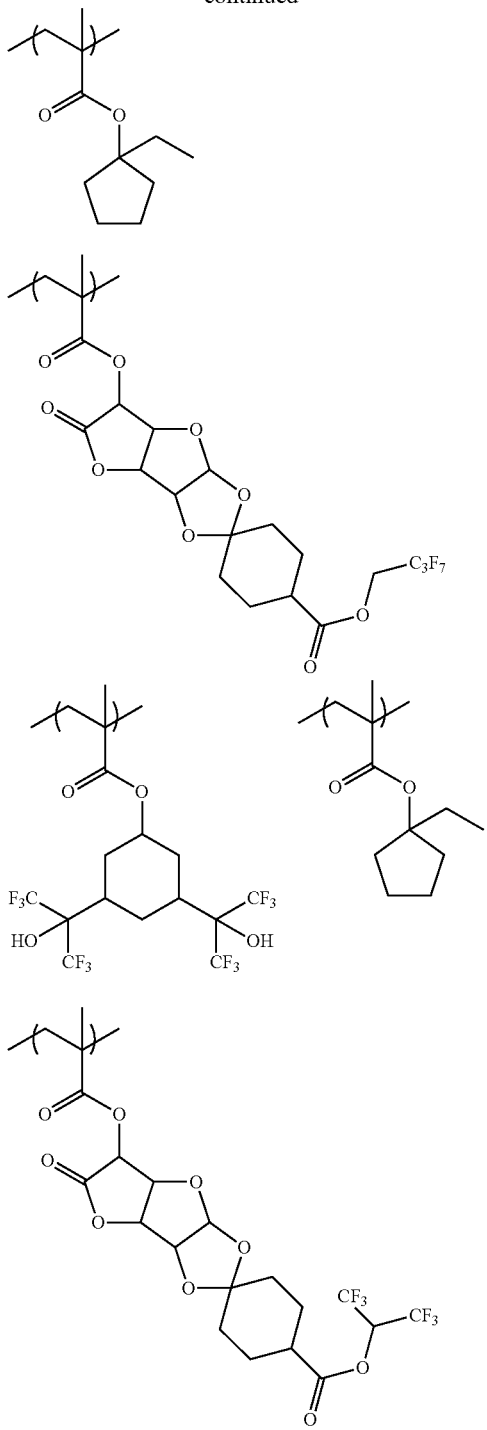

(B-54)

(B-54)

TABLE 2

| Polymer | Compositional Ratio (mol %) | Mw | Mw/Mn |
|---|---|---|---|
| B-1 | 50/50 | 6000 | 1.5 |
| B-2 | 30/70 | 6500 | 1.4 |
| B-3 | 45/55 | 8000 | 1.4 |
| B-4 | 100 | 15000 | 1.7 |
| B-5 | 60/40 | 6000 | 1.4 |
| B-6 | 40/60 | 8000 | 1.4 |

TABLE 2-continued

| Polymer | Compositional Ratio (mol %) | Mw | Mw/Mn |
|---|---|---|---|
| B-7 | 30/40/30 | 8000 | 1.4 |
| B-8 | 60/40 | 8000 | 1.3 |
| B-9 | 50/50 | 6000 | 1.4 |
| B-10 | 40/40/20 | 7000 | 1.4 |
| B-11 | 40/30/30 | 9000 | 1.6 |
| B-12 | 30/30/40 | 6000 | 1.4 |
| B-13 | 60/40 | 9500 | 1.4 |
| B-14 | 60/40 | 8000 | 1.4 |
| B-15 | 35/35/30 | 7000 | 1.4 |
| B-16 | 50/40/5/5 | 6800 | 1.3 |
| B-17 | 20/30/50 | 8000 | 1.4 |
| B-18 | 25/25/50 | 6000 | 1.4 |
| B-19 | 100 | 9500 | 1.5 |
| B-20 | 100 | 7000 | 1.5 |
| B-21 | 50/50 | 6000 | 1.6 |
| B-22 | 40/60 | 9600 | 1.3 |
| B-23 | 100 | 20000 | 1.7 |
| B-24 | 100 | 25000 | 1.4 |
| B-25 | 100 | 15000 | 1.7 |
| B-26 | 100 | 12000 | 1.8 |
| B-27 | 100 | 18000 | 1.3 |
| B-28 | 70/30 | 15000 | 2.0 |
| B-29 | 80/15/5 | 18000 | 1.8 |
| B-30 | 60/40 | 25000 | 1.8 |
| B-31 | 90/10 | 19000 | 1.6 |
| B-32 | 60/40 | 20000 | 1.8 |
| B-33 | 50/30/20 | 11000 | 1.6 |
| B-34 | 60/40 | 12000 | 1.8 |
| B-35 | 60/40 | 15000 | 1.6 |
| B-36 | 100 | 22000 | 1.8 |
| B-37 | 20/80 | 35000 | 1.6 |
| B-38 | 30/70 | 12000 | 1.7 |
| B-39 | 30/70 | 9000 | 1.5 |
| B-40 | 100 | 9000 | 1.5 |
| B-41 | 40/15/45 | 12000 | 1.9 |
| B-42 | 30/30/40 | 13000 | 2.0 |
| B-43 | 40/40/20 | 23000 | 2.1 |
| B-44 | 65/30/5 | 25000 | 1.6 |
| B-45 | 100 | 15000 | 1.7 |
| B-46 | 20/80 | 9000 | 1.7 |
| B-47 | 70/30 | 18000 | 1.5 |
| B-48 | 60/20/20 | 18000 | 1.8 |
| B-49 | 100 | 12000 | 1.4 |
| B-50 | 60/40 | 20000 | 1.6 |
| B-51 | 70/30 | 33000 | 2.0 |
| B-52 | 60/40 | 19000 | 1.8 |
| B-53 | 50/50 | 15000 | 1.5 |
| B-54 | 40/20/40 | 35000 | 1.9 |
| B-55 | 100 | 16000 | 1.4 |

By the actinic ray-sensitive or radiation-sensitive resin composition of the present invention containing a hydrophobic resin with hydrophobicity containing at least either of a fluorine atom or a silicon atom, the hydrophobic resin is unevenly distributed in the surface layer of a film formed of the actinic ray-sensitive or radiation-sensitive resin composition, and in a case where the immersion medium is water, the receding contact angle of the film surface with respect to water after baking and before exposure can be increased and the followability of the immersion liquid improved.

The receding contact angle of a film formed of the actinic ray-sensitive or radiation-sensitive resin composition of the present invention after baking and before exposure of the coating film is preferably from 60° to 90° at a temperature during exposure, ordinarily room temperature of 23±3° C. and a humidity of 45±5%, more preferably 65° or greater, still more preferably 70° or greater, and most preferably 75° or greater.

The hydrophobic resin is, as described above, unevenly distributed in the interface; however, different to a surfactant, the resin need not necessarily have a hydrophilic group in the molecule, and may not contribute to uniform mixing of polar/nonpolar substances.

In the immersion exposure step, the liquid for immersion needs to move on a wafer following the movement of an exposure head that is scanning the wafer at a high speed and forming an exposure pattern. Therefore, the contact angle of the liquid for immersion with respect to the resist film in a dynamic state is important, and the resist is required to have a performance of allowing liquid droplets to follow the high-speed scanning of an exposure head without leaving any liquid droplets.

Because the hydrophobic resin is hydrophobic, development residue (scum) and BLOB defects after alkali development easily worsen; however, because the alkali dissolution rate improves by having three or more polymer chains via at least one branch portion, development residue (scum) and BLO defect performance is improved compared with linear chain resins.

In the case where the hydrophobic resin contains fluorine atoms, the content of the fluorine atoms is preferably from 5 mass % to 80 mass %, and more preferably from 10 mass % to 80 mass %, with respect to the molecular weight of the hydrophobic resin. In addition, the content of repeating units including a fluorine atom is preferably 10 mol % to 100 mol % with respect to all repeating units in the hydrophobic resin, and more preferably 30 mol % to 100 mol %.

In the case where the hydrophobic resin contains silicon atoms, the content of the silicon atoms is preferably from 2 mass % to 50 mass %, and more preferably from 2 mass % to 30 mass %, with respect to the molecular weight of the hydrophobic resin. In addition, the content of repeating units including a silicon atom is preferably 10 mol % to 90 mol % with respect to all repeating units of the hydrophobic resin, and more preferably 20 mol % to 80 mol %.

The weight average molecular weight of the hydrophobic resin is preferably from 1000 to 100,000, more preferably from 2000 to 50,000 and still more preferably from 3000 to 35,000. Here, the weight average molecular weight of the resin indicates the polystyrene converted molecular weight measured by GPC (carrier: tetrahydrofuran (THF)).

The content of the hydrophobic resin in the actinic ray-sensitive or radiation-sensitive resin composition can be used by being appropriately adjusted such that the receding contact angle of the actinic ray-sensitive or radiation-sensitive resin film is within the above range. The content of the resin is preferably from 0.01 mass % to 20 mass % based on the total solid content of the actinic ray-sensitive or radiation-sensitive resin composition, more preferably from 0.1 mass % to 15 mass %, still more preferably from 0.1 mass % to 10 mass % and particularly preferably from 0.2 mass % to 8 mass %.

The hydrophobic resin may be used independently, or two or more kinds may be used in combination.

[6] Resin (D) Practically not Containing Fluorine Atoms and Silicon Atoms, Different to the Resin (P)

The actinic ray-sensitive or radiation-sensitive resin composition according to the present invention may contain 0.1 mass % or more to less than 10 mass % of a resin (D) practically not containing fluorine atoms and silicon atoms, different the Resin (P)(hereinafter, simply referred to as "resin (D)") with respect to the total solid content of the actinic ray-sensitive or radiation-sensitive resin composition.

Here, the resin (D) practically does not contain fluorine atoms and silicon atoms; however, specifically, the content of repeating units having a fluorine atom or a silicon atom is preferably 5 mol % or less with respect to all repeating units in the resin (D), more preferably 3 mol % or less, still more preferably 1 mol % or less, and ideally 0 mol %, that is, does not contain fluorine atoms and silicon atoms. From the viewpoint of the resin (D) being unevenly distributed in the surface layer portion of the resist film, achieving excellent uniformity of local pattern dimensions and EL and reductions in water residue defects, the content of the resin (D) in the composition in the present invention is 0.1 mass % or higher to less than 10 mass % based on the total solid content in the actinic ray-sensitive or radiation-sensitive resin composition, preferably 0.2 mass % to 8 mass %, more preferably 0.3 mass % to 6 mass %, and particularly preferably 0.5 mass % to 5 mass %.

In the present invention, the mass content rate occupied in the resin (D) of the $CH_3$ partial structure included in a side chain in the resin (D) is 12.0% or higher, and preferably 18.0% or higher. In so doing, low surface free energy can be achieved, the resin (D) can be unevenly distributed in the surface layer portion of the resist film. As a result, the uniformity of local pattern dimensions (uniformity of hole radius in formation of a fine hole pattern) and EL are excellent, and additionally, reductions in water residue defects can be achieved in immersion exposure.

Moreover, the upper limit of the mass content rate of the $CH_3$ partial structure included in a side chain portion in the resin (D) is preferably 50.0% or less, and more preferably 40% or lower.

Here, a methyl group directly bonded to the main chain of the resin (D)(for example, an α-methyl group of a repeating unit having a methacrylate structure), because the contribution to uneven distribution of the resin (D) in the surface due to influence of the main chain is small, it is not counted as not included in partial $CH_3$ structures according to the present invention. More specifically, in a case where the resin (D) includes a repeating unit derived from a monomer having a polymerizable site having a carbon-carbon double bond, such as a repeating unit represented by general formula (M) below, the $CH_3$ is not counted as a $CH_3$ partial structure included in a side chain portion according to the present invention, when $R_{11}$ to $R_{14}$ are $CH_3$ "itself".

On the other hand, a $CH_3$ partial structure present via any atom from a C—C main chain is counted as a $CH_3$ partial structure according to the present invention. For example, in a case where $R_{11}$ is an ethyl group ($CH_2CH_3$), it counted as having "one" $CH_3$ partial structure according to the present invention.

[Chem. 63]

(M)

In general formula (M) above, $R_{11}$ to $R_{14}$ each independently represents a side chain portion.

Examples of the side chain portion of $R_{11}$ to $R_{14}$ include a hydrogen atom and a monovalent organic group.

Examples of the monovalent organic group for $R_{11}$ to $R_{14}$ include an alkyl group, a cycloalkyl group, an aryl group, anlakyloxycarbonyl group, a cycloalkyloxycarbonyl group, an aryloxycarbonyl group, an alkylaminocarbonyl group, a cycloalkyl aminocarbonyl group, or an arylaminocarbonyl group.

The monovalent organic group may further have a substituent. Examples of the substituent include the same as the specific examples and the preferred examples explained later of a substituent which the aromatic group $Ar_{21}$ in general formula (II) may have.

In the present invention, a $CH_3$ partial structure included in an ethyl group, a propyl group, or the like are contained in the $CH_3$ partial structure (hereinafter, also referred to simply as "side chain $CH_3$ partial structure") included in a side chain portion in the resin (D).

Below, the mass content rate occupied in the resin (D) of the $CH_3$ partial structure included in a side chain portion in the resin (D) (hereinafter, also referred to simply as "mass content rate of a side chain $CH_3$ partial structure in the resin (D)") will be described.

Here, the mass content rate of the side chain $CH_3$ partial structure in the resin (D) will be described with a case where the resin (D) is configured from repeating units D1, D2, ..., Dx, ..., Dn, and the mol fraction of repeating units D1, D2, ..., Dx, ..., Dn in the resin (D) are $\omega 1, \omega 2, \ldots, \omega x, \ldots, \omega n$, respectively, as an example.

(1) First, the mass content rate (MCx) of the side chain $CH_3$ partial structure of repeating unit Dx can be calculated using the calculation formula of "100·15.03·(number of $CH_3$ partial structures in side chain portion in repeating unit Dx)/molecular weight (Mx) of repeating unit Dx".

Here, the number of $CH_3$ partial structures in the side chain portion in the repeating unit Dx does not include the number of methyl groups directly linked to the main chain.

(2) Next, using the mass content rate of the side chain $CH_3$ partial structure calculated for each repeating unit, the mass content rate of the side chain $CH_3$ partial structure in the resin (D) can be calculated using the calculation formula below.

mass content rate of side chain $CH_3$ partial structure in resin (D)

$$DMC = \Sigma[(\omega 1 \cdot MC1) + (\omega 2 \cdot MC2) + \ldots + (\omega x \cdot MCx) + \ldots + (\omega n \cdot MCn)]$$

Specific examples of the mass content rate of the $CH_3$ partial structure in the side chain portion of repeating unit Dx are listed in Table 3 below; however, the present invention is not limited thereto.

TABLE 3

| Structure of Repeating Unit | Mw of Repeating Unit | Number of $CH_3$ Partial Structures on Side Chain | Mass Content Rate of Side Chain $CH_3$ Partial Structure |
|---|---|---|---|
| [structure] | 222.24 | 0 | 0.0% |
| [structure] | 247.25 | 0 | 0.0% |
| [structure] | 168.23 | 1 | 8.9% |
| [structure] | 196.29 | 1 | 7.7% |
| [structure] | 224.34 | 3 | 20.1% |
| [structure] | 210.31 | 2 | 14.3% |
| [structure] | 142.2 | 3 | 31.7% |

TABLE 3-continued

| Structure of Repeating Unit | Mw of Repeating Unit | Number of CH₃ Partial Structures on Side Chain | Mass Content Rate of Side Chain CH₃ Partial Structure |
|---|---|---|---|
| (sec-butyl ester acrylate) | 156.22 | 3 | 28.9% |
| (isobutyl-like ester acrylate) | 156.22 | 4 | 38.5% |
| (2-methyl-2-adamantyl ester acrylate) | 234.33 | 1 | 6.4% |
| (1-adamantyl dimethyl ester acrylate) | 262.39 | 2 | 11.5% |
| (methyl ester acrylate) | 100.12 | 1 | 15.0% |
| (styrene) | 104.15 | 0 | 0.0% |
| (4-methylstyrene) | 118.18 | 1 | 12.7% |
| (4-tert-butylstyrene) | 160.26 | 3 | 28.1% |
| (isobutyl ester acrylate) | 128.17 | 2 | 23.5% |
| (2,4-dimethyl-3-pentyl ester acrylate) | 184.28 | 4 | 32.6% |
| (4-tert-butylcyclohexyl ester acrylate) | 224.34 | 3 | 20.1% |

TABLE 3-continued

| Structure of Repeating Unit | Mw of Repeating Unit | Number of CH$_3$ Partial Structures on Side Chain | Mass Content Rate of Side Chain CH$_3$ Partial Structure |
|---|---|---|---|
| (cyclohexyl acrylate structure) | 168.23 | 0 | 0.0% |
| (hydroxyadamantyl acrylate structure) | 236.31 | 0 | 0.0% |

Specific examples of the mass content rate of the side chain CH$_3$ partial structure in the resin (D) are listed in Table 4 below; however, the present invention is not limited thereto.

TABLE 4

| Structure of Resin (D) | Composition Ratio (mol %) | Mass Content Rate (%) of Side Chain CH$_3$ Partial Structure in Resin (D) |
|---|---|---|
| 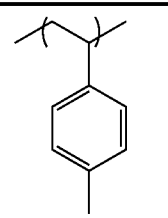 | 100 | 12.7 |
| 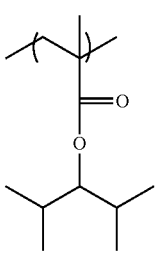 | 100 | 32.6 |
| 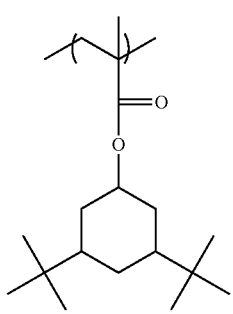 | 100 | 32.2 |

TABLE 4-continued

| Structure of Resin (D) | Composition Ratio (mol %) | Mass Content Rate (%) of Side Chain CH₃ Partial Structure in Resin (D) |
|---|---|---|
| | 30/70 | 25.9 |
| | 10/90 | 32.5 |
| | 15/85 | 26.2 |
| | 15/85 | 19.0 |
| | 50/50 | 21.8 |

TABLE 4-continued
| Structure of Resin (D) | Composition Ratio (mol %) | Mass Content Rate (%) of Side Chain CH₃ Partial Structure in Resin (D) |
|---|---|---|
| 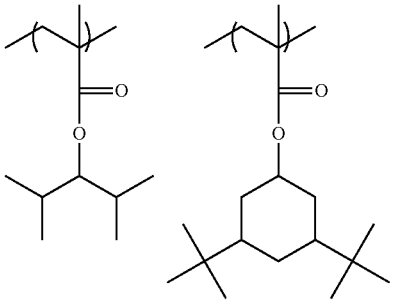 | 60/40 | 32.4 |
| 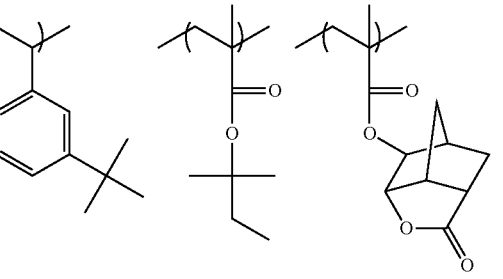 | 40/50/10 | 31.1 |
| 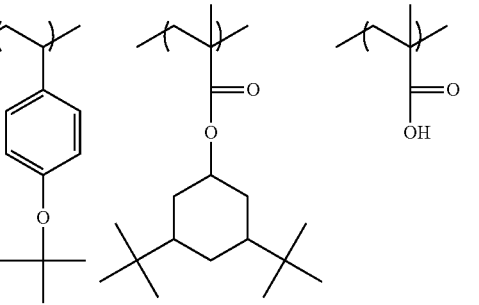 | 10/85/5 | 29.9 |
| 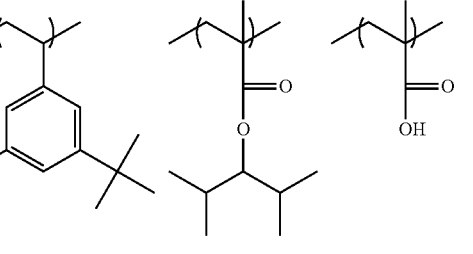 | 40/55/5 | 38.8 |
| 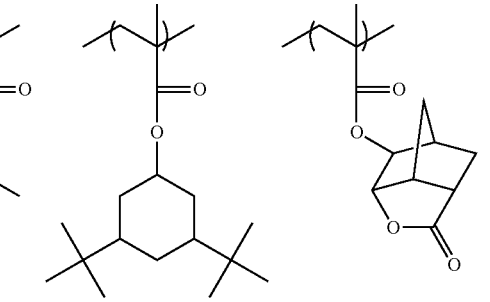 | 50/45/5 | 26.2 |

TABLE 4-continued

| Structure of Resin (D) | Composition Ratio (mol %) | Mass Content Rate (%) of Side Chain $CH_3$ Partial Structure in Resin (D) |
|---|---|---|
| | 20/80 | 28.1 |
| | 50/50 | 20.1 |
| | 40/60 | 33.7 |

The resin (D) preferably has at least one repeating unit represented by general formula (II) or (III) below, and more preferably is formed from only at least one of a repeating unit represented by general formula (II) or (III) below.

[Chem. 64]

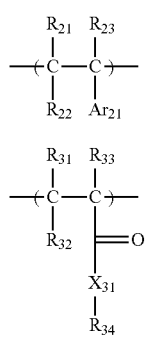

In the general formula (II),
$R_{21}$ to $R_{23}$ each independently represents a hydrogen atom or an alkyl group.
$Ar_{21}$ represents an aromatic group. $R_{22}$ and $Ar_{21}$ may form a ring, and in this case,
$R_{22}$ represents an alkylene group.

In general formula (III) above,
$R_{31}$ to $R_{33}$ each independently represents a hydrogen atom or an alkyl group.
$X_{31}$ represents —O— or —$NR_{35}$—. $R_{35}$ represents a hydrogen atom or an alkyl group.
$R_{34}$ represents an alkyl group or a cycloalkyl group.
The alkyl group of $R_{21}$ to $R_{23}$ in general formula (II) is preferably an alkyl group with 1 to 4 carbon atoms (a methyl group, ethyl group, propyl group, or butyl group), more preferably a methyl group or ethyl group, and particularly preferably a methyl group.
Examples of the alkylene group in a case where $R_{22}$ and $Ar_{21}$ form a ring include a methylene group and an ethylene group.
$R_{21}$ to $R_{23}$ in general formula (II) are particularly preferably a hydrogen atom or a methyl group.
The aromatic group of $Ar_{21}$ in general formula (II) may have a substituent, and examples thereof include an aryl group with 6 to 14 carbon atoms, such as a phenyl group, a naphthyl group; or an aromatic group including a heterocycle, such as thiophene, furan, pyrrole, benzothiophene, benzofuran, benzopyrrole, triazine, imidazole, benzimidazole, triazole, thiadiazole, or thiazole. Among these, an aryl group which may have a substituent with 6 to 14 carbon atoms, such as a phenyl group, or a naphthyl group is preferred.

Examples of the substituent which the aromatic group $Ar_{21}$ may have include an alkyl group, an alkoxy group and an aryl group; however, from the viewpoint of decreasing surface free energy by increasing the mass content rate of the $CH_3$ included in a side chain portion in the resin (D), an alkyl group and an alkoxy group are preferable, an alkyl group and an alkoxyl group with 1 to 4 carbon atoms is more preferable, and a methyl group, an isopropyl group, a tert-butyl group and a tert-butoxy group are particularly preferable.

Moreover, the aromatic group for $Ar_{21}$ may include 2 or more substituents.

The alkyl group of $R_{31}$ to $R_{33}$ and $R_{35}$ in general formula (III) is preferably an alkyl group with 1 to 4 carbon atoms (a methyl group, ethyl group, propyl group, or butyl group), more preferably a methyl group or ethyl group, and particularly preferably a methyl group.

$R_{31}$ to $R_{33}$ in general formula (III) are particularly preferably each independently a hydrogen atom or a methyl group.

$X_{31}$ in general formula (III) is preferably —O— or —NH— (that is, a case where $R_{35}$ in —$NR_{35}$— is a hydrogen atom) and particularly preferably —O—.

In general formula (III), the alkyl group for $R_{34}$ may be either linear or branched, and examples include a linear alkyl group (for example a methyl group, an ethyl group, an n-propyl group, an n-butyl group, an n-hexyl group, an n-octyl group, an n-dodecyl group or the like), or a branched alkyl group (for example, an isopropyl group, an isobutyl group, a tert-butyl group, a methylbutyl group, a dimethylpentyl group, or the like); from the viewpoint of decreasing surface free energy by increasing the mass content rate of the $CH_3$ included in a side chain portion in the resin (D), a branched alkyl group is preferable, a branched alkyl group with 3 to 10 carbon atoms is more preferable, and a branched alkyl group with 3 to 8 carbon atoms is particularly preferable.

In general formula (III), the cycloalkyl group for $R_{34}$ may have a substituent, and examples include a monocyclic cycloalkyl group, such as a cyclobutyl group, a cyclopentyl group and a cyclohexyl group; or a polycyclic cycloalkyl group, such as a norbornyl group, a tetracyclodecanyl group, and an adamantyl group. Among these, a monocyclic cycloalkyl group is preferable, a monocyclic cycloalkyl group with 5 to 6 carbon atoms is more preferable, and a cyclohexyl group is particularly preferable.

Examples of the substituent which the aromatic group $R_{34}$ may have include an alkyl group, an alkoxy group and an aryl group; however, from the viewpoint of decreasing surface free energy by increasing the mass content rate of the $CH_3$ included in a side chain portion in the resin (D), an alkyl group and an alkoxy group are preferable, an alkyl group and an alkoxyl group with 1 to 4 carbon atoms is more preferable, and a methyl group, an isopropyl group, a tert-butyl group and a tert-butoxy group are particularly preferable.

Moreover, the cycloalkyl group for $R_{34}$ may include 2 or more substituents.

It is preferable that $R_{34}$ not be a group leaving by decomposing due to the action of an acid, that is, the repeating unit represented by the general formula (III) not be a repeating unit having an acid-decomposable group.

In general formula (III), $R_{34}$ is most preferably a cyclohexyl group substituted with a branched alkyl group with 3 to 8 carbon atoms, an alkyl group with 1 to 4 carbon atoms or an alkoxyl group.

Specific examples of the repeating unit represented by general formula (II) or (III) are shown below; however, the present invention is not limited thereto.

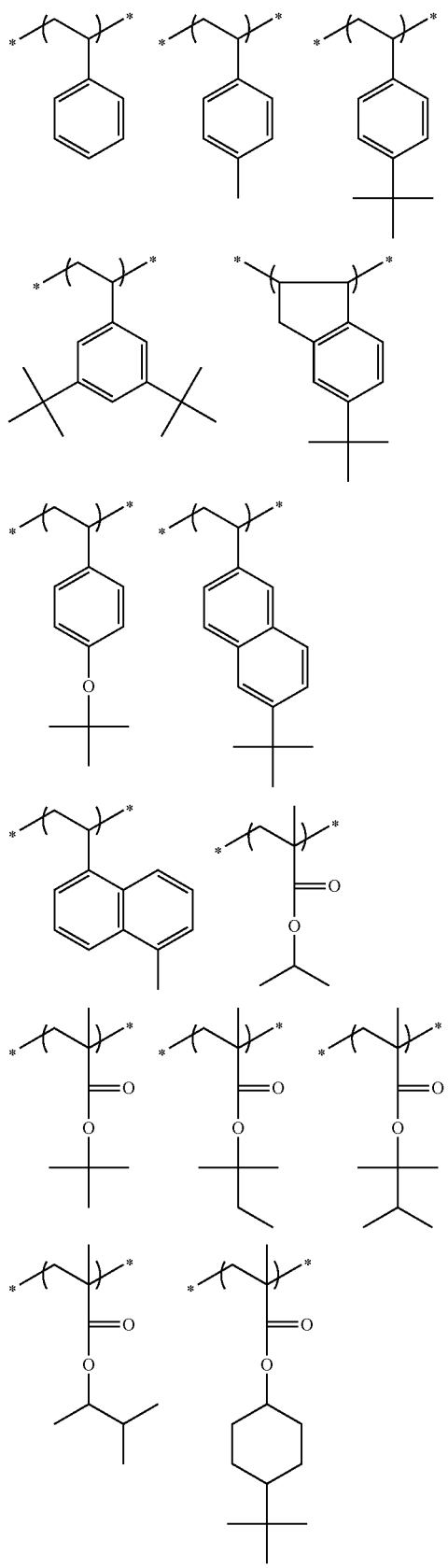

[Chem. 65]

-continued

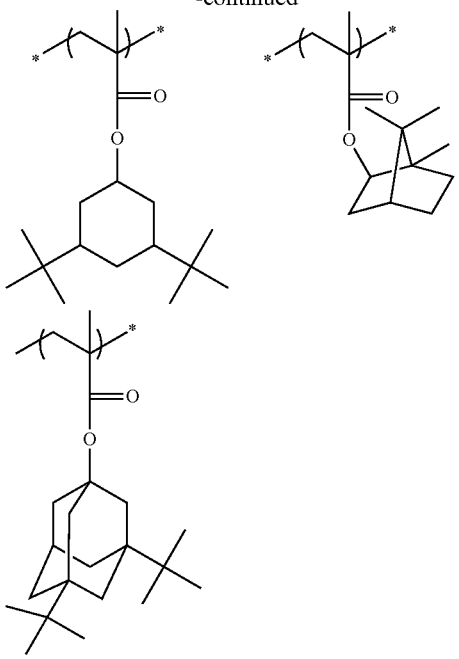

In a case where the resin (D) has a repeating unit represented by the general formula (II) or (III), the content of the repeating unit represented by the general formula (II) or (III), from the viewpoint of achieving the effect of the invention by reducing surface free energy, is preferably in a range of 50 mol % to 100 mol % with respect to all repeating units in the resin (D), more preferably in a range of 65 mol % to 100 mol %, and particularly preferably in a range of 80 mol % to 100 mol %.

The resin (D), similarly to the above-described resin (A), may appropriately have a repeating unit having an acid-decomposable group, a repeating unit having a lactone structure, a repeating unit having a hydroxyl group or a cyano group, a repeating unit having an acid group (alkali soluble group), or a repeating unit having an alicyclic hydrocarbon structure not having a polar group and not showing acid-decomposability.

Specific examples and preferred examples of each repeating unit that the resin (D) may have are the same as the specific examples and preferred examples of each repeating unit described above for the resin (A).

However, from the viewpoint of achieving the effect of the present invention, the resin (D) more preferably does not have a repeating unit having an acid-decomposable group, an alkali soluble repeating unit, or a repeating unit having a lactone structure.

The weight average molecular weight of the resin (D) according to the present invention is not particularly limited; however, the weight average molecular weight is preferably in a range from 3,000 to 100,000, more preferably in a range from 6,000 to 70,000, and particularly preferably in a range from 10,000 to 40,000. In particular, by having a weight average molecular weight in a range from 10,000 to 40,000 in the formation of a fine hole pattern, the Local CDU and exposure latitude are excellent, and defect performance is excellent in immersion exposure. Herein, the weight average molecular weight of the resin indicates the polystyrene converted molecular weight measured by GPC (carrier: THF or N-methyl-2-pryrrolidone (NMP))

In addition, the dispersity (Mw/Mn) is preferably 1.00 to 5.00, more preferably 1.03 to 3.50, still more preferably 1.05 to 2.50. The smaller the molecular weight distribution, the better the resolution and resist pattern profile.

The resin (D) according to the present invention may be one type used independently or may be a combination of two or more types.

As for the resin (D), various commercially available products may be used or the resin may be synthesized by an ordinary method (for example, radical polymerization). Examples of the general synthetic method include a batch polymerization method in which a monomer species and an initiator are dissolved in a solvent and heated so as to accomplish polymerization and a dropping polymerization method in which a solution of monomer species and initiator is added by dropwise addition to a heated solvent over a period of 1 to 10 hours. The dropping polymerization method is preferred.

The reaction solvent, the polymerization initiator, the reaction conditions (for example, temperature and concentration), and the purification method after reaction are the same as those described for the resin (A), but the concentration for the reaction is preferably from 10 mass % to 50 mass % in the synthesis of the resin (D).

Specific examples of the resin (D) are shown below; however, the present invention is not limited thereto. In addition, the molar ratio (the positional relationship of each repeating unit in each resin shown in the specific examples corresponds to the positional relationship of the number of the compositional ratio in Table 5), weight average molecular weight, and dispersity of the repeating units in each resin are shown in Table 5 below.

[Chem. 66-1]

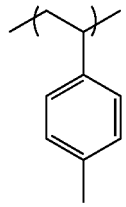

(B-56)

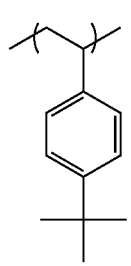

(B-57)

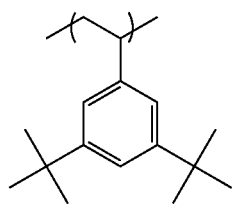

(B-58)

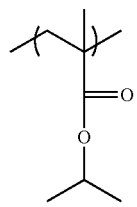
(B-59)
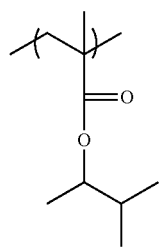
(B-60)
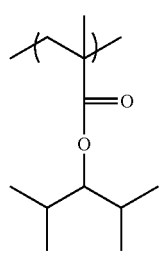
(B-61)
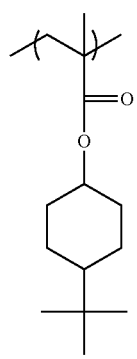
(B-62)
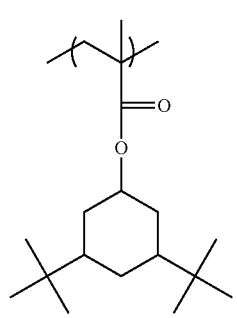
(B-63)
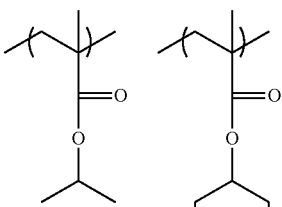
(B-64)
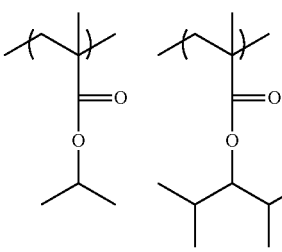
(B-65)
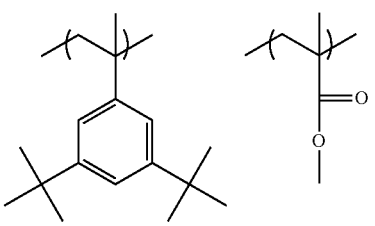
(B-66)
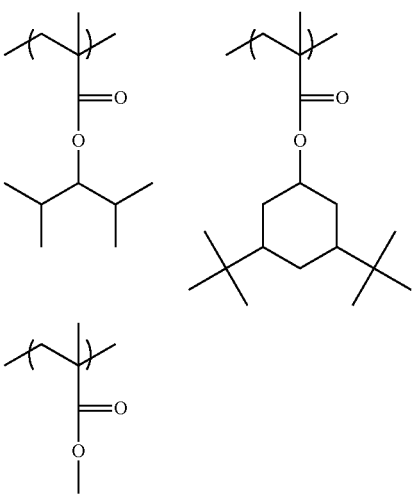
(B-67)
(B-68)

(B-69) 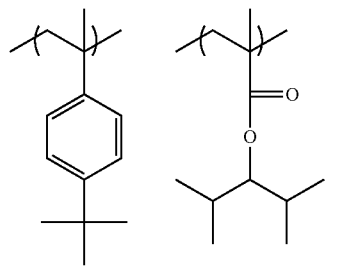
(B-70) 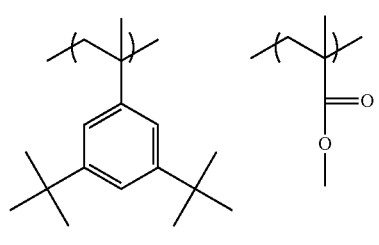
(B-71) 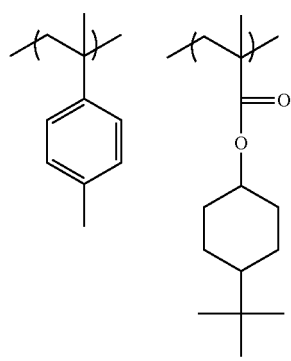
(B-72) 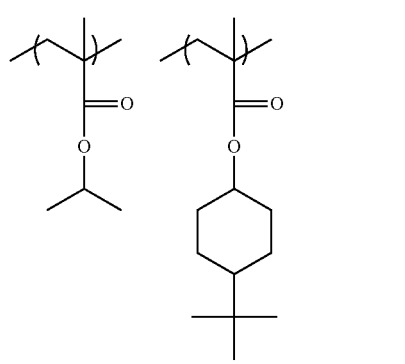
(B-73) 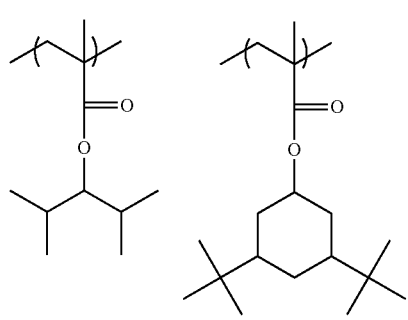
[Chem. 66-2]
(B-74) 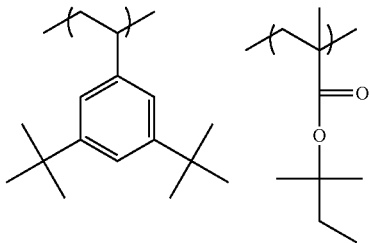
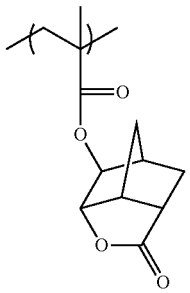
(B-75) 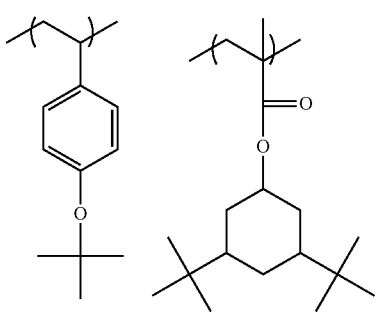
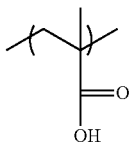
(B-76) 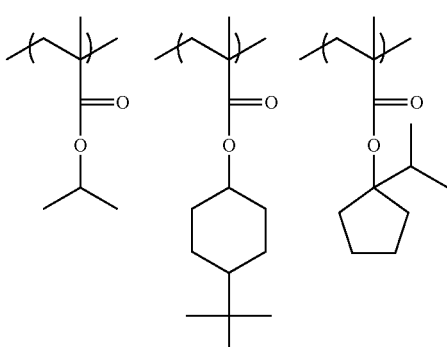
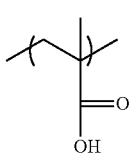

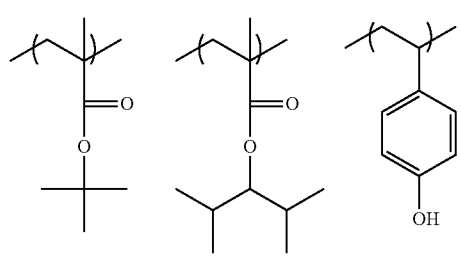
(B-77)
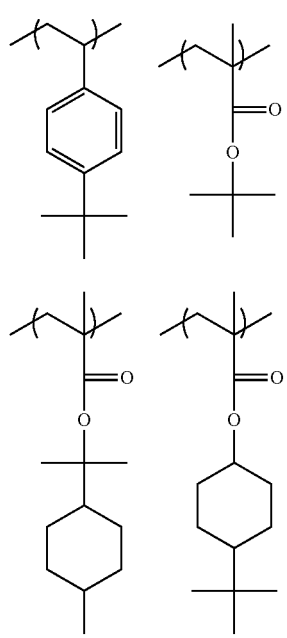
(B-78)
(B-79)
(B-80)
(B-81)
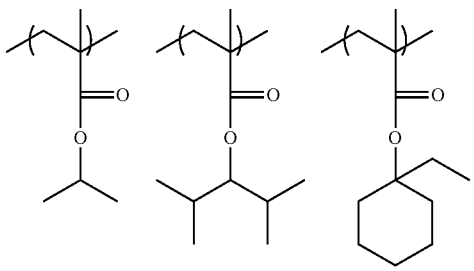
(B-82)
[Chem. 66-3]
(B-83)
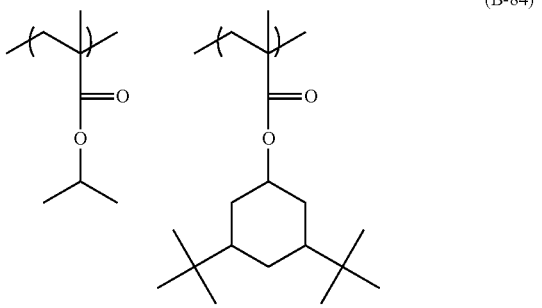
(B-84)
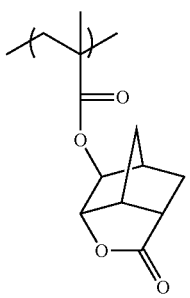

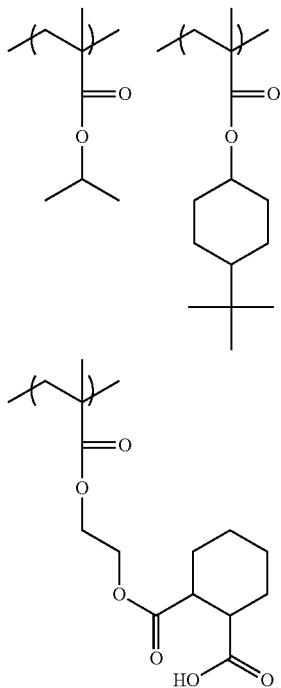

(B-85)

(B-86)

TABLE 5

| Polymer | Composition Ratio (mol %) | Mw | Mw/Mn |
|---|---|---|---|
| B-56 | 100 | 8000 | 1.4 |
| B-57 | 100 | 16000 | 1.5 |
| B-58 | 100 | 11500 | 1.5 |
| B-59 | 100 | 26400 | 1.8 |
| B-60 | 100 | 13500 | 1.6 |
| B-61 | 100 | 28500 | 1.8 |
| B-62 | 100 | 35200 | 2.1 |
| B-63 | 100 | 6500 | 1.4 |
| B-64 | 40/60 | 18600 | 1.6 |
| B-65 | 30/70 | 25800 | 2.0 |
| B-66 | 50/50 | 15200 | 1.6 |
| B-67 | 30/60/10 | 22000 | 1.7 |
| B-68 | 40/60 | 14300 | 1.5 |

TABLE 5-continued

| Polymer | Composition Ratio (mol %) | Mw | Mw/Mn |
|---|---|---|---|
| B-69 | 50/50 | 23400 | 1.8 |
| B-70 | 10/90 | 11200 | 1.5 |
| B-71 | 20/80 | 7200 | 1.4 |
| B-72 | 10/90 | 17600 | 1.8 |
| B-73 | 30/70 | 26500 | 2.1 |
| B-74 | 20/50/30 | 32100 | 2.2 |
| B-75 | 30/60/10 | 24600 | 1.8 |
| B-76 | 30/20/45/5 | 26200 | 1.9 |
| B-77 | 30/50/20 | 14600 | 1.5 |
| B-78 | 50/50 | 13500 | 1.6 |
| B-79 | 70/30 | 28700 | 1.9 |
| B-80 | 30/70 | 16800 | 1.8 |
| B-81 | 30/30/40 | 31200 | 2.3 |
| B-82 | 30/40/30 | 24000 | 1.9 |
| B-83 | 20/70/10 | 12600 | 1.6 |
| B-84 | 20/50/30 | 13500 | 1.5 |
| B-85 | 20/75/5 | 22200 | 1.8 |
| B-86 | 40/50/10 | 26100 | 1.9 |

[7] Basic Compound (N')

The actinic ray-sensitive or radiation-sensitive resin composition in the invention may contain a basic compound (N') in order to reduce the change in performance with aging from exposure to heating.

Preferred examples of the basic compound (N') include compounds having structures represented by the following formula (A) to (E).

[Chem. 67]

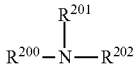 (A)

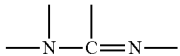 (B)

(C)

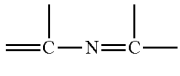 (D)

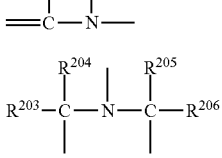 (E)

In general formula (A) and (E), $R^{200}$, $R^{201}$, and $R^{202}$ may be the same as or different from each other, and each independently represents a hydrogen atom, an alkyl group (preferably having 1 to 20 carbon atoms), a cycloalkyl group (preferably having 3 to 20 carbon atoms), or an aryl group (having 6 to 20 carbon atoms), in which $R^{201}$ and $R^{202}$ may be bonded to each other to form a ring; and $R^{203}$, $R^{204}$, $R^{205}$, and $R^{206}$ may be the same as or different from each other, and each independently represents an alkyl group having 1 to 20 carbon atoms.

The alkyl group having a substituent as the alkyl group is preferably an aminoalkyl group having 1 to 20 carbon atoms, a hydroxyalkyl group having 1 to 20 carbon atoms, or a cyanoalkyl group having 1 to 20 carbon atoms.

The alkyl group in general formula (A) and (E) is more preferably unsubstituted.

Preferred examples of the compound include guanidine, aminopyrrolidine, pyrazole, pyrazoline, piperazine, aminomorpholine, aminoalkylmorpholine, and piperidine; and more preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide, and 2-oxopropylthiophenium hydroxide. The compound having an onium carboxylate structure is a compound where the anion moiety of the compound having an onium hydroxide structure becomes a carboxylate, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound (N') include a phenoxy group-containing amine compound, a phenoxy group-containing ammonium salt compound, a sulfonic acid ester group-containing amine compound, and a sulfonic acid ester group-containing ammonium salt compound.

As for the phenoxy group-containing amine compound, the phenoxy group-containing ammonium salt compound, the sulfonic acid ester group-containing amine compound, and the sulfonic acid ester group-containing ammonium salt compound, it is preferable that at least one alkyl group be bonded to the nitrogen atom. Further, it is preferable that the compound have an oxygen atom in the alkyl chain to form an oxyalkylene group. The number of the oxyalkylene groups within the molecule is 1 or more, preferably from 3 to 9, and more preferably from 4 to 6. Among the oxyalkylene groups, the structures of —$CH_2CH_2O$—, —$CH(CH_3)CH_2O$—, or —$CH_2CH_2CH_2O$— are preferred.

Specific examples of the phenoxy group-containing amine compound, the phenoxy group-containing ammonium salt compound, the sulfonic acid ester group-containing amine compound, and the sulfonic acid ester group-containing ammonium salt compound include, but are not limited to, Compounds (C1-1) to (C3-3) illustrated in the specification of US2007/0224539A.

The basic compound (N') is more preferably a nitrogen-containing organic compound having a group leaving due to the action of an acid. Examples of such a compound include a compound represented by the general formula (F) below. Moreover, the compound represented by the following general formula (F) effectively exhibits basicity in a system by the group leaving by action of an acid.

[Chem. 68]

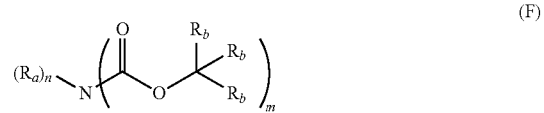

In general formula (F), $R_a$ independently represents a hydrogen atom, an alkyl group, a cycloalkyl group, an aryl group, or an aralkyl group. In addition, when n=2, two $R_a$'s may be the same as or different from each other, and two $R_a$'s may bond to each other to form a divalent heterocyclic hydrocarbon group (preferably with 20 carbon atoms or less) or a derivative thereof.

$R_b$'s independently represent a hydrogen atom, an alkyl group, a cycloalkyl group, an aryl group, and an aralkyl group. Herein, in —$C(R_b)(R_b)(R_b)$, when one or more $R_b$'s are hydrogen atoms, at least one of the remaining $R_b$'s is a cyclopropyl group or a 1-alkoxyalkyl group.

At least two $R_b$'s may bond to each other to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In the general formula (F), each of the alkyl group, the cycloalkyl group, the aryl group, and the aralkyl group represented by $R_a$ and $R_b$ may be substituted with a functional group such as a hydroxyl group, a cyano group, an amino group, a pyrrolidino group, a piperidino group, a morpholino group, and an oxo group, an alkoxy group, or a halogen atom.

Examples of the alkyl group, cycloalkyl group, aryl group, or aralkyl group (the alkyl group, cycloalkyl group, aryl group, and aralkyl group may be substituted with a functional group, alkoxy group, or halogen atom described above) of the R include:

a group derived from a linear or branched alkane, such as methane, ethane, propane, butane, pentane, hexane, heptane, octane, nonane, decane, undecane, or dodecane; a group obtained by substituting these alkane-derived groups with one or more kinds or one or more cycloalkyl groups, such as a cyclobutyl group, a cyclopentyl group, or a cyclohexyl group;

a group derived from cycloalkane, such as cyclobutane, cyclopentane, cyclohexane, cycloheptane, cyclooctane, norbornane, adamantane, or noradamantane; a group obtained by substituting these cycloalkane-derived groups with one or more kinds or one or more linear or branched alkyl groups, such as a methyl group, an ethyl group, an n-propyl group, an i-propyl group, an n-butyl group, a 2-methylpropyl group, a 1-methylpropyl group, or a t-butyl group;

a group derived from aromatic compounds such as benzene, naphthalene and anthracene; a group obtained by substituting these aromatic group-derived groups with one or more kinds or one or more linear or branched alkyl groups, such as a methyl group, an ethyl group, an n-propyl group, an i-propyl group, an n-butyl group, a 2-methylpropyl group, a 1-methylpropyl group, or a t-butyl group;

a group derived from heterocyclic compounds such as pyrrolidine, piperidine, morpholine, tetrahydrofuran, tetrahydropyran, indole, indoline, quinoline, perhydroquinoline, indazole, and benzimidazole; a group obtained by substituting these heterocyclic compound-derived groups with one or more kinds or one or more of a linear or branched alkyl group or a group derived from aromatic compounds; a group obtained by substituting a group derived from a linear or branched alkane and a group derived from cycloalkane with one or more kinds or one or more groups derived from aromatic compounds, such as a phenyl group, a naphthyl group, and an anthracenyl group; or a group obtained by substituting the above-described substituents with a functional group such as a hydroxyl group, a cyano group, an amino group, a pyrrolidino group, a piperidino group, a morpholino group, or an oxo group.

Particularly preferable basic compounds (N') in the present invention are specifically shown; however, the present invention is not limited thereto.

[Chem. 69]

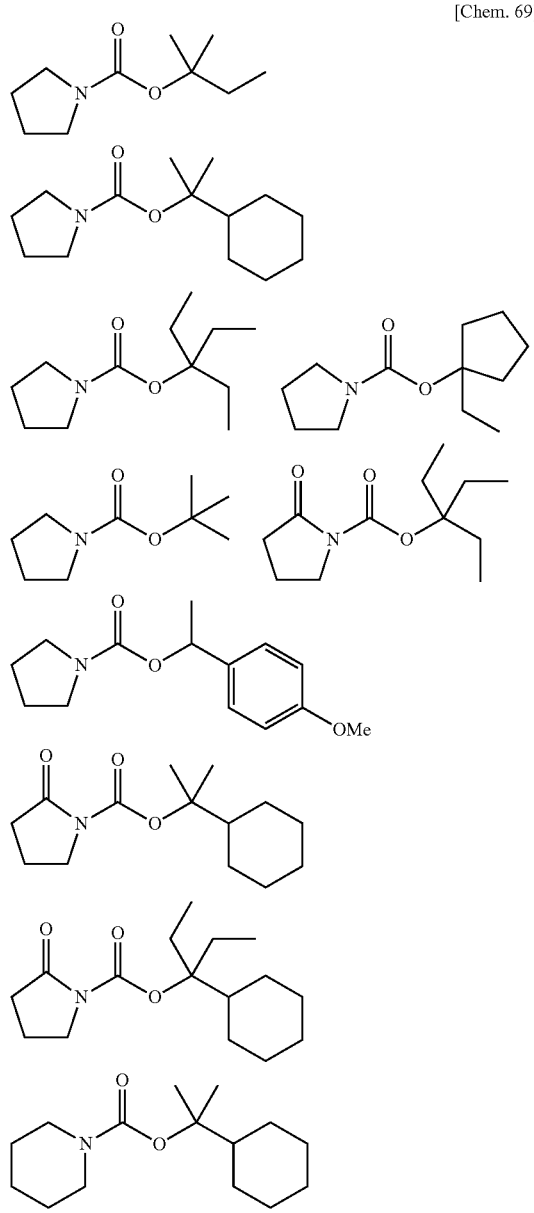

-continued

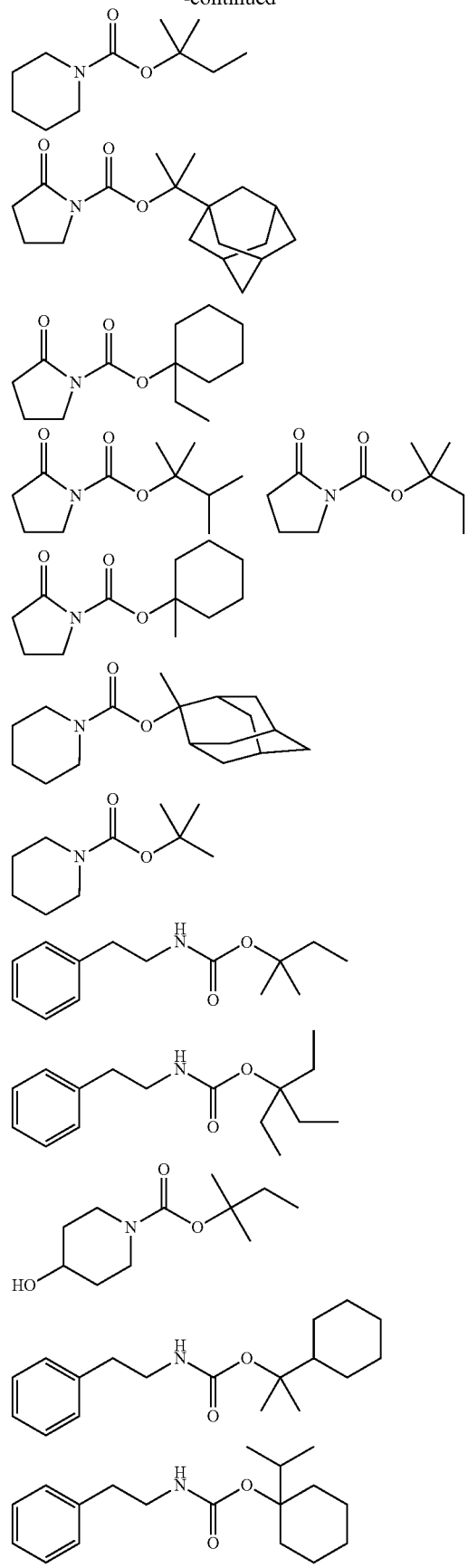

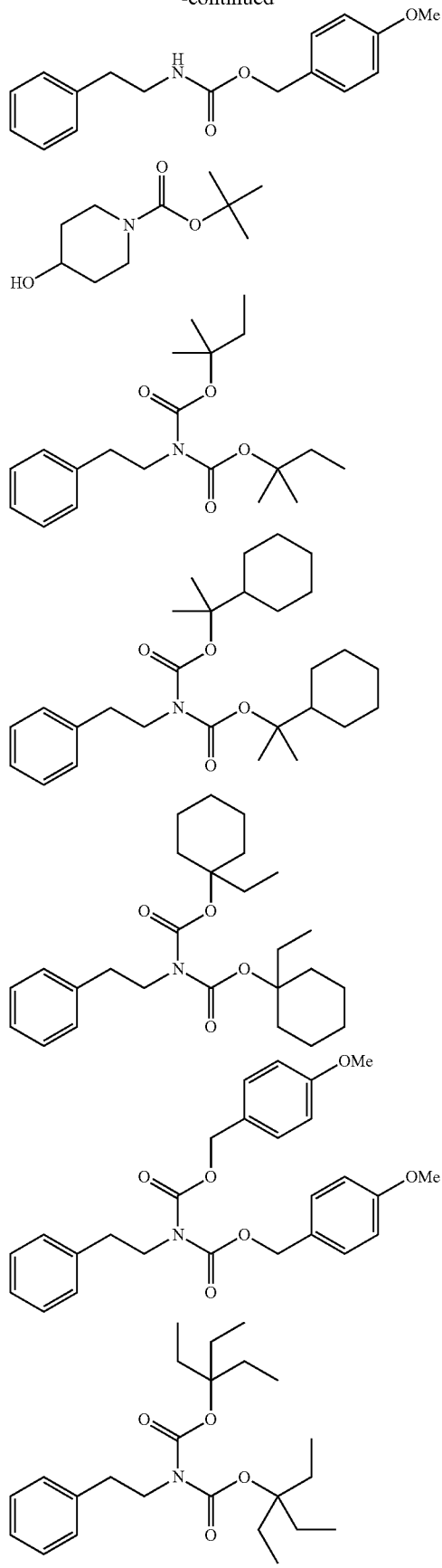
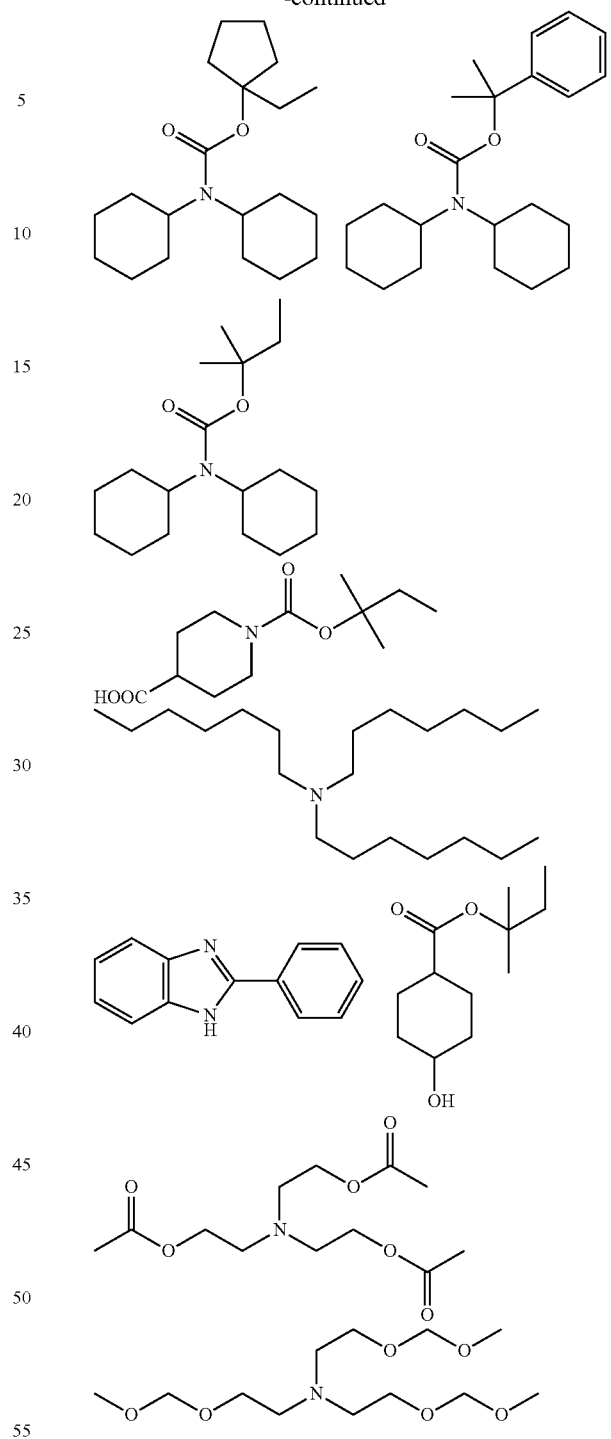

The compound represented by the general formula (F) to be used may be commercially available products or may be synthesized, for example, from a commercially available amine by the method described in Protective Groups in Organic Synthesis, 4th edition, and the like. It may also be synthesized in accordance with, for example, a method described in JP2009-199021A as the most general method.

In addition, the basic compound (N') may use a compound having basicity or increasing basicity due to the action of an acid, along with having a fluorine atom or silicon atom, such as disclosed in JP2011-141494A. Specific examples include the compounds (B-7) to (B-18) used in the Examples in JP2011-141494A.

The molecular weight of the basic compound (N') is preferably from 250 to 2000, and more preferably from 400 to 1000. From the viewpoints of further reduction of LWR and local pattern dimensional uniformity, the molecular weight of the basic compound (N') is preferably 400 or more, more preferably 500 or more, and still more preferably 600 or more.

These basic compounds (N') may be used independently, or two or more kinds thereof may be used together.

The actinic ray-sensitive or radiation-sensitive resin composition in the invention may or may not contain the basic compound (N'), but in the case of the basic compound (N') being contained, the amount of the basic compound (N') used is usually from 0.001 mass % to 10 mass %, and preferably from 0.01 mass % to 5 mass %, based on the solid content of the actinic ray-sensitive or radiation-sensitive resin composition.

The ratio between the acid generator and the basic compound used in the composition is preferably a ratio of acid generator/basic compound (molar ratio)=2.5 to 300. That is, the molar ratio is preferably 2.5 or more from the viewpoint of sensitivity and resolution, and preferably 300 or less from the viewpoint of suppressing the reduction in resolution due to thickening of the resist pattern with aging after exposure until heat treatment. The acid generator/basic compound (molar ratio) is more preferably from 5.0 to 200, and still more preferably from 7.0 to 150.

[8] Surfactant

The actinic ray-sensitive or radiation-sensitive resin composition in the invention may or may not further contain a surfactant, and in the case where it contains a surfactant, it is preferable to include any one fluorine-based and/or silicon-based surfactant (a fluorine-based surfactant, a silicon-based surfactant or a surfactant containing both fluorine atoms and silicon atoms) or two or more kinds thereof.

When the actinic ray-sensitive or radiation-sensitive resin composition in the invention contains the surfactant, a resist pattern with good sensitivity, resolution and adherence as well as few development defects can be obtained in using an exposure light source of 250 nm or less, and in particular, 220 nm or less.

Examples of the fluorine-based and/or silicon-based surfactant include the surfactants described in the specification of US Patent App. No. 2008/0248425, such as EFtop EF301 and EF303 (manufactured by Shin-Akita Kasei K. K.); Florad FC430, 431, and 4430 (manufactured by Sumitomo 3M Inc.); Megaface F171, F173, F176, F189, F113, F110, F177, F120, and R08 (manufactured by Dainippon Ink & Chemicals, Inc.); Surflon S-382, SC101, 102, 103, 104, 105, and 106, and KH-20 (manufactured by Asahi Glass Co., Ltd.); Troysol S-366 (manufactured by Troy Chemical); GF-300, and GF-150 (manufactured by Toagosei Chemical Industry Co., Ltd.); Surflon S-393 (manufactured by Seimi Chemical Co., Ltd.); EFtop EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA); and FTX-204G, 208G, 218G, 230G, 204D, 208D, 212D, 218D, and 222D (manufactured by NEOS Co., Ltd.). In addition, a polysiloxane polymer KP-341 (manufactured by Shin-Etsu Chemical Co., Ltd.) may also be used as the silicon-based surfactant.

Furthermore, other than those known surfactants above, a surfactant using a polymer having a fluoro-aliphatic group derived from a fluoro-aliphatic compound which is produced by a telomerization method (also called a telomer method) or an oligomerization method (also called an oligomer method), may also be used. The fluoro-aliphatic compound can be synthesized by the method described in JP2002-90991A.

Examples of the above-described type of surfactant include Megaface F178, F-470, F-473, F-475, F-476, and F-472 (manufactured by Dainippon Ink & Chemicals, Inc.), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene))acrylate (or methacrylate), and a (poly(oxypropylene))acrylate (or methacrylate).

Moreover, a surfactant other than the fluorine-based and/or silicon-based surfactant, described in the specification of US Patent App. No. 2008/0248425, may also be used in the invention.

The surfactants may be used independently or in combination of several kinds thereof.

In the case where the actinic ray-sensitive or radiation-sensitive resin composition contains the surfactant, the amount of the surfactant used is preferably from 0.0001 mass % to 2 mass %, and more preferably from 0.0005 mass % to 1 mass %, based on the total amount of the actinic ray-sensitive or radiation-sensitive resin composition (excluding the solvent).

On the other hand, by setting the addition amount of the surfactant to 10 ppm or less based on the total amount of the actinic ray-sensitive or radiation-sensitive resin composition (excluding the solvent), the resin (HR) according to the invention is more unevenly distributed to the surface, so that the resist film surface can be made more hydrophobic and the followability of water at the immersion exposure can be enhanced.

[9] Other Additives

The actinic ray-sensitive or radiation-sensitive resin composition in the invention may or may not contain an onium carboxylate. Examples of the onium carboxylate include those described in the specification of US Patent App. No. 2008/0187860.

The onium carboxylate can be synthesized by reacting sulfonium hydroxide, iodonium hydroxide, ammonium hydroxide, and carboxylic acid with silver oxide in a suitable solvent.

In the case where the actinic ray-sensitive or radiation-sensitive resin composition contains onium carboxylate, the content of the onium carboxylate is generally from 0.1 mass % to 20 mass %, preferably 0.5 mass % to 10 mass %, and still more preferably 1 mass % to 7 mass %, based on the total solid contents of the composition.

The actinic ray-sensitive or radiation-sensitive resin composition of the invention may further contain, for example, a dye, a plasticizer, a photosensitizer, a light absorber, an alkali-soluble resin, a dissolution inhibitor, a compound for accelerating dissolution in a developer (for example, a phenol compound having a molecular weight of 1000 or less, or a carboxyl group-containing alicyclic or aliphatic compound), or the like, if desired.

The phenol compound having a molecular weight of 1000 or less can be easily synthesized by referring to the methods described, for example, in JP1992-122938A (JP-H04-122938A), JP1990-28531A (JP-H02-28531A), U.S. Pat. No. 4,916,210B, EP219294B, and the like.

Examples of the carboxyl group-containing alicyclic or aliphatic compound include a carboxylic acid derivative having a steroid structure, such as cholic acid, deoxycholic acid, and lithocholic acid, an adamantanecarboxylic acid derivative, adamantanedicarboxylic acid, cyclohexanecarboxylic acid, and cyclohexanedicarboxylic acid; however, the present invention is not limited thereto.

The actinic ray-sensitive or radiation-sensitive resin composition in the invention is preferably used in a film thickness of 30 to 250 nm, and more preferably from 30 to 200 nm, from the viewpoint of enhancing the resolving power. Such a film thickness can be obtained by setting the solid concentration in the actinic ray-sensitive or radiation-sensitive resin composition to an appropriate range, thereby imparting an appropriate viscosity and enhancing the coatability and the film forming properties.

The solid content concentration of the actinic ray-sensitive or radiation-sensitive resin composition for use in the invention is usually from 1.0 mass % to 10 mass %, preferably from 2.0 mass % to 5.7 mass %, and more preferably from 2.0 mass % to 5.3 mass %. When the solid content concentration is in this range, the resist solution can be uniformly applied on a substrate, and in addition, a resist pattern with excellent line width roughness can be formed. The reasons therefor are not clearly known, but it is probably considered that by setting the solid content concentration to 10 mass % or less, and preferably 5.7 mass % or less, the materials, particularly the photoacid generator, in the resist solution are prevented from aggregation, and as a result, a uniform resist film can be formed.

The solid content concentration is a weight percentage of the weight of the resist components excluding the solvents, based on the total weight of the actinic ray-sensitive or radiation-sensitive resin composition.

The actinic ray-sensitive or radiation-sensitive resin composition of the invention is used, for example, after the above components are dissolved in a predetermined organic solvent, filtered using a filter, and then applied onto a predetermined support (substrate). The filter is preferably made of polytetrafluoroethylene, polyethylene, or nylon having a pore size of 0.1 µm or less, more preferably 0.05 µm or less, and still more preferably 0.03 µm or less. In the filtration using a filter, for example, cyclic filtration may be carried out as described in JP2002-62667A or filtration with serial or parallel connection of plural kinds of filters may be carried out. Further, the composition may be filtered plural times. In addition to the filtration using a filter, the composition may be subjected to a deaeration treatment or the like.

<Pattern Forming Method>

Next, the pattern forming method according to the present invention will be described. The pattern forming method (that is, negative pattern forming method) of the present invention includes at least;
(i) a step forming a film including the actinic ray-sensitive or radiation-sensitive resin composition (that is, a resist film) of the present invention,
(ii) a step irradiating the film with actinic rays or radiation (that is, an exposure step), and
(iii) a step developing the above film exposed using a developer including an organic solvent.

The exposure in Step (ii) above may be immersion exposure.

The pattern forming method of the present invention preferably includes (iv) a heating step after (ii) the exposure step.

The pattern forming method of the present invention may further include (v) a developing step using an alkali developer.

The pattern forming method of the present invention may include performing (ii) the exposure step a plurality of times.

The pattern forming method of the present invention may include performing (iv) the heating step a plurality of times.

The resist film of the present invention is a film formed from the actinic ray-sensitive or radiation-sensitive resin composition. More specifically, the film preferably formed by coating the actinic ray-sensitive or radiation-sensitive resin composition on a substrate. In the pattern forming method of the invention, the processes of forming a film from the actinic ray-sensitive or radiation-sensitive resin composition on a substrate; exposing the film; and developing may be carried out by a generally known method.

After preparing the film and before the exposure step, a prebake process (PB; Prebake) is also preferably included.

In addition, after the exposure step and before the development step, a heating step (PEB; Post Exposure Bake) is also preferably included.

Regarding the heating temperature, heating of any of PB and PEB is preferably at a temperature of 70° C. to 130° C., and more preferably at a temperature of 80° C. to 120° C.

The heating time is preferably 30 to 300 seconds, more preferably 30 to 180 seconds, and still more preferably 30 to 90 seconds.

Heating may be carried out by a unit included in an ordinary exposure/development apparatus, and may also be carried out using a hot plate or the like.

By the baking, the reaction of the exposed portion is accelerated and the sensitivity or pattern profile is improved.

The light source wavelength used in the exposure apparatus in the invention is not limited, but examples thereof infrared radiation, visible light, ultraviolet rays, far ultraviolet rays, extreme ultraviolet light, X-rays, and an electron beam. The far ultraviolet rays have a wavelength of preferably 250 nm or shorter, more preferably 220 nm or shorter, and particularly preferably 1 to 200 nm, specifically, a KrF excimer laser (248 nm), an ArF excimer laser (193 nm), an $F_2$ excimer laser (157 nm), X-rays, EUV radiation (13 nm), and an electron beam, with a KrF excimer laser, an ArF excimer laser, EUV radiation, or an electron beam being preferred, and an ArF excimer laser being more preferred.

Moreover, in the exposure of the invention, a liquid immersion exposure method may be applied.

The liquid immersion exposure method is a technique for improving the resolution, in which a high refractive-index liquid (hereinafter also referred to as a "liquid for liquid immersion") is filled between a projection lens and a sample to carry out exposure.

As described above, with regard to the "effect of the liquid immersion", taking $\lambda_0$ as the wavelength of exposure light in air, n as the refractive index of the liquid for liquid immersion to air and $\theta$ as the convergent half angle of the light beam, where $NA_0 = \sin \theta$, the resolving power and the focal depth (DOF) in the event of liquid immersion can be expressed by the following formula. Here, $k_1$ and $k_2$ are coefficients involved in the process.

$$\text{(Resolving Power)} = k_1 (\lambda_0/n)/NA_0$$

$$(DOF) = \pm k_2 (\lambda_0/n)/NA_0^2$$

That is, the effect of the liquid immersion is equivalent to the use of an exposure wavelength of 1/n. In other words, in projection optical systems of identical NA, liquid immersion enables the focal depth to be n-fold. This is effective in all pattern configurations. Further, this can be combined with a super-resolution technology, such as a phase shift method or a modified illumination method, now under study.

In the case of carrying out liquid immersion exposure, the washing of the surface of a film with an aqueous chemical liquid may be carried out (1) after forming a film on a substrate and before the exposing step, and then exposing the film through a liquid for liquid immersion, and/or (2) after exposing a film through liquid immersion and before heating the film.

The liquid for liquid immersion is preferably a liquid which is transparent in exposure wavelength whose temperature coefficient of a refractive index is as low as possible so as to ensure minimization of any distortion of an optical image projected on the film. Particularly, in the use of an ArF excimer laser (wavelength: 193 nm) as an exposure light source; however, it is more preferable to use water from the viewpoints of easiness of availability and easiness of handling in addition to the above-described viewpoints.

In a case where water is used, an additive (liquid) which decreases the surface tension of the water and increases surfactant potency may be added in a slight proportion. This additive is preferably a material which negligibly affects the optical coating of the lower surface of a lens element without dissolving the resist film on a wafer.

The additive is preferably an aliphatic alcohol with a refractive index approximately equal to that of water, and specific examples thereof include methyl alcohol, ethyl alcohol, and isopropyl alcohol. The addition of an alcohol with a refractive index approximately equal to that of water is advantageous in that even when the alcohol component is evaporated from water, thereby causing a change in the concentration, the change in the refractive index of the liquid as a whole can be minimized.

On the other hand, when a substance being opaque in light at 193 nm or an impurity whose refractive index is greatly different from that of water is mixed therein, the mixing would invite a distortion of optical image projected on the resist. Accordingly, distilled water is preferred as the water used. Furthermore, pure water that has been filtered through an ion exchange filter or the like may be used.

For the water, used as a liquid for liquid immersion, the electric resistivity is preferably 18.3 MΩcm or more, and the TOC (total organic matter concentration) is preferably 20 ppb or less. Also, the water is preferably subjected to a deaeration treatment.

Furthermore, by increasing the refractive index of the liquid for liquid immersion, it is possible to enhance lithography performance. From such viewpoints, an additive capable of increasing a refractive index may be added to the water, or heavy water ($D_2O$) may be used in place of the water.

The receding contact angle of a resist film using the actinic ray-sensitive or radiation-sensitive resin composition in the present invention is 70° or higher at a temperature of 23±3° C. and a humidity of 45±5%, is preferably 75° or higher which is suitable to a case where exposed via an immersion medium, and more preferably 75° to 85°.

Because water residue (watermark) defects are generated when the receding contact angle is too small, this is not preferable. By including the hydrophobic resin (HR) or resin (D) in the actinic ray-sensitive or radiation-sensitive resin composition in the present invention, the receding contact angle of the resist film surface can be improved.

In the liquid immersion exposure step, the liquid for liquid immersion needs to move on a wafer following the movement of an exposure head that is scanning the wafer at a high speed and forming an exposure pattern. Therefore, the contact angle of the liquid for liquid immersion with the resist film in a dynamic state is important, and the resist is required to have a performance of allowing liquid droplets to follow the high-speed scanning of an exposure head without leaving any liquid droplets.

In the invention, the substrate on which the film is formed is not particularly limited, and a substrate generally used for lithography in the production of a semiconductor device, such as an IC, a liquid crystal device or a circuit board such as a thermal head and further in other photofabrication processes, such as an inorganic substrate, for example, silicon, SiN, $SiO_2$, and SiN and a coating-type inorganic substrate, for example, SOG, can be used. Further, if necessary, an organic anti-reflection film may be formed between the film and the substrate.

In the case where the pattern forming method of the invention further includes development using an alkali developer, examples of the alkali developer include alkaline aqueous solutions of inorganic alkali such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, and cyclic amines such as pyrrole and piperidine.

Furthermore, the alkaline aqueous solution may be used by adding alcohols and a surfactant thereto each in an appropriate amount.

The alkali concentration of the alkali developer is usually from 0.1 mass % to 20 mass %.

The pH of the alkali developer is usually from 10.0 to 15.0.

Particularly, a 2.38 mass % aqueous solution of tetramethylammonium hydroxide is preferred.

As the rinsing liquid in the rinsing treatment carried out after alkali development, pure water is used, and an appropriate amount of a surfactant can also be added to the water used.

In addition, after the development or rinsing treatment, a treatment removing the developer or rinsing liquid adhering on the pattern by a supercritical fluid can be performed.

As the developer (hereinafter also referred to as an organic developer) in the development with a developer including an organic solvent in the pattern forming method of the invention, a polar solvent such as a ketone-based solvent, an ester-based solvent, an alcohol-based solvent, an amide-based solvent, and an ether-based solvent, or a hydrocarbon-based solvent may be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methylethyl ketone, methyl isobutyl ketone, acetylacetone, acetonylacetone, ionone, diacetonyl alcohol, acetylcarbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include, in addition to the glycol ether-based solvents above, dioxane, and tetrahydrofuran.

Examples of the amide-based solvent include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aromatic hydrocarbon-based solvents such as toluene and xylene, and aliphatic hydrocarbon-based solvents such as pentane, hexane, octane, and decane.

A plurality of these solvents may be mixed, or the solvent may be used by mixing with a solvent other than those described above or water. However, in order to sufficiently bring out the effects of the invention, the water content rate of the entire developer is preferably less than 10 mass %, and it is more preferred to include substantially no water.

That is, the content of the organic solvent in the organic developer is preferably from 90 mass % to 100 mass %, and more preferably from 95 mass % to 100 mass %, based on the total amount of the developer.

In particular, the organic developer is preferably a developer containing at least one organic solvent selected from a group consisting of a ketone-based solvent, an ester-based solvent, an alcohol-based solvent, an amide-based solvent, and an ether-based solvent.

The vapor pressure at 20° C. of the organic developer is preferably 5 kPa or less, more preferably 3 kPa or less, and particularly preferably 2 kPa or less. By setting the vapor pressure of the organic developer to 5 kPa or less, evaporation of the developer on a substrate or in a development cup is inhibited and the temperature uniformity in the wafer plane is enhanced, as a result, the dimensional uniformity in the wafer plane is improved.

Specific examples having a vapor pressure of 5 kPa or less include ketone-based solvents, such as 1-octanone, 2-octanone, 1-nonanone, 2-nonanone, 2-heptanone(methyl amyl ketone), 4-heptanone, 2-hexanone, diisobutyl ketone, cyclohexanone, methyl cyclohexanone, phenyl acetone, or methyl isobutyl ketone; ester-based solvents, such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, butyl formate, propyl formate, ethyl lactate, butyl lactate, or propyl lactate; alcohol-based solvents, such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, or n-decanol; glycol-based solvents, such as ethylene glycol, diethylene glycol, or triethylene glycol; glycol ether-based solvents, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, or methoxymethyl butanol; ether-based solvents, such as tetrahydrofuran; amide-based solvents, such as N-methyl-2-pyrrolidone, N,N-dimethylacetamide, or N,N-dimethyl formamide; aromatic hydrocarbon-based solvents, such as toluene or xylene; or aliphatic hydrocarbon-based solvents, such as octane or decane.

Specific examples having a vapor pressure in the particularly preferred range of 2 kPa or less include ketone-based solvents, such as 1-octanone, 2-octanone, 1-nonanone, 2-nonanone, 4-heptanone, 2-hexanone, diisobutyl ketone, cyclohexanone, methyl cyclohexanone, or phenyl acetone; ester-based solvents, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, ethyl lactate, butyl lactate, or propyl lactate; alcohol-based solvents, such as n-butyl alcohol, sec-butyl alcohol, tert-butyl alcohol, isobutyl alcohol, n-hexyl alcohol, n-heptyl alcohol, n-octyl alcohol, or n-decanol; glycol-based solvents, such as ethylene glycol, diethylene glycol or triethylene glycol; glycol ether-based solvents, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, or methoxymethyl butanol; amide-based solvents, such as N-methyl-2-pyrrolidone, N,N-dimethylacetamide, or N,N-dimethyl formamide; aromatic hydrocarbon-based solvents, such as xylene; or aliphatic hydrocarbon-based solvents, such as octane or decane.

An appropriate amount of a surfactant may be added to the organic developer, if desired.

The surfactant is not particularly limited but, for example, an ionic or nonionic fluorine-based and/or silicon-based surfactant can be used. Examples of such a fluorine-based and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. No. 5,405,720B, U.S. Pat. No. 5,360,692B, U.S. Pat. No. 5,529,881B, U.S. Pat. No. 5,296,330B, U.S. Pat. No. 5,436,098B, U.S. Pat. No. 5,576,143B, U.S. Pat. No. 5,294,511B, and U.S. Pat. No. 5,824,451B. A nonionic surfactant is preferred. The nonionic surfactant is not particularly limited, but use of a fluorine-based surfactant or a silicon-based surfactant is more preferred.

The amount of the surfactant used is usually from 0.001 mass % to 5 mass %, preferably from 0.005 mass % to 2 mass %, and more preferably from 0.01 mass % to 0.5 mass %, based on the total amount of the developing liquid.

Regarding the developing method, for example, a method of dipping the substrate in a bath filled with the developing liquid for a fixed time (dipping method), a method of raising the developing liquid on the substrate surface by the effect of a surface tension and keeping it still for a fixed time, thereby performing the development (puddle method), a method of spraying the developing liquid on a substrate surface (spraying method), a method of continuously discharging the developing liquid on the substrate spinning at a constant speed while scanning the developing liquid discharging nozzle at a constant rate (dynamic dispense method), or the like may be applied.

In the case where the above-described various developing methods include a step of discharging the developing liquid toward the resist film from a development nozzle of a developing apparatus, the discharge pressure of the developing liquid discharged (the flow velocity per unit area of the developing liquid discharged) is preferably 2 mL/sec/mm$^2$ or less, more preferably 1.5 mL/sec/mm$^2$ or less, and still more preferably 1 mL/sec/mm$^2$ or less. The flow velocity is not particularly limited in the lower limit, but from the viewpoint of throughput, is preferably 0.2 mL/sec/mm2 or more.

By setting the discharge pressure of the discharged developing liquid to the range above, pattern defects attributable to the resist residue after development can be greatly reduced.

Details of this mechanism are not clearly known, but it is considered that it is possible that due to the discharge pressure in the above-described range, the pressure imposed on the resist film by the developing liquid is small and the resist film or resist pattern is kept from inadvertent chipping or collapse.

Here, the discharge pressure (mL/sec/mm$^2$) of the developing liquid is a value at the outlet of a development nozzle in a developing apparatus.

Examples of the method for adjusting the discharge pressure of the developing liquid include a method of adjusting the discharge pressure by a pump or the like, and a method of supplying the developing liquid from a pressurized tank and adjusting the pressure to change the discharge pressure.

Further, after the development using a developing liquid including an organic solvent, stopping of the development by replacement with another solvent may be carried out.

After the development using a developing liquid including an organic solvent, washing with a rinsing liquid is preferably included.

The rinsing liquid used in the washing with a rinsing liquid after the development using a developing liquid including an organic solvent is not particularly limited as long as it does not dissolve the resist pattern, and a solution including an ordinary organic solvent may be used. As the rinsing liquid, a rinsing liquid including at least one organic solvent selected from a group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include those described above for the developing liquid including an organic solvent.

After the development using a developing liquid including an organic solvent, more preferably, washing with a rinsing liquid containing at least one organic solvent selected from the group consisting of a ketone-based solvent, an ester-based solvent, an alcohol-based solvent, and an amide-based solvent is carried out; still more preferably, washing with a rinsing liquid containing an alcohol-based solvent or an ester-based solvent is carried out after the development; particularly preferably, washing with a rinsing liquid containing a monohydric alcohol is carried out; and most preferably, washing with a rinsing liquid containing a monohydric alcohol having 5 or more carbon atoms is carried out.

Here, the monohydric alcohol used in the rinsing includes linear, branched, and cyclic monohydric alcohols, and specifically 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like may be used. As the particularly preferred monohydric alcohol having 5 or more carbon atoms, 1-hexanol, 2-hexanol, 4-methyl-2-pentanol, 1-pentanol, 3-methyl-1-butanol, or the like may be used.

A plurality of these respective components may be mixed or the solvent may be used by mixing it with an organic solvent other than those described above.

The water content in the rinsing liquid is preferably 10 mass % or less, more preferably 5 mass % or less, and particularly preferably 3 mass % or less. By setting the water content to 10 mass % or less, good development characteristics can be obtained.

The vapor pressure at 20° C. of the rinsing liquid used after the development using a developing liquid including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to a value ranging from 0.05 kPa to 5 kPa, the temperature uniformity in the wafer plane is enhanced and moreover, swelling due to permeation of the rinsing liquid is inhibited, as a result, the dimensional uniformity in the wafer plane is improved.

The rinsing liquid may also be used after adding thereto a surfactant in an appropriate amount.

In the rinsing, the wafer that has been subjected to development using a developing liquid including an organic solvent is washed using the above-described rinsing liquid including an organic solvent. The method for the washing treatment is not particularly limited, but examples of the method which can be applied include a method of continuously discharging the rinsing liquid on the substrate spinning at a fixed speed (spin coating method), a method of dipping the substrate in a bath filled with the rinsing liquid for a fixed time (dipping method), and a method of spraying the rinsing liquid on the substrate surface (spraying method). Above all, it is preferable to perform the washing treatment by the spin coating method and after the washing, remove the rinsing liquid from the substrate surface by spinning the substrate at a rotational speed of 2000 rpm to 4000 rpm. Further, it is also preferable to include heating (Post Bake) after the rinsing. The developing liquid and the rinsing liquid remaining between the patterns and inside the patterns are removed by the baking. The heating after the rinsing is carried out at usually from 40° C. to 160° C., and preferably from 70° C. to 95° C., and for usually from 10 seconds to 3 minutes, and preferably from 30 seconds to 90 seconds.

In addition, the invention relates to a method for preparing an electronic device, including the negative pattern forming method of the invention as described above, and an electronic device prepared by the preparation method.

The electronic device of the invention is suitably mounted on an electric/electronic device (domestic appliances, OA-medium-related devices, optical devices, communication devices, and the like).

EXAMPLES

Hereinbelow, the invention will be described in detail with reference to Examples, but the content of the invention is not limited thereto.

<Compound (A)>

The compound (A) was used by being appropriately selecting from (A-1) to (A-60) previously given as examples. In addition, the comparative compound was prepared from (PA-1) and (PA-2) below.

[Chem. 70]

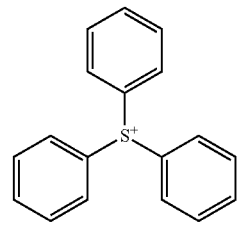

(PA-1)

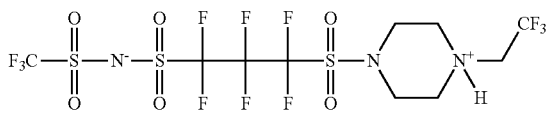

(PA-2)

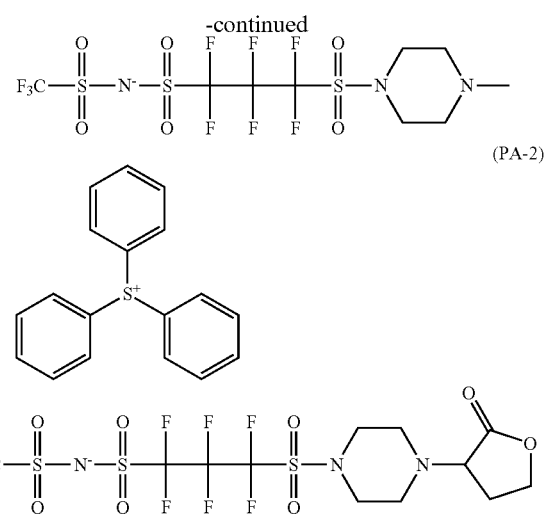

Synthesis Example of Compound (A)

Synthesis of Compound (A-1)

Under a nitrogen flow, a mixture of 18.97 g (60 mmol) of 1,1,2,2,3,3,-hexafluoropropane-1,3-disulfonylfluoride and 20 g of THF was cooled in ice, and a mixed solution of 7.69 g (60 mmol) of 1-acetylpiperazine, 60.71 g of triethylamine, and 20 g of THF was added dropwise thereto over 60 minutes. The solution after dropping was cooled in ice for 1 hour while being stirred, and further stirred for 6 hours at room temperature. 8.95 g (60 mmol) of trifluoromethanesulfonamide was added thereto, and the mixture was stirred for 6 hours at 80° C. Thereafter, 30 g of cyclopentylmethyl ether was further added, and 200 ml of ethyl acetate was added after decantation of the upper layer. After washing the organic layer with water, the resultant was further washed using 1N hydrochloric acid, and the solvent was distilled using a rotary evaporator.

45 ml of 3N hydrochloric acid and 25 ml of isopropanol were added to the obtained oil, and stirred for 5 hour at 80° C. The obtained solution was cooled to room temperature, subsequently added dropwise to 300 ml of distilled water and stirred for 1 hour at room temperature. The precipitated white solids were filtered out, and 22.16 g (yield 72%) of the following compound was obtained.

[Chem. 71]

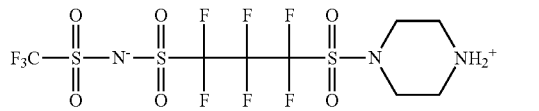

10.23 g (20 mmol) of the above compound was dissolved in 50 ml of MEK, 8.29 g (60 mmol) of potassium carbonate was added thereto, a mixture of 5.57 g (24 mmol) of 2,2,2-trifluoroethyl trifluoromethanesulfonate and 25 ml of MEK was further added and cooled to room temperature after stirring for 3 hours at 60° C. After 150 ml of distilled water was added to the obtained solution, the upper layer and lower layer together were added dropwise to 600 ml of 1N hydrochloric acid, and the resultant was stirred for 1 hour at room temperature. The precipitated white solids were filtered out, and 10.85 g (yield 91%) of the following compound was obtained.

[Chem. 72]

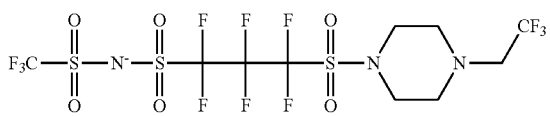

8.90 g (15 mmol) of the above compound, 5.41 g (15.75 mmol) of triphenylsulfonium bromide and 1.89 g (22.5 mmol) of sodium hydrogen carbonate were dissolved in 100 ml of chloroform and 100 ml of distilled water, and stirred for 1 hour at room temperature. After washing the obtained lower layer four times with distilled water, the solvent was distilled off using a rotary evaporator. The obtained oil was purified through column chromatography (SiO$_2$, ethyl acetate), and 11.2 g (yield 87%) of a white solid target compound (A-1) was obtained.

[Chem. 73]

(A-1)

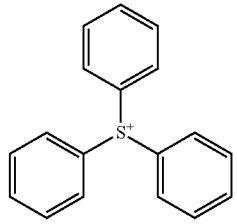

Compounds (A-2) to (A-60) were synthesized in the same manner as above.

<Acid Decomposable Resin (P)>

The following resins (P-1) to (P-6) were used as the acid-decomposable resin (P).

[Chem. 74]

(P-1)

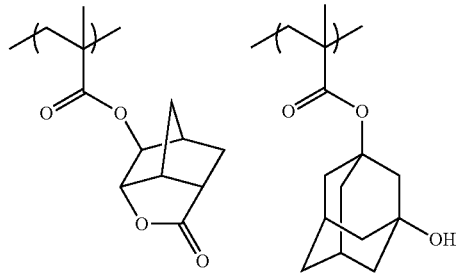

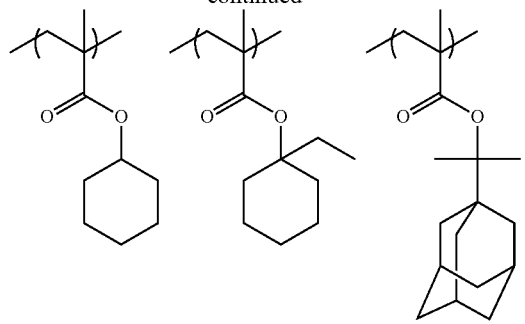
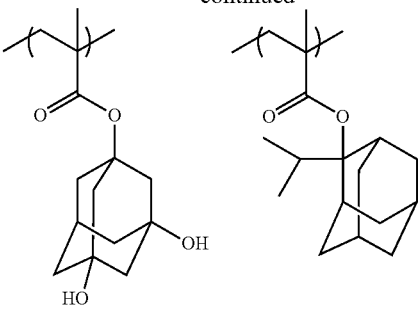
(P-2)
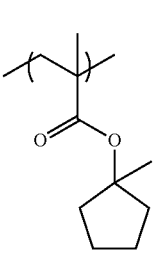
(P-3)
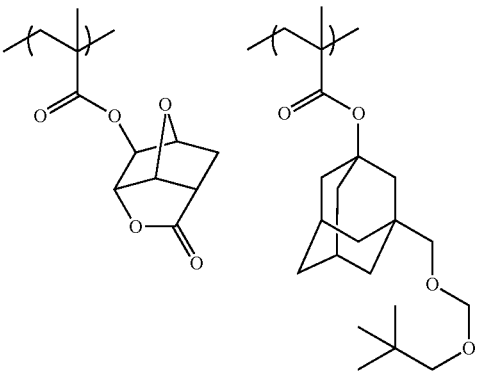
(P-5)
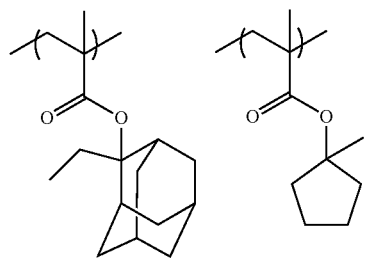
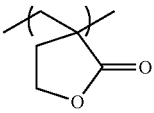
(P-6)
(P-4)
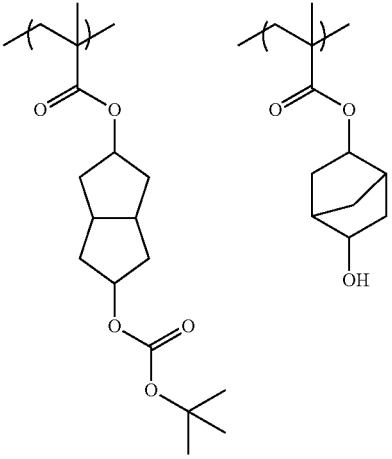

-continued

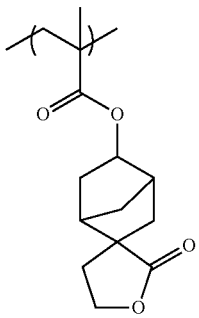

The weight average molecular weight Mw, dispersity Mw/Mn, and compositional ratio of each repeating unit for the resin (P-1) to (P-6) are shown in Table 6 below. The positional relationship of the numerical value of the compositional ratio (molar ratio) corresponds to the positional relationship of each repeating unit in each resin in Table 4.

TABLE 6

|  | Composition Ratio | | | | | Mw | Mw/Mn |
|---|---|---|---|---|---|---|---|
| (P-1) | 31 | 5 | 5 | 45 | 14 | 12100 | 1.62 |
| (P-2) | 50 | 50 | | | | 15100 | 1.72 |
| (P-3) | 30 | 11 | 19 | 40 | | 6800 | 1.48 |
| (P-4) | 20 | 20 | 10 | 10 | 40 | 10100 | 1.55 |
| (P-5) | 41 | 41 | 18 | | | 8200 | 1.58 |
| (P-6) | 30 | 10 | 60 | | | 8600 | 1.52 |

Synthesis Example of Acid-Decomposable Resin (P)

Synthesis of Resin (P-1)

Under a nitrogen flow, 6.44 g of cyclohexanone was added to a three-necked flask, and heated to 85° C. Solvent 1 was thus obtained. Next, monomer-1 (3.33 g), monomer-2 (0.59 g), monomer-3 (0.42 g), monomer-4 (4.42 g), and monomer-5 (1.97 g) were dissolved in cyclohexanone (25.75 g) and a monomer solution was prepared. Further, 4.2 mol % of a polymerization initiator V-601 (manufactured by Wako Pure Chemical Industries, Ltd.) with respect to the total amount of monomers was added to the monomer solution. The resultant was added dropwise to the above solvent 1 over 6 hours. After the finish of dropwise addition, the obtained solution was further reacted at 85° C. for 2 hours. After cooling the reaction liquid, it was added dropwise to a mixed solvent of 270 g of methanol/30 g of water, precipitated powder was filtered out and dried, thus obtaining 8.6 g of resin (P-1). The weight average molecular weight of the obtained resin (P-1) was 12100, the dispersity (Mw/Mn) was 1.62, and the compositional ratio (molar ratio) measured through $^{13}$C-NMR was 31/5/5/45/14.

[Chem. 75]

monomer-1

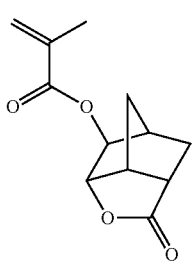

monomer-2

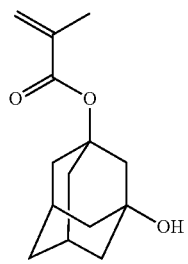

monomer-3

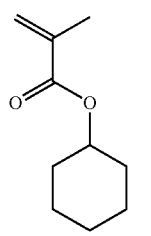

monomer-4

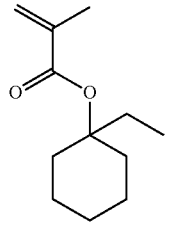

monomer-5

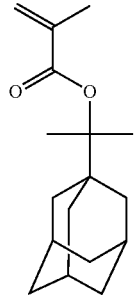

Resins (P-2) to (P-6) were synthesized in the same manner as resin (P-1)

<Acid Generator>

The acid generator was appropriately selected from acid generators z1 to z108 previously given as examples, and used.

<Basic Compound>

Compounds (N-1) to (N-9) below were used as the basic compound.

[Chem. 76]

(N-1)

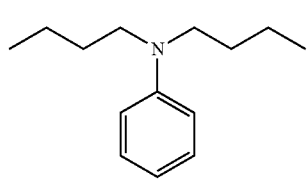

-continued (N-2)

[structure: 2,6-diisopropylaniline]

(N-3)

[structure: 2-phenylbenzimidazole]

(N-4)

[structure: tripentylamine / N,N-dipentylpentylamine]

(N-5)

[structure: N-methylcaprolactam]

(N-6)

[structure: morpholinoethyl ester of long-chain carboxylic acid]

(N-7)

[structure: morpholine with triethylene glycol monomethyl ether chain]

(N-8)

[structure: 4-hydroxy-1-(tert-butoxycarbonyl)piperidine]

(N-9)

[structure: 1-(tert-pentyloxycarbonyl)piperidine]

<Hydrophobic Resin (HR)>

The hydrophobic resin (HR) was appropriately selected from resins (B-1) to (B-55) previously given as examples, and used.

Further, the hydrophobic resin (HR-29) was synthesized in accordance with the descriptions of US Patent App. Nos. 2010/0152400, WO 2010/067905, WO 2010/067898, and the like.

<Resin (D)>

The resin (D) was appropriately selected from resins (B-56) to (B-86) previously given as examples, and used.

<Surfactant>

The surfactants below were used.

W-1: Megaface F176 (manufactured by Dainippon Ink & Chemicals, Inc.; fluorine-based)
W-2: Megaface R08 (manufactured by Dainippon Ink & Chemicals, Inc; fluorine- and silicon-based)
W-3: Polysiloxane Polymer KP-341 (manufactured by Shin-Etsu Chemical Co., Ltd., silicon-based)
W-4: Troysol S-366 (manufactured by Troy Chemical Co., Ltd.)
W-5: KH-20 (manufactured by Asahi Glass Co., Ltd.)
W-6: PolyFox PF-6320 (manufactured by OMNOVA Solutions Inc., fluorine-based)

<Solvent>

The solvents below were used.

(Group a)
SL-1: Propylene glycol monomethyl ether acetate (PG-MEA)
SL-2: Propylene glycol monomethyl ether propionate
SL-3: 2-Heptanone (Group b)
SL-4: Ethyl lactate
SL-5: Propylene glycol monomethyl ether (PGME)
SL-6: Cyclohexanone (Group c)
SL-7: γ-Butyrolactone
SL-8: Propylene carbonate <Developer>

As the developer, the following ones were prepared.

SG-1: Butyl acetate
SG-2: Methyl amyl ketone
SG-3: Ethyl-3-ethoxypropionate
SG-4: Pentyl acetate
SG-5: Isopentyl acetate
SG-6: Propylene glycol monomethyl ether acetate (PG-MEA)
SG-7: Cyclohexanone <Rinsing Liquid>

The rinsing liquids below were used.

SR-1: 4-methyl-2-pentanol
SR-2: 1-Hexanol
SR-3: Butyl acetate
SR-4: Methyl amyl ketone
SR-5: Ethyl-3-ethoxypropionate

[Evaluation Method]
<ArF Immersion Exposure>
(Resist Preparation and Pattern Formation)

The components shown in Table 8 below were dissolved at a solid content of 3.4 mass % in the solvents shown in the same table, each was filtered with a polyethylene filter having a 0.03 μm pore size, thus preparing an actinic ray-sensitive or radiation-sensitive resin composition (resist composition). ARC29SR (manufactured by Nissan Chemical Industries, Ltd) for an organic anti-reflection film was coated on a silicon wafer, baking was performed for 60 seconds at 205° C., thus forming an anti-reflection film with a film thickness of 95 nm.

A resist composition was coated thereon, and baking (Prebake: PB) was performed, to form a resist film with a 90 nm film thickness.

Pattern exposure was performed on the obtained wafer via a binary mask using an ArF immersion exposure device (NA 1.20). Thereafter, baking (Post Exposure Bake: PEB) was performed for 60 seconds, development was performed for 30 seconds using a negative developer, and rinsing performed using a rinsing liquid. Thereafter, a 44 nm (1:1) line and space resist pattern was obtained by rotating the wafer for 30 seconds at a rotation speed of 4000 rpm.

In Table 7 below, the temperature conditions (° C.) of PB and PEB in pattern forming, along with the developer and rinsing liquid used are shown for each Example and Comparative Example.

TABLE 7

| Example No. | PB (° C.) | PEB (° C.) | Developer | Rinsing Liquid |
|---|---|---|---|---|
| Example 1 | 110 | 100 | SG-1 | SR-1 |
| Example 2 | 105 | 95 | SG-1 | SR-2 |
| Example 3 | 110 | 100 | SG-1 | SR-1 |
| Example 4 | 105 | 95 | SG-2 | SR-1 |
| Example 5 | 100 | 105 | SG-2 | SR-3 |
| Example 6 | 105 | 90 | SG-3 | SR-1 |
| Example 7 | 95 | 100 | SG-1 | SR-4 |
| Example 8 | 90 | 95 | SG-4 | SR-1 |
| Example 9 | 100 | 100 | SG-5 | SR-5 |
| Example 10 | 110 | 95 | SG-1 | SR-1 |
| Example 11 | 105 | 105 | SG-1 | SR-1 |
| Example 12 | 110 | 90 | SG-6 | SR-1 |
| Example 13 | 105 | 100 | SG-2 | SR-2 |
| Example 14 | 100 | 95 | SG-1 | SR-1 |
| Example 15 | 105 | 100 | SG-7 | SR-1 |
| Example 16 | 95 | 95 | SG-1 | SR-3 |
| Example 17 | 90 | 105 | SG-2 | SR-1 |
| Example 18 | 100 | 90 | SG-1 | SR-4 |
| Example 19 | 110 | 100 | SG-1 | SR-1 |
| Example 20 | 105 | 95 | SG-1 | SR-5 |
| Example 21 | 110 | 100 | SG-1 | SR-1 |
| Example 22 | 105 | 95 | SG-2 | SR-1 |
| Example 23 | 100 | 105 | SG-2 | SR-1 |
| Example 24 | 105 | 90 | SG-3 | SR-2 |
| Example 25 | 95 | 100 | SG-1 | SR-1 |
| Example 26 | 90 | 95 | SG-4 | SR-1 |
| Example 27 | 100 | 100 | SG-5 | SR-3 |
| Example 28 | 110 | 95 | SG-1 | SR-1 |
| Example 29 | 105 | 105 | SG-1 | SR-4 |
| Example 30 | 110 | 90 | SG-6 | SR-1 |
| Example 31 | 105 | 100 | SG-2 | SR-5 |
| Example 32 | 100 | 95 | SG-1 | SR-1 |
| Example 33 | 105 | 100 | SG-7 | SR-1 |
| Example 34 | 95 | 95 | SG-1 | SR-1 |
| Example 35 | 90 | 105 | SG-2 | SR-2 |
| Example 36 | 100 | 90 | SG-1 | SR-1 |
| Example 37 | 110 | 100 | SG-1 | SR-1 |
| Example 38 | 105 | 95 | SG-1 | SR-3 |
| Example 39 | 110 | 100 | SG-1 | SR-1 |
| Example 40 | 105 | 95 | SG-2 | SR-4 |
| Example 41 | 100 | 105 | SG-2 | SR-1 |
| Example 42 | 105 | 90 | SG-3 | SR-5 |
| Comparative Example 1 | 90 | 100 | SG-4 | SR-1 |
| Comparative Example 2 | 100 | 95 | SG-5 | SR-1 |
| Comparative Example 3 | 110 | 100 | SG-1 | SR-2 |

(Line Width Roughness; LWR)

The obtained 44 nm (1:1) line and space resist pattern was observed using a length measuring scanning electron microscope (SEM: S-9380 II manufactured by Hitachi, Ltd.). The line width was measured at 50 points at even intervals for a range of 2 μm in the length direction of the space pattern, and the standard deviation from 3δ was calculated. The smaller the value, the more satisfactory the performance shown.

(Exposure Latitude; EL)

The exposure amount for forming the obtained 44 nm (1:1) line and space resist pattern was taken as the optimal exposure amount, and an exposure amount width permitting a pattern size of ±10% when the exposure amount is changed was determined. This value is divided by the optimal exposure amount and a percentage displayed. The larger the value, the lower the change in performance due to changes in the exposure amount, and the more satisfactory the EL.

In Table 8 below, the components and evaluation results of the compositions used in the Examples and Comparative Examples are shown. In Table 8, the Log P value is the value calculated by method previously shown for the Log P value of the basic site $R_N$—$CH_3$ of the compound (A).

TABLE 8

| Example No. | Compound (A) | Mass (g) | Acid Generator (B) | Mass (g) | Basic Compound (N') | Mass (g) | Acid-decomposable Resin (P) | Mass (g) | Hydrophobic Resin (HR) Resin (D) | Mass (g) |
|---|---|---|---|---|---|---|---|---|---|---|
| Example 1 | A-1 | 0.3 | z74/z76 | 0.2/0.6 | N-3 | 0.008 | P-1 | 10 | B-29 | 0.4 |
| Example 2 | A-2 | 0.4 | z32 | 0.7 | N-8 | 0.006 | P-3 | 10 | B-10 | 0.1 |
| Example 3 | A-3 | 0.1 | z45 | 1.1 | N-9 | 0.009 | P-2 | 10 | B-22 | 0.03 |
| Example 4 | A-4 | 0.25 | z88 | 0.8 | N-4 | 0.008 | P-4 | 10 | B-65 | 0.2 |
| Example 5 | A-5 | 0.3 | z51 | 0.9 | N-1 | 0.007 | P-1 | 10 | B-76 | 0.1 |
| Example 6 | A-6 | 0.4 | z95 | 0.7 | N-6 | 0.006 | P-5 | 10 | B-66 | 0.08 |
| Example 7 | A-7 | 0.15 | z67 | 0.8 | N-2 | 0.009 | P-2 | 10 | B-22 | 0.06 |
| Example 8 | A-8 | 0.2 | z102 | 0.7 | N-7 | 0.008 | P-6 | 10 | B-29/B-10 | 0.1/0.03 |
| Example 9 | A-9 | 0.3 | z31 | 0.6 | N-9 | 0.008 | P-1 | 10 | B-29 | 0.4 |
| Example 10 | A-10 | 0.4 | z103 | 0.7 | N-8 | 0.006 | P-3 | 10 | B-10 | 0.1 |
| Example 11 | A-11 | 0.1 | z72 | 1.1 | N-3 | 0.009 | P-1 | 10 | B-22 | 0.03 |
| Example 12 | A-12 | 0.25 | z19 | 0.8 | N-6 | 0.008 | P-5 | 10 | B-65 | 0.2 |
| Example 13 | A-13 | 0.3 | z74 | 0.9 | N-2 | 0.007 | P-2 | 10 | B-76 | 0.1 |
| Example 14 | A-14 | 0.4 | z37 | 0.7 | N-5 | 0.006 | P-4 | 10 | B-68 | 0.08 |
| Example 15 | A-16 | 0.15 | z105 | 0.8 | N-3 | 0.009 | P-3 | 10 | B-22 | 0.06 |
| Example 16 | A-18 | 0.2 | z32 | 0.7 | N-8 | 0.008 | P-3 | 10 | B-29/B-10 | 0.1/0.03 |
| Example 17 | A-20 | 0.3 | z106 | 0.8 | N-3 | 0.008 | P-3 | 10 | B-29 | 0.4 |
| Example 18 | A-22 | 0.4 | z20 | 0.7 | N-6 | 0.006 | P-6 | 10 | B-10 | 0.1 |
| Example 19 | A-24 | 0.1 | z76/z67 | 1.1/0.2 | N-2 | 0.009 | P-4 | 10 | B-22 | 0.03 |
| Example 20 | A-25 | 0.25 | z83 | 0.8 | N-6 | 0.008 | P-1 | 10 | B-65 | 0.2 |

TABLE 8-continued

| Example No. | Compound (A) | Mass (g) | Acid Generator (B) | Mass (g) | Basic Compound (N') | Mass (g) | Acid-decomposable Resin (P) | Mass (g) | Hydrophobic Resin (HR) | Mass (g) |
|---|---|---|---|---|---|---|---|---|---|---|
| Example 21 | A-26 | 0.3 | z4 | 0.9 | N-7 | 0.007 | P-6 | 10 | B-76 | 0.1 |
| Example 22 | A-27 | 0.4 | z89 | 0.7 | N-5 | 0.006 | P-4 | 10 | B-68 | 0.08 |
| Example 23 | A-28 | 0.15 | z88 | 0.8 | — | — | P-6 | 10 | B-22 | 0.06 |

| Example No. | Surfactant | Mass (g) | Solvent | (Mass Ratio) | LWR [nm] | EL [%] | Sensitivity [mJ/cm$^2$] | LogP Value |
|---|---|---|---|---|---|---|---|---|
| Example 1 | W-1 | 0.001 | SL-1/SL-6 | 70/30 | 4.4 | 9.1 | 42.5 | 2.07 |
| Example 2 | W-2 | 0.002 | SL-1/SL-7 | 90/10 | 4.5 | 8.9 | 41.2 | 2.07 |
| Example 3 | W-3 | 0.001 | SL-1/SL-4 | 90/10 | 4.8 | 9.2 | 45.3 | 1.26 |
| Example 4 | W-4 | 0.001 | SL-1/SL-5 | 70/30 | 4.9 | 8.8 | 44.3 | 1.26 |
| Example 5 | W-5 | 0.002 | SL-1/SL-6/SL-7 | 80/15/5 | 4.5 | 9.0 | 40.2 | 2.24 |
| Example 6 | W-6 | 0.001 | SL-3/SL-8 | 95/5 | 4.4 | 9.2 | 41.3 | 2.24 |
| Example 7 | W-2 | 0.001 | SL-2 | 100 | 4.4 | 8.9 | 43.2 | 1.60 |
| Example 8 | W-3 | 0.002 | SL-3/SL-4 | 80/20 | 4.6 | 9.1 | 41.2 | 1.60 |
| Example 9 | W-4 | 0.001 | SL-2/SL-6 | 80/20 | 4.5 | 8.9 | 43.5 | 2.70 |
| Example 10 | W-5 | 0.001 | SL-1/SL-6 | 70/30 | 4.4 | 8.8 | 42.5 | 2.70 |
| Example 11 | W-6 | 0.002 | SL-1/SL-7 | 90/10 | 4.5 | 9.0 | 41.2 | 2.81 |
| Example 12 | W-1 | 0.001 | SL-1/SL-4 | 90/10 | 4.6 | 9.1 | 45.3 | 2.81 |
| Example 13 | W-3 | 0.001 | SL-1/SL-5 | 70/30 | 4.4 | 9.1 | 44.3 | 3.34 |
| Example 14 | — | — | SL-1/SL-6/SL-8 | 80/15/5 | 4.4 | 8.9 | 40.2 | 3.34 |
| Example 15 | W-5 | 0.001 | SLL-3/SL-7 | 95/5 | 4.8 | 9.2 | 41.3 | 1.34 |
| Example 16 | W-6 | 0.001 | SL-3 | 100 | 4.5 | 8.8 | 43.2 | 1.70 |
| Example 17 | W-1 | 0.002 | SL-3/SL-5 | 80/20 | 4.6 | 9.0 | 41.2 | 1.57 |
| Example 18 | W-2 | 0.001 | SL-2/SL-7 | 80/20 | 4.4 | 9.2 | 43.5 | 1.75 |
| Example 19 | W-4 | 0.001 | SL-1/SL-6 | 70/30 | 4.8 | 8.9 | 42.5 | 1.43 |
| Example 20 | W-5/W-6 | 0.002 | SL-1/SL-7 | 90/10 | 4.6 | 9.1 | 41.2 | 2.11 |
| Example 21 | W-6 | 0.001 | SL-1/SL-4 | 90/10 | 4.4 | 8.9 | 45.3 | 2.11 |
| Example 22 | W-3 | 0.001 | SL-1/SL-5 | 70/30 | 4.9 | 8.8 | 44.3 | 1.43 |
| Example 23 | W-1 | 0.002 | SL-1/SL-6/SL-7 | 80/15/5 | 4.8 | 9.0 | 40.2 | 1.43 |

| Example No. | Compound (A) | Mass (g) | Acid Generator (B) | Mass (g) | Basic Compound (N') | Mass (g) | Acid-decomposable Resin (P) | Mass (g) | Hydrophobic Resin (HR) | Mass (g) |
|---|---|---|---|---|---|---|---|---|---|---|
| Example 24 | A-29 | 0.2 | z4 | 0.7 | N-1 | 0.008 | P-2 | 10 | B-29/B-10 | 0.1/0.33 |
| Example 25 | A-30 | 0.3 | z95 | 0.8 | N-6 | 0.008 | P-5 | 10 | B-29 | 0.4 |
| Example 26 | A-31 | 0.4 | z104 | 0.7 | N-9 | 0.006 | P-1 | 10 | B-10 | 0.1 |
| Example 27 | A-33 | 0.1 | z103 | 1.1 | N-8 | 0.009 | P-3 | 10 | B-22 | 0.03 |
| Example 28 | A-35 | 0.25 | z13 | 0.8 | N-3 | 0.008 | P-2 | 10 | B-65 | 0.2 |
| Example 29 | A-37 | 0.3 | z92 | 0.9 | N-6 | 0.007 | P-4 | 10 | B-76 | 0.1 |
| Example 30 | A-39 | 0.4 | z25 | 0.7 | N-3 | 0.006 | P-1 | 10 | B-68 | 0.08 |
| Example 31 | A-40 | 0.15 | z94 | 0.8 | — | — | P-4 | 10 | B-22 | 0.06 |
| Example 32 | A-41 | 0.2 | z103 | 0.7 | N-1 | 0.008 | P-3 | 10 | B-29/B-10 | 0.1/0.03 |
| Example 33 | A-43 | 0.3 | z27 | 0.8 | N-9 | 0.008 | P-2 | 10 | B-29 | 0.4 |
| Example 34 | A-44/A-1 | 0.2/0.2 | z95 | 0.7 | N-7 | 0.006 | P-5 | 10 | B-10 | 0.1 |
| Example 35 | A-46 | 0.1 | z105 | 1.1 | N-8 | 0.009 | P-3 | 10 | B-22 | 0.03 |
| Example 36 | A-50 | 0.25 | z106 | 0.8 | N-3 | 0.008 | P-3 | 10 | B-65 | 0.2 |
| Example 37 | A-52 | 0.3 | z19 | 0.9 | N-6 | 0.007 | P-6 | 10 | B-76 | 0.1 |
| Example 38 | A-54 | 0.4 | z20 | 0.7 | N-2 | 0.006 | P-4 | 10 | B-68 | 0.08 |
| Example 39 | A-56 | 0.15 | z102 | 0.8 | N-7 | 0.009 | P-5 | 10 | B-22 | 0.06 |
| Example 40 | A-57 | 0.2 | z89 | 0.7 | N-4 | 0.008 | P-4 | 10 | B-29/B-10 | 0.1/0.03 |
| Example 41 | A-58 | 0.3 | z19 | 0.8 | N-7 | 0.008 | P-3/P-6 | 5/5 | B-29 | 0.4 |
| Example 42 | A-60 | 0.4 | z88 | 0.7 | N-2 | 0.006 | P-5 | 10 | B-10 | 0.1 |
| Comparative Example 1 | PA-1 | 0.25 | z45 | 0.8 | N-3 | 0.008 | P-1 | 10 | B-65 | 0.2 |
| Comparative Example 2 | PA-2 | 0.3 | z45 | 0.9 | N-8 | 0.007 | P-1 | 10 | B-76 | 0.1 |
| Comparative Example 3 | — | — | z45 | 1 | N-2 | 0.009 | P-1 | 10 | B-29 | 0.1 |

| Example No. | Surfactant | Mass (g) | Solvent | (Mass Ratio) | LWR [nm] | EL [%] | Sensitivity [mJ/cm$^2$] | LogP Value |
|---|---|---|---|---|---|---|---|---|
| Example 24 | W-2 | 0.001 | SL-3/SL-7 | 95/5 | 4.5 | 9.1 | 41.3 | 1.58 |
| Example 25 | W-3 | 0.001 | SL-4 | 100 | 4.6 | 9.1 | 43.2 | 2.19 |
| Example 26 | — | — | SL-3/SL/6 | 80/20 | 4.5 | 8.9 | 41.2 | 2.07 |
| Example 27 | W-5 | 0.001 | SL-2/SL-8 | 80/20 | 4.8 | 9.2 | 43.5 | 1.26 |
| Example 28 | W-6 | 0.001 | SL-1/SL-6 | 70/30 | 4.4 | 8.8 | 42.5 | 2.24 |
| Example 29 | W-2 | 0.002 | SL-1/SL-7 | 90/10 | 4.6 | 9.0 | 41.2 | 1.60 |
| Example 30 | W-3 | 0.001 | SL-1/SL-4 | 90/10 | 4.4 | 9.2 | 45.3 | 2.70 |
| Example 31 | W-4 | 0.001 | SL-1/SL-5 | 70/30 | 4.5 | 8.9 | 44.3 | 2.70 |
| Example 32 | W-5 | 0.002 | SL-1/SL-6/SL-7 | 80/15/5 | 4.6 | 9.1 | 40.2 | 2.81 |
| Example 33 | W-6 | 0.001 | SL-3/SL-7 | 95/5 | 4.4 | 8.9 | 42.5 | 3.34 |
| Example 34 | W-1 | 0.001 | SL-5 | 100 | 4.6 | 9.2 | 41.2 | 3.34/2.07 |
| Example 35 | W-3 | 0.002 | SL-3/SL-7 | 80/20 | 4.8 | 8.8 | 45.3 | 1.34 |
| Example 36 | W-4 | 0.001 | SL-2/SL-8 | 80/20 | 4.5 | 9.0 | 44.3 | 1.57 |
| Example 37 | — | — | SL-1/SL-6 | 70/30 | 4.6 | 9.2 | 40.2 | 1.75 |
| Example 38 | W-6 | 0.002 | SL-1/SL-7 | 90/10 | 4.8 | 8.9 | 41.3 | 1.43 |
| Example 39 | W-1 | 0.001 | SL-1/SL-4 | 90/10 | 4.6 | 9.1 | 43.2 | 2.11 |

TABLE 8-continued

| | | | | | | | | |
|---|---|---|---|---|---|---|---|---|
| Example 40 | W-2 | 0.001 | SL-1/SL-5 | 70/30 | 4.9 | 8.9 | 41.2 | 1.43 |
| Example 41 | W-4 | 0.002 | SL-1/SL-6/SL-7 | 80/15/5 | 4.8 | 8.8 | 43.5 | 1.43 |
| Example 42 | W-5 | 0.001 | SL-3/SL-7 | 95/5 | 4.4 | 9.0 | 40.9 | 2.19 |
| Comparative Example 1 | W-1 | 0.001 | SL-1/SL-6 | 70/30 | 6.1 | 7.5 | 45.5 | 1.09 |
| Comparative Example 2 | W-1 | 0.001 | SL-1/SL-7 | 90/10 | 6.4 | 7.5 | 43.5 | 0.64 |
| Comparative Example 3 | W-1 | 0.001 | SL-1/SL-5 | 70/30 | 7.3 | 6.8 | 42.5 | — |

It is understood from the above results that the negative pattern formation method of the present invention has excellent exposure latitude and line width roughness. In addition, a value equivalent to the pattern forming method of the related art is obtained for sensitivity.

What is claimed is:

1. A pattern forming method comprising:
   (i) forming a film including an actinic ray-sensitive or radiation-sensitive resin composition containing a compound (A) represented by General Formula (I) shown below;
   a resin (P) capable of decreasing solubility with respect to a developer including an organic solvent by action of an acid; and
   a compound (B) capable of generating an acid by irradiation of actinic rays or radiation;
   (ii) irradiating the film with actinic rays or radiation;
   (iii) developing the film irradiated with the actinic rays or radiation using a developer including an organic solvent;

wherein in general formula (I),
$R_N$ represents a monovalent basic compound residue containing at least one nitrogen atom and an alkyl group substituted with at least one fluorine atom;
$A^-$ represents any of general formula (a-1) to (a-3) shown below:

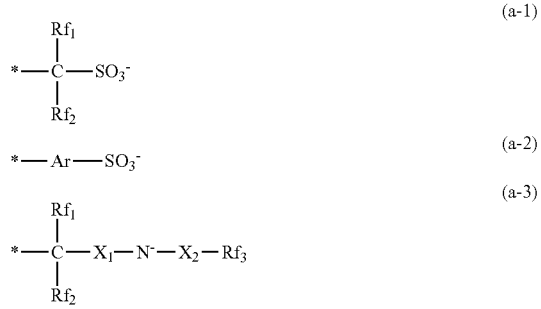

Ar represents an aryl group or a heteroaryl group;
$Rf_1$ and $Rf_2$ each independently represent a fluorine atom or an alkyl group substituted with at least one fluorine atom;
$Rf_3$ represents an alkyl group substituted with at least one fluorine atom;
$X_1$ and $X_2$ each independently represent —CO— or —$SO_2$—;
$X^+$ represents a counter cation;
* represents a bonding site with $R_N$; and
a Log P value of $R_N$—$CH_3$ is 1.2 or more to 4.0 or less, and wherein the monovalent basic compound residue contains a structure having a primary amino group, a secondary amino group, or a tertiary amino group.

2. The pattern forming method according to claim 1, wherein $R_N$-$A^-$ in the general formula (I) is represented by general formula (II) shown below;

wherein in general formula (II),
$A^-$ is as defined in the general formula (I);
Q represents a linking group;
$Rx_1$ and $Rx_2$ each independently represent a hydrogen atom or an organic group, and at least one of $Rx_1$ and $Rx_2$ contains the alkyl group substituted with at least one fluorine atom;
two or more of $Rx_1$, $Rx_2$ and Q may be bonded to each other to form a ring together with a nitrogen atom bonded therewith.

3. The pattern forming method according to claim 1, wherein $A^-$ in the general formula (I) is represented by the general formula (a-3).

4. The pattern forming method according to claim 1, wherein $X^+$ in the general formula (I) is an onium cation.

5. The pattern forming method according to claim 1, wherein the developer contains at least one type of organic solvent selected from a group consisting of a ketone-based solvent, an ester-based solvent, an alcohol-based solvent, an amide-based solvent, and an ether-based solvent.

6. A manufacturing method of an electronic device including the pattern forming method according to claim 1.

7. The pattern forming method according to claim 1, wherein $R_N$ in the general formula (I) represents a monovalent basic compound residue containing at least one nitrogen atom and at least one trifluoromethyl group.

8. The pattern forming method according to claim 1, wherein the Log P value of $R_N$—$CH_3$ is 1.25 or more to 3.0 or less.

9. The pattern forming method according to claim 1, wherein at least one of the at least one nitrogen atoms contained in the monovalent basic compound residue does not directly bond to an electron withdrawing functional group.

10. An actinic ray-sensitive or radiation-sensitive resin composition containing a compound (A) represented by general formula (I) shown below; a resin (P) capable of decreasing solubility with respect to a developer including an organic solvent by action of an acid; and a compound (B) capable of generating an acid by irradiation of actinic rays or radiation;

wherein in general formula (I), $R_N$ represents a monovalent basic compound residue containing at least one nitrogen atom and an alkyl group substituted with at least one fluorine atom;

$A^-$ represents any of general formula (a-1) to (a-3) shown below;

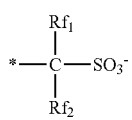

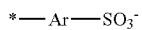

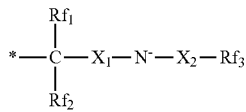

Ar represents an aryl group or a heteroaryl group;

$Rf_1$ and $Rf_2$ each independently represent a fluorine atom or an alkyl group substituted with at least one fluorine atom;

$Rf_3$ represents an alkyl group substituted with at least one fluorine atom;

$X_1$ and $X_2$ each independently represent —CO— or —$SO_2$—;

$X^+$ represents a counter cation;

* represents a bonding site with $R_N$;

a Log P value of $RN-CH_3$ is 1.2 or more to 4.0 or less, wherein the monovalent basic compound residue contains a structure having a primary amino group, a secondary amino group, or a tertiary amino group.

11. The actinic ray-sensitive or radiation-sensitive resin composition according to claim 10, wherein $R_N-A^-$ in the general formula (I) is represented by general formula (II) shown below:

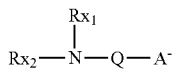

wherein in general formula (II), $A^-$ is as defined in the general formula (I);

Q represents a linking group;

$Rx_1$ and $Rx_2$ each independently represent a hydrogen atom or an organic group, and at least one of $Rx_1$ and $Rx_2$ contains the alkyl group substituted with at least one fluorine atom;

two or more of $Rx_1$, $Rx_2$ and Q may be bonded to each other to form a ring together with a nitrogen atom bonded therewith.

12. An actinic ray-sensitive or radiation-sensitive film including the actinic ray-sensitive or radiation-sensitive resin composition according to claim 10.

13. The actinic ray-sensitive or radiation-sensitive resin composition according to claim 10, wherein $R_N$ in the general formula (I) represents a monovalent basic compound residue containing at least one nitrogen atom and at least one trifluoromethyl group.

14. The actinic ray-sensitive or radiation-sensitive resin composition according to claim 10, wherein the Log P value of $R_N-CH_3$ is 1.25 or more to 3.0 or less.

15. The actinic ray-sensitive or radiation-sensitive resin composition according to claim 10, wherein at least one of the at least one nitrogen atoms contained in the monovalent basic compound residue does not directly bond to an electron withdrawing functional group.

16. A pattern forming method comprising:

(i) forming a film including an actinic ray-sensitive or radiation-sensitive resin composition containing a compound (A) represented by General Formula (I) shown below;

a resin (P) capable of decreasing solubility with respect to a developer including an organic solvent by action of an acid; and a compound (B) capable of generating an acid by irradiation of actinic rays or radiation;

(ii) irradiating the film with actinic rays or radiation; and (iii) developing the film irradiated with the actinic rays or radiation using a developer including an organic solvent;

 (I)

wherein in general formula (I), $R_N$ represents a monovalent basic compound residue containing at least one nitrogen atom and an alkyl group substituted with at least one fluorine atom;

$A^-$ represents general formula (a-3) shown below:

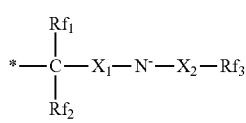

Ar represents an aryl group or a heteroaryl group;

$Rf_1$ and $Rf_2$ each independently represents a fluorine atom or an alkyl group substituted with at least one fluorine atom;

$Rf_3$ represents an alkyl group substituted with at least one fluorine atom;

$X_1$ and $X_2$ each independently represents —CO— or —$SO_2$—;

$X^+$ represents a counter cation;

* represents a bonding site with $R_N$; and a Log P value of $R_N-CH_3$ is 1.2 or more to 4.0 or less.

17. A pattern forming method comprising:

(i) forming a film including an actinic ray-sensitive or radiation-sensitive resin composition containing a compound (A) represented by General Formula (I) shown below;

a resin (P) capable of decreasing solubility with respect to a developer including an organic solvent by action of an acid; and a compound (B) capable of generating an acid by irradiation of actinic rays or radiation;

(ii) irradiating the film with actinic rays or radiation; and (iii) developing the film irradiated with the actinic rays or radiation using a developer including an organic solvent;

 (I)

wherein in general formula (I), $R_N$ represents a monovalent basic compound residue containing at least one nitrogen atom and at least one trifluoromethyl group;

A⁻ represents any of general formula (a-1) to (a-3) shown below:

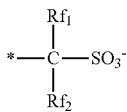
(a-1)

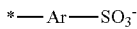
(a-2)

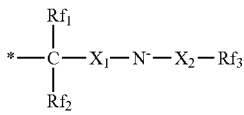
(a-3)

Ar represents an aryl group or a heteroaryl group;

$Rf_1$ and $Rf_2$ each independently represents a fluorine atom or an alkyl group substituted with at least one fluorine atom;

$Rf_3$ represents an alkyl group substituted with at least one fluorine atom;

$X_1$ and $X_2$ each independently represents —CO— or —$SO_2$—;

$X^+$ represents a counter cation;

* represents a bonding site with $R_N$; and a Log P value of $R_N$—$CH_3$ is 1.2 or more to 4.0 or less.

18. A pattern forming method comprising:
(i) forming a film including an actinic ray-sensitive or radiation-sensitive resin composition containing a compound (A) represented by General Formula (I) shown below;
a resin (P) capable of decreasing solubility with respect to a developer including an organic solvent by action of an acid; and
a compound (B) capable of generating an acid by irradiation of actinic rays or radiation;
(ii) irradiating the film with actinic rays or radiation; and
(iii) developing the film irradiated with the actinic rays or radiation using a developer including an organic solvent;

$$R_N\text{-}A^-X^+ \quad (I)$$

wherein in general formula (I), $R_N$ represents a monovalent basic compound residue containing at least one nitrogen atom and an alkyl group substituted with at least one fluorine atom;

A⁻ represents any of general formula (a-1) to (a-3) shown below:

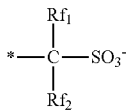
(a-1)

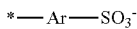
(a-2)

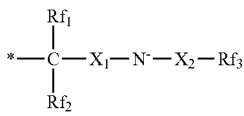
(a-3)

Ar represents an aryl group or a heteroaryl group;

$Rf_1$ and $Rf_2$ each independently represents a fluorine atom or an alkyl group substituted with at least one fluorine atom;

$Rf_3$ represents an alkyl group substituted with at least one fluorine atom;

$X_1$ and $X_2$ each independently represents —CO— or —$SO_2$—;

$X^+$ represents a counter cation;

* represents a bonding site with $R_N$; and a Log P value of $R_N$—$CH_3$ is 1.2 or more to 4.0 or less, and wherein at least one of the at least one nitrogen atoms contained in the monovalent basic compound residue does not directly bond to an electron withdrawing functional group.

19. An actinic ray-sensitive or radiation-sensitive resin composition containing a compound (A) represented by general formula (I) shown below; a resin (P) capable of decreasing solubility with respect to a developer including an organic solvent by action of an acid; and a compound (B) capable of generating an acid by irradiation of actinic rays or radiation;

$$R_N\text{-}A^-X^+ \quad (I)$$

wherein in general formula (I), $R_N$ represents a monovalent basic compound residue containing at least one nitrogen atom and at least one trifluoromethyl group;

A⁻ represents any of general formula (a-1) to (a-3) shown below:

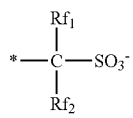
(a-1)

(a-2)

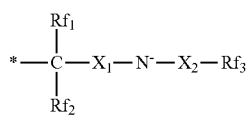
(a-3)

Ar represents an aryl group or a heteroaryl group;

$Rf_1$ and $Rf_2$ each independently represents a fluorine atom or an alkyl group substituted with at least one fluorine atom;

$Rf_3$ represents an alkyl group substituted with at least one fluorine atom;

$X_1$ and $X_2$ each independently represent —CO— or —$SO_2$—;

$X^+$ represents a counter cation;

* represents a bonding site with $R_N$;

a Log P value of RN—$CH_3$ is 1.2 or more to 4.0 or less.

20. An actinic ray-sensitive or radiation-sensitive resin composition containing a compound (A) represented by general formula (I) shown below; a resin (P) capable of decreasing solubility with respect to a developer including an organic solvent by action of an acid; and a compound (B) capable of generating an acid by irradiation of actinic rays or radiation;

$$R_N\text{-}A^-X^+ \quad (I)$$

wherein in general formula (I), $R_N$ represents a monovalent basic compound residue containing at least one nitrogen atom and an alkyl group substituted with at least one fluorine atom;

$A^-$ represents any of general formula (a-1) to (a-3) shown below:

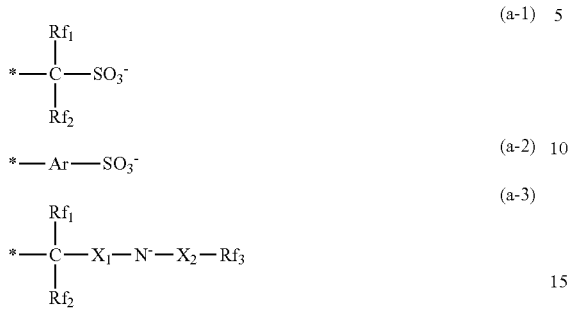

Ar represents an aryl group or a heteroaryl group;
$Rf_1$ and $Rf_2$ each independently represents a fluorine atom or an alkyl group substituted with at least one fluorine atom;
$Rf_3$ represents an alkyl group substituted with at least one fluorine atom;
$X_1$ and $X_2$ each independently represent —CO— or —$SO_2$—;
$X^+$ represents a counter cation;
* represents a bonding site with $R_N$;
a Log P value of RN—$CH_3$ is 1.2 or more to 4.0 or less, and wherein at least one of the at least one nitrogen atoms contained in the monovalent basic compound residue does not directly bond to an electron withdrawing functional group.

* * * * *